USO11233207B2

(12) United States Patent
Seifrid et al.

(10) Patent No.: US 11,233,207 B2
(45) Date of Patent: Jan. 25, 2022

(54) NARROW BANDGAP NON-FULLERENE ACCEPTORS AND DEVICES INCLUDING NARROW BANDGAP NON-FULLERENE ACCEPTORS

(71) Applicant: The Regents of the University of California, Oakland, CA (US)

(72) Inventors: Martin Seifrid, Goleta, CA (US); Guillermo C. Bazan, Santa Barbara, CA (US); Jaewon Lee, Goleta, CA (US); Thuc-Quyen Nguyen, Santa Barbara, CA (US); Benjamin R. Luginbuhl, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/179,294

(22) Filed: Nov. 2, 2018

(65) Prior Publication Data

US 2019/0157581 A1 May 23, 2019

Related U.S. Application Data

(60) Provisional application No. 62/580,710, filed on Nov. 2, 2017.

(51) Int. Cl.
*H01L 51/00* (2006.01)
*H01L 51/42* (2006.01)

(52) U.S. Cl.
CPC ...... *H01L 51/0094* (2013.01); *H01L 51/0012* (2013.01); *H01L 51/0034* (2013.01);
(Continued)

(58) Field of Classification Search
CPC ............ H01L 51/0012; H01L 51/4253; H01L 51/0068; H01L 51/0094; H01L 51/0074;
(Continued)

(56) References Cited

U.S. PATENT DOCUMENTS

2009/0108255 A1\* 4/2009 Bazan ................ H01L 51/4253
257/40
2012/0273732 A1\* 11/2012 Jenekhe ................ C08G 73/22
252/500
(Continued)

FOREIGN PATENT DOCUMENTS

WO    WO-2012174561 A2 \* 12/2012 .......... C08G 61/122

OTHER PUBLICATIONS

Liu, F., et al., "A Thieno[3,4-b]thiophene-Based Non-fullerene Electron Acceptor for High-Performance Bulk-Heterojunction Organic Solar Cells", J. Am. Chem. Soc., 2016, pp. 15523-15526, vol. 138.
(Continued)

*Primary Examiner* — Golam Mowla
(74) *Attorney, Agent, or Firm* — Gates & Cooper LLP

(57) ABSTRACT

Organic devices comprising an organic semiconducting acceptor motif coupled to a donor motif. Examples include IOTIC-2F, ITOTIC-2F, COTIC-4F, and SiOTIC-4F as acceptor materials. The acceptor materials have narrow bandgap (1.1 eV-1.3 eV), strong near-IR absorption and high solar cell EQE in near infrared (IR) region. The acceptor materials may also be used as the absorbing/light sensitive region in an IR photodetector.

31 Claims, 65 Drawing Sheets

(52) U.S. Cl.
CPC ...... *H01L 51/0053* (2013.01); *H01L 51/0067* (2013.01); *H01L 51/0068* (2013.01); *H01L 51/0071* (2013.01); *H01L 51/0072* (2013.01); *H01L 51/0074* (2013.01); *H01L 51/0096* (2013.01); *H01L 51/0037* (2013.01); *H01L 51/0051* (2013.01); *H01L 51/4253* (2013.01); *H01L 2251/308* (2013.01); *H01L 2251/552* (2013.01)

(58) Field of Classification Search
CPC ............ H01L 51/0071; H01L 51/0051; H01L 51/0053; H01L 51/0034; H01L 51/0067; H01L 51/0037; H01L 51/0072; H01L 51/0096
See application file for complete search history.

(56) References Cited

U.S. PATENT DOCUMENTS

| | | | | |
|---|---|---|---|---|
| 2012/0322966 | A1* | 12/2012 | Bazan | C08G 61/126 528/33 |
| 2013/0247989 | A1* | 9/2013 | Bazan | C07D 495/04 136/263 |
| 2013/0264552 | A1* | 10/2013 | Cui | C08G 69/00 257/40 |
| 2014/0020739 | A1* | 1/2014 | Yang | H01L 27/302 136/255 |

OTHER PUBLICATIONS

Lin, Y., et al., "An Electron Acceptor Challenging Fullerenes for Efficient Polymer Solar Cells", Advanced Materials, 2015, pp. 1170-1174, vol. 27.

Li, Y., et al., "A near-infrared non-fullerene electron acceptor for high performance polymer solar cells", Energy & Environmental Science, 2017, pp. 1610-1620, vol. 10.

Baran, D., et al., "Reduced voltage losses yield 10% efficient fullerene free organic solar cells with 41 V open circuit voltages", Energy & Environmental Science, 2016, pp. 3783-3793, vol. 9.

Zhao, W., et al., "Molecular Optimization Enables over 13% Efficiency in Organic Solar Cells", J. Am. Chem. Soc., 2017, pp. 7148-7151, vol. 139.

Yang, Y., et al., "Side-Chain Isomerization on an n-type Organic Semiconductor ITIC Acceptor Makes 11.77% High Efficiency Polymer Solar Cells", J. Am. Chem. Soc., 2016, pp. 15011-15018, vol. 138.

Kan, B., et al., "Small-Molecule Acceptor Based on the Heptacyclic Benzodi(cyclopentadithiophene) Unit for Highly Efficient Nonfullerene Organic Solar Cells", J. Am. Chem. Soc., 2017, pp. 4929-4934, vol. 139.

Chen, S., et al., "A Wide-Bandgap Donor Polymer for Highly Efficient Non-fullerene Organic Solar Cells with a Small Voltage Loss", J. Am. Chem. Soc., 2017, pp. 6298-6301, vol. 139.

Lee et al., "Design of Nonfullerene Acceptors with Near-Infrared Light Absorption Capabilities". Adv. Energy Mater. 2018, 8, 1801209 (9 pages).

Lee et al., "Bandgap Narrowing in Non-Fullerene Acceptors: Single Atom Substitution Leads to High Optoelectronic Response Beyond 1000 nm". Adv. Energy Mater. 2018, 1801212 (6 pages).

Yao et al., "Design and Synthesis of a Low Bandgap Small Molecule Acceptor for Efficient Polymer Solar Cells". Adv. Mater. 2016, 28, pp. 8283-8287.

Lee et al., "Side-Chain Engineering of Nonfullerene Acceptors for Near-Infrared Organic Photodetectors and Photovoltaics". ACS Energy Lett. 2019, 4, pp. 1401-1409.

Yao et al., "Design, Synthesis, and Photovoltaic Characterization of a Small Molecular Acceptor with an Ultra-Narrow Band Gap". Angew. Chem. Int. Ed. 2017, 56, pp. 3045-3049.

\* cited by examiner

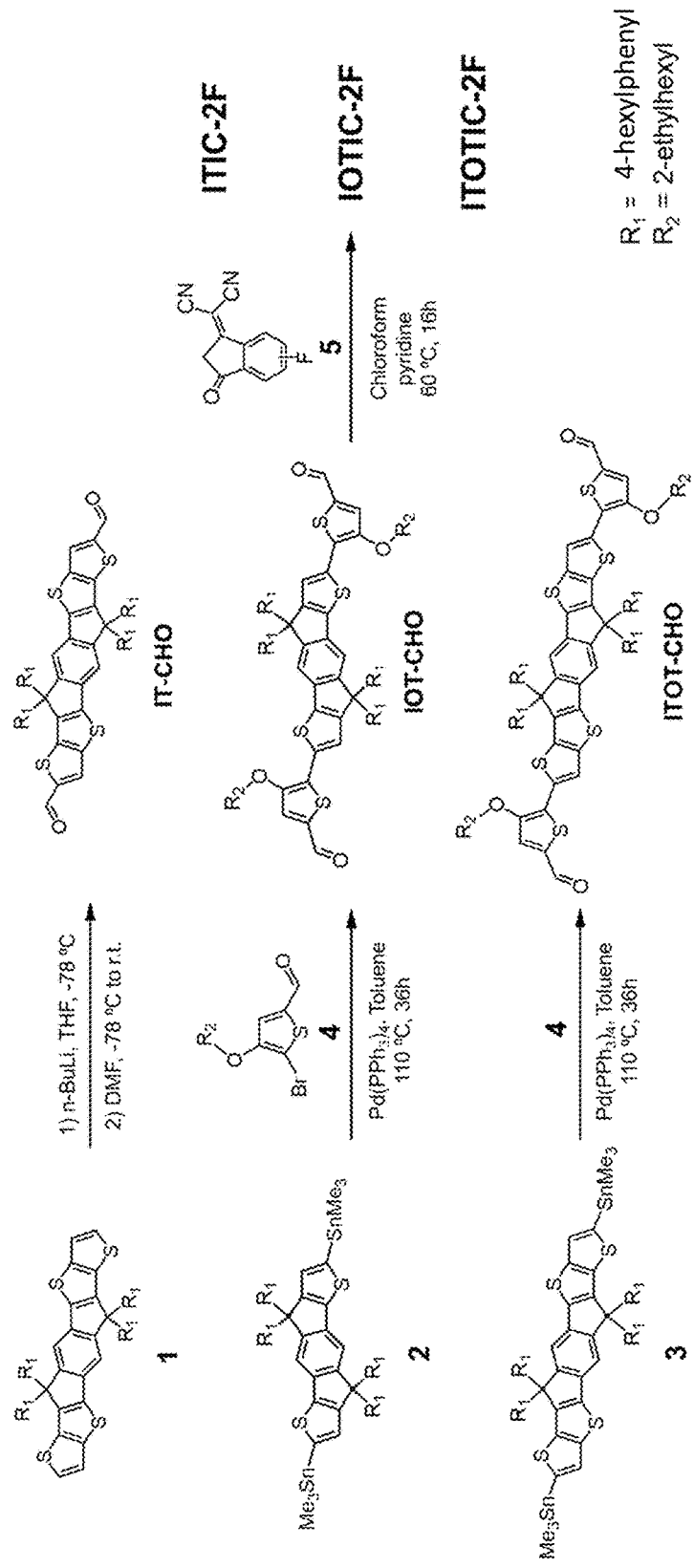
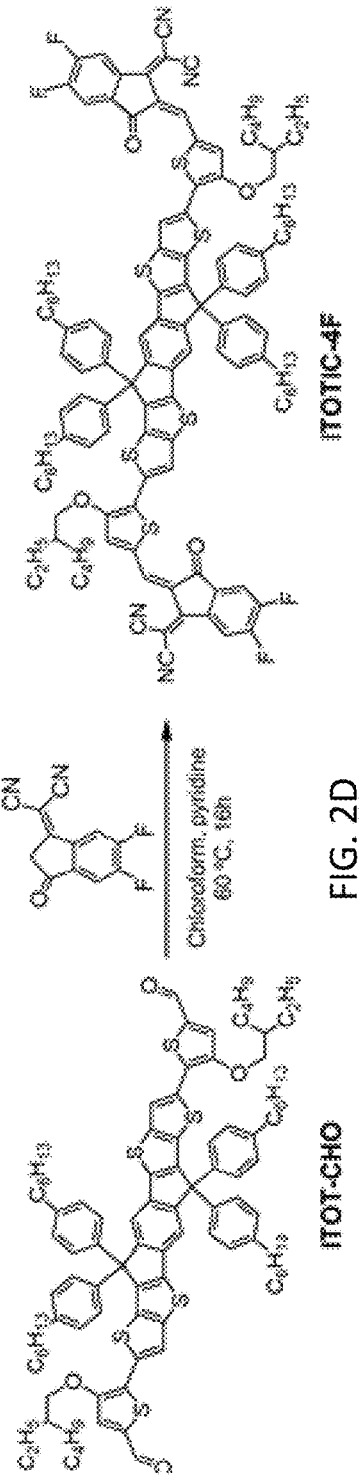
FIG. 2C
FIG. 2D

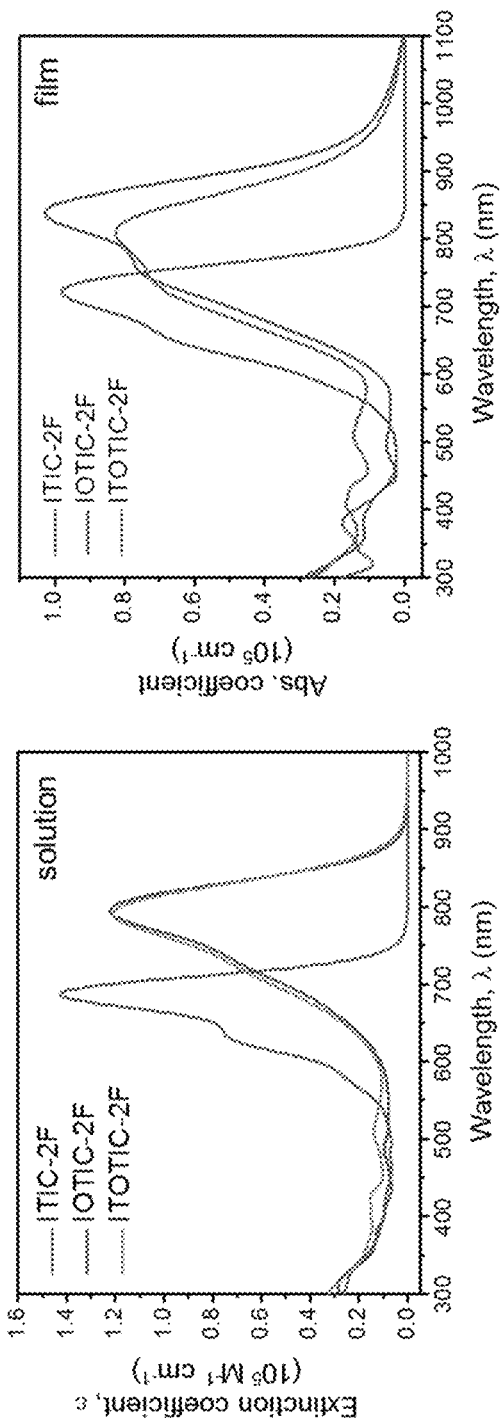
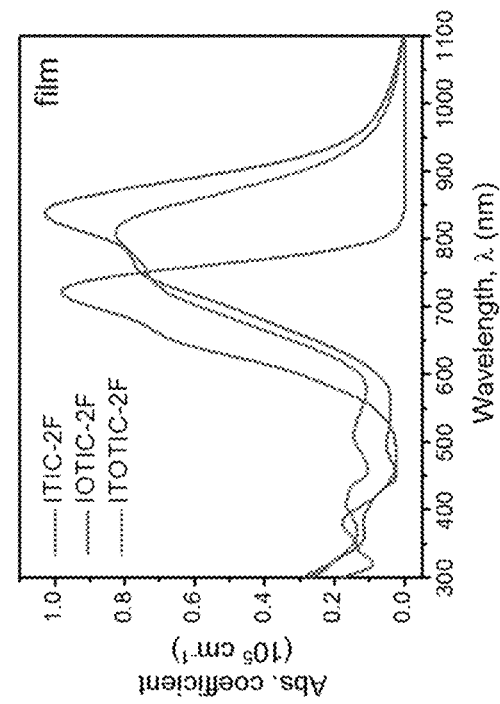
FIG. 4A
FIG. 4B

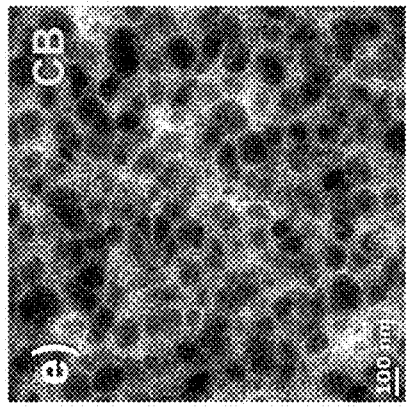
FIG. 10E
FIG. 10C
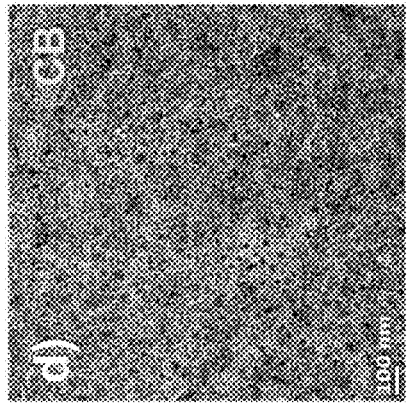
FIG. 10D
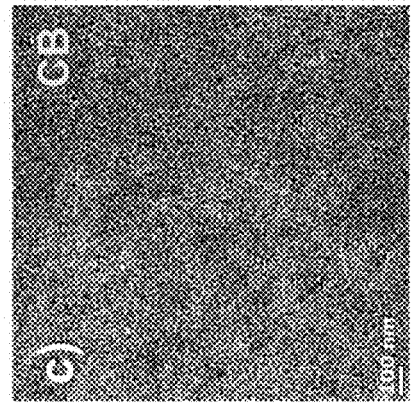
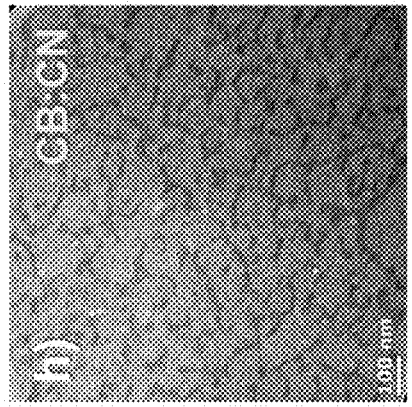
FIG. 10H
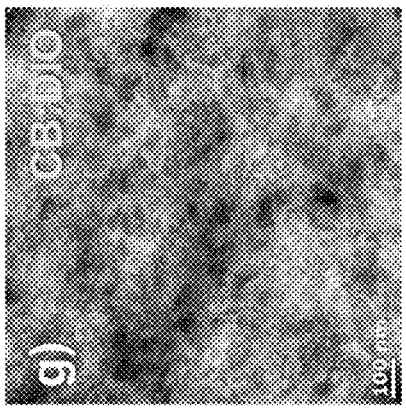
FIG. 10G
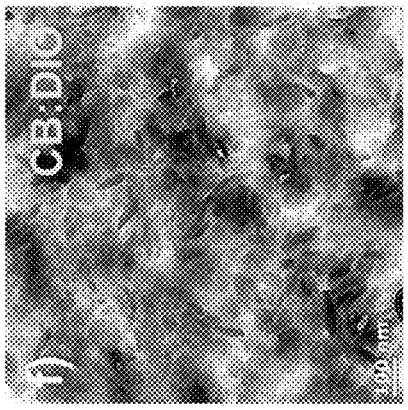
FIG. 10F

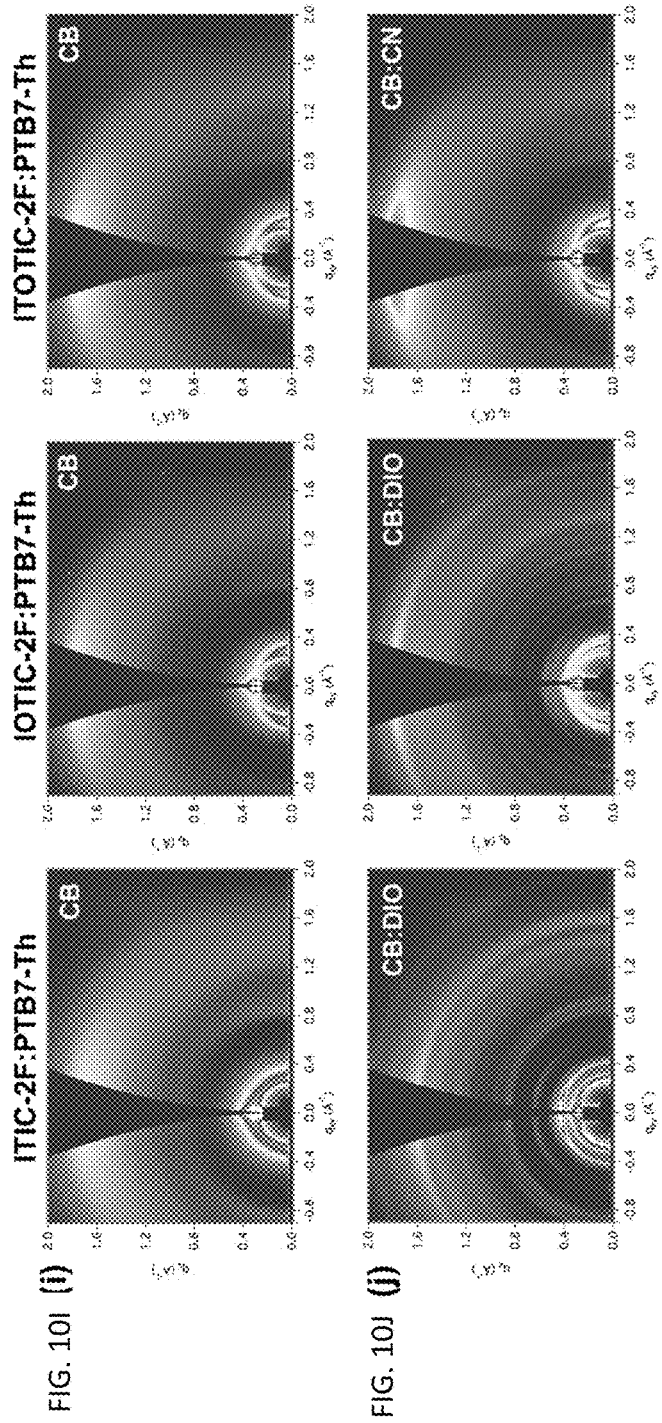
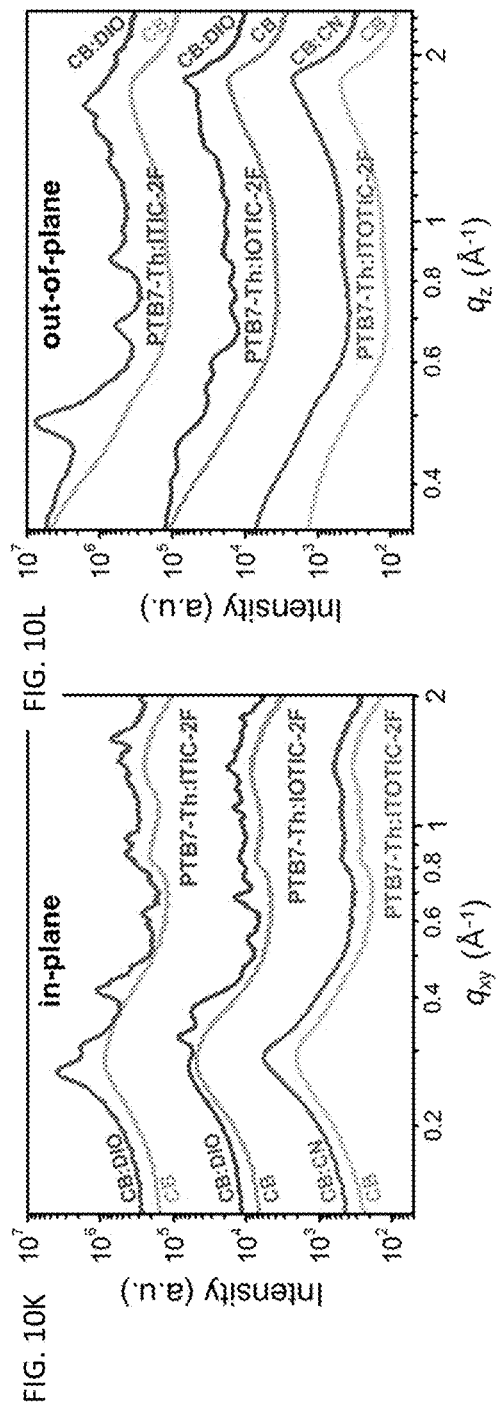
FIG. 10I   FIG. 10J   FIG. 10K   FIG. 10L

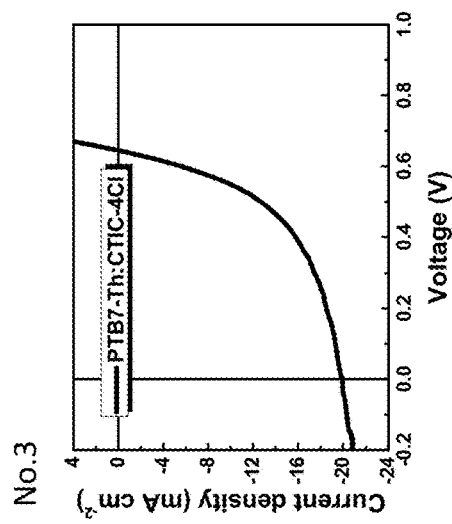
FIG. 15G
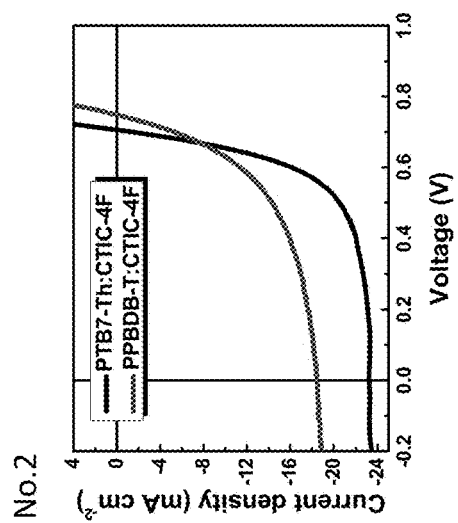
FIG. 15H
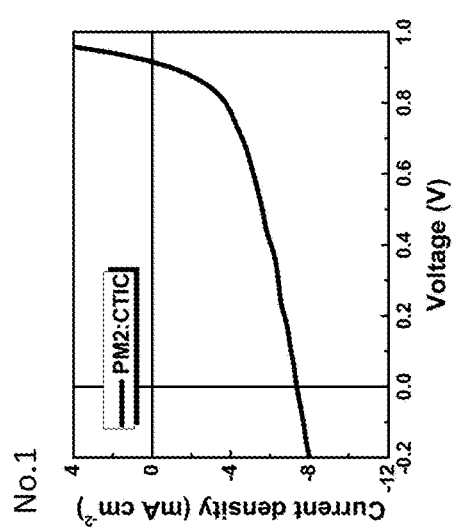
FIG. 15I
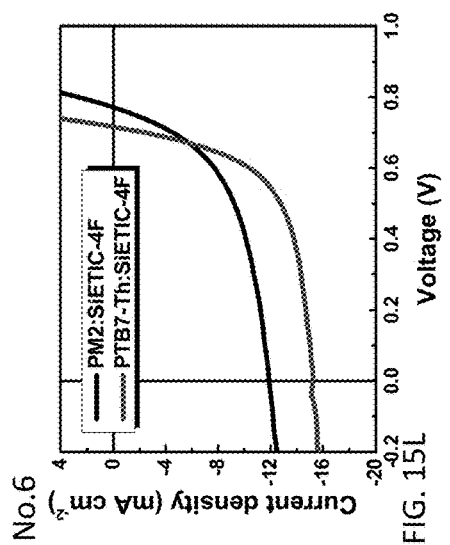
FIG. 15J
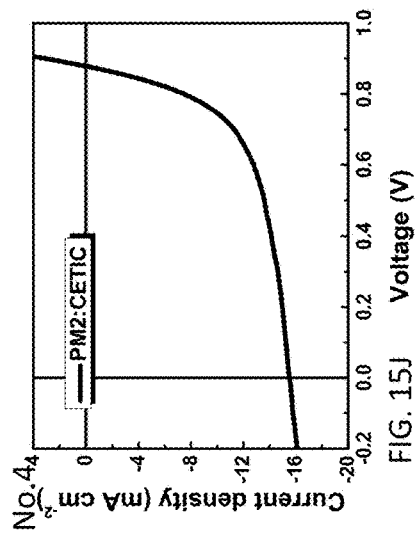
FIG. 15K
FIG. 15L

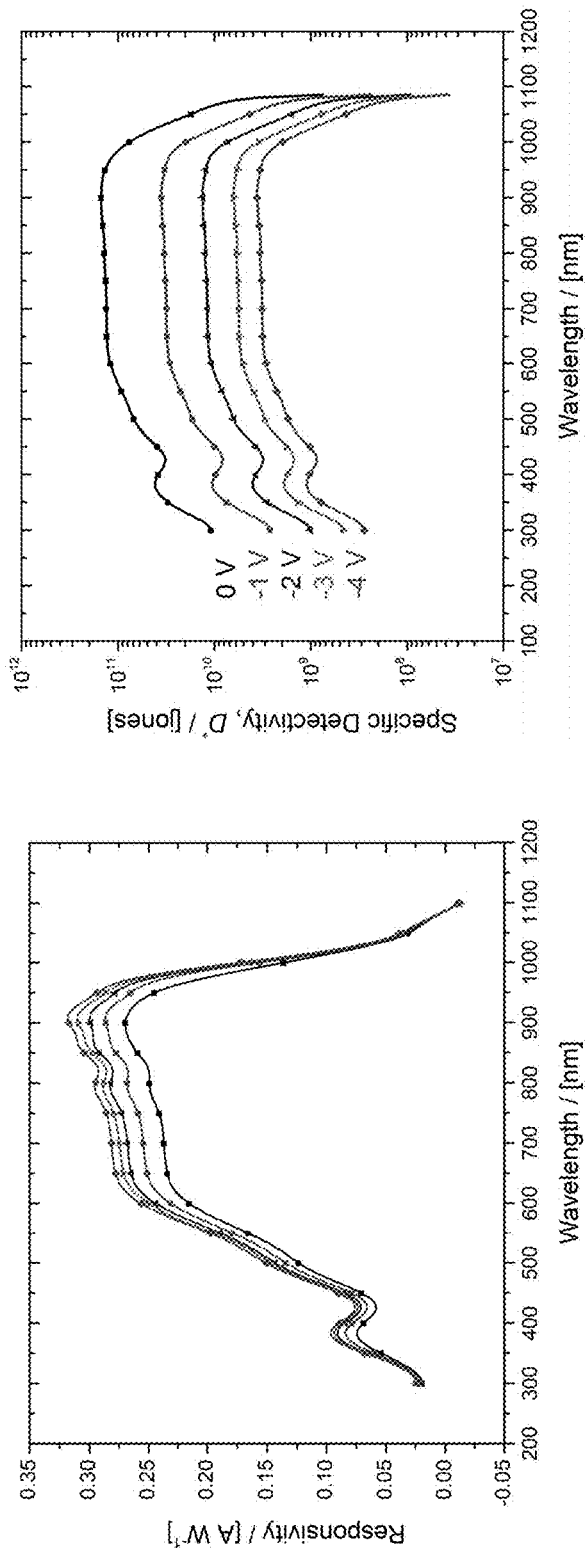
FIG. 16L
FIG. 16M
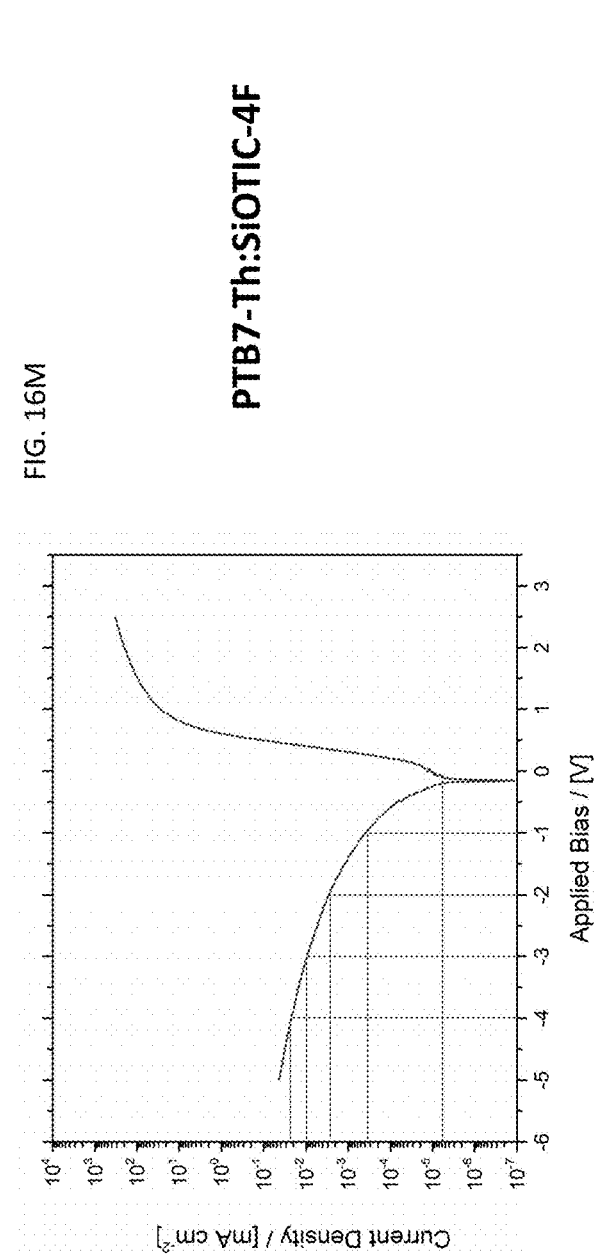
PTB7-Th:SiOTIC-4F
FIG. 16N

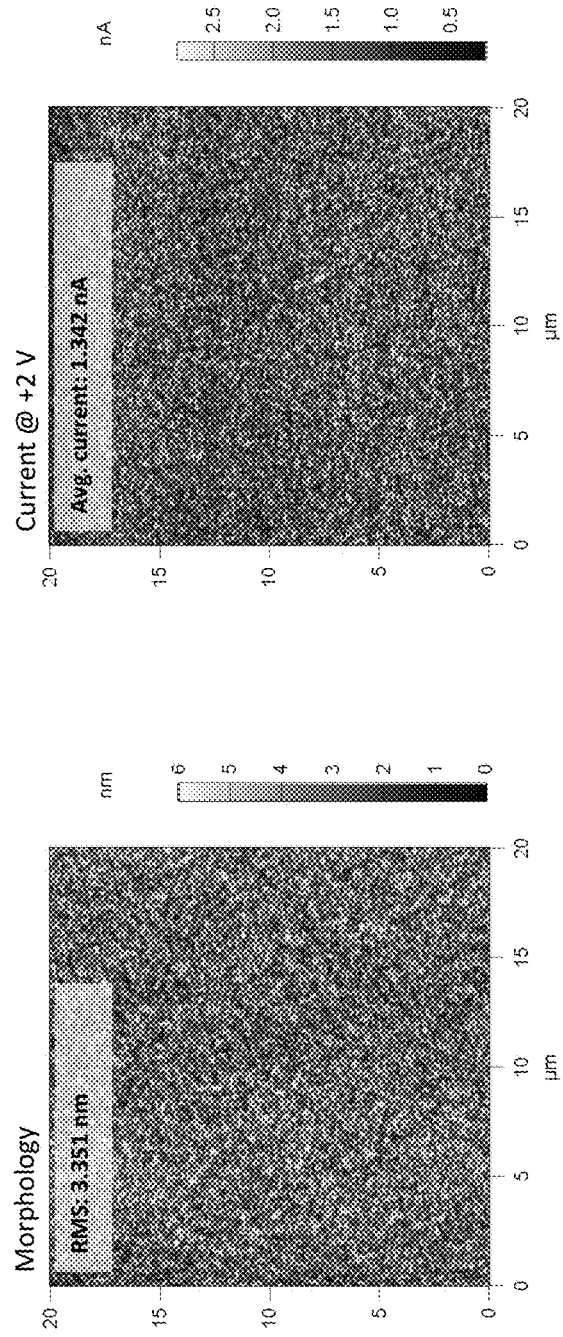
FIG. 18A
FIG. 18B
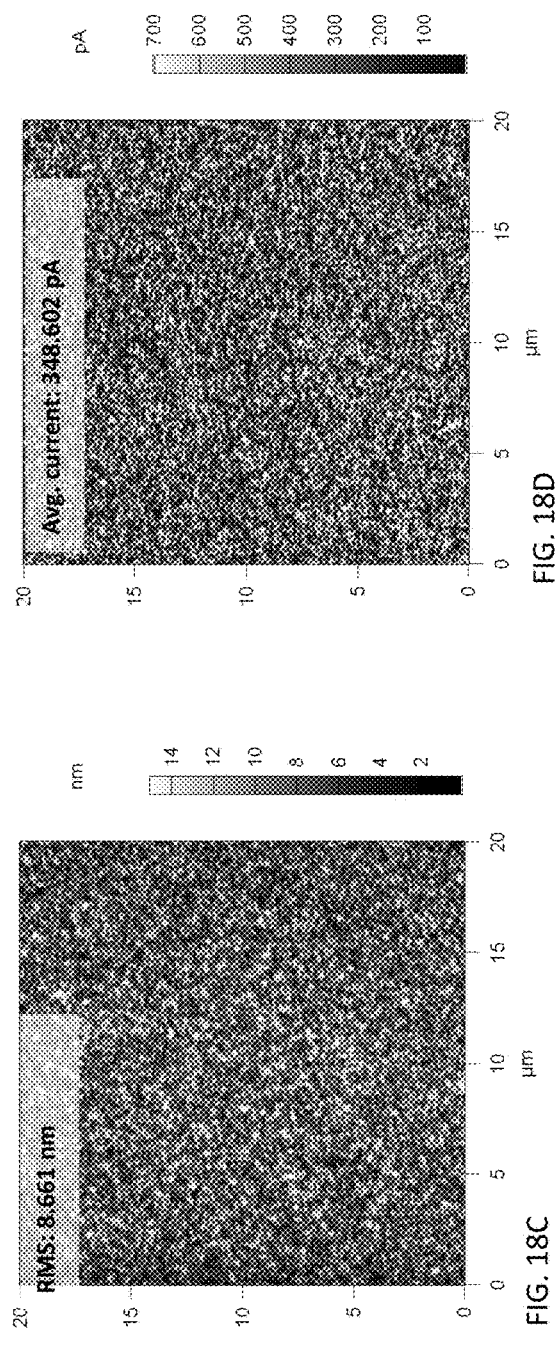
FIG. 18C
FIG. 18D

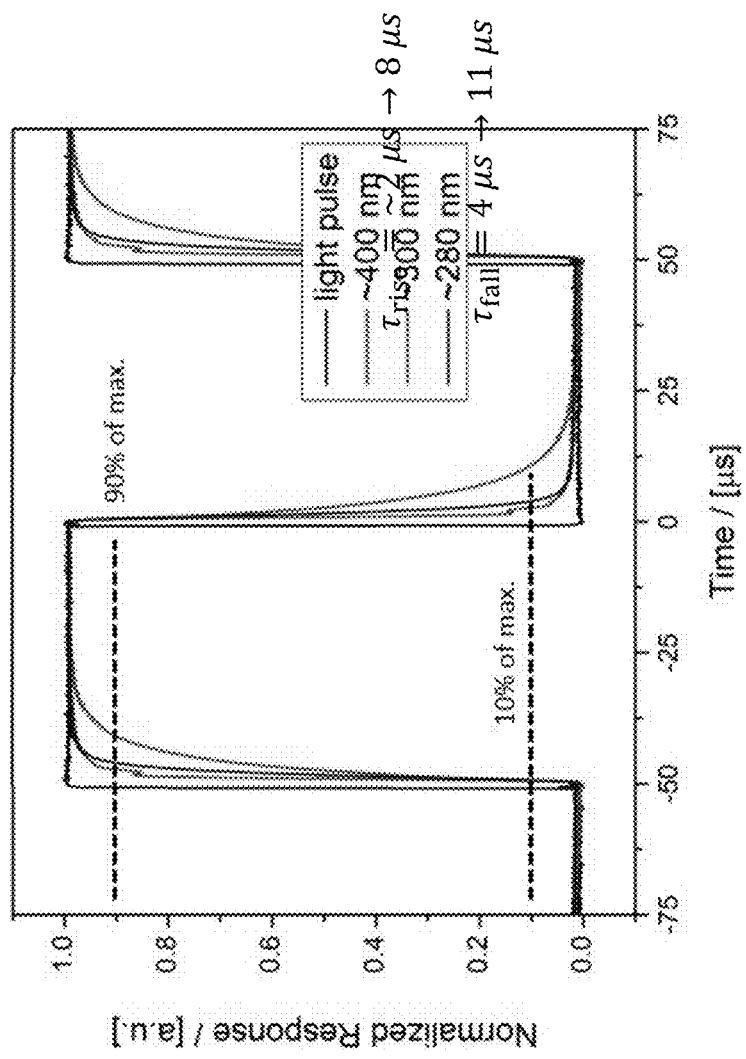
FIG. 19A  Transient photocurrent behavior for different thicknesses of PTB7-Th:SiOTIC-4F active layers.

$R_1$ or $R_2$ = H or any sort of solubilizing chain
Ar = any sort of aryl unit $X_1$ or $X_2$ = O, S, malonitrile
Y = halogen, -CN or any solubilizing chain (any number of substituents)
Ar = any sort of aryl unit EWG = any electron withdrawing group, can be but not limited to F, Cl, Br, I, CN, $NO_2$, sulfonate, ketone, ester; n = 1, 2, 3 or 4

DPP based polymers

DTP based polymer

NARROW BANDGAP NON-FULLERENE ACCEPTORS AND DEVICES INCLUDING NARROW BANDGAP NON-FULLERENE ACCEPTORS

CROSS REFERENCE TO RELATED APPLICATIONS

This application claims the benefit under 35 U.S.C. Section 119(e) of and commonly-assigned U.S. Provisional Patent Application No. 62/580,710, filed Nov. 2, 2017, by Martin Seifrid, Guillermo C. Bazan, Jaewon Lee, Thuc-Quyen Nguyen, and Seo-Jin Ko, entitled "NARROW BANDGAP NON-FULLERENE ACCEPTORS AND DEVICES INCLUDING NARROW BANDGAP NON-FULLERENE ACCEPTORS,";

STATEMENT REGARDING FEDERALLY SPONSORED RESEARCH AND DEVELOPMENT

This invention was made with Government support under Grant No. N00014-14-1-0580 awarded by the U.S. Office of Naval Research. The Government has certain rights in this invention.

which application is incorporated by reference herein.

BACKGROUND OF THE INVENTION

1. Field of the Invention

The present invention relates to organic semiconducting electron donors and acceptors that can be used in organic photovoltaic (OPV) devices. These materials with tailored molecular orbital energy levels and optical absorption profiles are relevant for NIR optical detection and for the fabrication of transparent solar cells.

2. Description of the Related Art (Note: This application references a number of different publications as indicated throughout the specification by one or more reference numbers in superscripts, e.g., [x]. A list of these different publications ordered according to these reference numbers can be found below in the section entitled "References." Each of these publications is incorporated by reference herein.)

Organic photovoltaics (OPVs) or Organic Solar Cells (OSCs), as a promising technology for clean and renewable energy conversion, have attracted considerable attention in recent years.[1] In terms of absolute device performance, OPV technologies are lagging behind approaches based on Si, Perovskites, etc.,[2] but inherent advantages in light weight, flexibility, low cost, colour, and transparency allow OPVs to better serve functional and aesthetic demands. Building integration of semi-transparent photovoltaics has been identified as a key application for large area, printable OPVs because organic photovoltaic materials provide finite bandwidth absorption and adjustable transmission, through manipulation of molecular structure, so that OPV devices can be paired with complementary systems, such as plants. In such applications, the absorption window of the OPV device could be tuned to the 700 nm and longer range in order to let through wavelengths of light that are necessary for plant photosynthesis. This would allow for the production of electricity while also maximizing plant growth.[3]

During the past several years, non-fullerene acceptor (NFA) based OPVs have been presenting very promising prospects because they have opened a new avenue for molecular design of organic semiconductor with finely tunable optoelectronic properties, as well as overcoming intrinsic insufficiencies of fullerene derivatives.[4] To date the most successful NFAs design strategy is "acceptor-donor-acceptor" (A-D-A) molecular architectures, first developed by Zhan et al.[5] Restraining rotational disorder within this A-D-A structural motif enables rigid/planar NFAs to achieve extensive π-electron delocalization that enhances their charge carrier transport and lowers optical bandgap ($Eg^{opt}$). At present, state-of-the-art OSCs using NFAs have PCEs of 13%[6], surpassing fullerene based OSCs.

None-the-less, A-D-A structured NFAs have several limitations that hamper their application in photovoltaic devices. Despite of rapid progress in NFA-OSCs, however, most of the high-performing NFAs reported so far still show intense absorbance in the UV-Vis range, with spectral limitation at approx. 850 nm. Beyond maintaining high visible transparency, the development of narrow bandgap non-fullerene acceptors (NBG-NFA) with the $Eg^{opt}$ below ~1.35 eV is additionally desirable, as sunlight possesses about 50% of its radiation intensity in the NIR region. One or more embodiments of the present invention satisfy these needs.

In addition, narrow optical gap conjugated polymers, oligomers and small molecules are relevant for applications including organic thin film transistors and organic photodetectors. At the same time, sensing optical signatures from the ultraviolet-visible to the near-infrared (NIR) spectral regions is growing in importance for technologies including imaging, optical communication, remote control, night-time surveillance, environmental monitoring, and chemical/biological detections. Photodetectors for these applications are predominantly based on inorganic semiconductors. However, photodetectors based on GaN, Si, and InGaAs are inflexible and can only cover limited sub-bands: 250 nm to 400 nm (UV), 450 nm to 800 nm (visible) and 900 nm to 1700 nm (NIR), respectively. It is challenging to tune the optical spectra of inorganic materials or integrate multiple photodetectors for broadband applications. Using organic counterparts in photodetectors provides opportunities to access a broad and tunable absorption spectrum, efficient photogeneration of charge carriers, and fast switching response. Conjugated polymers, oligomers and small molecules with high charge carrier mobility are suitable for applications as organic photodetectors with higher sensitivity or the ability to detect low light signals. For example, the highest specific detectivity of polymer:PCBM photodetector reported is ~ $10^{13}$ Jones which is much higher than the specific detectivity of commercial PbS photoconductors from Thorlabs ~ $10^{11}$ Jones. Additionally, organic semiconductors can be solution-processed into light-weight, flexible, and large-area devices that open in biomedical applications such as oxygen monitoring and biosensor platforms.

SUMMARY OF THE INVENTION

Modification of chemical structure creates a solution-processable organic semiconductor for use as electron-accepting materials in organic photovoltaic (OPV) devices, organic photodetector and other organic electronic devices. The devices and compositions of matter described herein can be embodied in many ways including, but not limited to, the following.

1. An organic device, comprising an active region comprising an organic semiconducting acceptor moiety coupled to a donor moiety so as to form an organic semiconducting molecule having an A-D'-D-D'-A structure, wherein the active region outputs electrical current in response to absorbing electromagnetic radiation, wherein D' is a donor moiety comprising an alkoxythienyl, D is a donor moiety comprising a dithiophene, and A is an acceptor moiety comprising (3-oxo-2,3-dihydro-1H-inden-1-ylidene)malononitrile (IC).

2. The device of embodiment 1, wherein the dithiophene has side chains soluble in a solvent used to solution process the device. 3. The device of one or any combination of the previous embodiments, wherein the organic semiconducting molecule has a HOMO in a range of −5.0 eV to −5.5 eV, a LUMO in a range of −3.8 eV to −4.3 eV, and a bandgap in a range of 1.0 eV to 1.4 eV.

4. The device of embodiment 1 or 2, wherein the organic semiconducting molecule has a bandgap narrower than 1.3 eV.

5. The device of embodiment 1 or 2, wherein the organic semiconducting molecule has a bandgap narrower than 1.2 eV.

6. The device of embodiment 1 or 2, wherein the organic semiconducting molecule has a bandgap narrower than 1.1 eV.

7. The device of embodiment of one or any combination of the previous embodiments, where the organic semiconducting molecule is an electron acceptor.

8. The device of embodiment of one or any combination of the previous embodiments, further comprising an organic semiconducting donor molecule.

9. The device of embodiment 8, wherein the donor molecule is at least one compound selected from PTB7-Th or from the list of compounds illustrated in FIGS. 23*a*-23*d*.

10. The device of one or any combination of the previous embodiments, wherein the device is an organic solar cell.

11. The device of one or any combination of the previous embodiments, wherein the active region is the sensing element in an (e.g., infrared) photodetector.

12. The device of one or any combination of the previous embodiments, wherein the device has an external quantum efficiency (EQE) above 45% in the wavelength range of 600-1000 nm.

13. The device of one or any combination of the previous embodiments, wherein the device has an external quantum efficiency (EQE) above 55% in the wavelength range of 600-1000 nm.

14. The device of one or any combination of the previous embodiments, wherein the organic semiconducting molecule comprises IOTIC-2F, ITOTIC-2F, IOTIC-2Cl, IOTIC-2Br, o-IO2-4F, p-IO2-4F, IOTN-BO, ITOTIC-4F, GeOTIC-4F, COTIC-4Cl, SiOTIC-4Cl, CTIC-4F, CTIC-4Cl, CETIC-4F, CETIC, SiTIC-4F, or SiETIC-4F.

15. The device of one or any combination of the previous embodiments, wherein A is an acceptor moiety comprising (3-oxo-2,3-dihydro-1H-inden-1-ylidene)malononitrile (IC).

16. A composition of matter, comprising: a molecule of the structure:

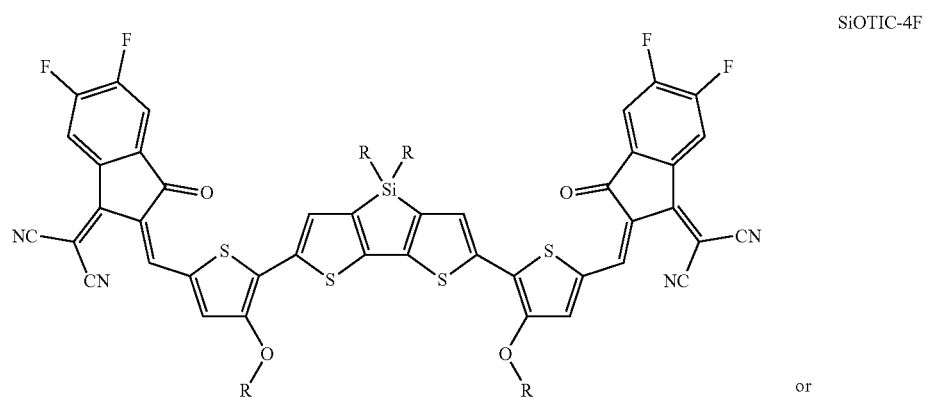

SiOTIC-4F or

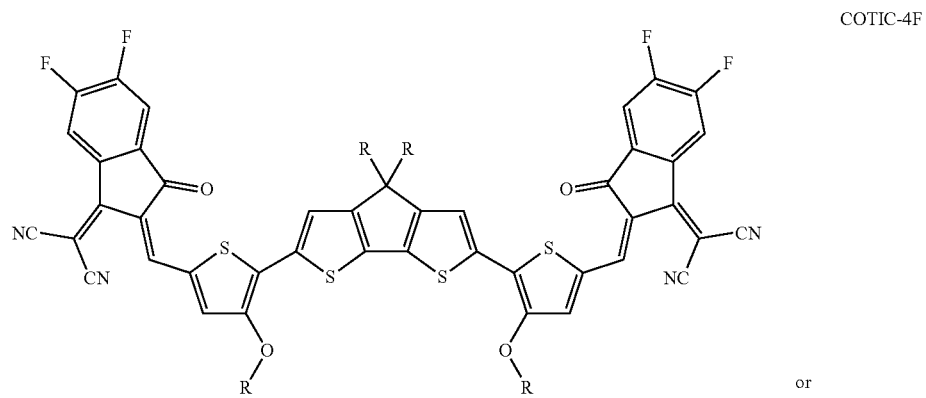

COTIC-4F or

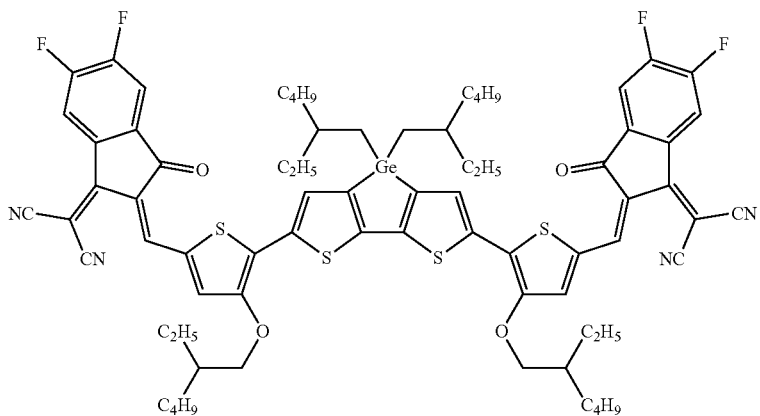
GeOTIC-4F
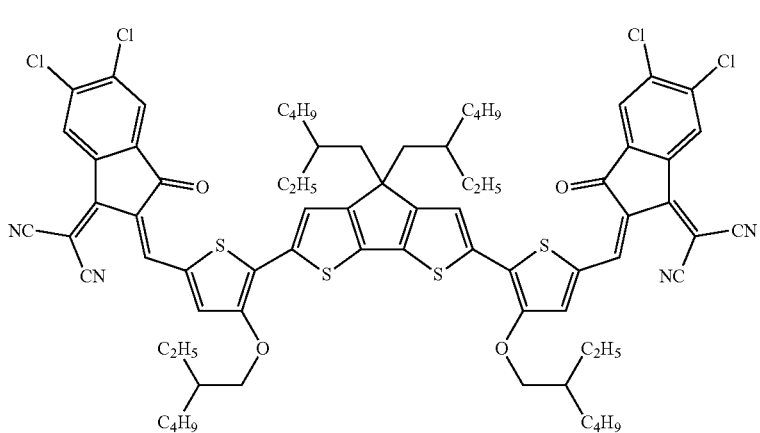
COTIC-4Cl
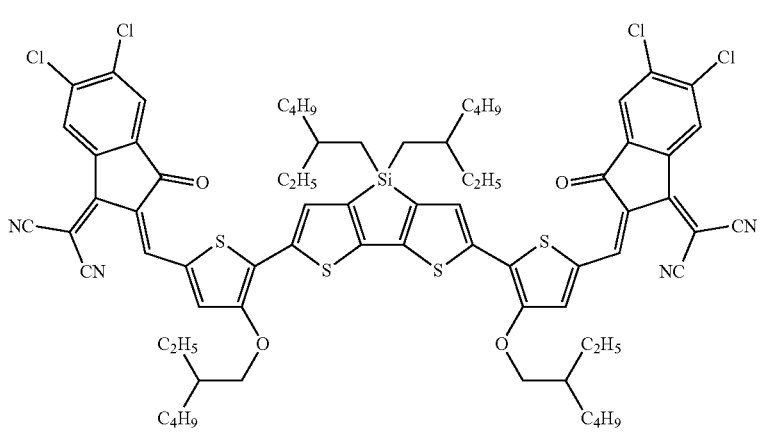
SiOTIC-4Cl wherein $C_2H_5$ and $C_4H_9$ can also be R that is a solubilizing chain comprising a substituted or non-substituted alkyl, aryl (aromatic) or alkoxy chain.

17. A composition of matter, comprising
an organic semiconducting molecule having a structure:

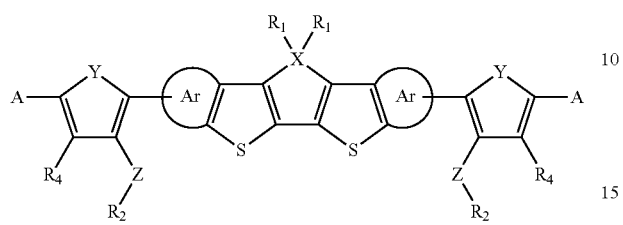

wherein:

each Ar is independently a substituted or non-substituted aromatic functional group, or each Ar is independently nothing and the valence of its respective thiophene ring is completed with hydrogen;

X is C, Si, Ge, N or P; Y is O, S, Se or N—$R_3$;

Z is O, S, Se, or N—$R_3$;

each $R_1$, $R_2$, and $R_3$ is independently hydrogen or a substituted or non-substituted alkyl, aryl or alkoxy chain;

$R_4$ is either a hydrogen or the same as Z—$R_2$; and

A is an acceptor moiety.

18. The composition of matter of embodiment 17, wherein the organic semiconducting molecule has the structure:

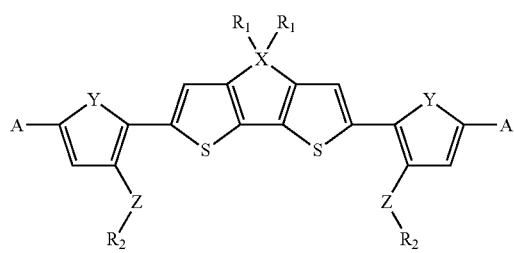

wherein X is C, Si, Ge, N or P; Y is O, S or Se; Z is O or S.

each $R_1$ and $R_2$ is independently hydrogen or a substituted or non-substituted alkyl, aryl or alkoxy chain. A is an acceptor moiety.

19. The composition of matter of embodiment 17, wherein:

the R, $R_1$, $R_2$ and/or $R_3$ each comprise a substituted or non-substituted alkyl, aryl or alkoxy chain including, but not limited to, a $C_6$-$C_{50}$ substituted or non-substituted alkyl or alkoxy chain, —$(CH_2CH_2O)n$ (n=2 ~ 30), $C_6H_5$, —$C_nF_{(2n+1)}$ (n=2 ~ 50), —$(CH_2)_nN(CH_3)_3Br$ (n=2 ~ 50), 2-ethylhexyl, $PhC_mH_{2m+1}$(m=1-50), —$(CH_2)_nN(C_2H_5)_2$ (n=2 ~50), —$(CH_2)_nSi(C_mH_{2m+1})_3$ (m, n=1 to 50), or —$(CH_2)_nSi(OSi(C_mH_{2m+1})_3)_x(C_pH_{2p+1})_y$ (m, n, p=1 to 50, x+y=3).

20. The composition of matter of embodiment 17 or 18, wherein A is a compound of the structure:

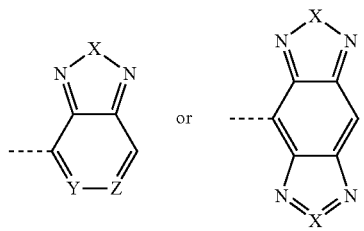

Y or Z=CH, CF, N, C—CN or C—OR

X=O, S, Se or N—R where R is H or solubilizing chain

21. The composition of matter of embodiments 17 or 18 wherein A is a compound of the structure:

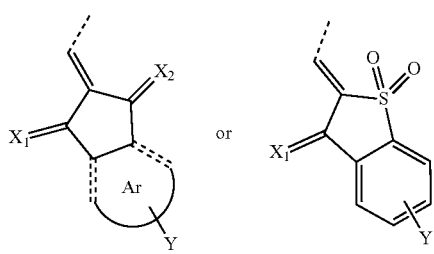

$X_1$ or $X_2$=O, S, malonitrile

Y=halogen, —CN or any solubilizing chain

Ar=any sort of aryl unit

22. The composition of matter of embodiments 17 or 18, wherein A is a compound of the structure:

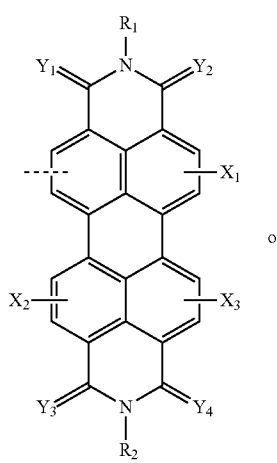

-continued

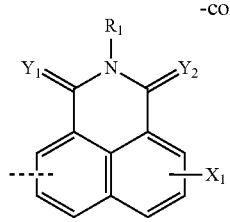

$X_1$, $X_2$ or $X_3$ = halogen, CN or alkoxy, alkylthio or N- or S-annulated $Y_1$, $Y_2$, $Y_3$ or $Y_4$ = S or O
$R_1$ or $R_2$ = H or solubilizing chain 23. The composition of matter of embodiments 17 or 18, wherein A is a compound of the structure:

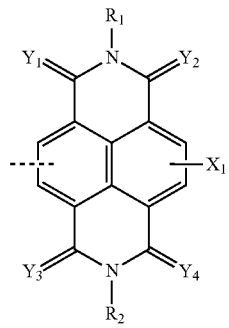

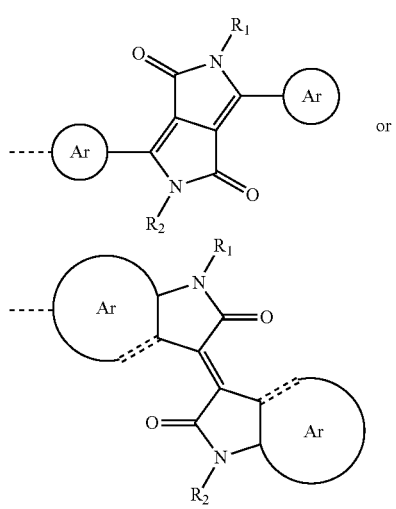

$R_1$ or $R_2$ = H or any sort of solubilizing chain
Ar = any sort of aryl unit

24. The composition of matter of embodiments 17 or 18, wherein A is a compound of the structure:

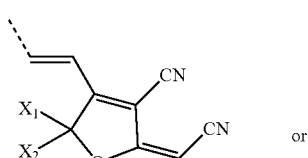

$X_1$ or $X_2$ = methyl or trifluoromethyl

-continued

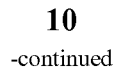

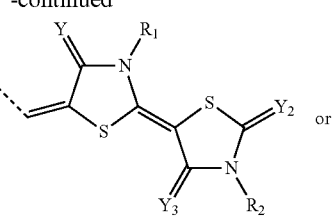

$Y_1$, $Y_2$ or $Y_3$ = O, S or malonitrile
R = any solubilizing chain or H

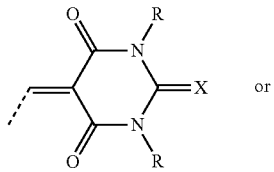

X = O, S, Se
R = H or any solubilizing chain

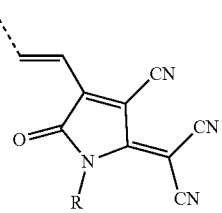

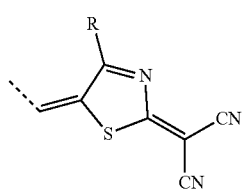 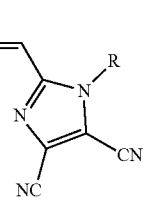

R = H or any solubilizing chain

25. The composition of matter of embodiments 17 or 18, wherein A is a compound of the structure:

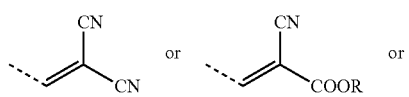

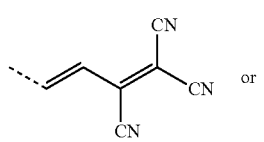

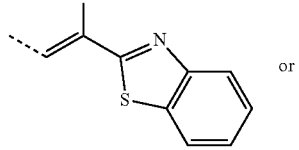

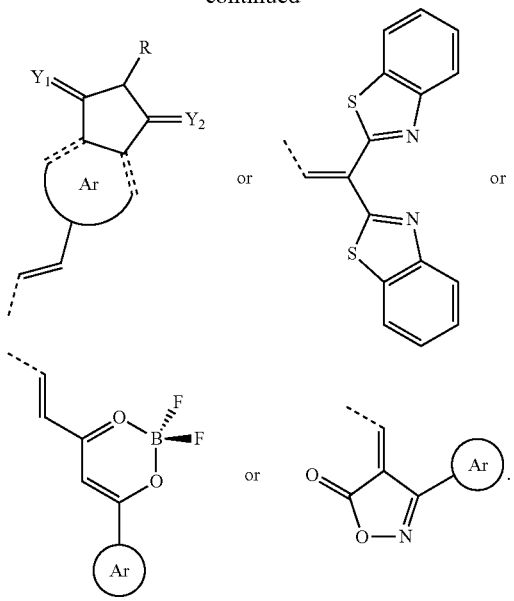

R = H or any solubilizing chains
Y₁ or Y₂ = S, O or malonitrile
Ar = any aryl unit 26. The composition of matter of embodiments 17 or 18, wherein the organic semiconducting molecule has the structure:

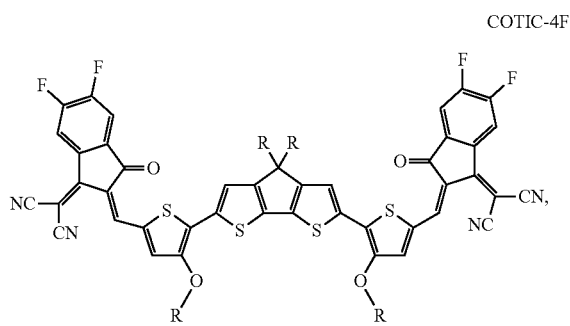

COTIC-4F and R is a solubilizing chain comprising a substituted or non-substituted alkyl, aryl or alkoxy chain.

27. The composition of matter of embodiment 17, wherein the organic semiconducting molecule has the structure:

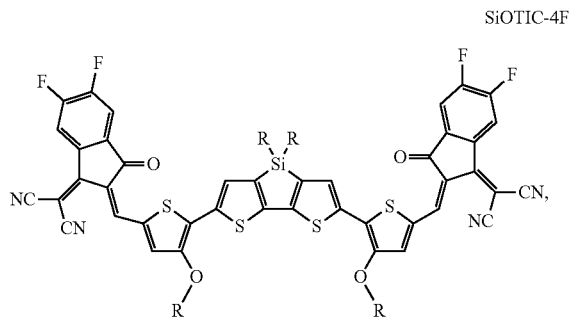

SiOTIC-4F and wherein R is a solubilizing chain comprising a substituted or non-substituted alkyl, aryl or alkoxy chain.

In one or more examples, the organic semiconductor has the lowest optical gap reported to date (as low as 1.06 eV). In one or more examples, single junction OPVs comprising the electron-accepting materials paired with a PTB7-Th donor have low open circuit voltage ($V_{oc}$) loss ≈ 0.49 eV, the highest power conversion efficiencies (PCE), e.g., >12% reported to date, and a high external quantum efficiency (EQE), e.g., >70%, in the broad range of 580-850 nm (largest EQE in the NIR region reported to date). The organic semiconductors were also incorporated as sensitive layers in photodetectors, wherein the photodetectors had a detectivity as high as $2.6 \times 10^{12}$ Jones at 950 nm wavelength.

BRIEF DESCRIPTION OF THE DRAWINGS

Referring now to the drawings in which like reference numbers represent corresponding parts throughout:

FIGS. 2A-2D. Synthetic procedures for exemplary Narrow Bandgap Non-Fullerene Acceptors according to the first embodiment.

FIGS. 4A-4B. Absorption spectra of ITIC-2F, IOTIC-2F, and ITOTIC-2F in chlorobenzene solution (FIG. 4A) and as a thin solid film (FIG. 4B).

FIGS. 15G-15O. J-V characteristics of OPV devices comprising further examples of DTX-based NFAs.

FIGS. 16B-16D. Performance of photodetector having an active sensing layer comprising COTIC-4F, wherein FIG. 16B shows current density vs. applied bias, FIG. 16C shows EQE vs. wavelength, and FIG. 16D shows responsivity vs. wavelength.

FIGS. 16I-16N. Photodetector performance as a function of applied bias.

FIGS. 18A-18D. Atomic Force Microscope height and conductivity images of exemplary ZnO layers used in a photodetector. FIGS. 18A and 18B shows single layer ZnO morphology and conductivity, respectively, and FIGS. 18C and 18D show double layer ZnO morphology and conductivity, respectively.

FIG. 19A. Measured transient response of a photodetector according to one or more examples.

(FIG. 20G) 2D GIWAXS images for optimized blend films. (FIG. 20H) In-plane and (FIG. 20I) out-of-plane line-cut profiles for neat and blend films.

DETAILED DESCRIPTION OF THE INVENTION

Figure 1:
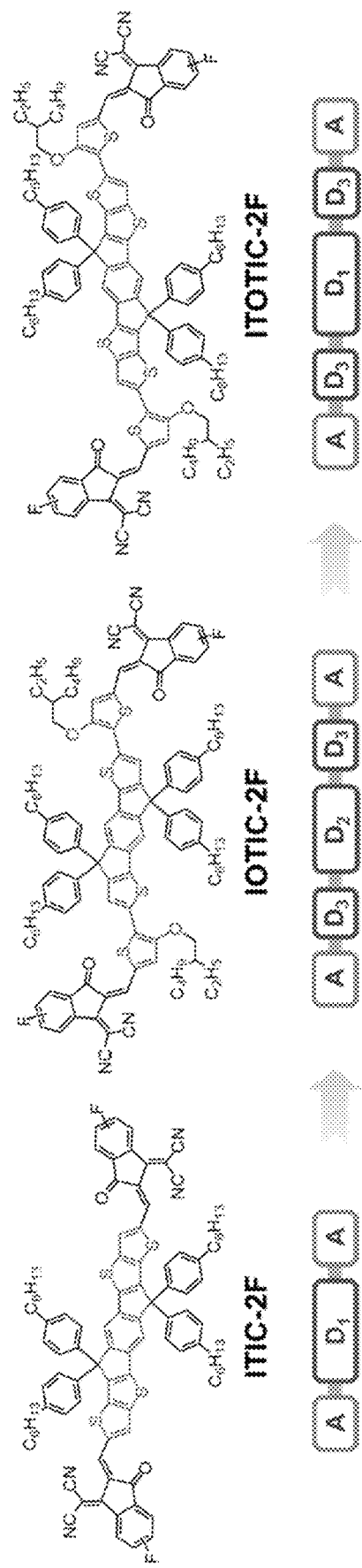
FIG. 1 Chemical structures of ITIC-2F, IOTIC-2F, and ITOTIC-2F.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Due to the low energy of the optical transitions required for NIR sensing, it is necessary to employ a donor-acceptor (D-A) motif in the design of the organic semiconductors, with molecules based on alternating electron-rich and electron-poor units that comprise the D-A motif. The donor-acceptor motifs can be electron-rich (electron donating) and electron-poor (electron accepting) dye compounds. This type of design makes it possible to lower the energy of the optical absorption gap (narrow optical bandgap) into the NIR region. Multiple types of D-A structures can be employed for narrow bandgap small molecule or oligomer organic semiconductor design, including but not limited to: D-A-D, A-D-A, D-A-D-A-D, A-D-A-D-A, A-A'-D-A'-A, D-D'-A-D'D, A-D'-D-D'-A and D-A'-A-A'-D. Depending on the relative strength of the D-A motifs, the final compound can function as an electron donor or an electron acceptor or both. The lowest energy optical transition can be modulated by changes in the strength of the donor and acceptor units. Note also the possibility to process these materials by evaporation, instead of only by solution deposition, due to their limited molecular masses.

An effective strategy to narrower bandgap is to use a stronger donor and/or acceptor motif. For example, as demonstrated in FIG. 1, an electron-rich group such as an alkoxy-thiophene was added to the IDT donor core, resulting in structures such as IOTIC-2F and ITOTIC-2F, which displayed narrower gap than ITIC-2F. To further narrow $E_g$, the IDT core can be replaced with a more electron-rich unit such as a cyclopentadithiophene or a dithienosilole (SDT), resulting in NFAs with very narrow bandgaps such as COTIC-4F and SiOTIC-4F in FIG. 11.

The narrow gap organic semiconductors developed here can be used for near-IR photodetector applications. High sensitivity, detectivity, and rectification ratio between forward and reverse bias, low dark current at negative bias (reverse bias), and fast photoresponse time can be expected from such near-IR organic photodetectors. Various NIR bulkheterojunction (BHJ) organic photodetector systems can be tested using a diode structure: ITO/PEDOT:PSS or CPE-K/BHJ active layer/Al; and ITO/ZnO/BHJ active layer/MoO$_3$/Ag. CPE-K is a self-doped pH neutral conjugated polyelectrolyte which can replace PEDOT:PSS (pH ~ 2) in optoelectronic devices. The response time of a photodetector is determined by the charge carrier mobility whereas the dark current ($J_d$) influences its detectivity.

Technical Description

A. Narrow Bandgap Non-Fullerene Acceptors According to a First Embodiment

Most of the high performance A-D-A type NFAs based on the rigid heterocyclic cores reported so far still show a high absorption coefficient in the UV-Vis range with absorption spectra limited at about 850 nm; not an ideal situation for transparent organic solar cell applications. Moreover, sunlight possesses about 50% of its radiation intensity in the NIR region. Thus, the development of narrow bandgap non-fullerene acceptor (NBG-NFA) with the optical absorption gap below ~1.35 eV is desirable to sufficiently utilise NIR solar irradiation to achieve high efficiency, while simultaneously maintaining high visible transparency.

The present disclosure describes methods for designing NBG-NFA materials providing minimized photon energy loss in efficient semitransparent OPV applications. As described herein, three non-fullerene acceptors (NFAs) with π-extension of conjugated backbone are synthesized to reduce bandgaps and demonstrate minimized photon energy losses in efficient organic photovoltaic (OPVs) devices.

NBG-NFAs, IOTIC-2F and ITOTIC-2F are synthesized based on electron-rich complexes (D'-D-D', e.g. $D_3$-$D_2$-$D_3$ or $D_3$-$D_1$-$D_3$ in FIG. 1) end-capped with electron-deficient dye unit (A) (e.g., mono-fluorinated IC acceptor units in FIG. 1), thus constructing the A-D'-D-D'-A molecular structure. The molecular design rationale is as follows. First, the NFAs are structurally evolved by extending π-conjugation of the donor core (D, e.g. $D_1$ or $D_2$ in FIG. 1), which could induce a stronger intramolecular charge transfer (ICT) effect and therefore reduce the optical bandgap as the conjugation extends. Second, by flanking the strong electron-donating alkoxythienyl unit (D', e.g. $D_3$ in FIG. 1) with a strong electron-donating IDT/IDTT core (D), the D'-D-D' donor complexes were constructed so that the target NFAs based on the A-D'-D-D'-A structure possess small energetic gaps with the polymer donor, in terms of HOMO$_D$-HOMO$_A$ offsets, by upshifting the HOMO level to minimize photon energy loss in the PSCs.

NBG-NFAs IOTIC-2F and ITOTIC-2F exhibit strong NIR absorption with narrow optical bandgaps of 1.31 eV and 1.32 eV, as well as high-lying HOMO energy levels of −5.34 eV and −5.22 eV, respectively. The PCE of greater than 12% was obtained from photovoltaic characterization of the PSCs based on the PTB7-Th and IOTIC-2F. More importantly, the IOTIC-2F-based PSCs showed a $V_{OC}$ of 0.82 V with an $E_{loss}$ of 0.49 eV, which is a very small value for PSCs with such a low $E_g^{opt}$ (<1.31 eV).

Results

1. Material Synthesis

Figure 2A:
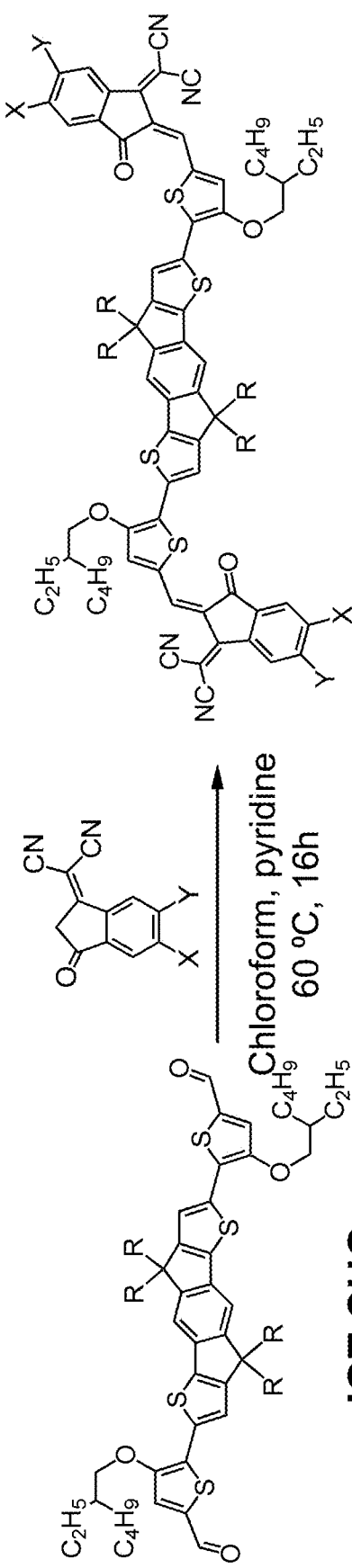
Figure 2B:
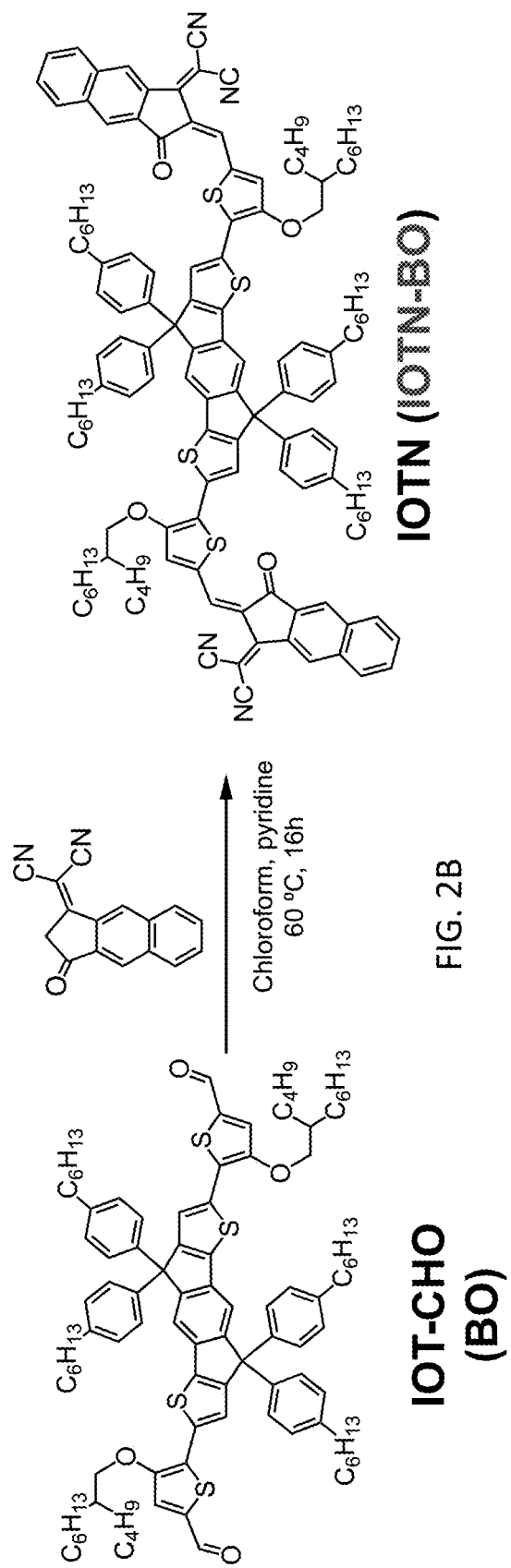
Figure 3A:
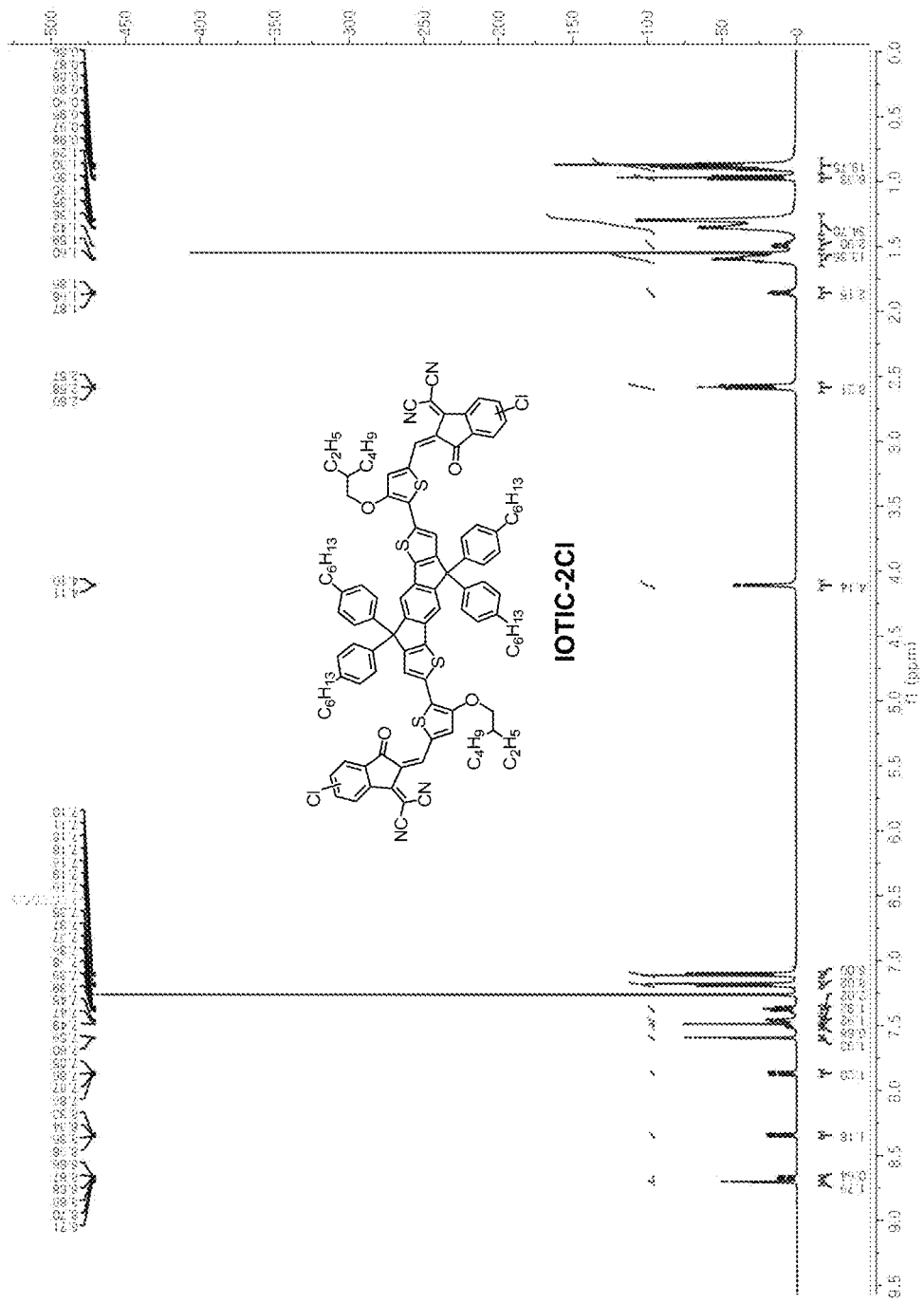
FIGS. 3A-3E ¹H NMR and ¹³C NMR spectra of Narrow Bandgap Non-Fullerene Acceptors according to the first embodiment.
Figure 3B:
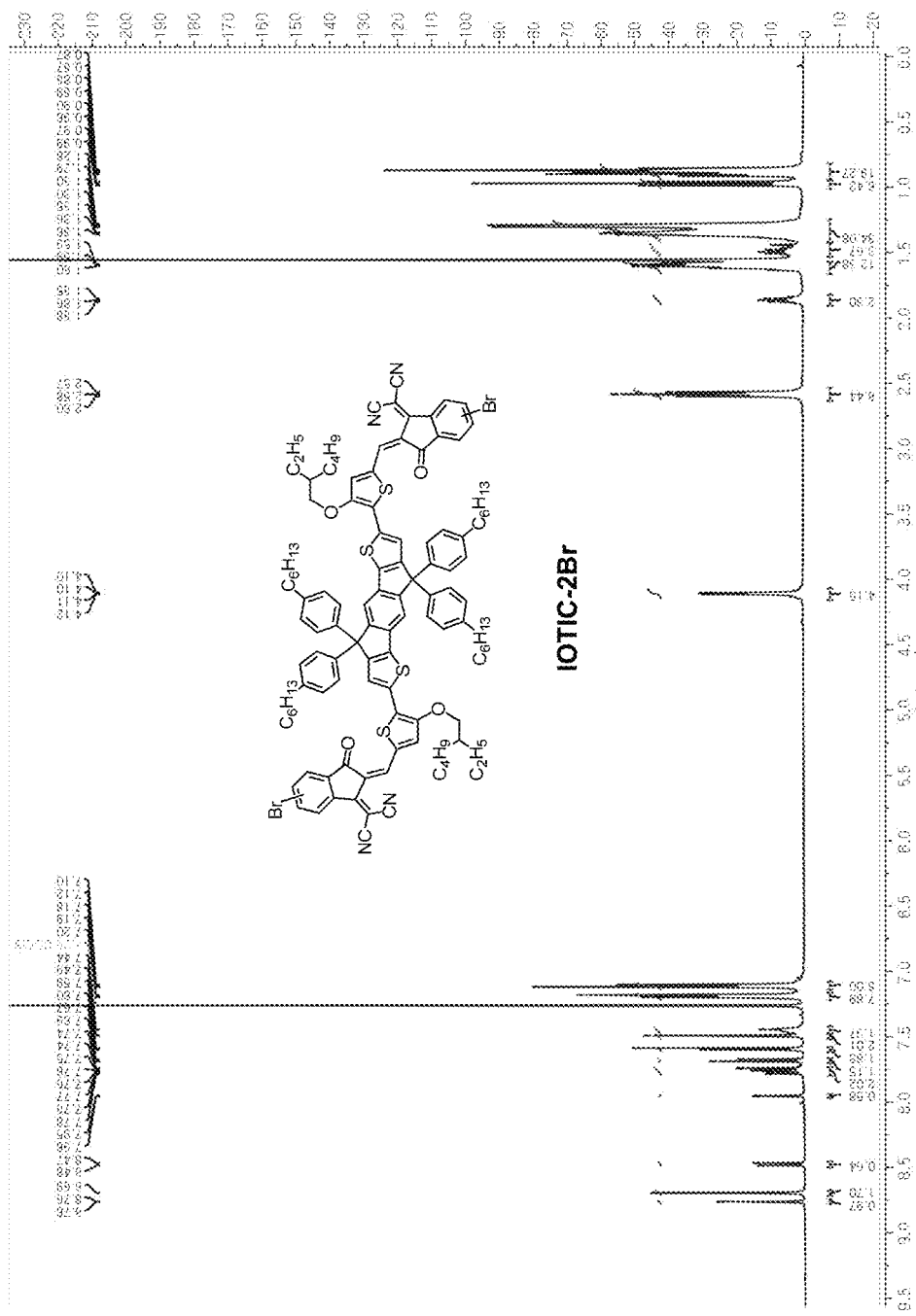
Figure 3C:
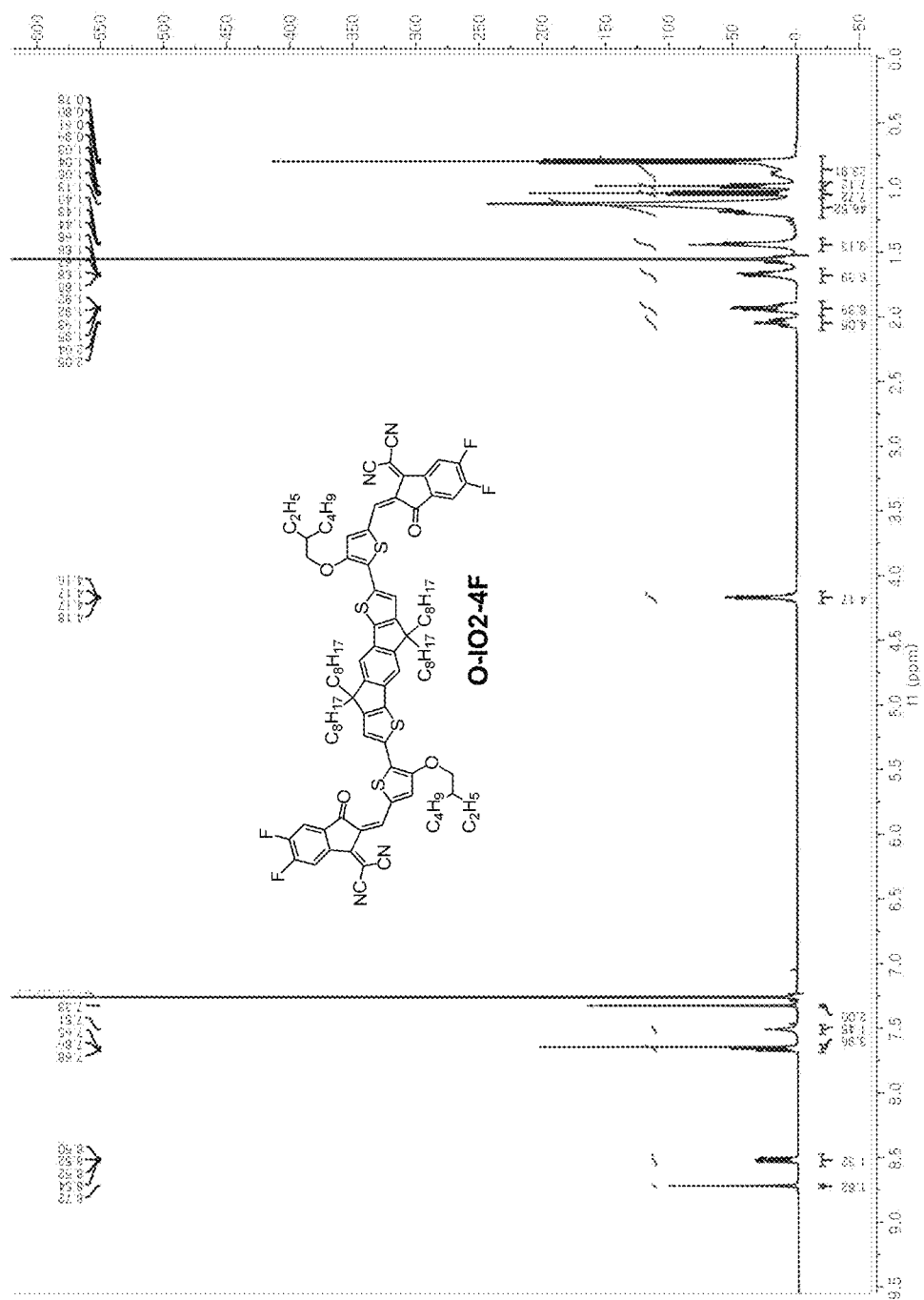
Figure 3D:
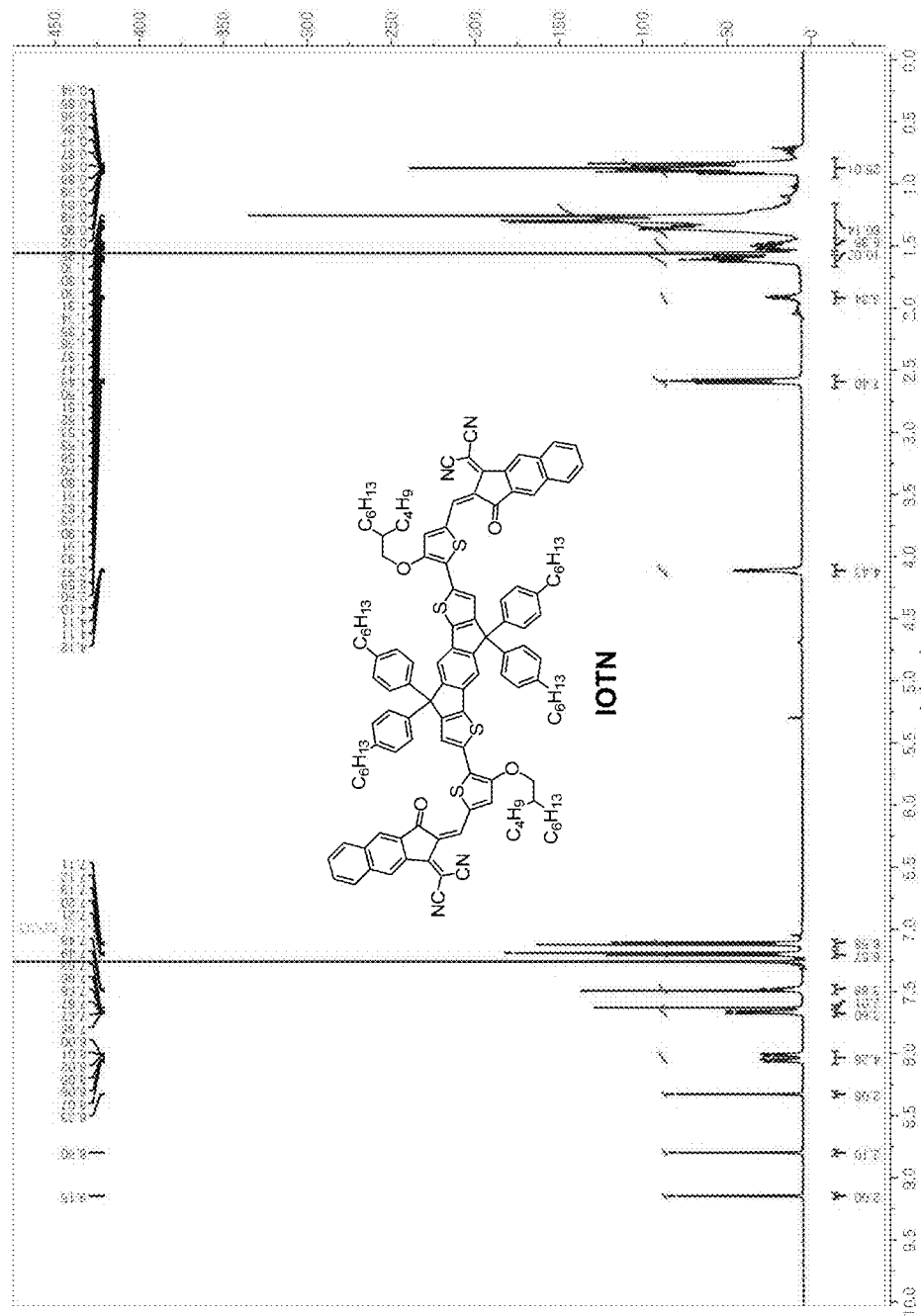
Figure 3E:
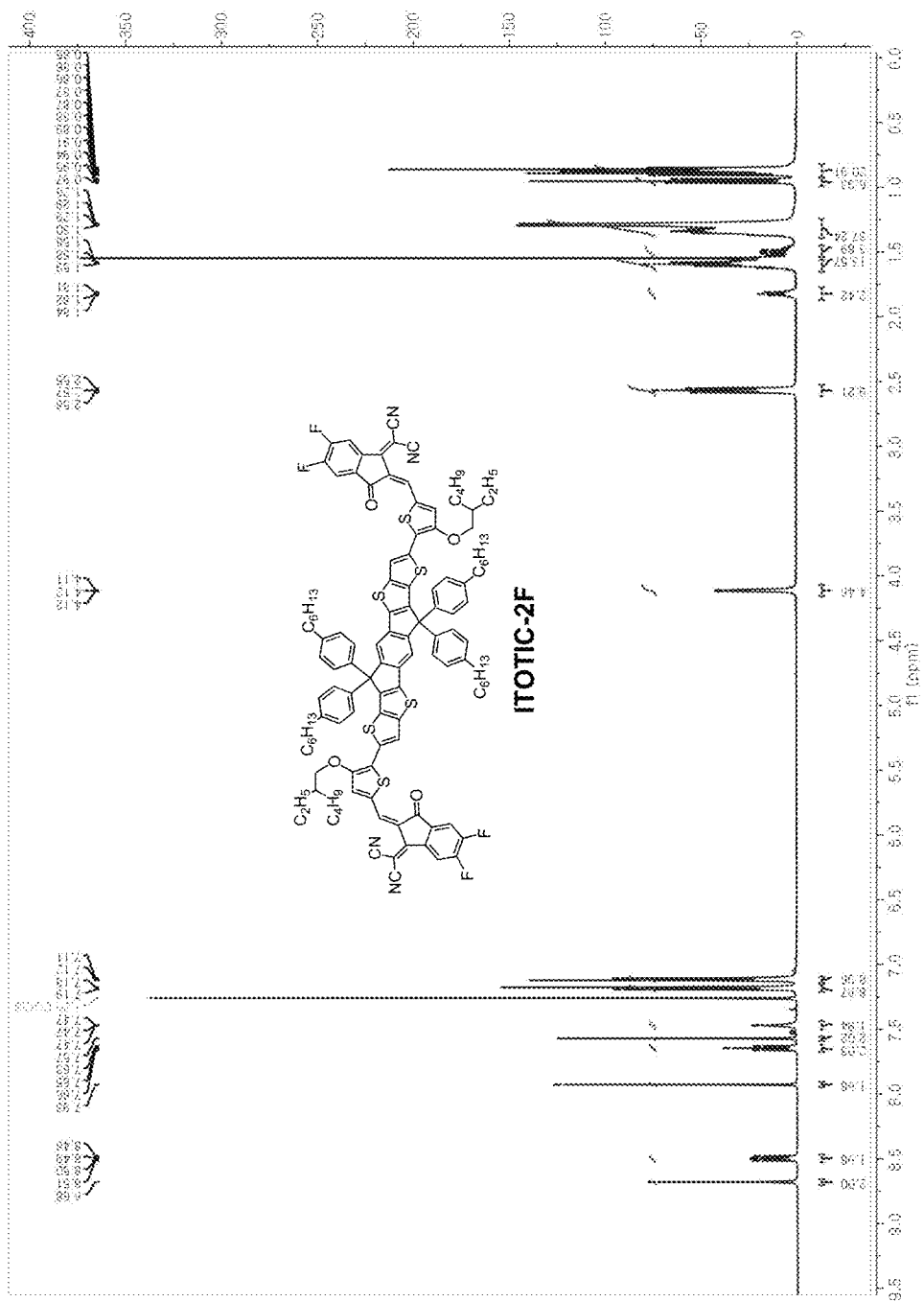
Figure 4C:
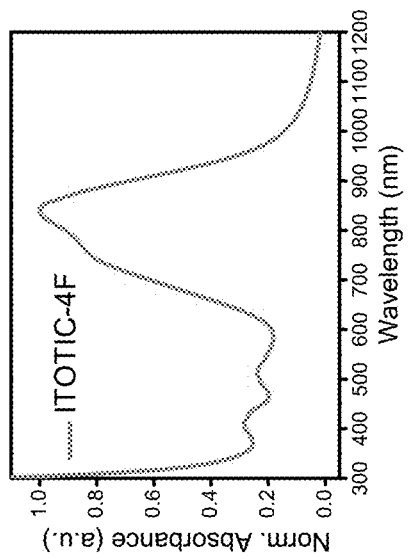
FIGS. 4C-4G. Film absorption spectra of compositions of further examples.
Figure 4D:
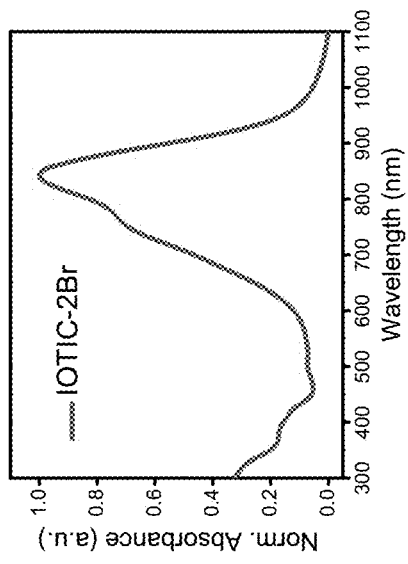
Figure 4E:
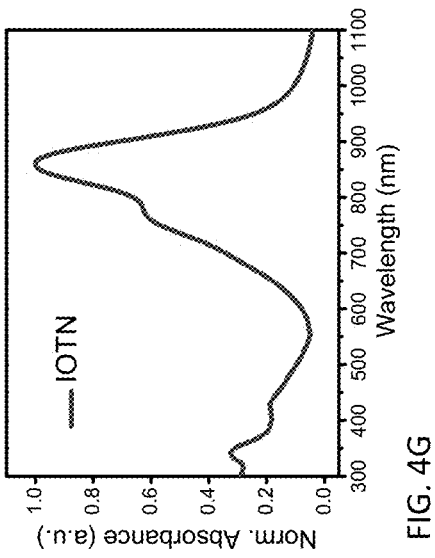
Figure 4F:
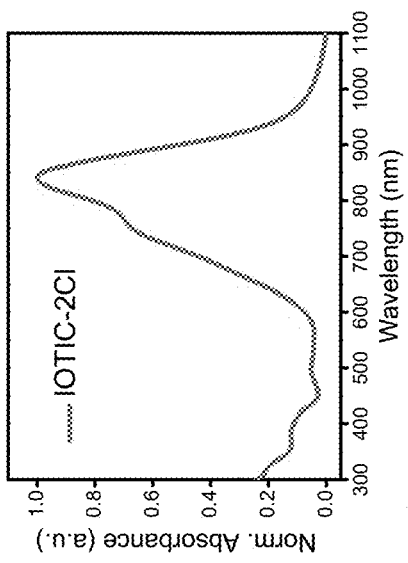
Figure 4G:
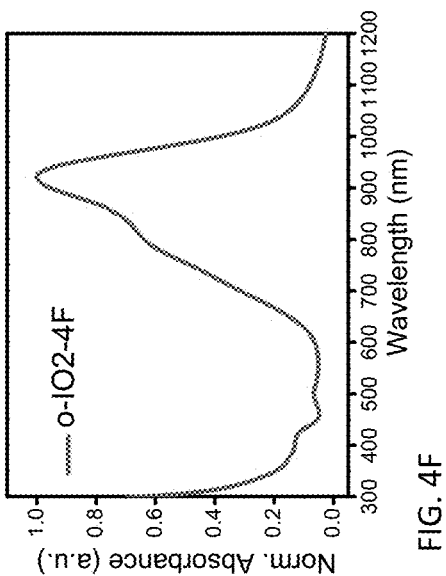
Figure 6A:
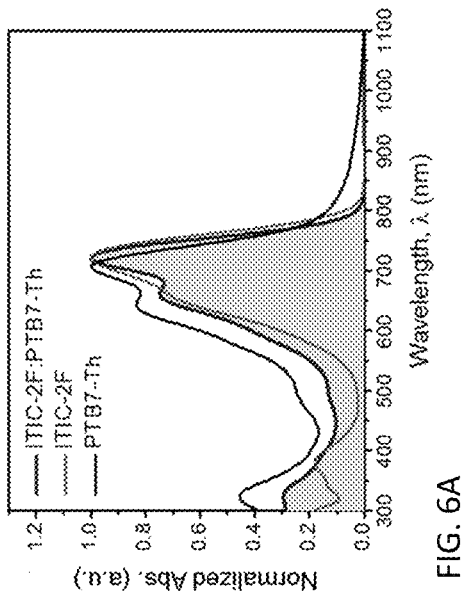
FIGS. 6A-6B Absorption spectra of PTB7-Th: blend films based on ITIC-2F (FIG. 6A), IOTIC-2F (FIG. 6B), and ITOTIC-2F (FIG. 6C).
Figure 6C:
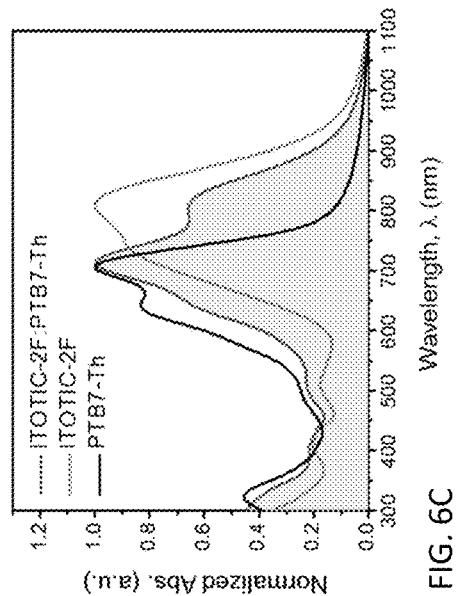

The present disclosure describes synthesis of three non-fullerene acceptors (NFAs) with π-extension of conjugated backbone, their chemical properties, and applications in OPVs to investigate the effects of chemical modification. The molecular structures of three NFA small molecules, namely ITIC-2F, IOTIC-2F, and ITOTIC-2F, are illustrated in FIG. 1 and corresponding synthetic routes are depicted in FIG. 2C. The synthesis of indaceno[1,2-b:5,6-b']dithiophene (IDT) and indacenodithieno[3,2-b]thiophene (IDTT) have been well described by reported literatures.[22,23] A Stille coupling reaction between compound 2 (or 3) and compound 4 in the presence of catalytic Pd(PPh$_3$)$_4$ in anhydrous toluene produced key bisaldehyde intermediates, IOT-CHO and ITOT-CHO, respectively. For the synthesis of IT-CHO, IDTT was converted into bisaldehyde IT-CHO by lithiation with n-butyllithium followed by quenching with dimethylformamide (DMF). Finally, Knoevenagel condensation reaction between three bisaldehyde intermediates and monofluorinated IC (compound 5) was conducted to afford target molecules. IOTIC-2F was afforded in 74% yield. A similar reaction condition as for IOTIC-2F was used for ITIC-2F and ITOTIC-2F preparation. To synthesize the bisaldehyde intermediates, in which the alkoxy substituents point toward the IDT or IDTT cores, the compound 4,5-bromo-4-((2-ethylhexyl)oxy)thiophene-2-carbaldehyde, was prepared by a modified synthetic condition from literature.[8] Another compound 5 as an acceptor end-group, was synthesized using a modified synthetic condition from literature.[9]

Compound 5 is a mixture of two isomers, which is difficult to separate. Isomeric compound 5 was used for the final condensation reaction and thus the resultant products have three regioisomers.

The new compounds are fully characterized by spectroscopic methods such as $^1$H NMR, $^{13}$C NMR, and MALDI-TOF mass spectra. New compounds ITIC-2F, IOTIC-2F, and ITOTIC-2F are readily soluble in common organic solvents such as dichloromethane, chloroform (CF), and chlorobenzene (CB) at room temperature. These three NFAs exhibit good thermal stability with a decomposition temperature ($T_d$, 5% weight loss) of 342, 345, and 391° C. for ITIC-2F, IOTIC-2F, and ITOTIC-2F, respectively, measured using thermogravimetric analysis.

Incorporation of fluorine atoms in organic semiconductors improves/enhances the intramolecular interaction (the push-pull effect), as well as enhances the intermolecular interactions, which are beneficial to reducing the bandgap and enhancing charge transport properties.[7] However, the inductively withdrawing nature of fluorine ensures that the HOMO level of electron acceptor is deep-lying and thus produces a lower $V_{OC}$ in OPVs. Moreover, in some cases, organic semiconductors with multiple fluorine substituents have been reported to exhibit excessive aggregation and thus overly segregated BHJ morphologies. Based on these considerations, a mono-fluorine atom was introduced onto the IC dye acceptor.

Materials

All reagents were purchased from commercial sources and used without further purification unless otherwise noted.

ITIC-2F (FIG. 2D): A mixture of compound IDTT-CHO (IT-CHO in FIG. 2D) (127 mg, 0.12 mmol) and compound 4 (100 mg, 0.47 mmol), dry chloroform (20 mL), and pyridine (0.4 mL) was added into to a flame-dried and nitrogen-filled one-neck round-bottom flask (50 mL). The flask was purged with N$_2$ for 20 min and the reactant was heated to 60° C. for 16 h. After the mixture cooled to room temperature, the reaction mixture was concentrated in vacuum. The residue was purified by silica gel column chromatography (n-hexane/dichloromethane, 3/7, Rf=0.7) to afford the product as a black green solid (127 mg, 72%).

$^1$H NMR (500 MHz, CDCl$_3$, ppm): δ 8.85 (s, 2H), 8.70 (q, 0.6H), 8.36 (dd, 1.4H), 8.22 (d, 2H), 7.91 (dd, 1.4H), 7.64 (s, 2H), 7.55 (dd, 0.6H), 7.41 (m, 2H), 7.20 (d, 8H), 7.13 (d, 8H), 2.57 (t, 8H), 1.59 (m, 8H), 1.28 (m, 24H), 0.86 (t, 12H).

$^{13}$C NMR (125 MHz, CDCl$_3$): 186.92, 186.86, 167.94, 167.54, 165.89, 165.46, 159.44, 159.15, 155.95, 153.49, 153.43, 147.92, 147.89, 147.65, 147.49, 143.99, 142.77, 142.75, 142.55, 142.47, 140.18, 140.11, 139.72, 139.06, 138.65, 138.53, 137.36, 137.19, 136.09, 133.28, 126.16, 126.08, 122.77, 122.68, 122.41, 122.15, 121.96, 118.81, 114.83, 114.61, 114.45, 114.37, 113.08, 112.87, 110.07, 110.89, 70.36, 69.35, 63.46, 63.45, 35.61, 31.90, 31.46, 29.39, 22.79, 14.29.

MS (MALDI-TOF): m/z 1462.595 (M$^-$).

IOT-CHO (FIG. 2D): A mixture of compound 2 (300 mg, 0.24 mmol), compound 4 (194 mg, 0.61 mmol, 2.5 eq), (Pd(PPh$_3$)$_4$) (25 mg), and dry toluene (10 mL) was added into to a flame-dried and nitrogen-filled one-neck round-bottom flask (50 mL). The flask was purged with N$_2$ for 20 min and the reactant was heated to 120° C. for 36 h. After the mixture cooled to room temperature, DI water was added, and the mixture was extracted with dichloromethane for two times (50 ml×3). The organic layer was dried over MgSO$_4$ and concentrated in vacuum. The residue was purified by silica gel column chromatography (n-hexane/dichloromethane, 3/7, Rf=0.5) to afford the product as a deep orange solid (239 mg, 71%).

$^1$H NMR (500 MHz, CDCl$_3$, ppm): δ 9.73 (s, 2H), 7.44 (d, 4H), 7.38 (s, 2H), 7.18 (d, 8H), 7. 08 (d, 8H), 4.06 (d, 4H), 2.58 (t, 8H), 1.80 (m, 2H), 1.48-1.62 (m, 16H), 1.30-1.46 (m, 32H), 0.88-0.95 (m, 24H).

IOTIC-2F (FIG. 2D): A mixture of compound IOT-CHO (100 mg, 0.07 mmol) and compound 5 (60 mg, 0.28 mmol), dry chloroform (20 mL), and pyridine (0.4 mL) was added into to a flame-dried and nitrogen-filled one-neck round-bottom flask (50 mL). The flask was purged with N$_2$ for 20 min and the reactant was heated to 60° C. for 16 h. After the mixture cooled to room temperature, the reaction mixture was concentrated in vacuum. The residue was purified by silica gel column chromatography (n-hexane/dichloromethane, 2/8, Rf=0.55) to afford the product as a dark green solid (96 mg, 74%).

$^1$H NMR (500 MHz, CDCl$_3$, ppm): δ 8.70 (s, 1.7H), 8.66 (q, 0.9H), 8.34 (dd, 1.6H), 7.86 (q, 1.6H), 7.59 (s, 1.9H), 7.46-7.52 (m, 4.4H), 7.35-7.38 (m, 2H), 7.18 (d, 8H), 7. 10 (d, 8H), 4.10 (d, 4H), 2.58 (t, 8H), 1.86 (m, 2H), 1.47-1.60 (m, 16H), 1.28-1.46 (m, 32H), 0.86-0.98 (m, 24H).

$^{13}$C NMR (125 MHz, CDCl$_3$): 187.35, 165.84, 157.96, 154.88, 146.95, 142.70, 142.61, 142.15, 141.35, 140.16, 139.30, 137.47, 137.32, 136.23, 133.19, 131.84, 129.91, 128.76, 128.10, 125.69, 123.64, 121.76,121.65,118.22, 115.95, 114.73, 113.04, 74.84, 68.96, 63.12, 39.84, 35.81, 31.95, 31.56, 30.74, 29.35, 29.27, 24.12, 23.22, 22.81, 14.34, 14.32, 11.36.

MS (MALDI-TOF): m/z 1771.933 (M$^-$).

ITOT-CHO (FIG. 2D): A mixture of compound 3 (200 mg, 0.15 mmol), compound 4 (142 mg, 0.44 mmol, 3 eq), (Pd(PPh$_3$)$_4$) (25 mg), and dry toluene (10 mL) was added into to a flame-dried and nitrogen-filled one-neck round-bottom flask (50 mL). The flask was purged with N$_2$ for 20 min and the reactant was heated to 120° C. for 36 h. After the mixture cooled to room temperature, DI water was added, and the mixture was extracted with dichloromethane for two times (50 ml×3). The organic layer was dried over MgSO$_4$ and concentrated in vacuum. The residue was purified by silica gel column chromatography (n-hexane/dichloromethane, 2/8, Rf=0.55) to afford the product as a deep orange solid (135 mg, 61%).

$^1$H NMR (500 MHz, CDCl$_3$, ppm): δ 9.74 (s, 2H), 7.63 (s, 2H), 7.52 (s, 2H), 7.45 (s, 2H), 7.17 (d, 8H), 7. 07 (d, 8H), 4.07 (d, 4H), 2.55 (t, 8H), 1.78 (m, 2H), 1.44-1.58 (m, 16H), 1.27-1.38 (m, 32H), 0.84-0.94 (m, 24H).

ITOTIC-2F (FIG. 2D): A mixture of compound ITOT-CHO (141 mg, 0.09 mmol) and compound 5 (60 mg, 0.38 mmol), dry chloroform (20 mL), and pyridine (0.4 mL) was added into to a flame-dried and nitrogen-filled one-neck round-bottom flask (50 mL). The flask was purged with N$_2$ for 20 min and the reactant was heated to 60° C. for 16 h. After the mixture cooled to room temperature, the reaction mixture was concentrated in vacuum. The residue was purified by silica gel column chromatography (n-hexane/chloroform, 2/8, Rf=0.6) to afford the product as a dark green solid (148 mg, 82%).

$^1$H NMR (500 MHz, CDCl$_3$, ppm): δ 8.69 (s, 2.0H), 8.66 (q, 0.9H), 8.34 (dd, 1.5H), 7.92 (s, 1.5H), 7.86 (q, 1.5H), 7.56 (s, 2H), 7.52 (dd, 0.9H), 7.47 (m, 2H), 7.35-7.39 (m, 2H), 7.18 (d, 8H), 7. 10 (d, 8H), 4.11 (d, 4H), 2.57 (t, 8H), 1.82 (m, 2H), 1.48-1.60 (m, 16H), 1.28-1.34 (m, 32H), 0.85-0.97 (m, 24H).

$^{13}$C NMR (125 MHz, CDCl$_3$): 187.16, 167.83, 165.77, 158.96, 154.97, 154.53, 147.02, 146.93, 146.69, 142.60, 142.52, 142.32, 142.29, 139.91, 139.85, 137.23, 136.43, 136.05, 135.49, 133.17, 132.03, 129.71, 128.84, 128.17, 125.82, 125.74, 121.87, 121.75, 121.56, 121.14, 120.86, 117.64, 115.07, 114.92, 114.67, 112.97, 112.75, 74.70, 69.08, 63.18, 39.94, 35.84, 31.93, 31.53, 30.82, 29.41, 29.39, 24.23, 23.23, 22.81, 14.34, 14.30, 11.47.

MS (MALDI-TOF): m/z 1883.748 (M$^-$).

General procedure. A similar reaction condition as for IOTIC-2F was used for IOTIC-2Cl, IOTIC-2Br, o-IOT-4F, IOTN, ITOTIC-4F preparation. A mixture of bisaldehyde intermediates, end-dyes (4 eq), dry chloroform (20 mL), and pyridine (0.4 mL) was added into to a flame-dried and nitrogen-filled one-neck round-bottom flask (50 mL). The flask was purged with N$_2$ for 20 min and the reactant was heated to 60° C. for 16 h. After the mixture cooled to room temperature, the reaction mixture was concentrated in vacuum. The residue was purified by silica gel column chromatography using n-hexane/dichloromethane mixture as an eluent to afford the products.

2. Material Characterization 2.1. Ultraviolet-Visible (UV-Vis) Spectra

Absorption spectra of the three molecules were measured in CB solution and thin films. Incorporation of electron-rich alkoxythienyl units (D$_3$) clearly redshift absorption spectra by enhancing the ICT strength. A CB solution of the A-D$_3$-D$_1$-D$_3$-A structured ITOTIC-2F displays a strong absorption in the 650-850 nm region with a maxima peak at 794 nm, which is redshifted by ~ 107 nm relative to that of ITIC-2F (687 nm). The maximum extinction coefficient of IOTIC-2F in CB is 1.22×10$^5$ M$^{-1}$ cm$^{-1}$, which is relatively lower than that of ITIC-2F (1.42×10$^5$ M$^{-1}$ cm$^{-1}$). This may correlate with the increased conformational disorder of the A-D'-D-D'-A conjugated system in solution due to the bulky side groups on the π-bridge alkoxythienyl units. IOTIC-2F and ITOTIC-2F possess quite similar absorption characteristics in solution probably due to their proximate molecular structure. However, the peak of the localized π-π* transition in the high-energy wavelengths is red-shifted from 488 nm (for IOTIC-2F) to 509 nm (for ITOTIC-2F) due to the more π-extended IDTT core. [24]

The IOTIC-2F film shows a maximum absorption peak at 839 nm with an absorption onset of ≈ 947 nm, corresponding to an $E_g^{opt}$ of 1.31 eV. Notably, the main absorption band of the IOTIC-2F film locates at 700-900 nm, which is desirable for semitransparent OSC applications. Contrary to the trend in the solution extinction coefficient, the absorption coefficient of the IOTIC-2F neat film from CB is relatively larger than that of the ITIC-2F neat film. Intramolecular S • • • O noncovalent interactions between the IDT core (D$_2$) and alkoxythienyl units (D$_3$) could induce the planar backbone, thus increasing π-π intermolecular interactions in the solid state.[25,26] IOTIC-2F provides a complementary absorption to a widely used polymer PTB7-Th (also known as PCE10 or PBDTT-EFT), which is beneficial for achieving high photocurrent. Interestingly, ITOTIC-2F based on the more π-extended IDTT core ($D_1$) exhibits slightly blue-shifted absorption, with a $\lambda_{max}$ of 809 nm and a $E_g^{opt}$ of 1.32 eV relative to that of IOTIC-2F. In addition, the relatively intense shoulder at ~839 nm in the absorption band of the IOTIC-2F film compared to that of the ITOTIC-2F film indicates that IOTIC-2F possess stronger intermolecular packing properties in the solid state. The present disclosure speculates that the extended conjugation of the aromatic system in ITOTIC-2F leads to a decrease in molecular solubility, which suppresses the chain planarization and ordered molecular packing during the rapid spin-casting film-formation process; i.e. as the ITOTIC-2F molecules are deposited from a warm solution onto the substrate, it is kinetically quenched before it reaches a sufficient level of aggregation.

TABLE 1

Optical and electrochemical properties of ITIC-2F, IOTIC-2F, and ITOTIC-2F.

| compd | $\lambda_{s,\,max}$ (nm)[a] | $\lambda_{f,\,max}$ (nm)[b] | $E_g^{opt}$ (eV)[c] | HOMO (eV)[d] | LUMO (eV)[e] | $E_g^{CV}$ (eV)[f] |
|---|---|---|---|---|---|---|
| ITIC-2F | 687 | 721 | 1.56 | −5.55 | −4.15 | 1.40 |
| IOTIC-2F | 794 | 839 | 1.31 | −5.34 | −4.06 | 1.28 |
| ITOTIC-2F | 791 | 809 | 1.32 | −5.22 | −4.11 | 1.11 |

[a]Absorption maximum in solution.
[b]Absorption maximum in film.
[c]Optical band gap calculated from the absorption edge of thin film.
[d]HOMO energy level estimated from the onset oxidation potential.
[e]LUMO energy level estimated from the onset reduction potential.
[f]HOMO-LUMO gap estimated from CV.

2.2. Electrochemistry

The electrochemical behaviors of three NFAs were investigated by cyclic voltammetry (CV) on films with ferrocene as the reference. The optical and electrochemical properties of NFAs are summarized in Table 1. The IOTIC-2F energy levels of the HOMO estimated from the onset oxidation and LUMO calculated from the reduction potential are at approximately −5.34 and −4.06 eV, respectively. In comparison with ITIC-2F, the HOMO and LUMO level of IOTIC-2F are shifted upward by 0.21 eV and 0.09 eV, respectively. This clearly indicates that the incorporation of the $D_3$ π-bridge significantly decrease the $F_g$ by predominantly upshifting the HOMO energy levels. The extended conjugation in these molecules leads to increasing HOMO levels, and thus the energy offset of $\Delta E_{HOMO}$ between PTB7-Th and NFAs gets smaller from ITIC-2F to IOTIC-2F to ITOTIC-2F. The $\Delta E_{HOMO}$ for IOTIC-2F and ITOTIC-2F are only ~ 0.14 eV and ~0.02 eV, respectively. While these orbital energy estimates from the CV measurements may contain significant error contributions, the A-D'-D-D'-A structured IOTIC-2F and ITOTIC-2F clearly possess much higher-lying HOMO levels compared to that of the A-D-A structured ITIC-2F, which mitigates energy losses.

3. Photovoltaic Performances of Bulk-Heterojunction Solar Cells 3.1. Device Fabrication and Characterization Method The OSC devices using a BHJ blend of PTB7-Th as the electron donor and NFAs (IOTIC-2F or ITOTIC-2F) as the acceptor were fabricated in an inverted device structure of indium-tin-oxide (ITO)/zinc oxide (ZnO)/PTB7-Th:NFA/ MoO₃/Ag. Photovoltaic devices were fabricated according to the following procedures. First, the glass/ITO substrates were cleaned with detergent, then ultra-sonicated in acetone and isopropyl alcohol, and subsequently dried in an oven overnight at 100° C. The zinc oxide (ZnO) solution was prepared using mixture of diethyl zinc solution and tetrahydrofuran (THF) (1:2, v/v %) and the ZnO film (35 nm) was prepared from spin-casting at 4000 rpm for 15 s and annealing at 110° C. for 15 min.[7] The blend solution (total 20 mg/mL) of PTB7-Th (1.0 wt %):NFA (1.5 wt %) dissolved in CB (with 2 vol % 1,8-diiodooctane or 2 vol % 1-chloronaphthalene) was spin-coated (800 to 1300 rpm for optimization) on top of the ZnO layer in a nitrogen-filled glove box. The device was pumped down in vacuum (<10⁻⁶ torr), and the MoO₃/Ag (6 nm/100 nm thick) electrode for inverted architecture was deposited on top of the active layer by thermal evaporation. The deposited MoO₃/Ag electrode defined the active area as 21.5 mm². Photovoltaic characteristics measurements were carried out inside the glove box using a high quality optical fiber to guide the light from the solar simulator equipped with a Keithley 2635A source measurement unit. J-V curves were measured under AM 1.5 G illumination at 100 mW cm⁻² using an aperture (10.7 mm²) to define the illuminated area. EQE measurements were conducted in nitrogen-filled glove box using an EQE system. The monochromatic light intensity was calibrated using a Si photodiode and chopped at 100 Hz.

3.2. Photovoltaic Characteristics

Figure 5:
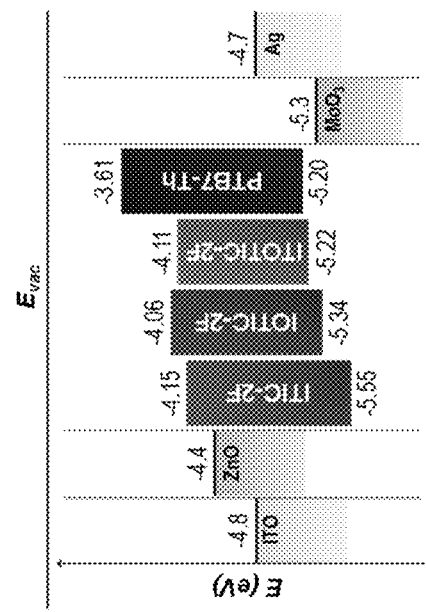
FIG. 5 Energy level diagram of the inverted device structure with active materials.
Figure 6B:
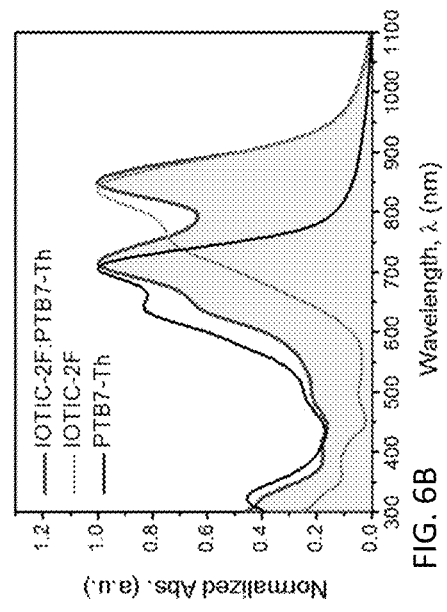
Figure 7B:
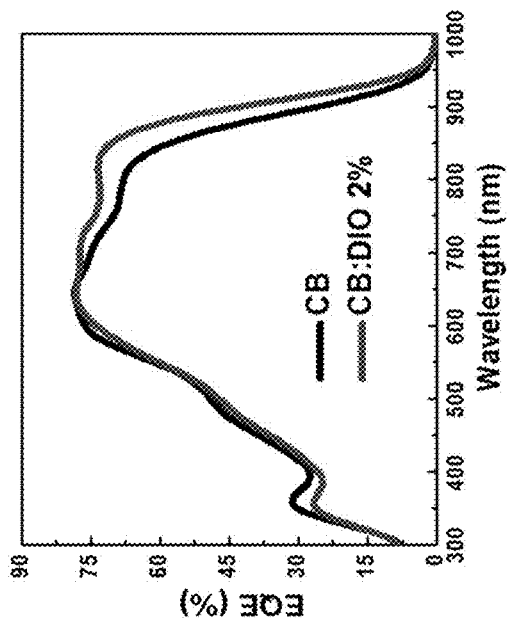
FIGS. 7A-7B. J-V characteristics (FIG. 7A) and EQE spectra (FIG. 7B) of the PTB7-Th:IOTIC-2F OPV devices under illumination of an AM 1.5 G at 100 mW cm⁻².
Figure 7A:
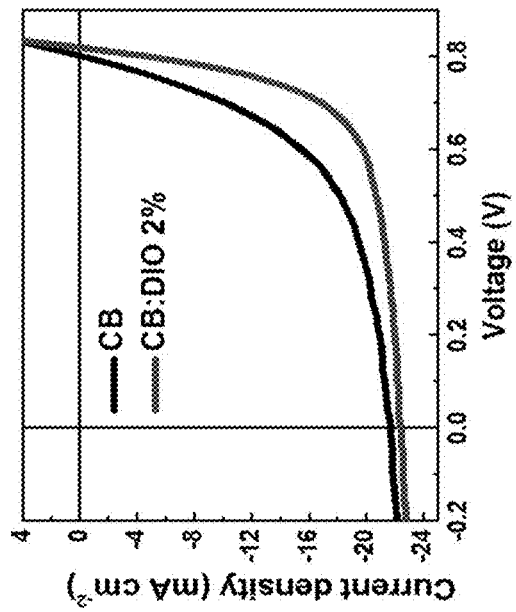

The widely used narrow-bandgap polymer PTB7-Th is chosen as the electron donor to pair with NBG-NFA to fabricate OPVs based on the following considerations. First, the energy levels of PTB7-Th (HOMO=−5.20 eV and LUMO=−3.46 eV) match well with those of IOTIC-2F, which provides an efficient energetic driving force for exciton dissociation (FIG. 5). Second, PTB7-Th possesses an $E_g^{opt}$ of 1.59 eV, which gives a complementary optical absorption with NBG-NFAs. The PTB7-Th:IOTIC-2F blend film exhibits a strong absorption mainly located in the near infrared (NIR) region up to 950 nm, while it shows weak absorption in the 400-600 nm region, which meets the requirement of transparent OPVs since the human eye has the highest sensitivity in the yellow-green wavelength region (500-600 nm) (FIG. 6B). The device fabrication conditions, such as donor:acceptor weight ratio, solution concentration, processing additive volume ratio, and spin-coating speed are optimized. Tables 2a-2b summarizes the photovoltaic parameters of the optimized devices based on PTB7-Th:NBG-NFA (1:1.5, w/w) without and with additives.

Current-voltage (J-V) characteristics of the PTB7-Th: NFA cells with different D/A ratios exhibit the best performance at a 1:1.5 D/A ratio spin coated from CB. As shown in FIG. 8A, the optimized devices based on PTB7-Th: IOTIC-2F gave PCEs up to 12.6% with an impressive, surprising, and unexpected $J_{SC}$ of 23.22 mA cm⁻² and $V_{OC}$ as high as 0.82 V. Under the same device architecture, the two other NFAs (ITIC-2F and ITOTIC-2F) yielded very different device performances. Although ITIC-2F-based devices exhibited a promising PCEs of ~9.16% with a relatively higher fill factor (FF) of 0.71, they gave lower photocurrent densities (~ 17.33 mA cm⁻²) when compared to the IOTIC-2F-based devices, due to the limited absorption range of ITIC-2F. The higher FF of ITIC-2F-based cells could be ascribed to the relatively higher electron mobility of ITIC-2F and better balanced hole/electron charge transport properties in the BHJ devices. The ITOTIC-2F-based cells show poor device performances mainly due to a low $J_{SC}$ of 7.32 mA cm⁻².

TABLE 2a

Performance of the OPVs based on PTB7-Th/NFAs.

| blends[a] | additive[b] | $V_{OC}$ (V) | $J_{SC}$ (mA cm$^{-2}$) | FF (%) | PCE (%)[c] | $E_{loss}$ (eV)[d] |
|---|---|---|---|---|---|---|
| PTB7-Th:IOTIC-2F | — | 0.801 | 21.71 | 54.2 | 9.44 | 0.509 |
|  | CN | 0.802 | 16.18 | 64.4 | 8.35 | 0.508 |
|  | DIO | 0.820 | 22.49 | 66.0 | 12.20 | 0.490 |
| PTB7-Th:ITOTIC-2F | CN | 0.792 | 7.41 | 62.0 | 3.64 | 0.528 |
|  | DIO | 0.768 | 2.60 | 54.9 | 1.10 | 0.552 |

[a]PTB7-Th:NFA = 1:1.5 (w/w).
[b]Processing solvent additives were used. 2% CN (v/v) and 2% DIO (v/v), respectively.
[c]Highest PCEs.
[d]Photon energy loss is calculated using the formula $E_{loss} = E_g^{opt} - qV_{OC}$.

TABLE 2b

Photovoltaic performances of the OSCs based on PTB7-Th and various acceptors measured at simulated 100 mW cm$^{-2}$ AM 1.5 G illumination.

| Acceptor[a] | Additive[b] | $V_{OC}$ (V) | $J_{SC}$ (mA cm$^{-2}$) | FF | PCE (%)[c] |
|---|---|---|---|---|---|
| ITIC-2F | — | 0.751 ± 0.001 | 16.48 ± 0.07 | 0.68 ± 0.01 | 8.61 (8.49 ± 0.11) |
|  | DIO | 0.748 ± 0.003 | 17.01 ± 0.40 | 0.70 ± 0.01 | 9.16 (8.91 ± 0.17) |
| IOTIC-2F | — | 0.779 ± 0.015 | 21.81 ± 0.36 | 0.56 ± 0.01 | 9.74 (9.48 ± 0.11) |
|  | DIO | 0.815 ± 0.005 | 23.10 ± 0.85 | 0.64 ± 0.02 | 12.6 (12.1 ± 0.51) |
| ITOTIC-2F | — | 0.794 ± 0.001 | 3.63 ± 0.21 | 0.53 ± 0.01 | 1.67 (1.53 ± 0.10) |
|  | CN | 0.785 ± 0.009 | 7.32 ± 0.36 | 0.61 ± 0.02 | 3.88 (3.67 ± 0.22) |

[a]PTB7-Th:acceptor blend ratios are 1:1.5 (w/w).
[b]Processing solvent additives were used. 2% CN (v/v) and 2% DIO (v/v), respectively.
[c]Average values from 18 devices.

Figure 8B:
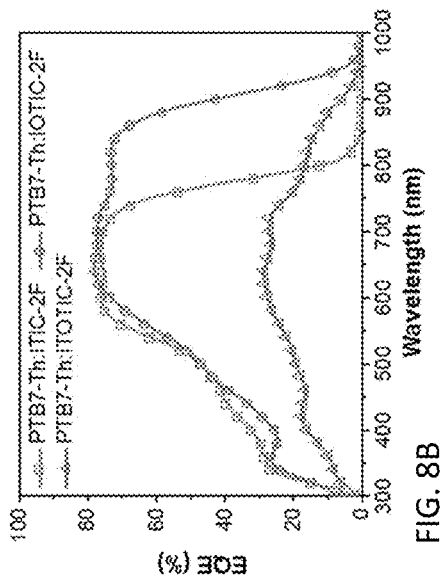
FIGS. 8A-8B. J-V characteristics (FIG. 8A) and EQE spectra (FIG. 8B) of the optimized OSC devices under illumination of an AM 1.5 G at 100 mW cm⁻².
Figure 8D:
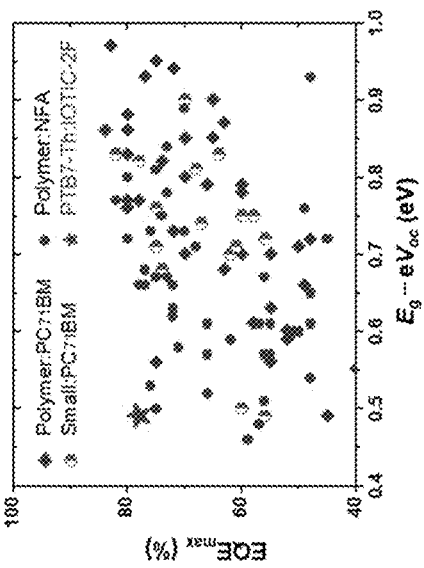
FIG. 8D. Comparison of the $EQE_{max}$ vs $E_{loss}$ ($E_g - eV_{OC}$) for different types of BHJ organic solar cells (PCE >5%).
Figure 8A:
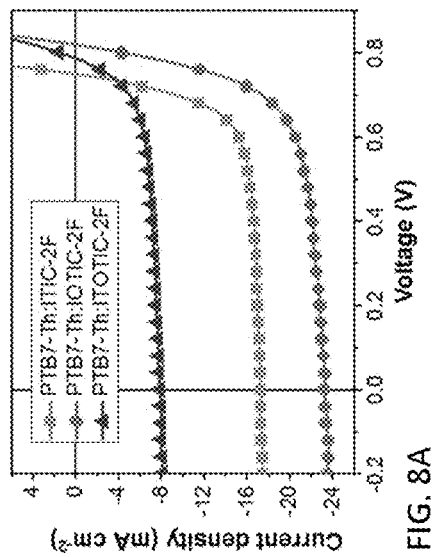
Figure 8C:
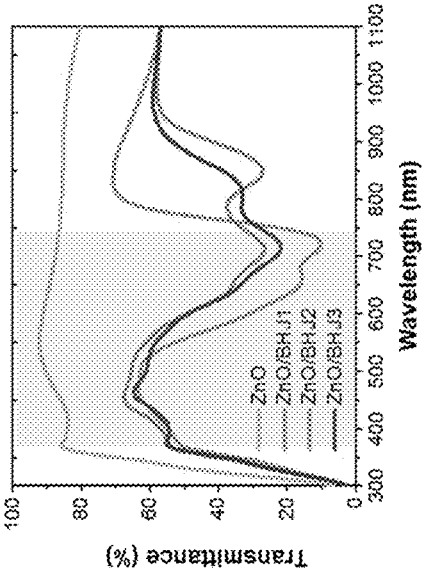
FIG. 8C. Transmission spectra of the ITIC-2F (BHJ1), IOTIC-2F (BHJ2), and ITOTIC-2F (BHJ3)-based blend films on the glass/ITO/ZnO substrate.

FIG. 8B is a comparison of the external quantum efficiency (EQE) spectra of the optimized devices having different compositions. While the PTB7-Th:IOTIC-2F-based devices exhibit broad solar spectral response from 300 to 950 nm, the EQE values have an obvious decrease in the range of 300-600 nm, which is the most sensitive region to human eyes. Remarkably, the PTB7-Th:IOTIC-2F-based device has EQEs over 70% in the range of 600-850 nm and a maximum EQE ($EQE_{max}$) value reaching 78% at 645 nm. The outstanding $J_{SC}$ values over 23 mA cm$^{-2}$ in the PTB7-Th:IOTIC-2F-based device can largely be ascribed to an efficient utilisation of the NIR solar radiation by narrow bandgap IOTIC-2F molecules. Meanwhile, the A-D-A structured ITIC-2F-based devices exhibited the limited EQE spectra to 800 nm, which gave a relatively lower $J_{SC}$ (~17 mA cm$^{-2}$) relative to the devices based on IOTIC-2F. FIG. 8C shows the transmission spectra of the ITO glass/ZnO/BHJ films. The average visible transmittances (AVT) of the samples in the range of 370-740 nm are 40.7, 52.3, and 47.9% for ITIC-2F, IOTIC-2F, and ITOTIC-2F, respectively. In particular, the IOTIC-2F:PTB7-Th blends open a large spectral window in the 400-600 nm region.

The $E_{loss}$ is also an important parameter in interpreting the deviation of $V_{OC}$ in OSCs because the $eV_{OC}$ is significantly lower than the energy of photons absorbed, as determined by the smaller value of donor or acceptor material. FIG. 8D plots the $E_{loss}$ vs. the corresponding $EQE_{max}$ for OSCs in the literature. In fullerene-based OSCs, low $E_{loss}$ appears to incur a trade-off with $EQE_{max}$. As seen in the FIG. 8D, most polymer:PC$_{71}$BM blends show an $E_{loss}$ greater than 0.7 eV and, when the $E_{loss}$ is below 0.6 eV level, the corresponding EQE drops to less than 60%. In the recent published cases, few polymer:NFA pairs have achieved low $E_{loss}$ and high EQE simultaneously. While some of these reports focused on minimizing the voltage loss while keeping EQE as high as possible, in most cases, the $E_g$ of the corresponding devices remained above 1.35 eV.[27-30] In the examples presented herein, the $E_{loss}$ is as low as 0.49 eV for IOTIC-2F:PTB7-Th devices, which is the lowest value reported for the OSCs exceeding $EQE_{max}$ of 70%. Notably, such a small $E_{loss}$ was achieved using a narrow bandgap NFA (IOTIC-2F) with an $E_g$ of 1.31 eV, indicating that the upper performance limit of NFA OSCs has not yet been reached. NBG NFAs that harvest more of the available sunlight, like IOTIC-2F, offer a promising avenue toward reaching that limit.

4. Photodetector Characteristics

Figure 9:
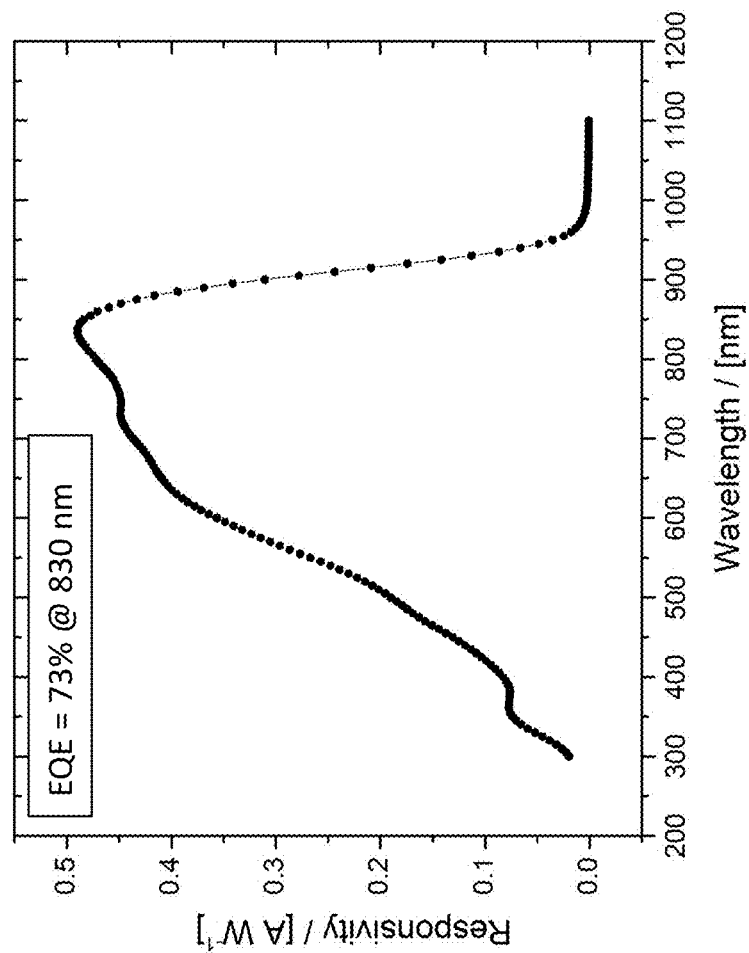
FIG. 9. Responsivity of a photodetector comprising a Narrow Bandgap Non-Fullerene Acceptor IOTIC-2F according to the first embodiment.
Figure 9:
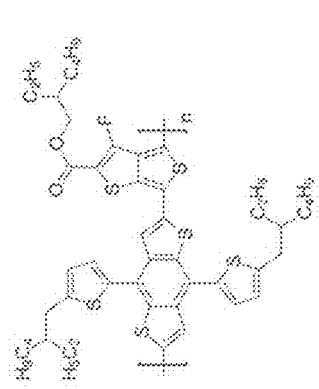
Figure 9:
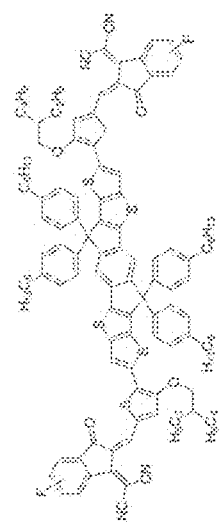

FIG. 9 illustrates the measured responsivity of a photodetector comprising a photosensitive active layer including PTB7-Th:IOTIC-2F (1:1.5). The device structure is ITO/ZnO/active layer/MoO$_x$/Ag. The active layer has a thickness of 100 nm and the device area is 0.20 cm$^2$. Strong photo response in the near IR range of 600-900 nm was achieved.

5. Morphology

Figures 10A, 10B:
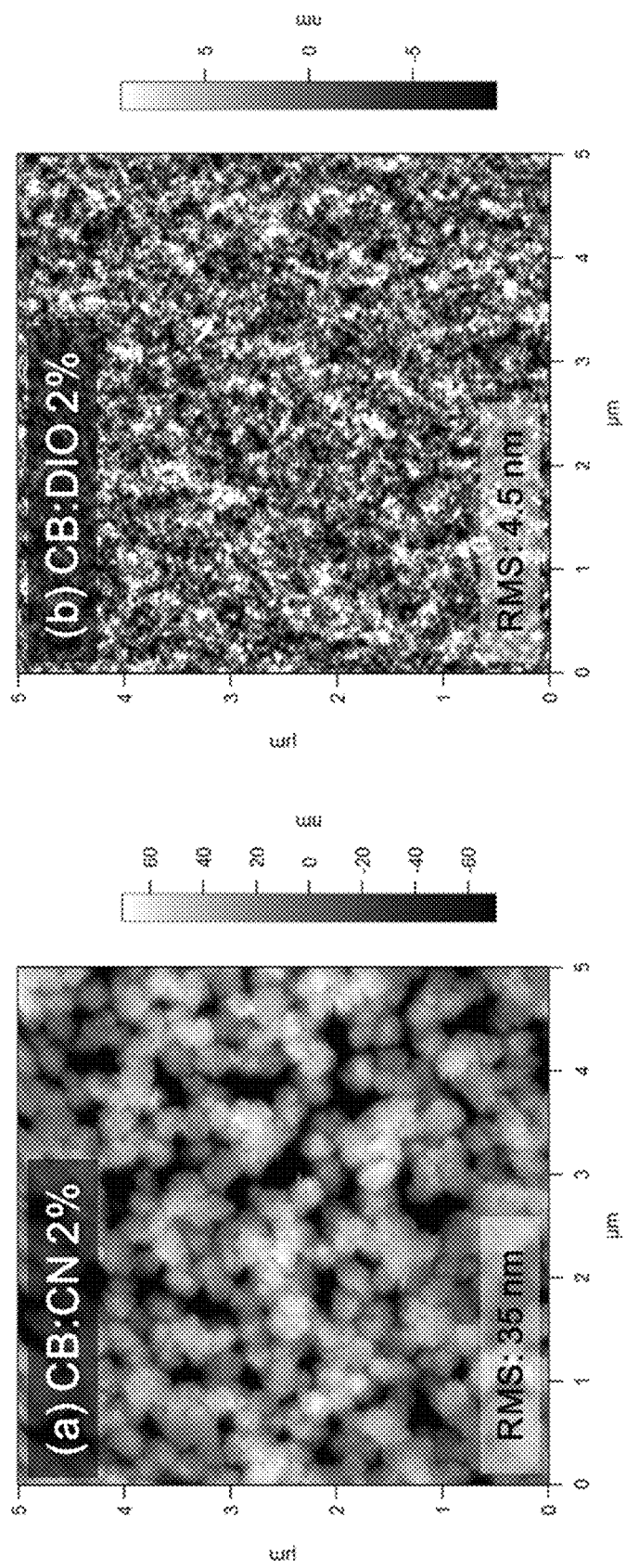
FIGS. 10A-10O. AFM height images of the PTB7-Th:IOTIC-2F blend films prepared by (FIG. 10A) 2% CN and (FIG. 10B) 2% DIO as processing additives. TEM images of the BHJ active layers (scale bar: 200 nm) for ITIC-2F:PTB7-Th, IOTIC-2F:PTB7-Th, and ITOTIC-2F:PTB7-Th blends without additives (FIGS. 10c-10e) and with additives (FIGS. 10f-10h). 2D GIWAXS patterns of PTB7-Th:NFA blend films prepared (FIG. 10i) without additive and (FIG. 10j) with additive, and the corresponding GIWAXS profiles along (FIG. 10k) in-plane and (FIG. 10l) out-of-plane directions. The in-plane line-cut profiles for comparison between neat and blend films prepared with optimum conditions.

The morphology of thin films plays a critical role in determining the device performance of OSCs. Atomic force microscopy (AFM) was used to investigate the morphology of the blend films. As shown in FIG. 10B, the PTB7-Th:IOTIC-2F blend film prepared with 2% DIO additive presents a relatively smooth surface feature with a mean-square surface roughness ($R_q$) of 4.5 nm, while the device with 2% CN additive (FIG. 10A) exhibits quite rough surface feature ($R_q$=35 nm) with large phase segregation features. The favorable BHJ morphologies with nanoscale phase separation and appropriate domain sizes should benefit the charge generation and transport processes in the devices, which partially contributed to high $J_{SC}$ and FF values.

The topographic features of the films were also examined using transmission electron microscopy (TEM). For the films processed without additives, the ITIC-2F (or IOTIC-2F) and PTB7-Th blend shows a well-mixed BHJ morphology with a bicontinuous D/A network (FIGS. 10C and 10D), which gave the high PCEs—8.6% for ITIC-2F and 9.7% for IOTIC-2F, respectively. However, clear evidence for severe phase segregation is observed in the ITOTIC-2F:PTB7-Th blend (FIG. 10e), resulting in a poor dispersion of ITOTIC-2F in the polymer matrix. These large ITOTIC-2F-dominant domains may result from the lower solubility limit of ITOTIC-2F and the consequent early demixing of ITOTIC-2F from PTB7-Th and solvent during the film-forming process. The small amount of 1-chloronaphthalene (CN) additive leads to smaller ITOTIC-2F domains and thus better mixed heterojunction (FIG. 10H). In contrast, processing with 2 vol % 1,8-diiodooctane (DIO) significantly changes the BHJ morphology for the ITIC-2F (or IOTIC-2F)-based blend film, resulting in larger domains of both donor and acceptor components relative to the as-cast condition (FIGS. 10F and 10G). Since only acceptor molecules comprise nitrogen, it is possible to distinguish between donor- and acceptor-rich phases using elemental maps from electron energy loss spectroscopy (EELS). The EELS confirms that the dark regions with distinct grain shapes in the ITIC-2F (or IOTIC-2F)-based blend originate from the acceptor molecules. This indicates that the ITIC-2F (or IOTIC-2F) molecules organize into highly crystalline morphologies and undergo multiscale phase segregation in the presence of DIO. This is expected to improve the structural order in bulk films with DIO, evidenced by the improved FF values in both ITIC-2F and IOTIC-2F-based devices.

Figure 10O:
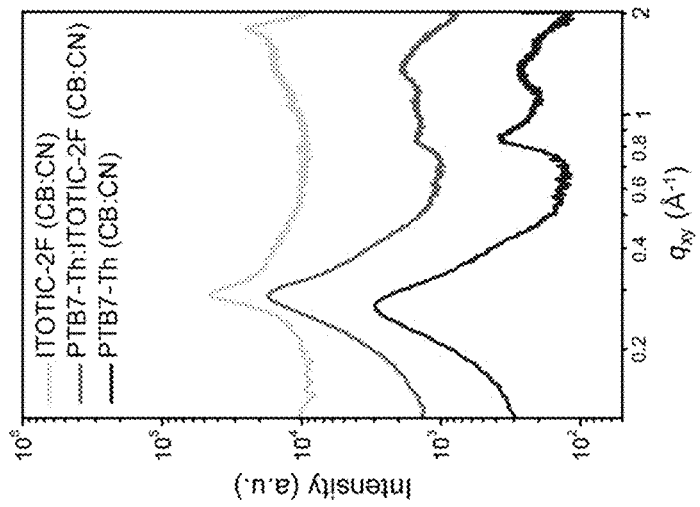
Figure 10N:
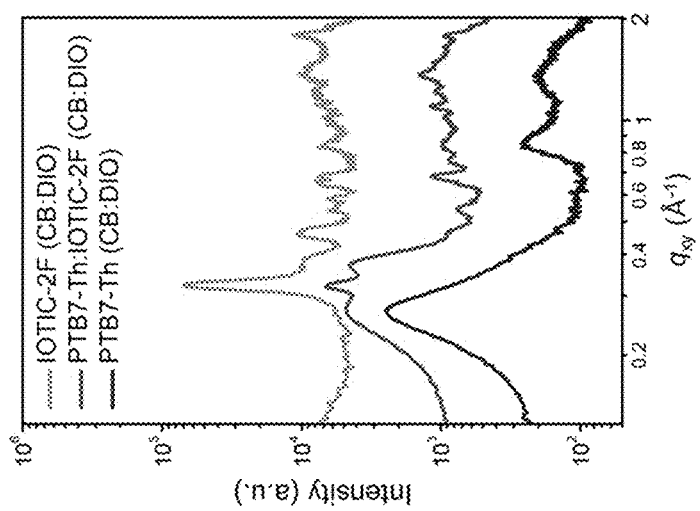
(FIG. 10M) ITIC-2F:PTB7-Th, (FIG. 10N) IOTIC-2F:PTB7-Th, and (FIG. 10O) ITOTIC-2F:PTB7-Th systems.
Figure 10M:
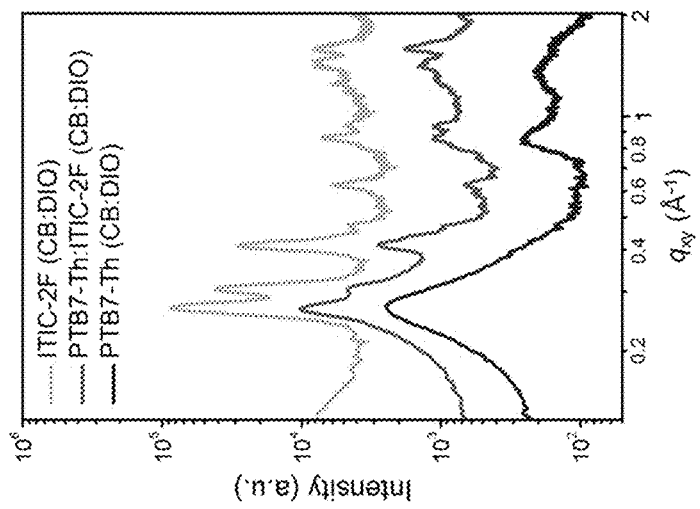

Grazing incidence wide-angle X-ray scattering (GI-WAXS) was employed to gain further insight into the effects of additive processing on the thin-film self-assembly and crystalline order in these PTB7-Th:NFA systems. 2D GIWAXS patterns of blend films are shown in FIG. 10I to 10J, with the corresponding 1D profiles presented in FIG. 10K to 10L. Processing with DIO greatly changes the manner of molecular packing in the ITIC-2F (or IOTIC-2F)-based blend film. Obvious crystalline halos with multiple diffraction peaks were seen in both blend films, which are difficult to see in the polymer:fullerene solar cells. As seen from the line-cut profiles of the PTB7-Th:IOTIC-2F blend film, a distinct (010) peak is seen in the out-of-plane direction and a quite sharp (100) peak is seen in the in-plane direction. Thus, large crystals of IOTIC-2F take a face-on orientation with corresponding π-π stacking distance of 3.48 Å. To investigate how processing additives affect the polymer and NFA components, both neat and blend films prepared with and without additives were compared.,Processing with DIO significantly increases the degree of crystalline order in both ITIC-2F and IOTIC-2F neat films, while PTB7-Th is relatively insensitive to additive processing. PTB7-Th orients face-on with the same relative degree of anisotropy, regardless of solvent processing. Thus, in the DIO-processed blends, the observed increase in crystalline packing features originates primarily from ITIC-2F or IOTIC-2F molecules. Meanwhile, ITOTIC-2F is the least ordered of the acceptors. As-cast, it orients slightly face-on to the surface, but gains more edge-on character when processed with CN. Blend films processed with CN show almost no change in the degree of ITOTIC-2F crystalline order. Many recent reports of NFA solar cells observe that both polymer donors and small molecule acceptors tend to lose their crystalline order when blended into BHJ films.[31, 32] This usually results in lower charge transport properties for the BHJ devices, compared to neat films of the individual components. Thus, achieving high PCEs in BHJ OSCs requires maintaining high crystalline order of both donor and acceptor components while keeping an appropriate level of intermixing.[33] FIGS. 10M-O clearly indicate that the ITIC-2F:PTB7-Th (or IOTIC-2F:PTB7-Th) blend film processed with DIO maintains the highly crystalline features of both the donor polymer and acceptor small molecule components. Overall, a combination of morphology characterization results indicates that ITIC-2F- and IOTIC-2F-based blend can achieve a favorable BHJ morphology for efficient charge separation and transport, thus leading to the high $J_{SC}$ and FF.

B. DTX Based Non-Fullerene Acceptors

The present disclosure further describes design and synthesis of A-D'-D-D'A structured Ultra NBG-NFAs comprising NBG-NFAs with DTX (cyclopentadithiophene (CPDT), dithienosilole (DTS), dithienogermole (DTG), dithienopyrrole (DTP)) donor core units, COTIC-4F and SiOTIC-4F based on electron-rich complexes (D'-D-D') end-capped with electron-deficient dye unit (A), 2-(5,6-difluoro-3-oxo-2,3-dihydro-1H-inden-1-ylidene)malononitrile, IC-2F), thus constructing the A-D'-D-D'-A molecular structure. Combining strong electron-donating D and D' subunits in the D'-D-D' configuration significantly reduces the $E_g^{opt}$ by predominantly upshifting the highest occupied molecular orbital (HOMO) levels of resulting molecules. Since $V_{OC}$ is at the first order proportional to the difference between the HOMO level of donor and the lowest unoccupied molecular orbital (LUMO) level of acceptor,[9] the molecular design described herein ensures a high-lying acceptor LUMO level, which is preferred for the goal of reducing $E_g^{opt}$ without sacrificing the $V_{OC}$. Conformational "locks" via S•••O interactions involving proximate alkoxy groups and thienyl S atoms enhance π-system coplanarity[10] and thus significantly decrease the localized π-π* transition in the high-energy wavelengths. In addition, solubilizing alkoxy groups ensure sufficient solution processability. Lastly, fluorination of the end-capping moieties (A) further enhances the ICT effect, thereby yielding narrower bandgaps than the non-fluorinated analogues.[11] Indeed, COTIC-4F and SiOTIC-4F exhibit strong NIR absorption with narrow $E_g^{opt}$ of 1.10 eV and 1.17 eV, respectively. To the best of our knowledge, the $E_g^{opt}$ of 1.10 eV is the lowest value for non-fullerene small molecule acceptors reported thus far. OSCs based on a blend of the polymeric donor PTB7-Th and non-fullerene acceptor SiOTIC-4F exhibit a power conversion efficiency (PCE) of up to 9.6% with impressive short-circuit current density ($J_{SC}$) values of ~24 mA cm$^{-2}$ despite a small photon energy loss of 0.525 eV, demonstrating the great potential of NBG-NFAs for efficient semitransparent OSC applications.

Results

1. Material Synthesis

DTX based NBG-NFAs can be synthesized with different bridging atoms in the donor core and structural precision.

Figure 11A:
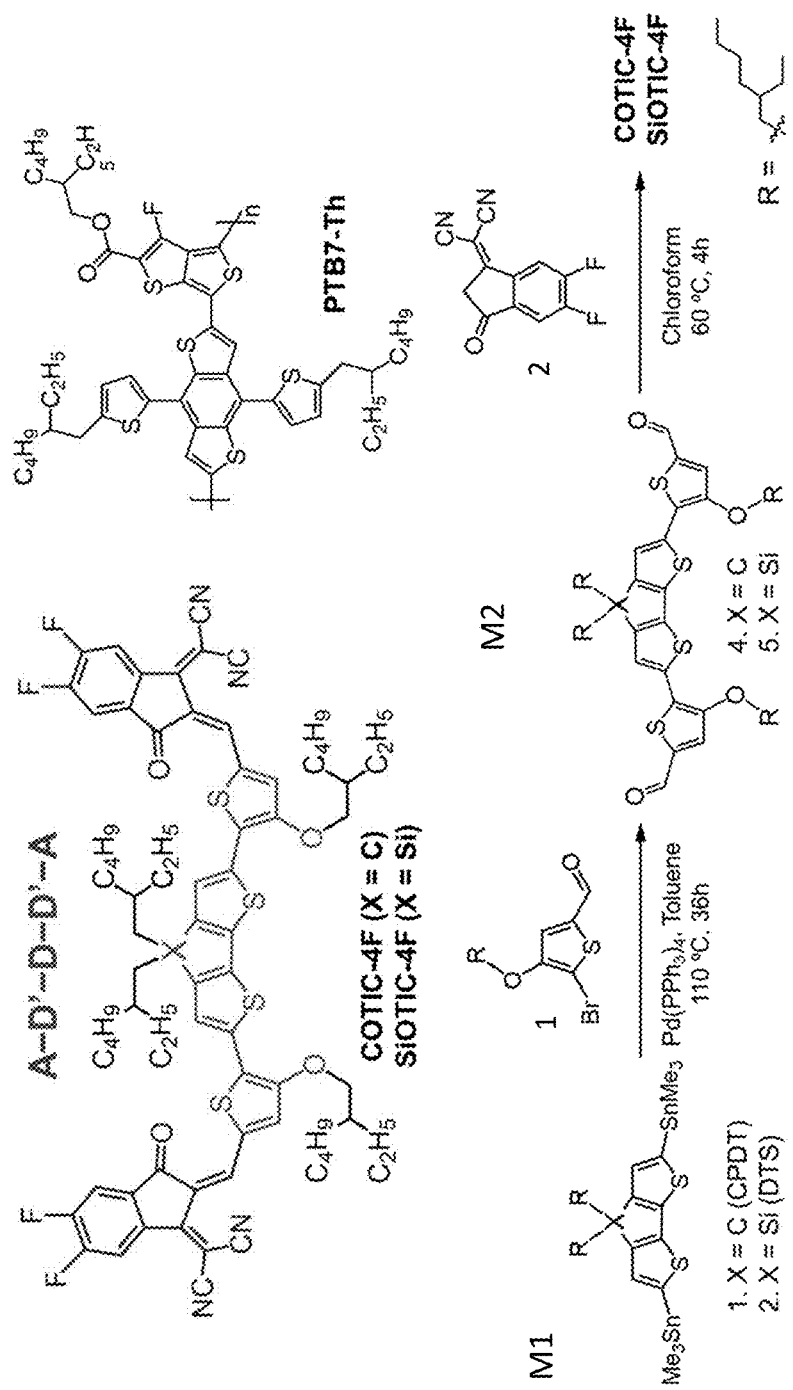
FIG. 11A. Molecular Structure of COTIC-4F, SiOTIC-4F, and PTB7-Th (top); Synthesis of COTIC-4F and SiOTIC-4F (bottom).
Figure 11B:
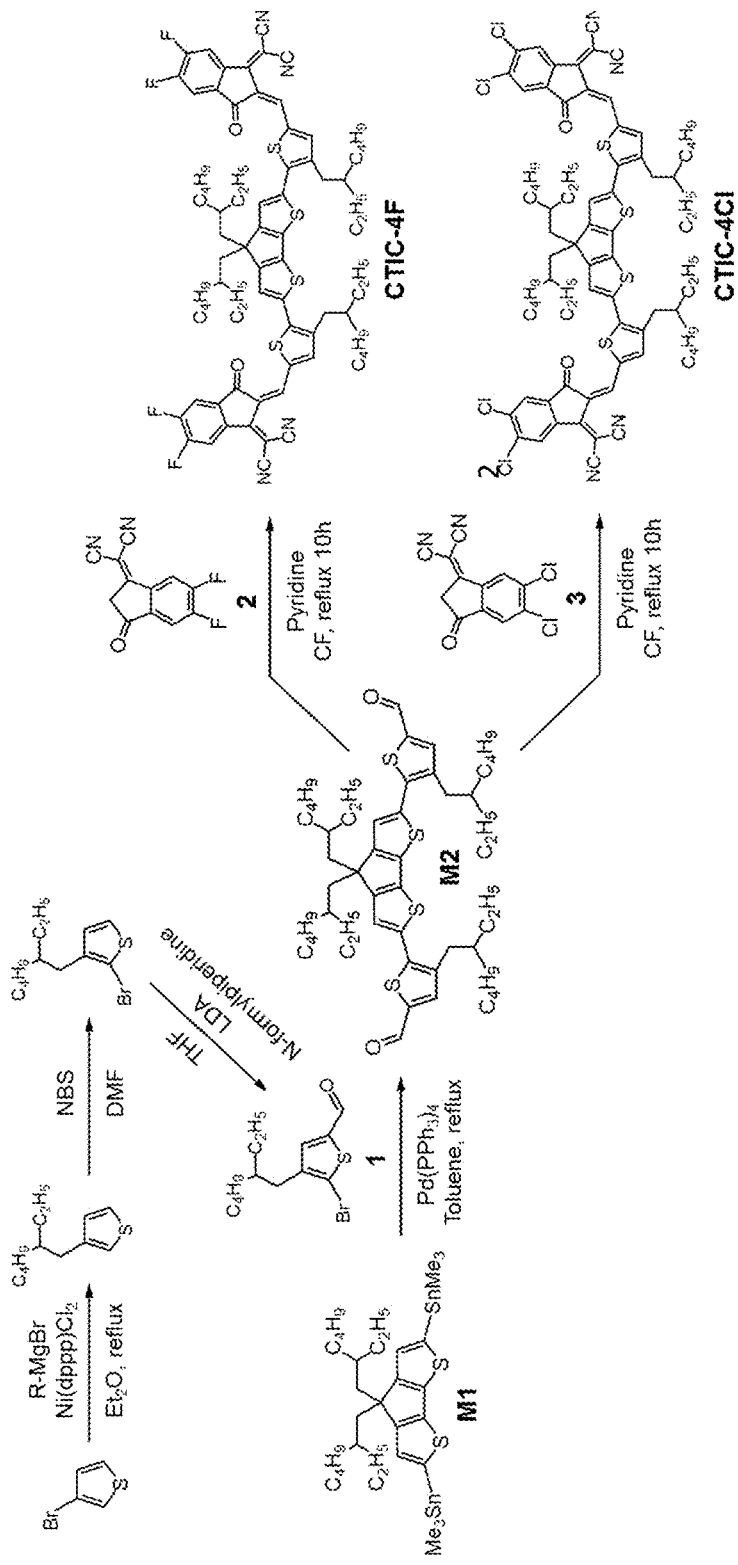
FIGS. 11B-11C. synthetic routes for exemplary DTX based NFAs according to a second embodiment.

FIG. 11A shows the synthetic route of COTIC-4F and SiOTIC-4F by means of two reactions. A Stille coupling reaction between (4,4'-di-2-ethylhexyl-4H-cyclopenta[1,2-b:5,4-b']dithiophene-2,6-diyl)bis(trimethylstanne) (M1) and 5-bromo-4-((2-ethylhexyl)oxy)thiophene-2-carbaldehyde (1) in the presence of catalytic Pd(PPh$_3$)$_4$ in anhydrous toluene produced dialdehyde M2. Subsequently, the Knoevenagel condensation reaction between compound M2 and 2-(5,6-difluoro-3-oxo-2,3-dihydro-1H-inden-1-ylidene)malononitrile (2, IC-2F) afforded COTIC-4F in 78% yield as a dark-green solid. Similar reaction conditions were used to prepare SiOTIC-4F in 75% yield. The new compounds were fully characterized by spectroscopic methods. COTIC-4F and SiOTIC-4F exhibit good solubility in common organic solvents such as dichloromethane, chloroform (CF), and chlorobenzene (CB) at room temperature, and good thermal stability with decomposition temperatures ($T_d$, 5% weight loss) of 328° C. and 368° C. for COTIC-4F and SiOTIC-4F, respectively, measured using thermogravimetric analysis. Each R is 2-ethylhexyl, R can also be independently hydrogen or a substituted or non-substituted alkyl, aryl or alkoxy chain. FIG. 11B illustrates a scheme for synthetic procedures of making CTIC-4F and CTIC-4Cl. A Stille coupling reaction between (4,4'-di-2-ethylhexyl-4H-cyclopenta[1,2-b:5,4-b']dithiophene-2,6-diyl)bis(trimethylstanne) (M1) and 5-bromo-4-(2-ethylhexyl)thiophene-2-carbaldehyde (1) in the presence of catalytic Pd(PPh$_3$)$_4$ in anhydrous toluene produced M2. Subsequently, Knoevenagel condensation reaction between dialdehyde M2 and 2-(5,6-difluoro-3-oxo-2,3-dihydro-1H-inden-1-ylidene)malononitrile (2) was conducted to afford CTIC-4F in 74% yield. A similar reaction condition in CTIC-4F was used for CTIC-4Cl preparation based on the monomer 3 in 71% yield. In order to provide good solubility of these NFAs in organic solvents for solution-processability, we introduced branched 2-ethlhexyl groups onto both CPDT central core and π-bridge thienyl units. Consequently, CTIC-4F and CTIC-4Cl can be easily dissolved in common organic solvents such as dichloromethane, chloroform, and chlorobenzene at room temperature.

Figure 11C:
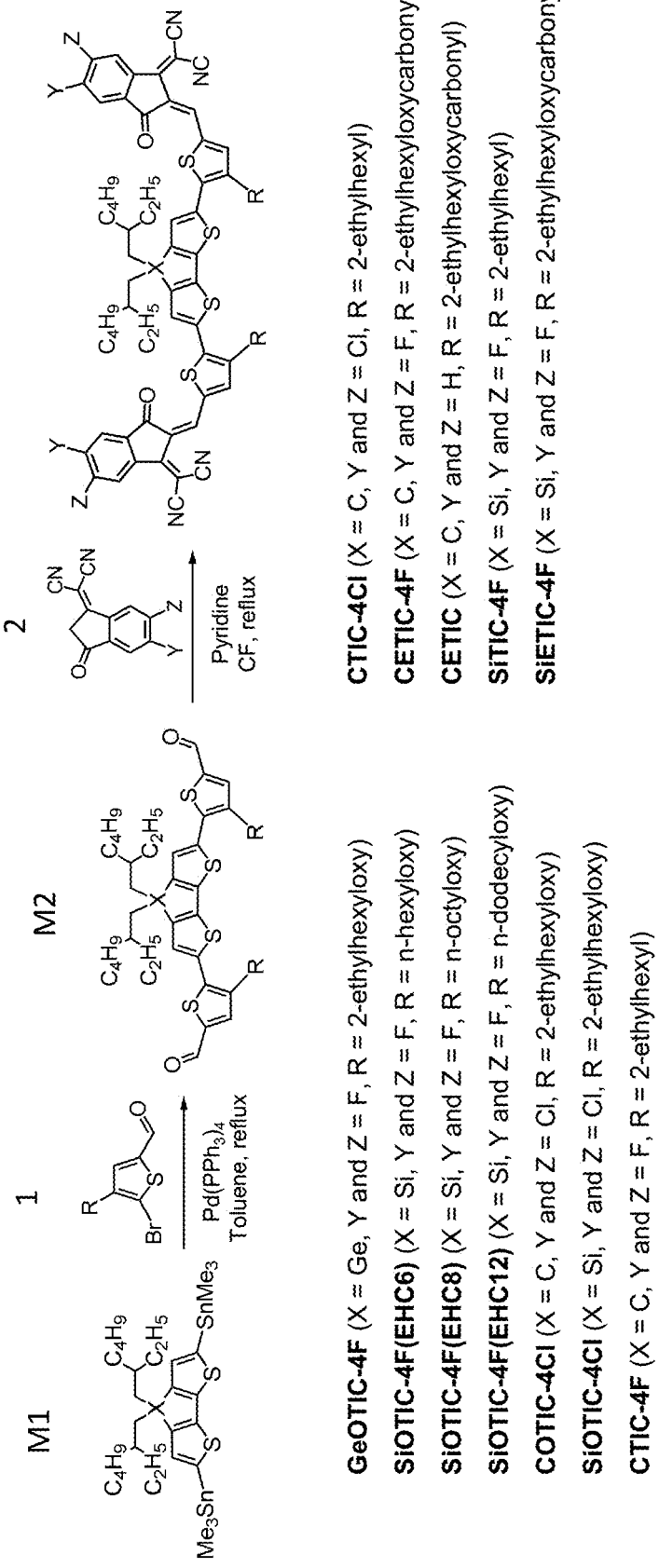
Figure 12A:
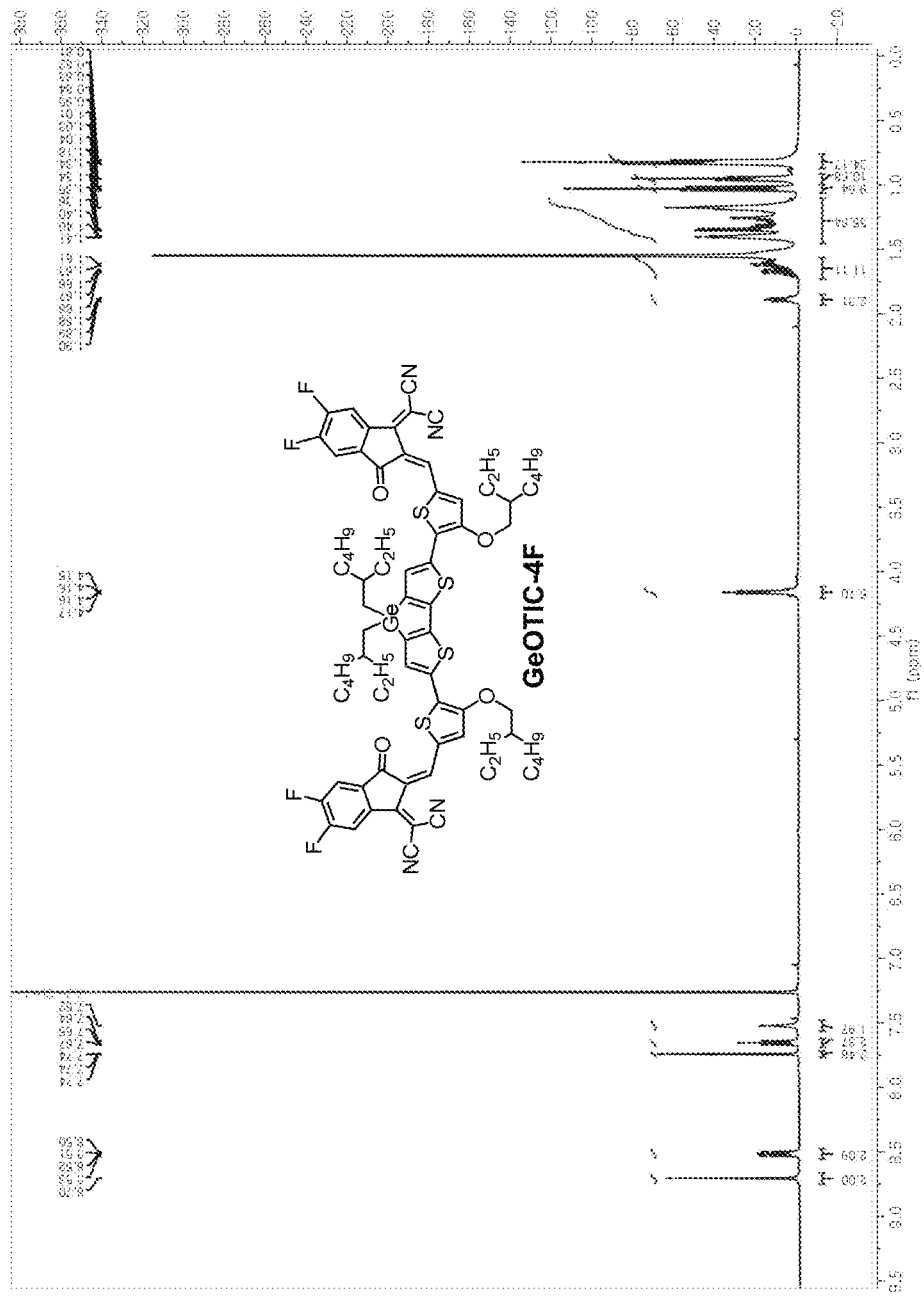
FIGS. 12A-12J. $^1$H NMR spectra of various exemplary DTX based NFAs.
Figure 12B:
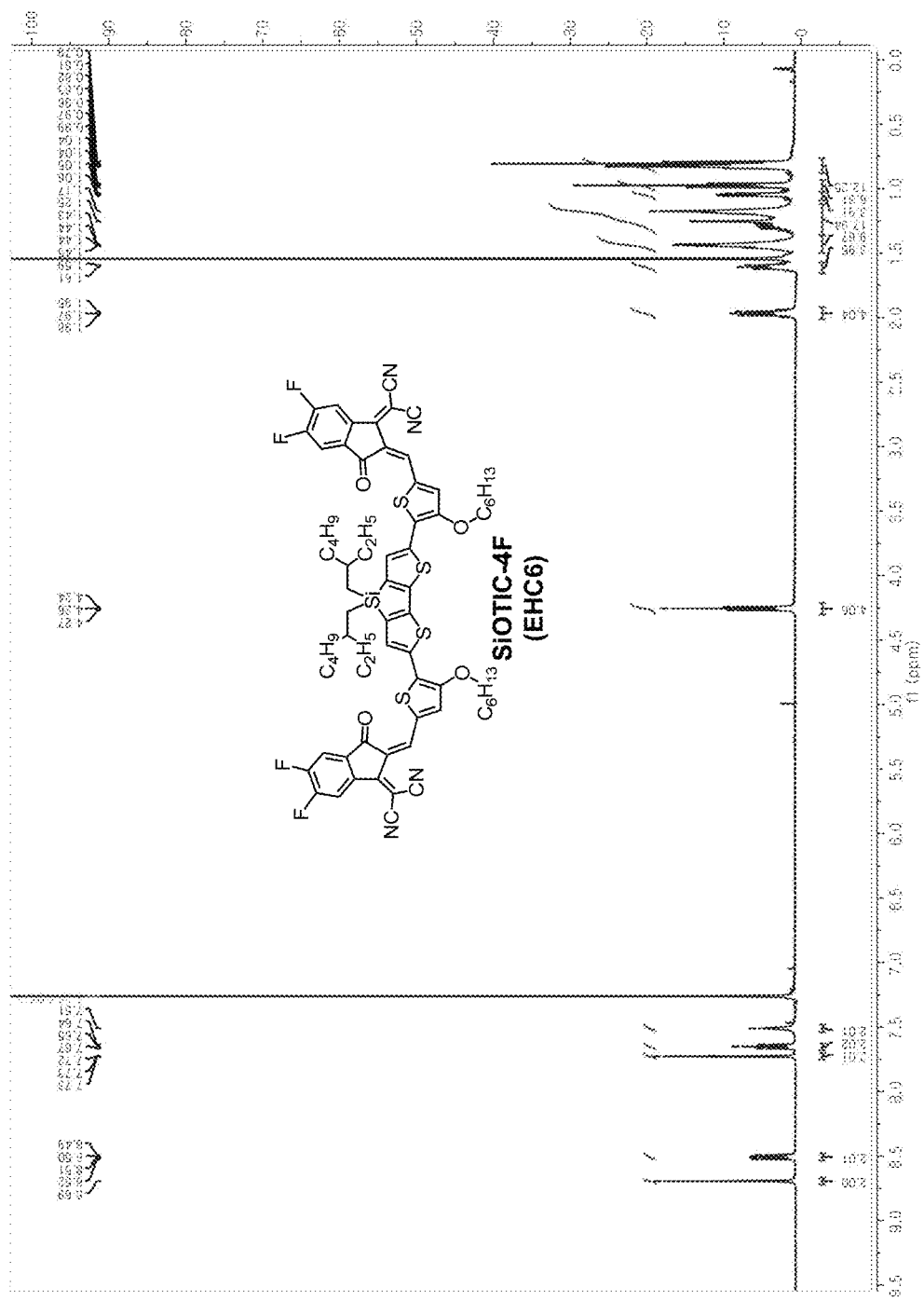
Figure 12C:
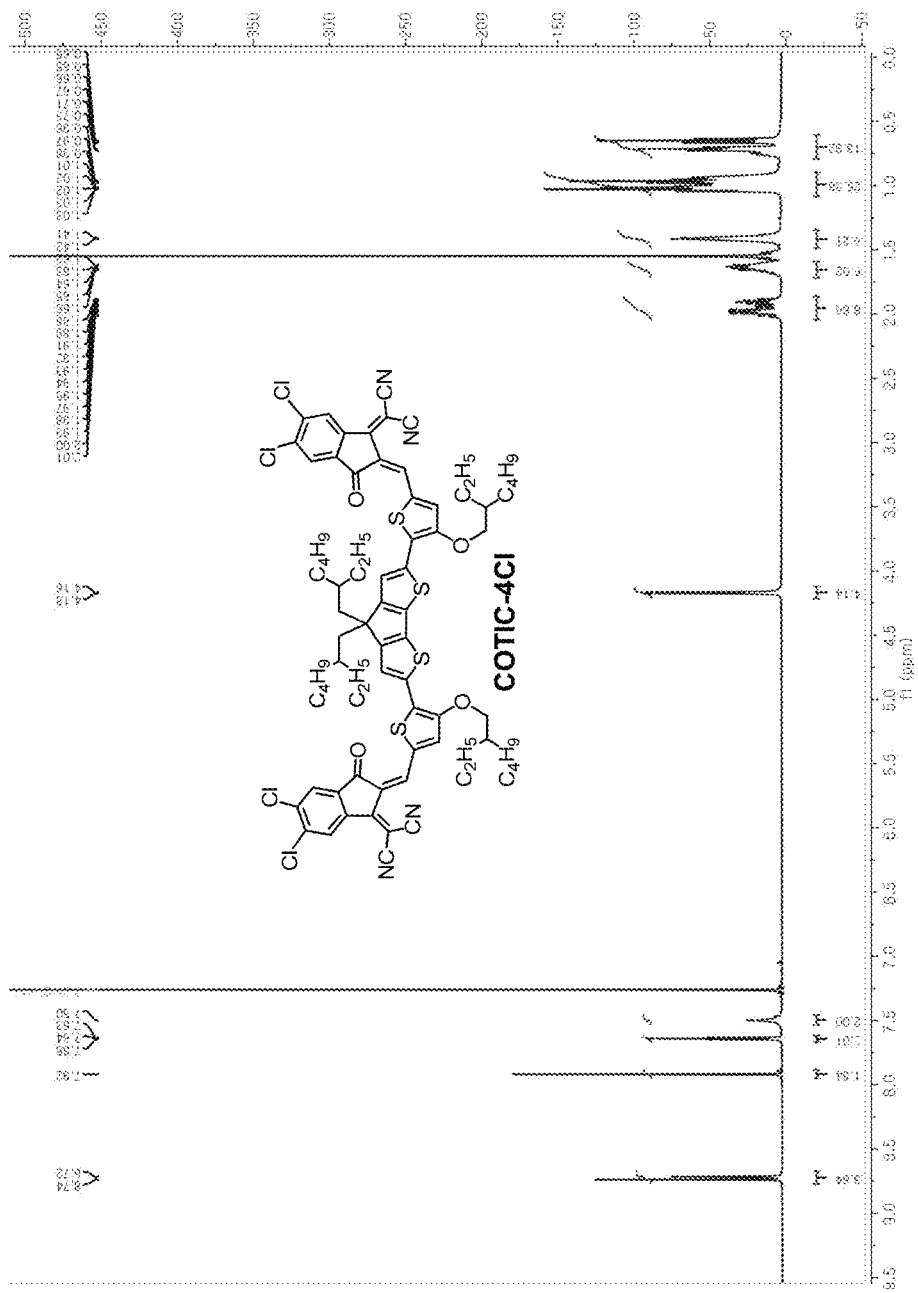
Figure 12D:
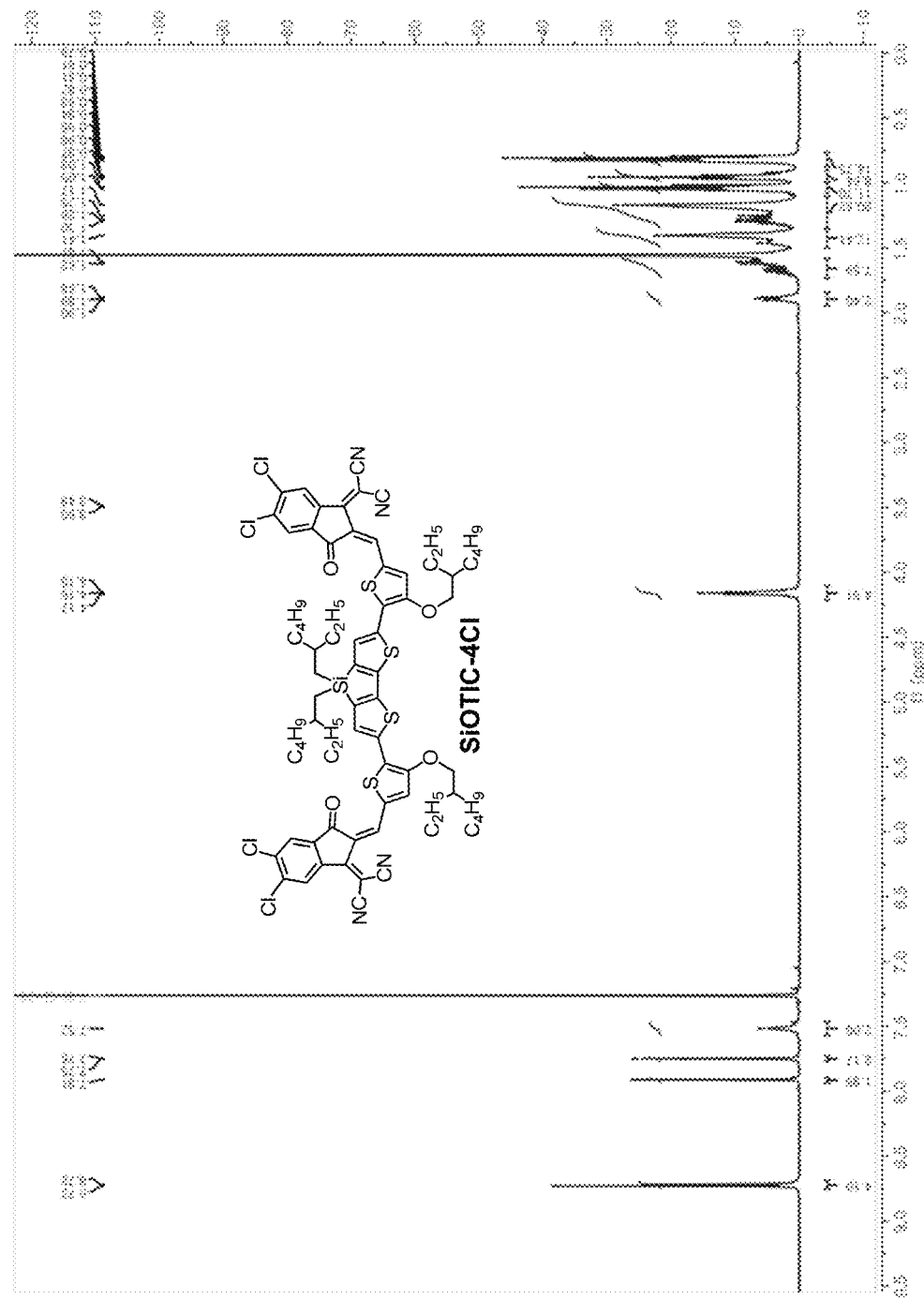
Figure 12E:
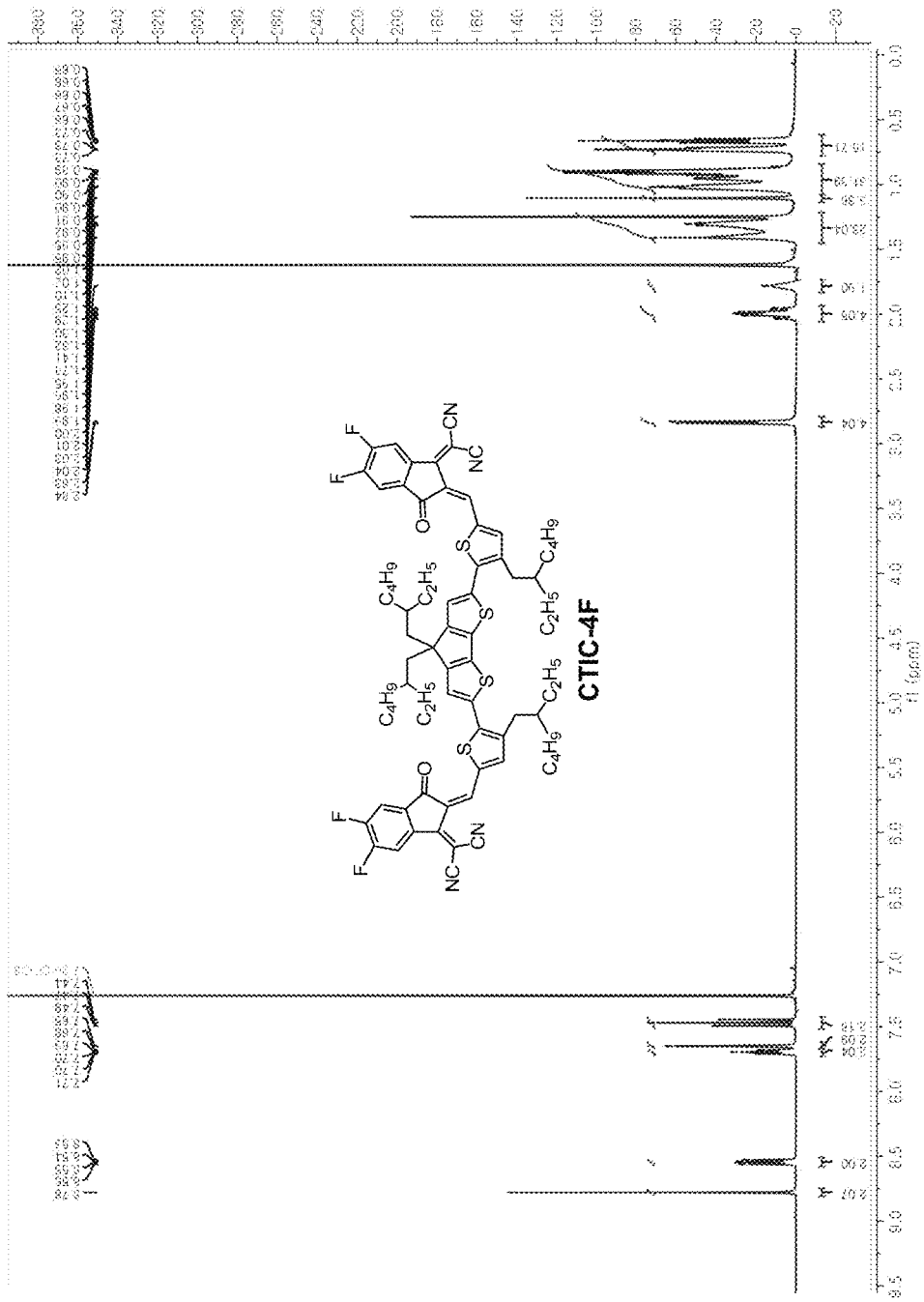
Figure 12F:
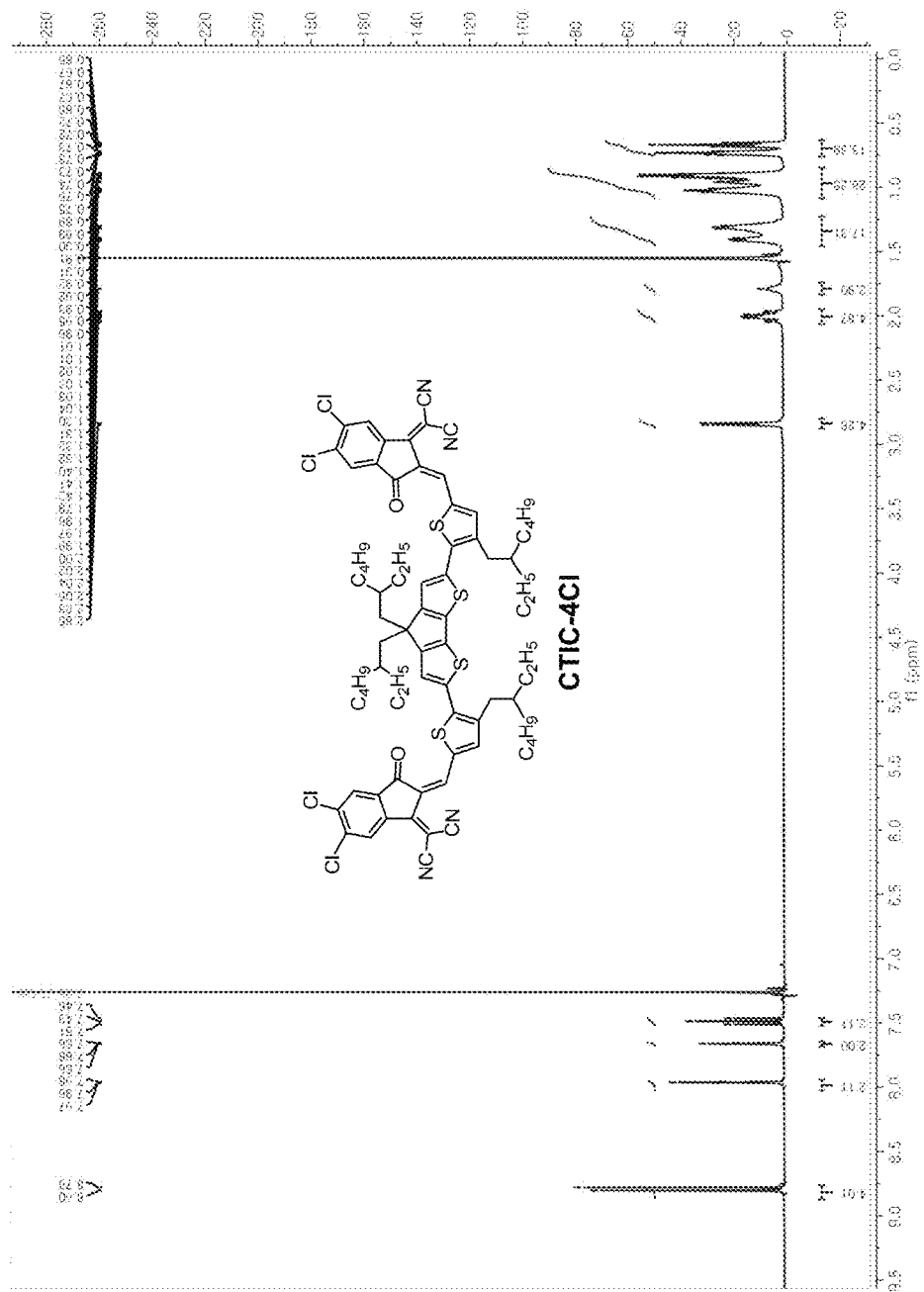
Figure 12G:
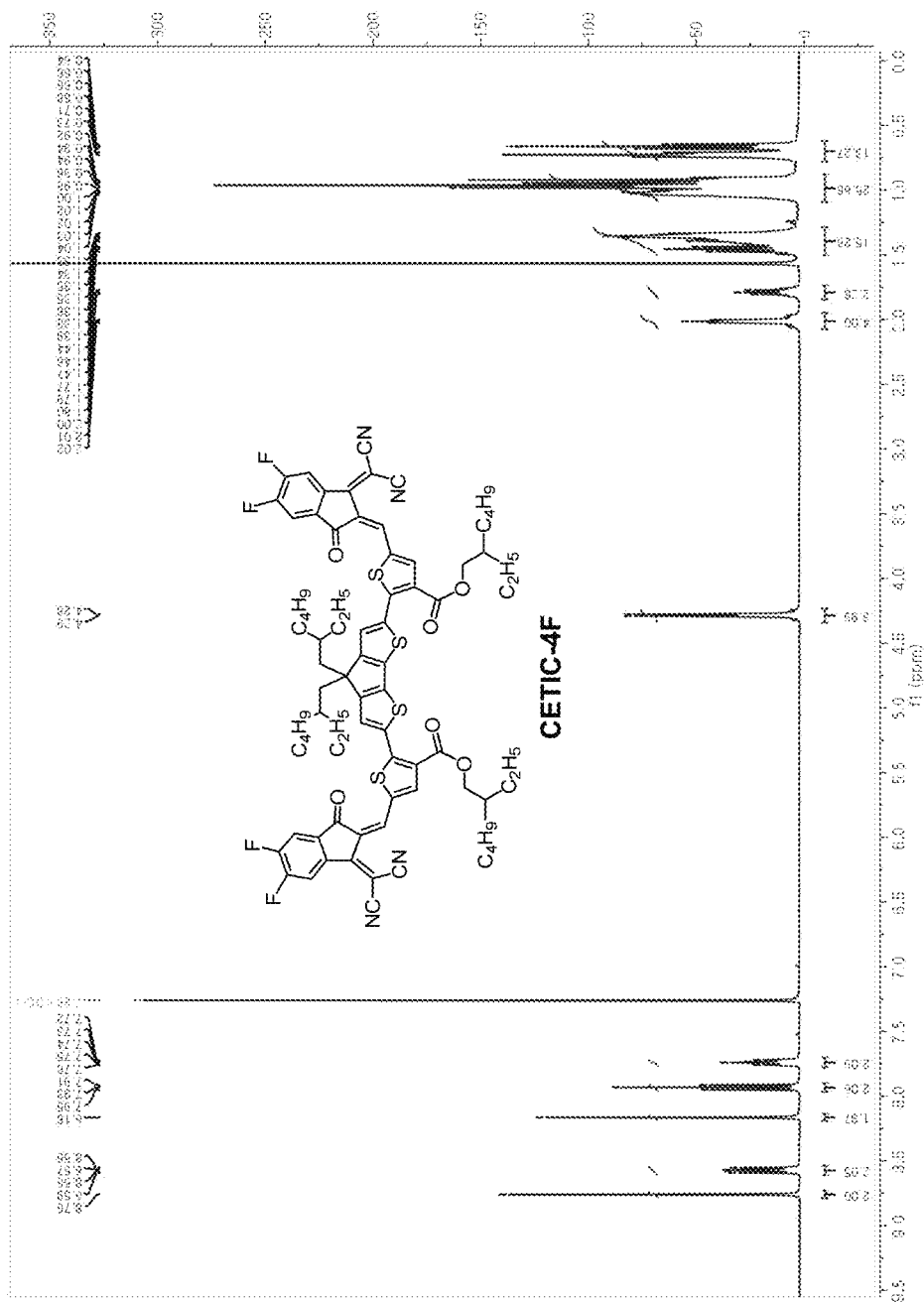
Figure 12H:
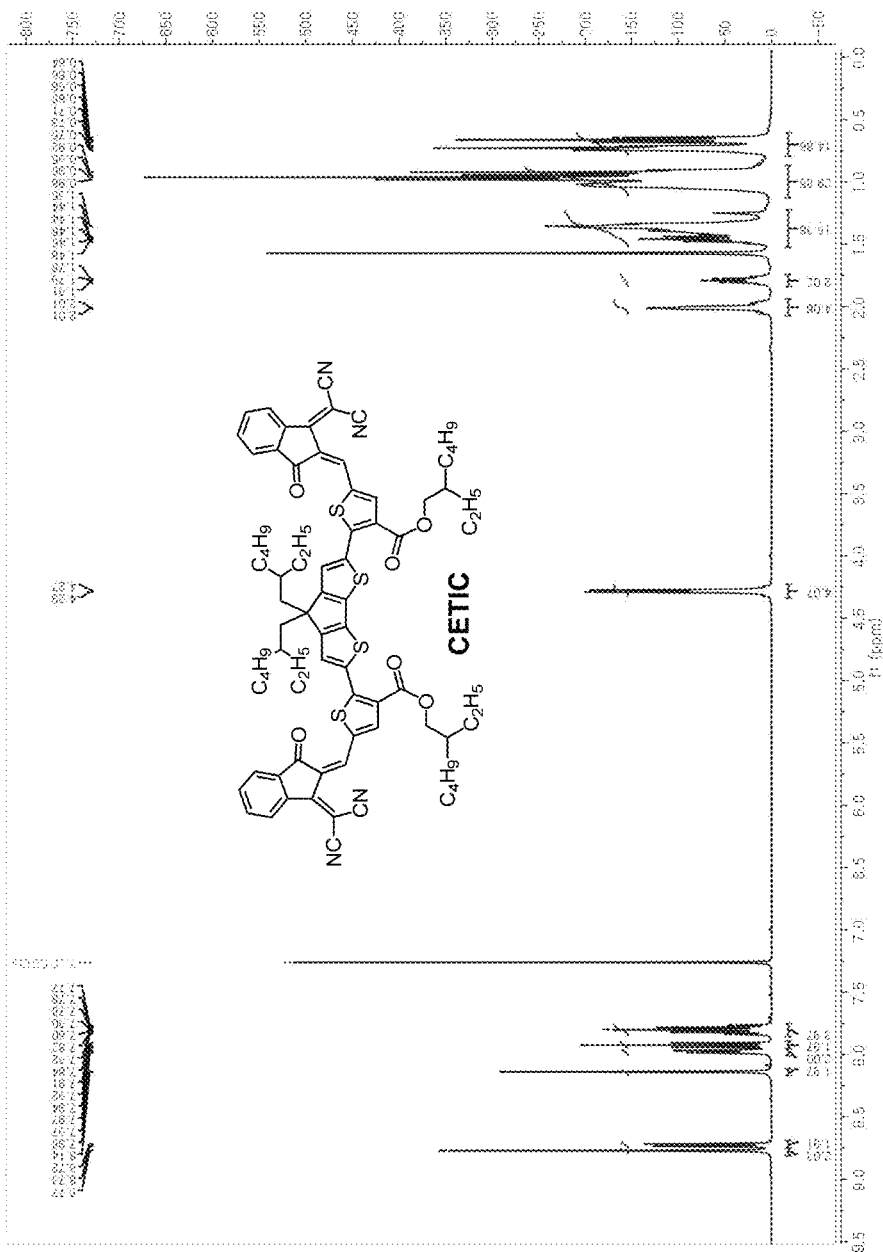
Figure 12I:
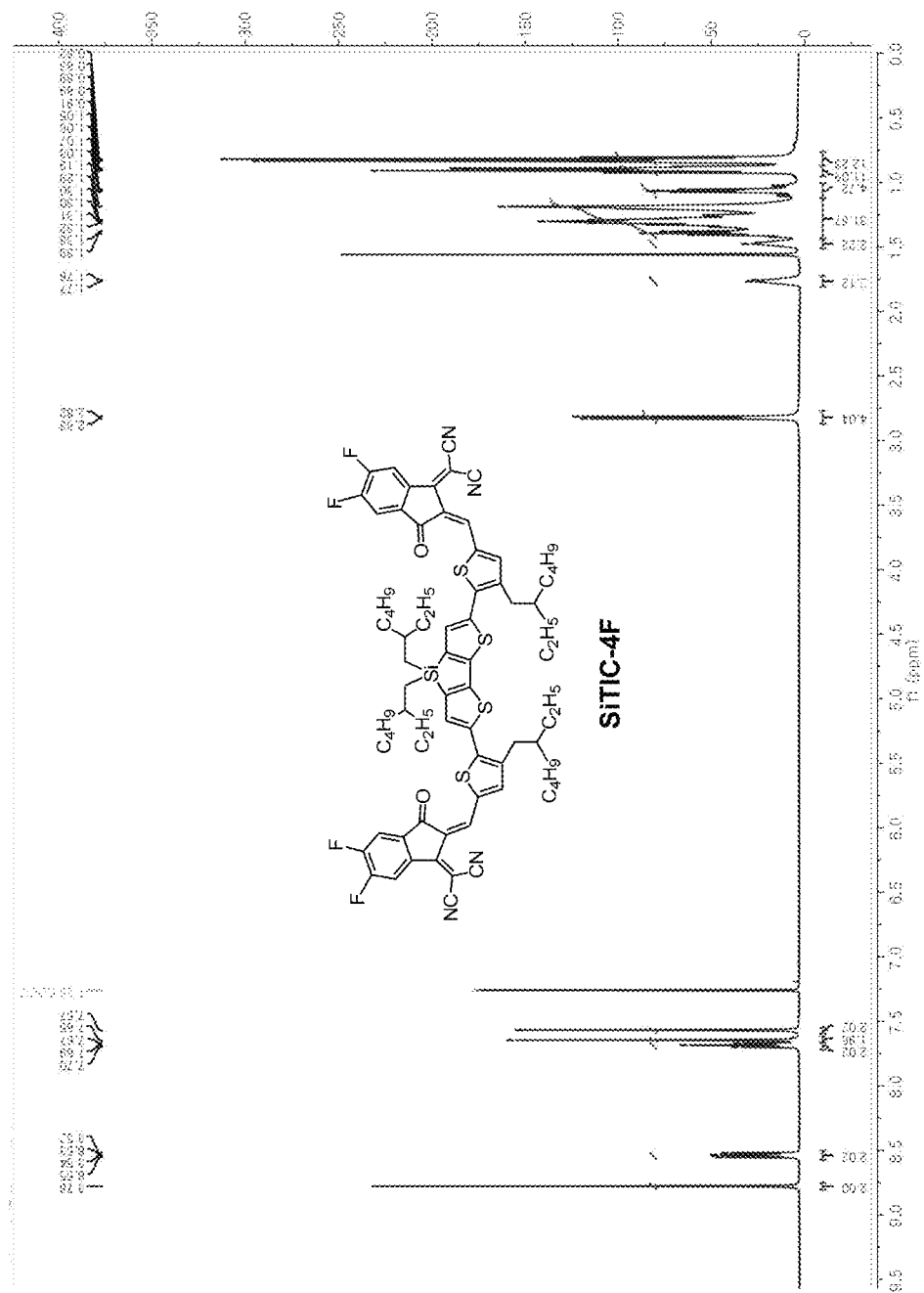
Figure 12J:
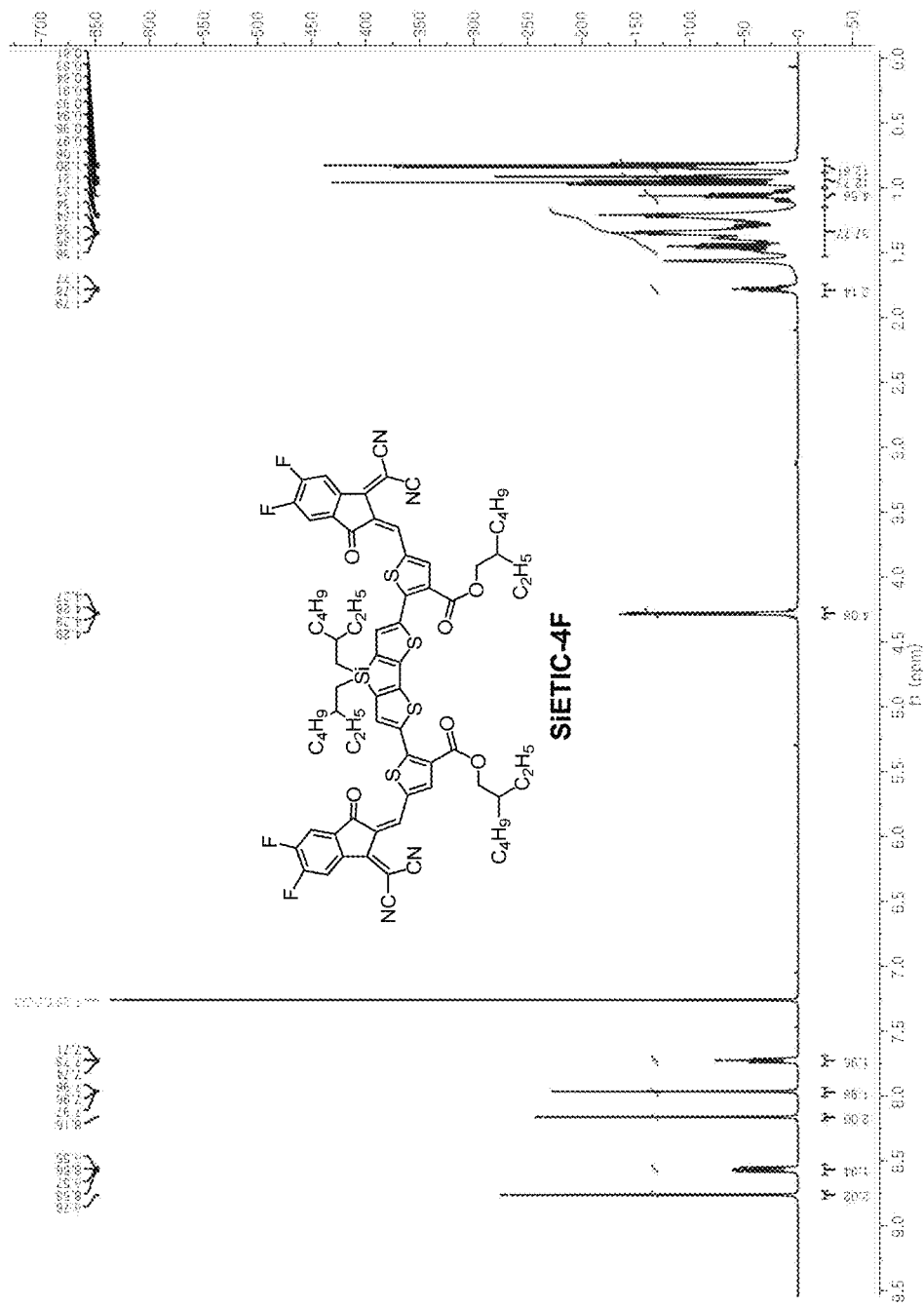

FIG. 11C illustrates a more generalized synthesis procedure. The procedure comprises a Stille coupling reaction between M1 and compound 1 in the presence of catalytic $Pd(PPh_3)_4$ in anhydrous toluene so as to produce M2. Subsequently, a Knoevenagel condensation reaction between dialdehyde M2 and compound 2 was conducted to afford the DTX based NFAs. In order to provide good solubility of these NFAs in organic solvents for solution-processability, some embodiments introduced solubilizing groups (e.g. branched 2-ethlhexyl) onto either or both DTX (e.g. CPDT, DTS, DTG) central core and π-bridge thienyl units so that the DTX-NFAs can be easily dissolved in common organic solvents such as dichloromethane, chloroform, and chlorobenzene at room temperature. Each R is independently hydrogen or a substituted or non-substituted alkyl, aryl or alkoxy chain unless indicated otherwise.

Materials. All reagents were purchased from commercial sources and used without further purification unless otherwise noted. THF was dried over Na/benzophenone. 4,4-bis (2-ethylhexyl)-4H-cyclopenta[1,2-b:5,4-b']dithiophene-2,6-diyl)bis(trimethylstannane),[1] 5-bromo-4-(2-ethylhexyl) thiophene-2-carbaldehyde,[2] 2-(5,6-difluoro-3-oxo-2,3-dihydro-1H-inden-1-ylidene)malononitrile,[3] and 2-(5,6-dichloro-3-oxo-2,3-dihydro-1H-inden-1-ylidene) malononitrile[4] was prepared by modified synthetic conditions in the literature.

5,5'-(4,4-bis (2-ethylhexyl)-4H-cyclopenta[1,2-b:5,4-b'] dithiophene-2,6-diyl)bis(4-((2-ethylhexyl)oxy)thiophene-2-carbaldehyde) (FIG. 11A, compound 4): A mixture of 4,4-bis(2-ethylhexyl)-4H-cyclopenta[1,2-b:5,4-b']dithiophene-2,6-diyl)bis(trimethylstannane), compound 1, (200 mg, 0.27 mmol), 5-bromo-4-((2-ethylhexyl)oxy)thiophene-2-carbaldehyde, compound 3, (263 mg, 0.82 mmol, 3 eq), $(Pd(PPh_3)_4)$ (25 mg), and dry toluene (10 mL) was added into a flame-dried and nitrogen-filled one-neck round-bottom flask (50 mL). The flask was purged with $N_2$ for 20 min and the reactant was heated to 120° C. for 36 h. After the mixture cooled to room temperature, DI water was added, and the mixture was extracted with dichloromethane two times (50 ml×3). The organic layer was dried over $MgSO_4$ and concentrated in vacuum. The residue was purified by silica gel column chromatography (n-hexane/dichloromethane, 3/7, Rf=0.4) to afford the product as a sticky red solid (167 mg, 69%).

$^1$H NMR (500 MHz, $CDCl_3$, ppm): δ 9.75 (s, 2H), 7.47 (s, 2H), 7.32 (s, 2H), 4.10 (d, 4H), 1.83-1.94 (m, 6H), 1.49-1.65 (m, 10H), 1.37-1.39 (m, 8H), 0.92-1.01 (m, 28H), 0.60-0.72 (m, 12H).

2,2'-((2Z,2'Z)-((5,5'-(4,4-bis (2-ethylhexyl)-4H-cyclopenta[1,2-b:5,4-b']dithiophene-2,6-diyl)bis(4-((2-ethylhexyl)oxy)thiophene-5,2-diyl))bis(methanylylidene))bis(5,6-difluoro-3-oxo-2,3-dihydro-1H-indene-2,1-diylidene)) dimalononitrile (COTIC-4F): A mixture of compound 4 (310 mg, 0.35 mmol) and 2-(5,6-difluoro-3-oxo-2,3-dihydro-1H-inden-1-ylidene)malononitrile, compound 6, (276 mg, 1.19 mmol, 3.4 eq), dry chloroform (35 mL), and pyridine (0.5 mL) was added into to a flame-dried and nitrogen-filled one-neck round-bottom flask (100 mL). The flask was purged with $N_2$ for 20 min and the reactant was heated to 50° C. for 1.5 h. After the mixture cooled to room temperature, the reaction mixture was concentrated in vacuum. The residue was purified by silica gel column chromatography (n-hexane/dichloromethane, 2/8, Rf=0.4) to afford the product as a dark green solid (361 mg, 78%).

$^1$H NMR (500 MHz, $CDCl_3$, ppm): δ 8.70 (s, 2H), 8.51 (q, 2H), 7.66 (t, 2H), 7.62 (t, 2H), 7.50 (s, 2H), 4.16 (d, 4H), 1.88-1.99 (m, 6H), 1.51-1.70 (m, 8H), 1.35-1.45 (br.s, 8H), 1.25 (s, 2H), 0.91-1.05 (m, 28H), 0.62-0.75 (m, 12H).

$^{13}$C NMR (125 MHz, $CDCl_3$): 186.39, 161.59, 161.53, 161.47, 158.28, 155.59, 155.47, 155.11, 153.54, 153.49, 153.44, 153.38, 143.37, 143.31, 143.26, 138.01, 137.96, 137.92, 136.96, 136.89, 136.75, 136.72, 136.22, 134.59, 132.00, 131.99, 131.98, 129.91, 122.83, 122.73, 122.63, 120.90, 115.18, 115.01, 114.88, 114.81, 112.65, 112.50, 75.05, 68.56, 54.15, 43.70, 39.95, 35.58, 34.26, 34.24, 30.74, 30.72, 29.92, 29.30, 29.29, 29.28, 28.67, 28.66, 27.53, 27.51, 24.18, 23.23, 23.04, 14.35, 14.21, 11.43, 10.77, 10.76.

MS (MALDI-TOF): calculated m/z 1303.70; found m/z 1303.209.

5,5'-(4,4-bis (2-ethylhexyl)-4H-silolo[3,2-b:4,5-b']dithiophene-2,6-diyl)bis (4-((2-ethylhexyl)oxy)thiophene-2-carbaldehyde) (FIG. 11A, compound 5): A similar procedure was performed with compound 4. A mixture of compound 2 (400 mg, 0.54 mmol), compound 3 (446 mg, 1.40 mmol, 2.6 eq), $(Pd(PPh_3)_4)$ (25 mg), and dry toluene (15 mL) was added into to a flame-dried and nitrogen-filled one-neck round-bottom flask (50 mL). The flask was purged with $N_2$ for 20 min and the reactant was heated to 120° C. for 36 h. After the mixture cooled to room temperature, DI water was added, and the mixture was extracted with dichloromethane for two times (50 ml×3). The organic layer was dried over $MgSO_4$ and concentrated in vacuum. The residue was purified by silica gel column chromatography (n-hexane/dichloromethane, 3/7, Rf=0.45) to afford the product as a sticky red solid (356 mg, 74%).

$^1$H NMR (500 MHz, $CDCl_3$, ppm): δ 9.76 (s, 2H), 7.48 (s, 2H), 7.40 (s, 2H), 4.10 (d, 4H), 1.82-1.87 (m, 2H), 1.47-1.68 (m, 8H), 1.34-1.45 (m, 8H), 1.14-1.25 (m, 20H), 0.92-1.02 (m, 14H), 0.75-0.84 (m, 12H).

2,2'-((2Z,2'Z)-((5,5'-(4,4-bis (2-ethylhexyl)-4H-silolo[3,2-b:4,5-b']dithiophene-2,6-diyl)bis(4-((2-ethylhexyl)oxy) thiophene-5,2-diyl))bis(methanylylidene))bis(5,6-difluoro-3-oxo-2,3-dihydro-1H-indene-2,1-diylidene)) dimalononitrile (SiOTIC-4F): A mixture of compound 5 (330 mg, 0.37 mmol) and compound 6 (288 mg, 1.25 mmol), dry chloroform (20 mL), and pyridine (0.4 mL) was added into to a flame-dried and nitrogen-filled one-neck round-bottom flask (50 mL). The flask was purged with $N_2$ for 20 min and the reactant was heated to 55° C. for 4 h. After the mixture cooled to room temperature, the reaction mixture was concentrated in vacuum. The residue was purified by silica gel column chromatography (n-hexane/dichloromethane, 2/8, Rf=0.45) to afford the product as a dark green solid (360 mg, 74%).

$^1$H NMR (500 MHz, $CDCl_3$, ppm): δ 8.70 (s, 2H), 8.51 (q, 2H), 7.74 (s, 2H), 7.65 (t, 2H), 7.52 (s, 2H), 4.16 (t, 4H), 1.89 (t, 2H), 1.54-1.70 (m, 8H), 1.35-1.45 (br.s, 8H), 1.14-1.28 (m, 20H), 0.95-1.04 (m, 14H), 0.79-0.82 (m, 12H).

$^{13}$C NMR (125 MHz, $CDCl_3$): 186.27, 158.32, 155.62, 155.52, 154.92, 153.56, 153.52, 147.22, 147.10, 146.99, 137.18, 136.93, 136.39, 134.60, 132.10, 131.44, 129.90, 121.13, 155.18, 155.01, 114.81, 114.76, 112.68, 112.53, 74.91, 68.80, 39.95, 36.07, 35.90, 30.75, 30.73, 29.30, 29.14, 29.04, 24.27, 23.26, 23.21, 17.85, 14.36, 11.49, 10.97.

MS (MALDI-TOF): calculated m/z 1319.77; found m/z 1319.258.

5,5'-(4,4-bis (2-ethylhexyl)-4H-cyclopenta[1,2-b:5,4-b'] dithiophene-2,6-diyl)bis(4-(2-ethylhexyl)thiophene-2-carbaldehyde) (FIG. 11B, M2): A mixture of compound M1 (900 mg, 1.23 mmol), 5-bromo-4-(2-ethylhexyl)thiophene-2-carbaldehyde (937 mg, 3.09 mmol, 2.5 eq), (Pd(PPh$_3$)$_4$) (71 mg, 5 mol %), and dry toluene (20 mL) was added into to a flame-dried and nitrogen-filled one-neck round-bottom flask (100 mL). The flask was purged with N$_2$ for 10 min and the reactant was heated to 120° C. for 36 h. After the mixture cooled to room temperature, DI water was added, and the mixture was extracted with dichloromethane for two times (50 ml×2). The organic layer was dried over MgSO$_4$ and concentrated in vacuum. The residue was purified by silica gel column chromatography (n-hexane/dichloromethane, 3/7) to afford the product as a sticky red solid (733 mg, 70%).

iH NMR (500 MHz, CDCl$_3$, ppm): δ 9.83 (s, 2H), 7.56 (s, 2H), 7.16 (t, 2H), 2.77 (d, 4H), 1.98-1.88 (m, 4H), 1.71 (br, 2H), 1.40-1.23 (m, 18H), 1.04-0.84 (m, 28H), 0.75-0.60 (m, 12H). $^{13}$C NMR (125 MHz, CDCl$_3$): 182.68, 158.78, 142.82, 142.80, 142.79, 140.22, 140.15, 140.14, 140.03, 139.89, 139.84, 139.42, 139.34, 139.23, 138.93, 138.90, 135.67, 135.60, 135.54, 123.05, 123.03, 54.54, 43.51, 40.23, 40.19, 35.50, 34.55, 34.53, 34.51, 34.03, 33.98, 33.94, 32.82, 32.78, 29.00, 28.96, 28.88, 28.86, 27.59, 27.56, 25.94, 25.91, 25.90, 25.87, 23.26, 23.25, 23.23, 23.01, 22.99, 14.32, 14.31, 14.26, 10.95, 10.93, 10.92, 10.91, 10.89, 10.88, 10.88, 10.86.

2,2'-((2Z,2'Z)-((5,5'-(4,4-bis (2-ethylhexyl)-4H-cyclopenta[1,2-b:5,4-b']dithiophene-2,6-diyl)bis(4-(2-ethylhexyl)thiophene-5,2-diyl))bis(methanylylidene))bis(5,6-difluoro-3-oxo-2,3-dihydro-1H-indene-2,1-diylidene)) dimalononitrile (CTIC-4F): A mixture of compound M2 (380 mg, 0.45 mmol) and 2-(5,6-difluoro-3-oxo-2,3-dihydro-1H-inden-1-ylidene)malononitrile (330 mg, 1.43 mmol, 3.2 eq), dry chloroform (20 mL), and pyridine (0.4 mL) was added into to a flame-dried and nitrogen-filled one-neck round-bottom flask (50 mL). The flask was purged with N$_2$ for 10 min and the reactant was heated to 60° C. for 10 h. After the mixture cooled to room temperature, the reaction mixture was concentrated in vacuum. The residue was purified by silica gel column chromatography (n-hexane/dichloromethane, 2/8) to afford the product as a dark brown solid (421 mg, 74%).

$^1$H NMR (500 MHz, CDCl$_3$, ppm): δ 8.78 (s, 2H), 8.55 (q, 2H), 7.70 (t, 2H), 7.65 (s, 2H), 7.47 (t, 2H), 2.84 (d, 4H), 2.05-1.95 (m, 4H), 1.78 (br, 2H), 1.43-1.24 (m, 18H), 1.12-0.86 (m, 28H), 0.75-0.63 (m, 12H). $^{13}$C NMR (125 MHz, CDCl$_3$): 186.22, 160.69, 160.67, 160.65, 158.42, 155.76, 155.65, 153.66, 153.56, 151.28, 151.26, 149.86, 149.81, 149.76, 141.16, 141.12, 141.08, 140.41, 140.32, 140.23, 137.46, 137.16, 137.14, 137.12, 136.89, 136.86, 136.82, 134.70, 134.66, 134.29, 134.25, 134.21, 123.95, 123.88, 123.82, 121.48, 115.25, 115.08, 114.48, 114.40, 112.86, 112.71, 69.89, 54.68, 43.54, 39.74, 39.72, 39.69, 35.66, 34.39, 34.37, 34.14, 34.10, 34.09, 34.07, 32.81, 32.79, 31.45, 29.90, 28.90, 28.88, 28.80, 28.79, 27.59, 27.57, 25.96, 23.27, 23.26, 23.24, 23.04, 14.33, 14.32, 14.31, 14.25, 10.92, 10.91, 10.89, 10.87, 10.86, 10.84.

2,2'-((2Z,2'Z)-((5,5'-(4,4-bis (2-ethylhexyl)-4H-cyclopenta[1,2-b:5,4-b']dithiophene-2,6-diyl)bis(4-(2-ethylhexyl)thiophene-5,2-diyl))bis(methanylylidene))bis(5,6-dichloro-3-oxo-2,3-dihydro-1H-indene-2,1-diylidene)) dimalononitrile (CTIC-4 Cl): A mixture of compound M2 (250 mg, 0.30 mmol) and 2-(5,6-dichloro-3-oxo-2,3-dihydro-1H-inden-1-ylidene)malononitrile (310 mg, 1.18 mmol, 4.0 eq), dry chloroform (20 mL), and pyridine (0.4 mL) was added into to a flame-dried and nitrogen-filled one-neck round-bottom flask (50 mL). The flask was purged with N$_2$ for 10 min and the reactant was heated to 60° C. for 10 h. After the mixture cooled to room temperature, the reaction mixture was concentrated in vacuum. The residue was purified by silica gel column chromatography (n-hexane/dichloromethane, 2/8) to afford the product as a dark brown solid (280 mg, 71%).

iH NMR (500 MHz, CDCl$_3$, ppm): δ 8.80 (s, 2H), 8.78 (s, 2H), 7.96 (t, 2H), 7.66 (s, 2H), 7.49 (t, 2H), 2.85 (d, 4H), 20.5-1.95 (m, 4H), 1.78 (br, 2H), 1.43-1.24 (m, 18H), 1.12-0.86 (m, 28H), 0.75-0.63 (m, 12H).

General procedure for DTX-based non fullerene acceptors. A similar reaction condition as for COTIC-4F was used. A mixture of bisaldehyde intermediates, end-dyes (4 eq), dry chloroform (20 mL), and pyridine (0.4 mL) was added into to a flame-dried and nitrogen-filled one-neck round-bottom flask (50 mL). The flask was purged with N$_2$ for 20 min and the reactant was heated to 60° C. for 16 h. After the mixture cooled to room temperature, the reaction mixture was concentrated in vacuum. The residue was purified by silica gel column chromatography using n-hexane/dichloromethane mixture as an eluent to afford the products.

2. Material Characterization 2.1. UV-Vis Spectra

Figures 13A, 13B:
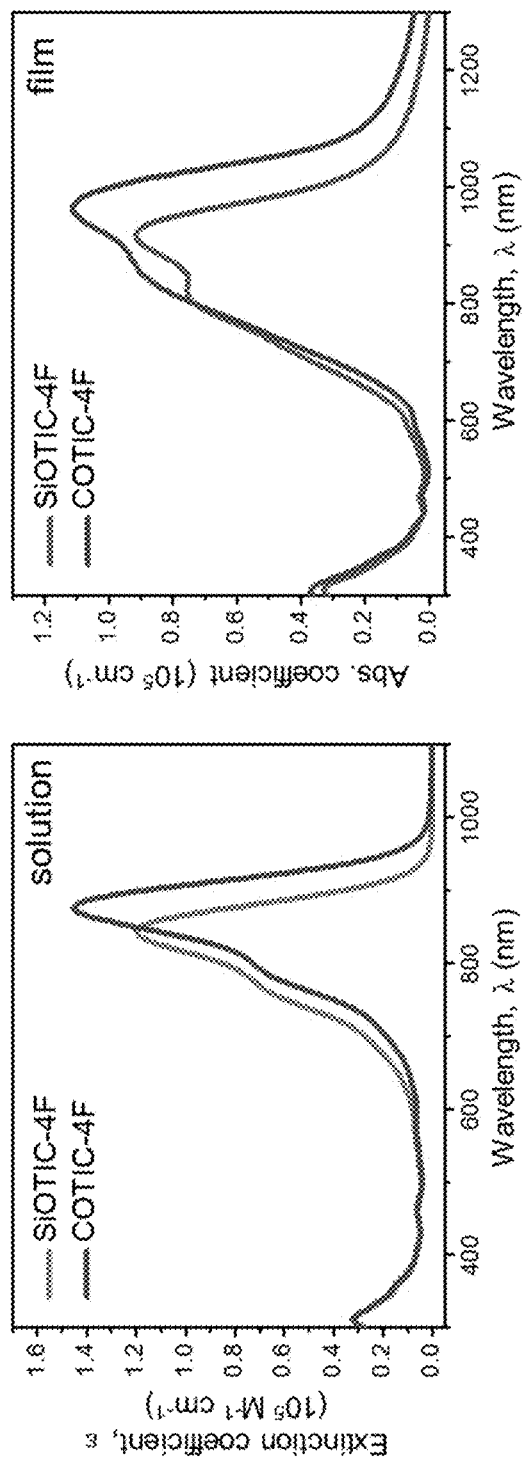
FIGS. 13A-13B. UV-vis-NIR absorption spectra of COTIC-4F and SiOTIC-4F in chloroform solution (FIG. 13A) and as a thin solid film (FIG. 13B).
Figure 13C:
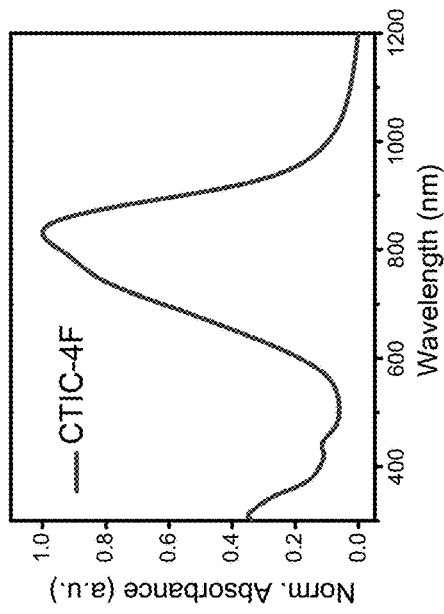
FIGS. 13C-13L. Film UV-vis-NIR absorption spectra of further examples of DTX based NFAs.
Figure 13D:
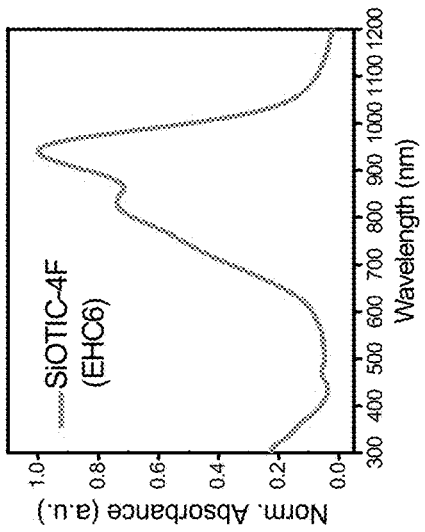
Figure 13E:
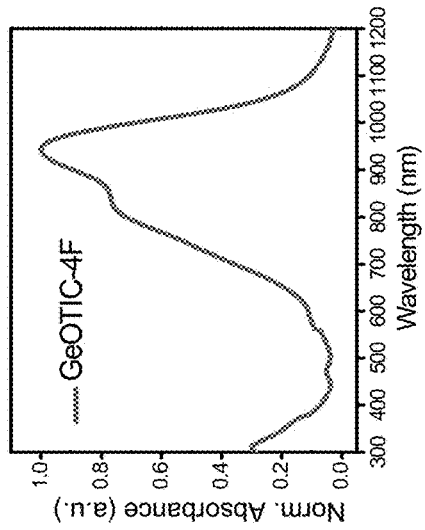
Figure 13F:
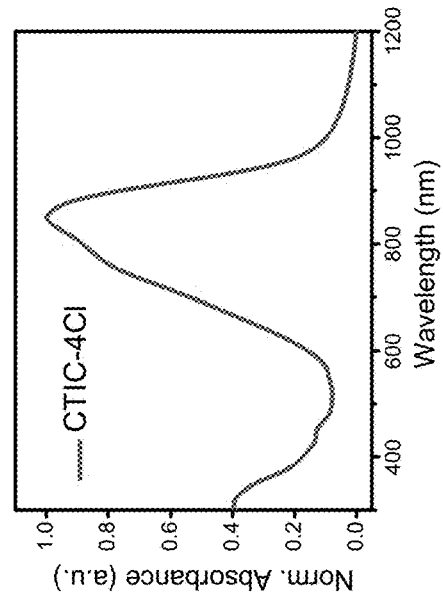
Figure 13G:
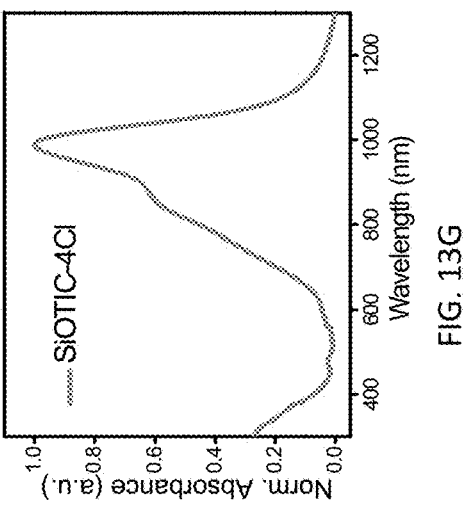
Figure 13H:
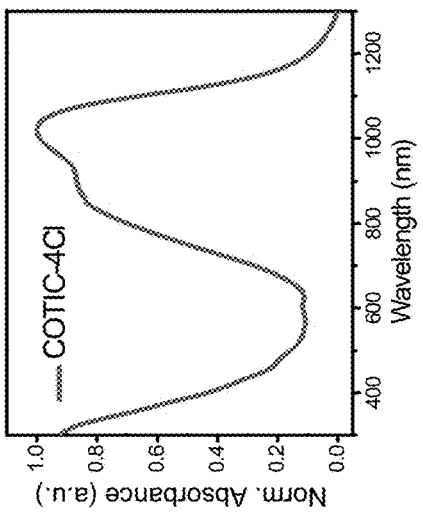
Figure 13I:
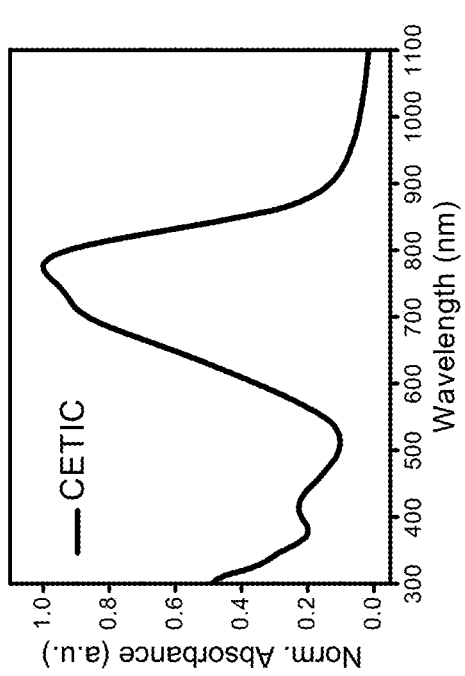
Figure 13J:
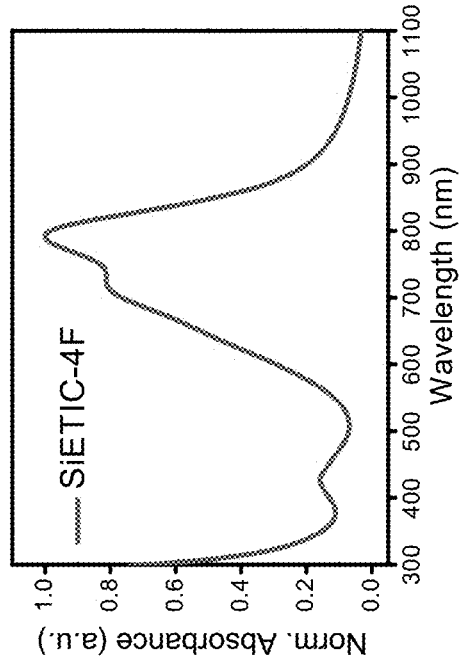
Figure 13K:
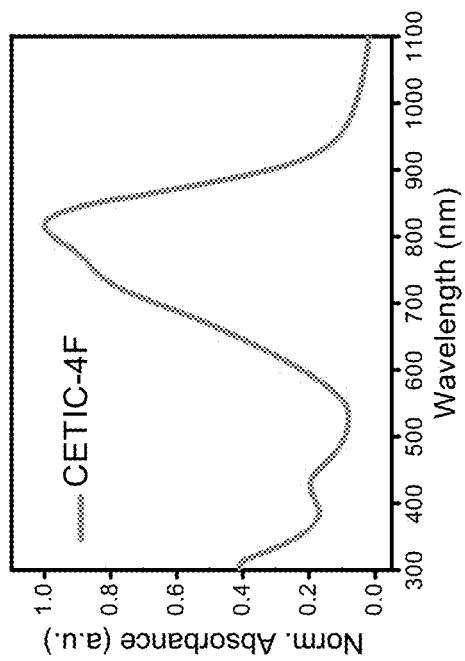
Figure 13L:
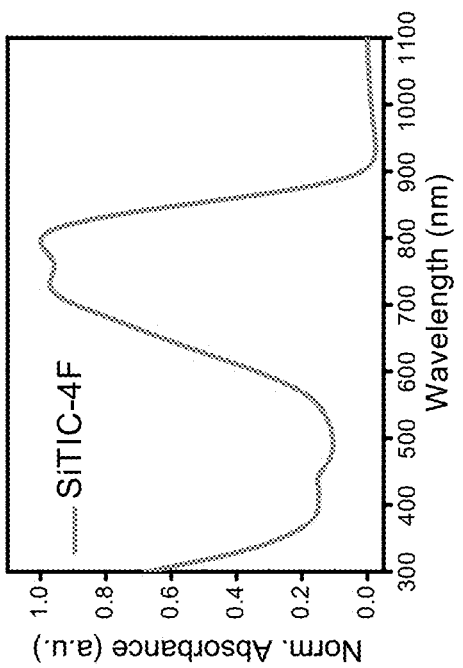

Absorption spectra of solutions and thin films of COTIC-4F and SiOTIC-4F are shown in FIGS. 13A-13B. A dilute chloroform (CF) solution of COTIC-4F displays a strong absorption in the 700-950 nm region with a maximal absorption wavelength ($\lambda_{max}$) at 875 nm, which is redshifted by ≈ 33 nm relative to that of SiOTIC-4F (FIG. 13A). The maximum extinction coefficient of COTIC-4F in CF is 1.45×10$^5$ M$^{-1}$ cm$^{-1}$, which is similar to that of SiOTIC-4F (1.20×10$^5$ M$^{-1}$ cm$^{-1}$). As shown in FIG. 13B, the absorption spectrum of a COTIC-4F film exhibits a marked redshift (~100 nm) with a $\lambda_{max}$ of 975 nm, compared to its solution. The optical bandgaps were determined by corresponding thin film absorption onsets, which provide $E_g^{opt}$ of 1.10 eV and 1.17 eV for COTIC-4F and SiOTIC-4F, respectively. Because the dominating absorptions of both NFA molecules are located in the NIR region, these materials are considered to have great potential in semitransparent OSC and NIR organic photodetector (OPD) applications.

2.2. Electrochemistry

The electrochemical cyclic voltammetry (CV) was conducted on a CHI-730B electrochemistry workstation with glassy carbon disk, Pt wire, and Ag/Ag+ electrode as the working electrode, counter electrode, and reference electrode, respectively in a 0.1 M tetrabutylammonium hexafluorophosphate (n-Bu$_4$NPF$_6$)-anhydrous acetonitrile solution at a potential scan rate of 50 mV s$^{-1}$. Thin films of samples were deposited onto the glassy carbon working electrode from a 1.5 mg mL$^{-1}$ chloroform solution. The electrochemical onsets were determined at the position where the current starts to differ from the baseline. The potential of Ag/AgCl reference electrode was internally calibrated by using the ferrocene/ferrocenium redox couple (Fc/Fc$^+$). The electrochemical energy levels were estimated by using the empirical formula: $E_{HOMO}=-(4.80+E_{onset,\ ox})$ and $E_{LUMO}=-(4.80+E_{onset,\ red})$.[12] The HOMO and LUMO energy levels of COTIC-4F were calculated as −5.26 and −4.17 eV, respectively. In comparison with COTIC-4F, the HOMO level of SiOTIC-4F was shifted downward by 0.02 eV while the LUMO was shifted upward by 0.05 eV.

Cyclic voltammetry (CV) measurements were carried out in order to estimate orbital energy levels. The HOMO and LUMO levels were deduced from the onsets of the oxidation and reduction peaks. The $HOMO_{CV}$ levels of COTIC-4F and SiOTIC-4F were calculated to be −5.26 eV and −5.28 eV, respectively. We must recognize that the $E_{HOMO}$ values are within experimental error relative to each other. From the reduction onsets, the $LUMO_{CV}$ levels were measured to be −4.17 eV and −4.12 eV for COTIC-4F and SiOTIC-4F, respectively. The LUMO levels calculated by the following equation: $E_{LUMO}=E_g^{opt}+E_{HOMO}$ are −4.16 eV and −4.11 eV for COTIC-4F and SiOTIC-4F, which are similar to the values calculated from the CV measurements. State-of-the-art NFA small molecules mostly have acceptor-donor-acceptor (A-D-A) molecular structures with deep-lying HOMO levels in the range of −5.40 to −5.60 eV.[6] Although orbital energy estimates obtained through CV contain substantial error, COTIC-4F and SiOTIC-4F possess much higher HOMO levels compared to those of A-D-A structured NFAs, which is beneficial for mitigating energy losses. In addition, because most reported narrow bandgap polymer donors (NBG-PDs) exhibit the HOMO levels below −5.20±0.1 eV, COTIC-4F and SiOTIC-4F offer opportunities for pairing with NBG-PDs.

TABLE 3

Optical and electrochemical properties of SiOTIC-4F and COTIC-4F.

| compd | $\lambda_{s, max}$ (nm)[a] | $\lambda_{f, max}$ (nm)[b] | $E_g^{opt}$ (eV)[c] | $HOMO^{CV}$ (eV)[d] | $LUMO^{CV}$ (eV)[e] | $LUMO^{opt}$ (eV)[f] | $E_g^{CV}$ (eV)[g] |
|---|---|---|---|---|---|---|---|
| COTIC-4F | 875 | 975 | 1.10 | −5.26 | −4.17 | −4.16 | 1.09 |
| SiOTIC-4F | 842 | 935 | 1.17 | −5.28 | −4.12 | −4.11 | 1.16 |

[a]Absorption maximum in solution.
[b]Absorption maximum in film.
[c]Optical band gap calculated from the absorption edge of thin film.
[d]HOMO energy level estimated from the onset oxidation potential.
[e]LUMO energy level estimated from the onset reduction potential.
[f]$LUMO^{opt}$ was calculated according to: $E_{LUMO} = E_g^{opt} + E_{HOMO}$.
[g]HOMO-LUMO gap estimated from CV.

Optical and electrochemical properties of A-D'-D-D'-A type NFAs with various D, D' and A units were listed in table 1, table 3, and table 4, and their corresponding structures were listed in FIG. 1, FIG. 2, FIG. 11 and FIG. 25. By systematically changing the electron donating and withdrawing strength of the D, D' and A units, $E_{HOMO}$ of the NFAs were successfully tuned between −5.73 eV and −5.22 eV, $E_{LUMO}$ of the NFAs were successfully tuned between −3.92 eV and −4.34 eV, and the optical bandgap were successfully tuned between 1.56 and 1.06 eV.

TABLE 4

Optical and electrochemical properties of A-D'-D-D'-A type NFAs with various D, D' and A units. Structures of the NFAs were listed in FIG. 11 and FIG. 25.

| compd | $\lambda_{f, max}$ (nm)[a] | $E_g^{opt}$ (eV)[b] | HOMO (eV)[c] | LUMO (eV)[d] | $E_g^{CV}$ (eV)[e] |
|---|---|---|---|---|---|
| IOTIC-2Cl | 842 | 1.30 | −5.40 | −3.92 | 1.48 |
| IOTIC-2Br | 843 | 1.30 | −5.43 | −3.94 | 1.49 |
| o-IO2-4F | 920 | 1.20 | −5.41 | −4.09 | 1.32 |
| IOTN-BO | 861 | 1.29 | −5.27 | −3.93 | 1.34 |
| ITOTIC-4F | 841 | 1.26 | −5.40 | −4.12 | 1.28 |
| GeOTIC-4F | 945 | 1.14 | −5.51 | −4.03 | 1.48 |
| COTIC-4Cl | 1115 | 1.06 | −5.36 | −4.09 | 1.27 |
| SiOTIC-4Cl | 990 | 1.10 | −5.36 | −4.07 | 1.29 |
| CTIC-4F | 831 | 1.30 | −5.57 | −4.10 | 1.47 |
| CTIC-4Cl | 850 | 1.29 | −5.62 | −4.03 | 1.59 |
| CETIC-4F | 822 | 1.33 | −5.70 | −4.19 | 1.51 |
| CETIC | 777 | 1.40 | −5.63 | −4.34 | 1.29 |
| SiTIC-4F | 796 | 1.39 | −5.61 | −4.05 | 1.56 |
| SiETIC-4F | 793 | 1.40 | −5.73 | −4.14 | 1.59 |

[a]Absorption maximum in film.
[b]Optical band gap calculated from the absorption edge of thin film.
[c]HOMO energy level estimated from the onset oxidation potential.
[d]LUMO energy level estimated from the onset reduction potential.
[e]HOMO − LUMO gap estimated from CV.

The chemical properties and applications of various NBG-NFAs in devices such as OPVs and photodetectors are studied to investigate the effects of the chemical modification.

3. Photovoltaic Performances of Bulk-Heterojunction (BHJ) Solar Cells 3.1. Device Fabrication and Characterization of Solar cells Comprising COTIC-4F or SiOTIC-4F The OSC devices using a BHJ blend of PTB7-Th as the electron donor and NFAs (COTIC-4F or SiOTIC-4F) as the acceptor were fabricated in an inverted device structure of indium-tin-oxide (ITO)/zinc oxide (ZnO)/PTB7-Th:NFA/MoO$_3$/Ag.

Figures 14, 15A, 15B:
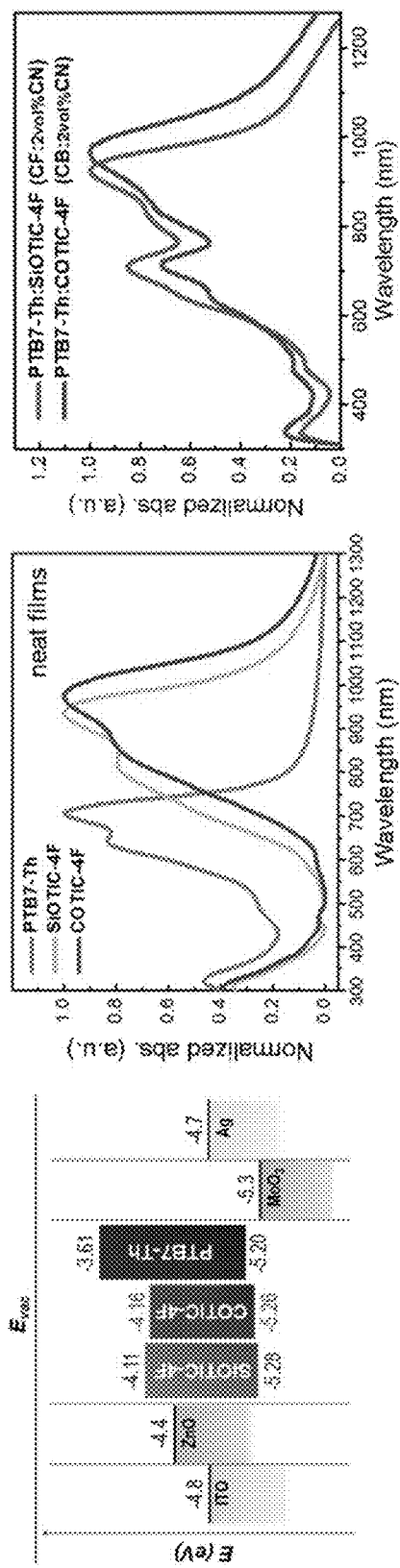
FIG. 14 Schematic energy level diagram of active layer materials obtained from film CV measurements with an inverted device configuration.
FIGS. 15A-15B. Absorption spectra of neat films (FIG. 15A) and blend films (FIG. 15B) for SiOTIC-4F (or COTIC-4F) and PTB7-Th systems.

The widely used PTB7-Th was chosen as the electron donor to pair with COTIC-4F and SiOTIC-4F acceptors based on the following considerations. First, the HOMO level (−5.20 eV) of PTB7-Th is close to the HOMO levels of the acceptors (FIG. 14), which is beneficial to minimize the charge transfer energy losses. Second, PTB7-Th shows complementary absorption properties with COTIC-4F or SiOTIC-4F, so that the donor:acceptor (D/A) blend films absorb a broad region of solar radiation from 500 nm to 1100 nm (FIGS. 15A, 15B).

Photovoltaic devices were fabricated according to the following procedures. First, the glass/ITO substrates were cleaned with detergent, then ultra-sonicated in acetone and isopropyl alcohol, and subsequently dried in an oven overnight at 100° C. The zinc oxide (ZnO) solution was prepared using mixture of diethyl zinc solution and tetrahydrofuran (THF) (1:2, v/v %) and the ZnO film (35 nm) was prepared from spin-casting at 4000 rpm for 15 s and annealing at 110° C. for 15 min.[7] The blend solution (total 20 mg/mL) of PTB7-Th (1.0 wt %):NFA (1.5 wt %) dissolved in chlorobenzene with 2 vol % 1-chloronaphthalene (CN) for COTIC-4F and chloroform with 2 vol % CN for SiOTIC-4F was spin-coated (800 to 1300 rpm for optimization) on top of the ZnO layer in a nitrogen-glove box. The device was pumped down in vacuum (<10$^{-6}$ torr), and the MoO$_3$/Ag (6 nm/100 nm thick) electrode for inverted architecture was deposited on top of the active layer by thermal evaporation. The deposited MoO$_3$/Ag electrode defined the active area as 21.5 mm$^2$. Photovoltaic characteristics measurements were carried out inside the glove box using a high quality optical fiber to guide the light from the solar simulator equipped with a Keithley 2635A source measurement unit. J-V curves were measured under AM 1.5G illumination at 100 mW cm$^{-2}$ using an aperture (10.7 mm$^2$) to define the illuminated area. EQE measurements were conducted in nitrogen-filled glove box using an EQE system. The monochromatic light intensity was calibrated using a Si photodiode and chopped at 100 Hz.

3.2. Photovoltaic Characteristics of COTIC and SIOTIC Devices

The device fabrication conditions, such as D/A weight ratio and processing solvent were varied in order to determine optimal condition. The PTB7-Th:NFA cells exhibit the best performance at a 1:1.5 D/A ratio spin coated from CB with 2 vol % 1-chloronaphthalene (CN) for COTIC-4F and CF with 2 vol % CN for SiOTIC-4F, respectively. After optimizing the device fabrication conditions, a PCE of 9.6% with a remarkably high $J_{SC}$ of 23.97 mA cm$^{-2}$ was obtained for the PTB7-Th:SiOTIC-4F-based device, which is higher than that of the PTB7-Th:COTIC-4F-based devices (PCE=7.8%). FIG. 15E shows the current density-voltage (J-V) curves and Table 5 summarizes the photovoltaic parameters of the optimized OSC devices.

TABLE 5

Performance of the OPVs based on PTB7-Th:NFAs.

| blends[a] | $V_{OC}$ (V) | $J_{SC}$ (mA cm$^{-2}$) | FF (%) | PCE$_{ave\ (max)}$ (%)[b] |
|---|---|---|---|---|
| SiOTIC-4F | 0.65 ± 0.003 | 23.44 ± 1.04 | 61.4 ± 1.04 | 9.4 ± 0.2 (9.6) |
| COTIC-4F | 0.56 ± 0.009 | 21.41 ± 1.22 | 56.3 ± 0.04 | 7.0 ± 0.6 (7.8) |

[a]PTB7-Th:NFA = 1:1.5 (w/w), 2% CN (v/v).
[b]Average values from 15 devices.

Figure 15D:
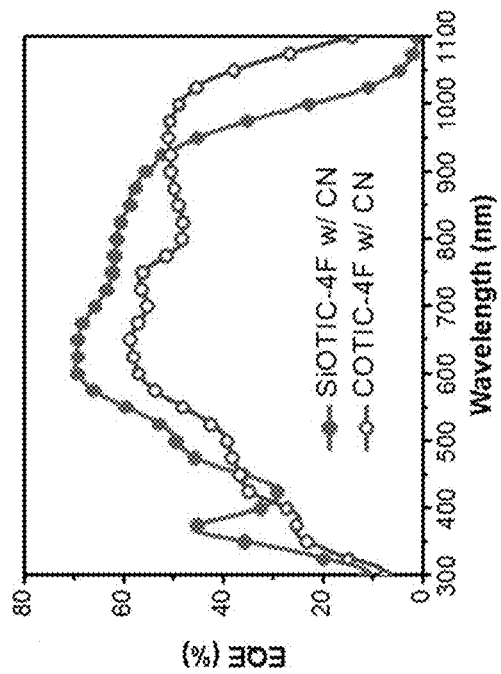
FIGS. 15C-15D. J-V characteristics (FIG. 15D) and EQE spectra (FIG. 15E) of the OPV devices comprising SiOTIC-4F or COTIC-4F blended with PTB7-Th under illumination of an AM 1.5 G at 100 mW cm$^{-2}$.
Figure 15C:
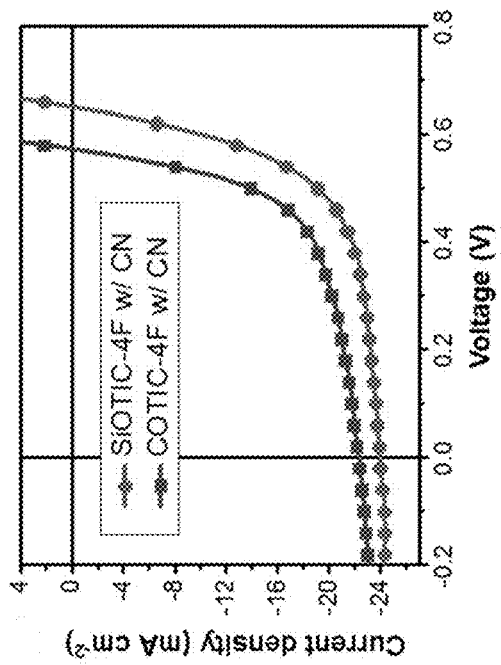

The external quantum efficiency (EQE) spectra of the optimized devices with 2% CN as an additive are shown in FIG. 15D and show a broad spectral response in the region of 300-1050 nm for SiOTIC-4F and 300-1150 nm for COTIC-4F, indicating that both blend components contribute to the $J_{SC}$. The EQE of the PTB7-Th:SiOTIC-4F blend is above 55% in the wavelength range of 550-900 nm with the maximum value approaching 70% at 610 nm. This result indicates that, despite a very small energetic offset between donor and acceptor HOMO levels (<0.1±0.05 eV), efficient hole transfer from the NFA to the PTB7-Th occurs (note: the energetic offset calculated from the CV measurement has large potential errors). The PTB7-Th:SiOTIC-4F-based optimized devices exhibited an average $V_{OC}$ of 0.65 V, indicating that the $E_{loss}$ is estimated to be ~0.52 eV. Charge transport properties were measured using hole- and electron-only devices. Using the space charge-limited current (SCLC) method, the hole and electron mobilities of PTB7-Th:SiOTIC-4F were estimated to be 3.3×10$^{-4}$ and 9.8×10$^{-5}$ cm$^2$ V$^{-1}$ s$^{-1}$, and of PTB7-Th:COTIC-4F were estimated to be 2.1×10$^{-4}$ and 8.5×10$^{-5}$ cm$^2$ V$^{-1}$ s$^{-1}$ respectively. The balanced hole/electron mobilities in the blend film are beneficial for reducing space charge accumulation and thus facilitating charge extraction. Overall, the wide-range light harvesting and efficient photon-to-current conversion contribute to the high $J_{SC}$ and PCEs. Meanwhile, the average visible transmittances (AVT, 370-740 nm) of the ITO glass/ZnO/BHJ films are 53 and 49% for SiOTIC-4F and COTIC-4F, respectively. Thus, SiOTIC-4F and COTIC-4F have great potential in semitransparent OSC applications.

3.3 Solar Cells Comprising CTIC-4F and CTIC-4Cl

Figure 15F:
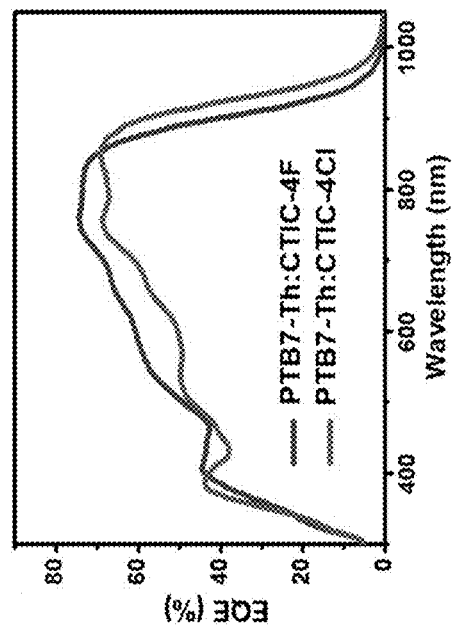
FIGS. 15E-15F. J-V characteristics (FIG. 15F) and EQE spectra (FIG. 15G) of the OPV devices comprising CTIC-4F or CTIC-4Cl blended with PTB7-Th under illumination of an AM 1.5 G at 100 mW cm$^{-2}$.
Figure 15E:
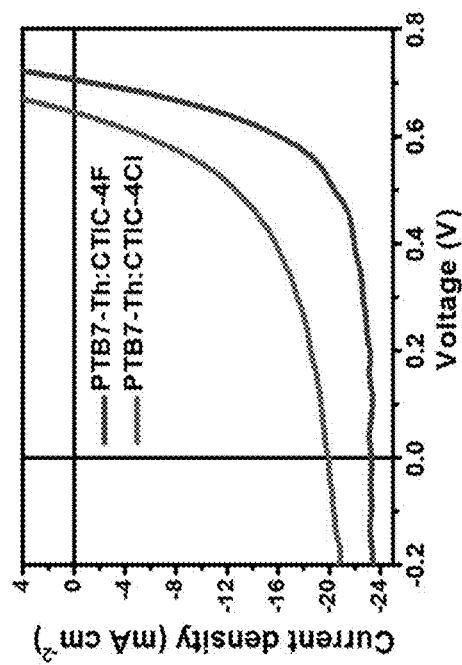
Figures 15M, 15N, 15O:
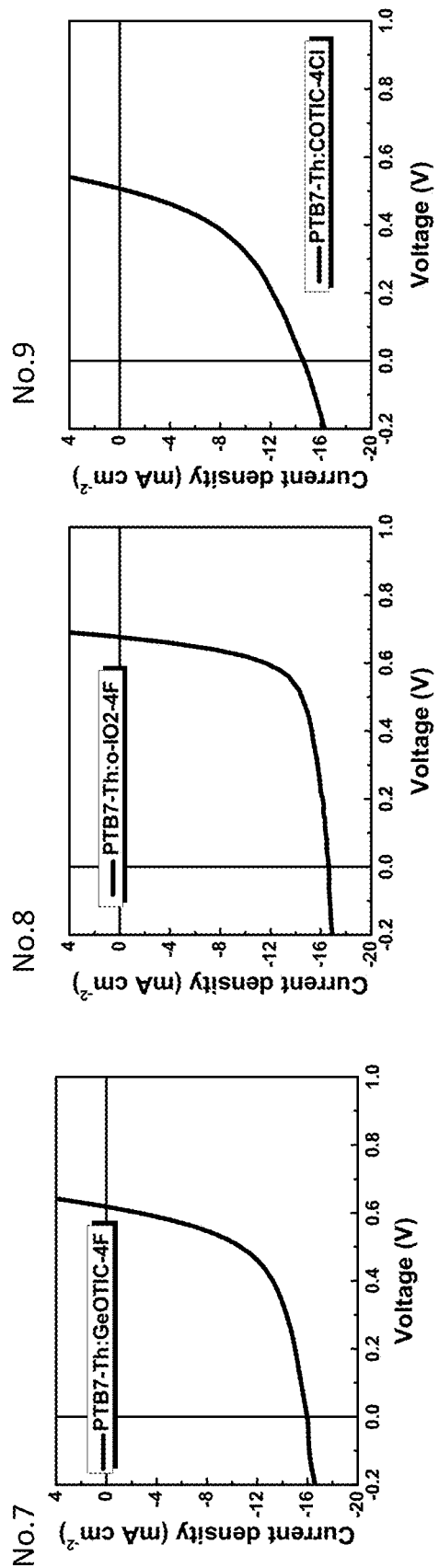

To evaluate the performance of CTIC-4F and CTIC-4Cl, solar cells were fabricated with the architecture ITO/ZnO/PTB7-Th:NFA/MoO$_3$/Ag. Widely used PTB7-Th was chosen as the electron donor. Best performance was obtained at a 1:1.5 PTB7-Th/NFA ratio spin coated from CB with 2 vol % 1-chloronaphthalene (CN). After optimizing the device fabrication conditions, a PCE of 10.5.0% with a high $J_{SC}$ of 23.4 mA cm$^{-2}$ was obtained for the PTB7-Th:CTIC-4F-based device, which is higher than that of the PTB7-Th:CTIC-4Cl-based counterpart (PCE=6.5%). FIG. 15E shows the current density-voltage (J-V) curves and Table 6 summarizes relevant photovoltaic parameters of the optimized OSC devices. EQE spectra of the optimized devices are shown in FIG. 15F. One observes a high near-infrared response in the 700-900 nm region with EQE$_{max}$ of ~75% for CTIC-4F and ~70% for CTIC-4Cl, indicating that an efficient charge transfer occurs from NFAs to PTB7-Th in the devices.

TABLE 6

Performance of solar cell devices based on PTB7-Th:NFAs blends.

| blends[a] | additive | $V_{OC}$ (V) | $J_{SC}$ (mA cm$^{-2}$) | FF (%) | PCE$_{max}$ (%) |
|---|---|---|---|---|---|
| CTIC-4F | 2% CN | 0.701 | 24.1 | 59.6 | 10.1 |
| CTIC-4Cl | 2% CN | 0.645 | 20.0 | 50.6 | 6.5 |

[a]PTB7-Th:NFA ratio is 1:1.5 (w/w).

FIGS. 15G-15O and Table 7 summarize solar cell performance based on blends including various example DTX based NFAs (the data referenced by numbers in the FIGs. refers to the respective sample number in Table 7).

TABLE 7

| No. | NFAs | Blend system | Solvent | $V_{OC}$ (V) | $J_{SC}$ (mA cm$^{-2}$) | FF | PCE (%)[c,d] |
|---|---|---|---|---|---|---|---|
| 1 | CTIC | PM2:CTIC | CB | 0.92 | 7.44 | 0.47 | 3.23 |
| 2 | CTIC-4F | PTB7-Th:CTIC-4F | CB:2% CN | 0.71 | 23.36 | 0.64 | 10.5 |
|  |  | PBDBT:CTIC-4F | CB:2% CN | 0.75 | 18.56 | 0.52 | 7.23 |
| 3 | CTIC-4Cl | PTB7-Th:CTIC-4Cl | CB | 0.65 | 19.95 | 0.51 | 6.7 |
| 4 | CETIC | PM2:CETIC | CF:CB | 0.88 | 15.52 | 0.58 | 7.9 |
| 5 | CETIC-4F | PTB7-Th:CETIC-4F | CB:2% CN | 0.65 | 19.92 | 0.62 | 8.1 |
|  |  | PBDB-T:CETIC-4F | CB:2% CN | 0.72 | 16.6 | 0.53 | 6.5 |
| 6 | SiETIC-4F | PM2:SiETIC-4F | CF:CB | 0.77 | 11.89 | 0.52 | 4.7 |
|  |  | PTB7-Th:SiETIC-4F | CF:0.2% CN | 0.72 | 15.24 | 0.60 | 6.5 |
| 7 | GeOTIC-4F | PTB7-Th:GeOTIC-4F | CF:0.2% CN | 0.62 | 15.93 | 0.56 | 5.5 |

TABLE 7-continued

| No. | NFAs | Blend system | Solvent | $V_{OC}$ (V) | $J_{SC}$ (mA cm$^{-2}$) | FF | PCE (%)$^{c,d}$ |
|---|---|---|---|---|---|---|---|
| 8 | o-IO2-4F | PTB7-Th:o-IO2-4F | CB:2% CN | 0.68 | 16.65 | 0.67 | 7.5 |
| 9 | COTIC-4Cl | PCE10:COTIC-4Cl | CB:2% CN | 0.51 | 14.59 | 0.44 | 3.22 |
| 10 | p-IO2-4F | PTB7-Th:p-IO2-4F | | 0.70 | 22.95 | 0.67 | 10.7 |

4. Organic Photodetectors (OPD)

a. Example Fabrication

Figure 16A:
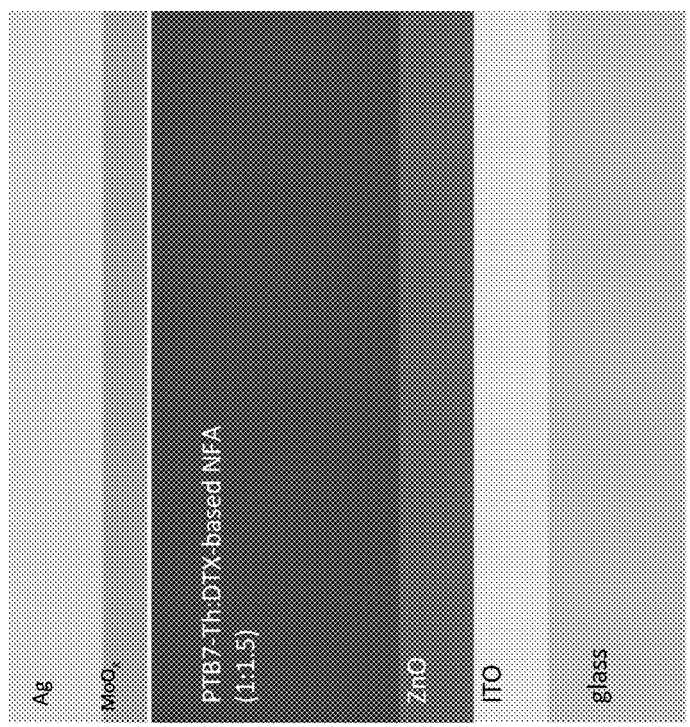
FIG. 16A. Exemplary photodetector structure.

Organic photodiodes were fabricated via spin-coating and thermal deposition. The device architectures were glass/ITO (130 nm)/ZnO$_x$ (35 nm-80 nm)/PTB7-Th:DTX-based NFA (70-600 nm)/MoO$_x$ (7 nm-100 nm)/Ag (100 nm) (as illustrated in FIG. 16A) or glass/ITO/PEDOT:PSS/active layer/Al with 70-600 nm thickness active layer.

The zinc oxide (ZnO$_x$) films were prepared by mixing 1 part diethyl zinc (15% by weight in toluene) with 1.5 parts tetrahydrofuran in an inert atmosphere glovebox (O$_2$<5 ppm). The solution was then filtered through a 0.45 μm PTFE syringe filter and removed from the glove box. 30 μL of the zinc oxide precursor solution was dropped onto pre-cleaned ITO substrates spinning at 4000 rpm.

The substrates were thermally annealed at 110° C. in air for 20 minutes. Immediately after annealing, the substrates were brought into the glovebox where 25 μL of active layer solutions were spin-cast on top (see table 8 for examples of processing conditions). The thickness of the active layer was increased by using a more concentrated solution of the donor:acceptor blend, as well as by lowering the spin speed during spin coating. The thickest films were achieved using a solution consisting of D:A (1:1.5 w/w) dissolved in chlorobenzene at a total concentration of 35 mg/mL. Chloronapthalene was used as a solvent additive at a volume ratio of 2-4%. The solution was heated to 60° C. and stirred overnight.

Films were scratched for the common cathode, then blown clean with N$_2$. Electrodes consisting of a 7-100 nm thickness of molybdenum oxide (MoO$_x$) followed by 100 nm of silver were deposited at a pressure less than 1×10$^{-6}$ torr. The device area (defined by a shadow mask) was approximately 0.20 cm$^2$.

TABLE 8

Active layer processing details. All D:A ratios are 1:1.5 (w/w).

| Donor | Acceptor | Solvent | Concentration [mg/mL] | Spin Speed [rpm] |
|---|---|---|---|---|
| PTB7-Th | COTIC-4F | CB + 2% CN | 20 | 2500 |
| PTB7-Th | SiOTIC-4F | CB + 2% CN | 20 | 2500 |
| PTB7-Th | IOTIC-2F | CB + 2% DIO | 20 | 2500 |

CB = chlorobenzene, CN = chloronapthalene, DIO = diiodooctane. Solvent additives are given as percentage by volume. Structures of COTIC-4F, SiOTIC-4F, and IOTIC-2F shown in FIGS. 16E and 16F (procedure for IOTIC-2F device shown for comparison).

b. Responsivity and Detectivity Performance

The response time of a photodetector is determined by the charge carrier mobility whereas the dark current ($J_d$) influences its detectivity. Thus, narrow band gap conjugated polymers and oligomers with high mobility are suitable for applications as organic photodetectors. Experimentally, the response time can be measured by illuminating a test device with a monochromatic near-IR diode laser coupled with a function generator to create pulses. The signal from the test device is amplified using a transimpedance amplifier and measured with an oscilloscope.

Responsivity ($\mathcal{R}$) is calculated according to the following equation:

$$\mathcal{R}(\lambda) = \frac{q\lambda}{hc} EQE(\lambda)$$

where q is the elementary charge, λ is the photon wavelength, h is Planck's constant, c is the speed of light in vacuum, and EQE is the external quantum efficiency. The units of $\mathcal{R}$ are Amps per Watt (A/W). Thus, R can be calculated directly by measuring $J_{ph}$ from the device at certain light intensity or by measuring EQE.

The specific detectivity (D*) of the devices was calculated using the following definition:

$$D^*(\lambda) = \frac{\mathcal{R}(\lambda)}{\sqrt{2qJ_{dark}}}$$

where $J_{dark}$ is the measured current density of the device at a given applied bias. In this equation, the current due to noise is approximated as $J_{dark}$. High values of D* indicate higher sensitivity or the ability to detect low light signals. To more accurately determine D*, the true noise level in the device must be measured.

The NEP (Noise Equivalent Power) is the minimum power required to distinguish signal from noise: NEP=$I_n$/R where $I_n$ is the noise current, which can be measured at different frequencies using a preamplifier and a dynamic signal analyzer or a lock-in amplifier. Thus, NEP is the ability of a detector to detect at low light level.

Figure 16B:
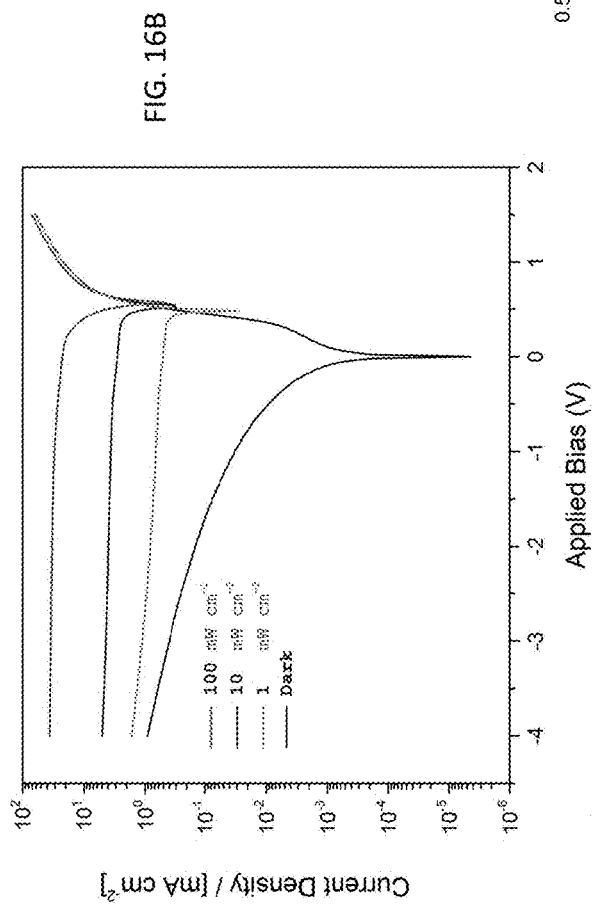
Figure 16D:
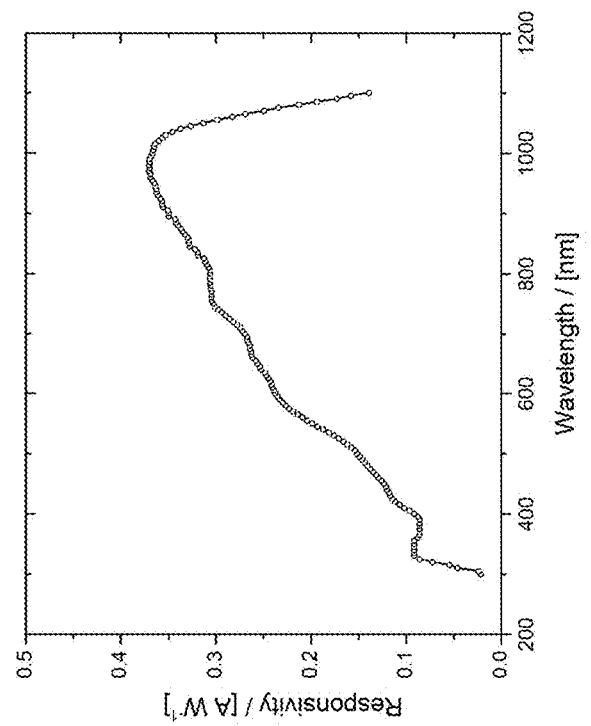
Figure 16C:
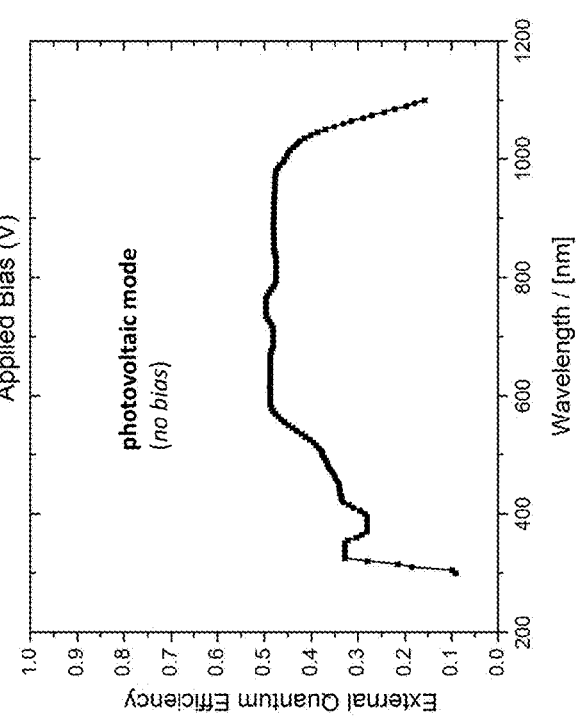
Figure 16E:
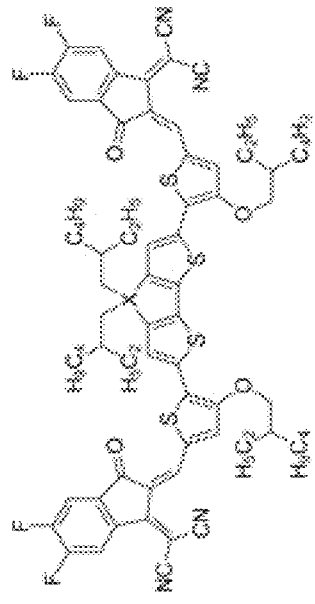
FIGS. 16E and 16F. Structures of exemplary NFAs used in photodetectors.
Figure 16F:
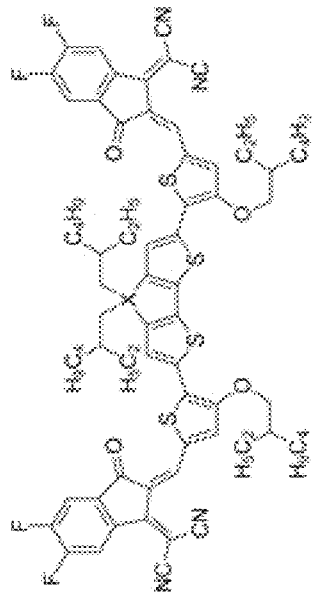
Figure 16G:
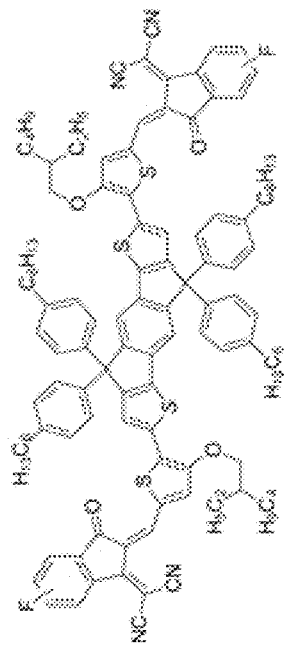
FIG. 16G. Comparison of the responsivity of photodetectors comprising the structures in FIGS. 16E and 16F.
Figure 16H:
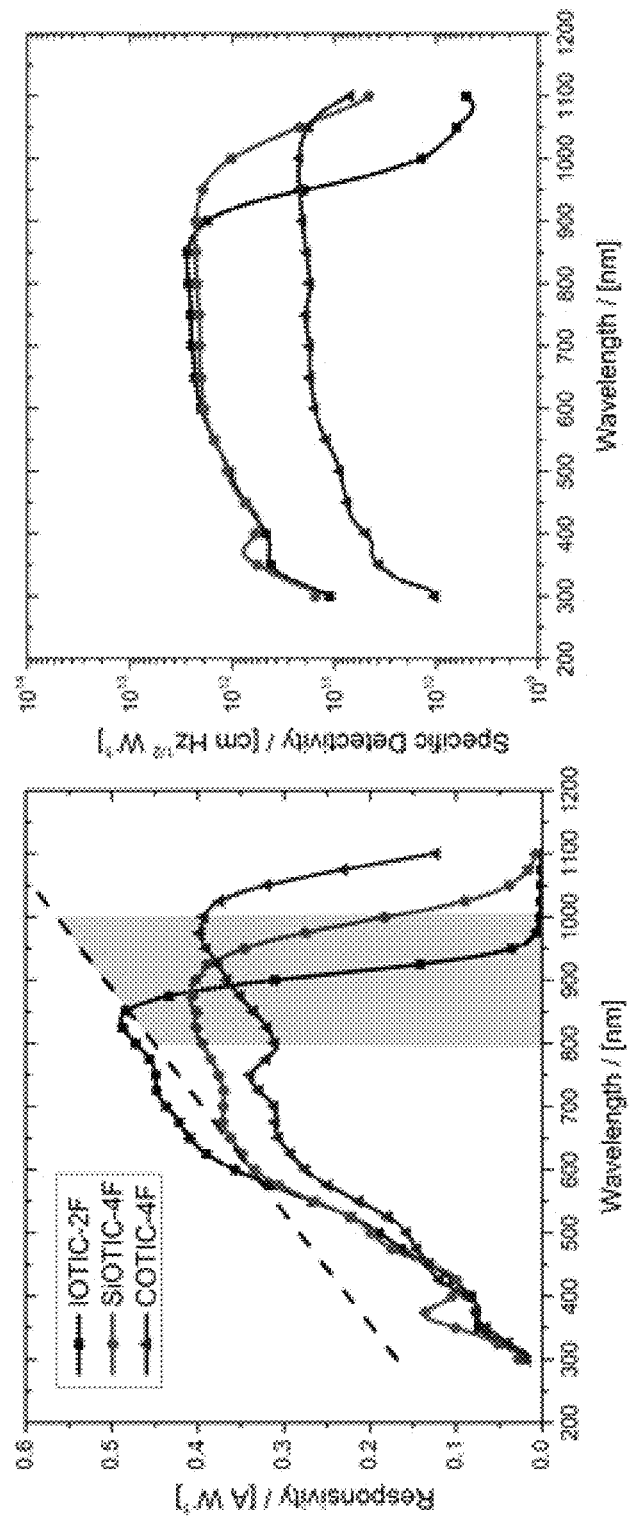
FIG. 16H. Comparison of the detectivity of photodetectors comprising the structures in FIGS. 16E and 16F.

FIGS. 16B, 16C, and 16D show the measured current density, EQE and responsivity, respectively, for COTIC-4F based devices fabricated according to the method in section 4a. For comparison, the responsivity and detectivity for devices based on different NFAs are shown in FIGS. 16G and 16H (for NFA structures shown in FIGS. 16E and 16F). Responsivity over 0.4 AW$^{-1}$ and specific detectivity over 10$^{12}$ cmHz$^{1/2}$W$^{-1}$ were achieved in the 650 nm to 950 nm near IR absorption region.

Figures 16I, 16J:
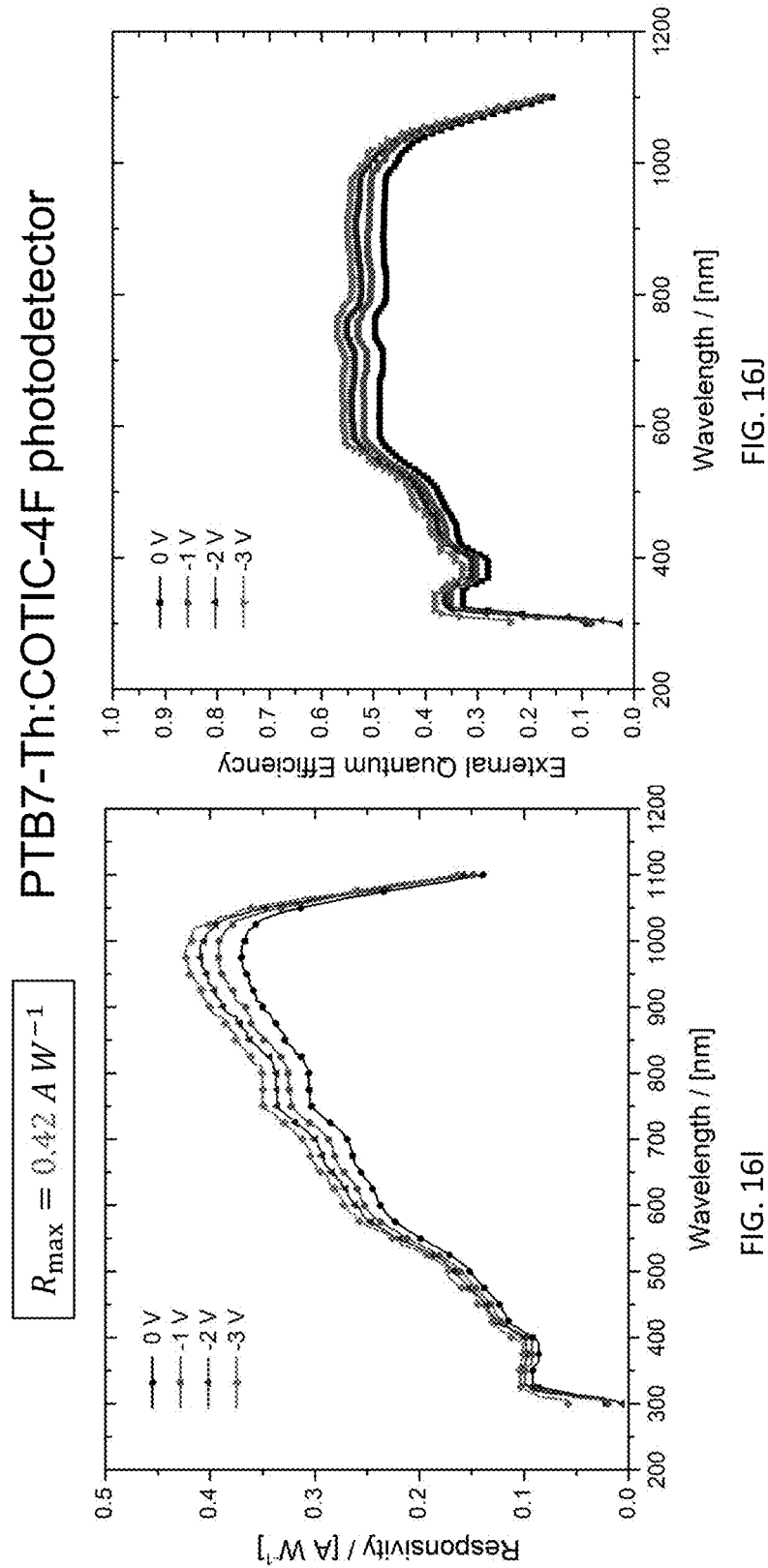
Figure 16K:
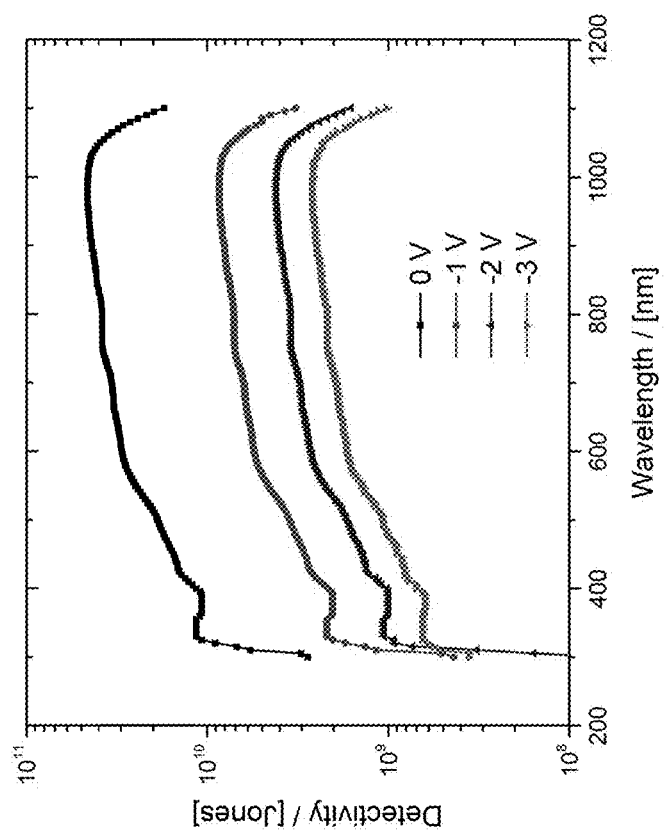

In some cases, the responsivity of a photodiode can be increased by applying a negative bias. This external electric field can potentially overcome losses due to charge carrier recombination by reducing the barrier to charge separation and reducing the extraction time. OPDs made with PTB7-Th:COTIC-4F active layers showed increased performance with increasing negative bias, as shown in FIGS. 16I and 16J (although detectivity was reduced, FIG. 16K). Negative bias improves responsivity of both PTB7-Th:SiOTIC-4F and PTB7-Th:COTIC-4F devices. FIGS. 16L and 16M showing responsivity and detectivity as a function of applied DC bias for SiOTIC-4F devices. FIG. 16N shows the dark current density as a function of applied bias for the SiOTIC-4F based OPD with a dark (leakage) current around $3\times10^{-4}$ mA/cm$^2$ at applied bias of $-1$V Applying an external bias also increases the dark current in the device, which raises the noise floor and can decrease the detectivity. As discussed in the next sections, the noise due to dark current can be minimized by using appropriate electrode materials, increasing the thickness of the absorbing active layer, reducing the device area, using different processing conditions for the zinc oxide (ZnO) electron transport layer (ETL), using alternative ETLs, and using evaporated blocking layers at the top electrode.

c. Leakage Current Control

Figures 17A, 17B:
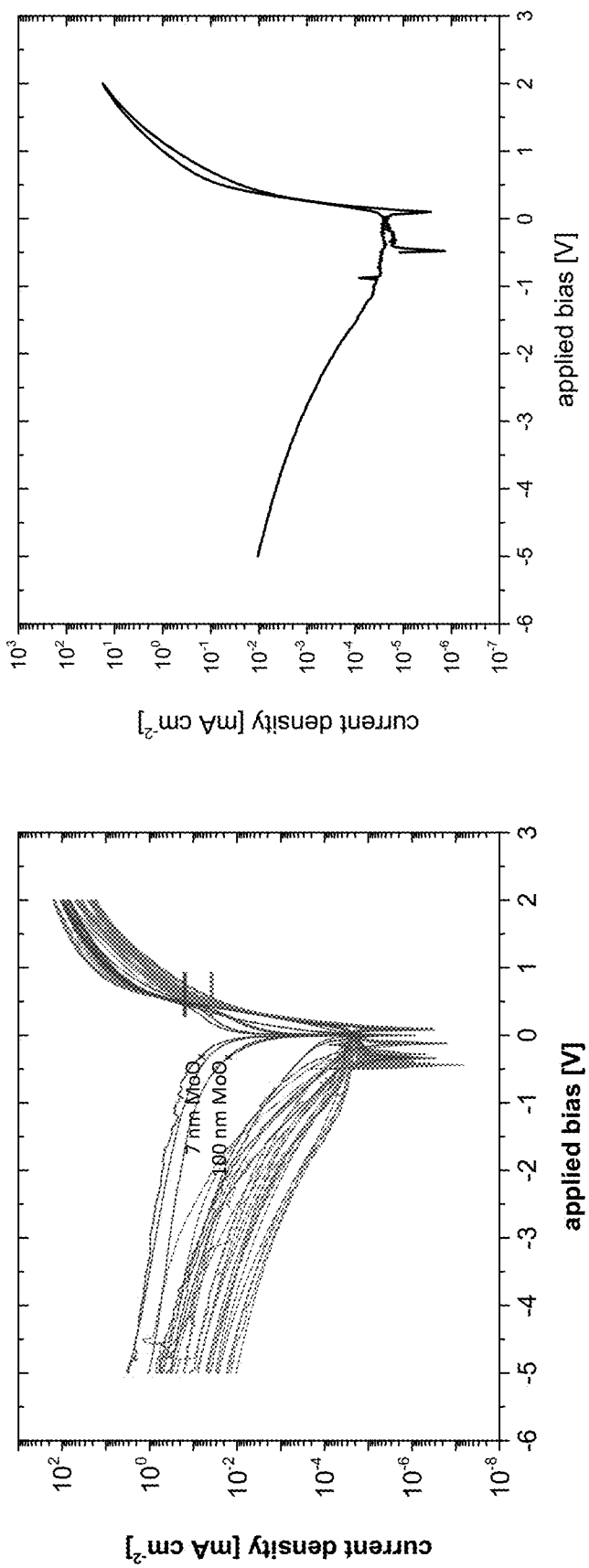
FIGS. 17A-17D. Photodetector performance as a function of hole transport layer thickness.
Figures 17C, 17D:
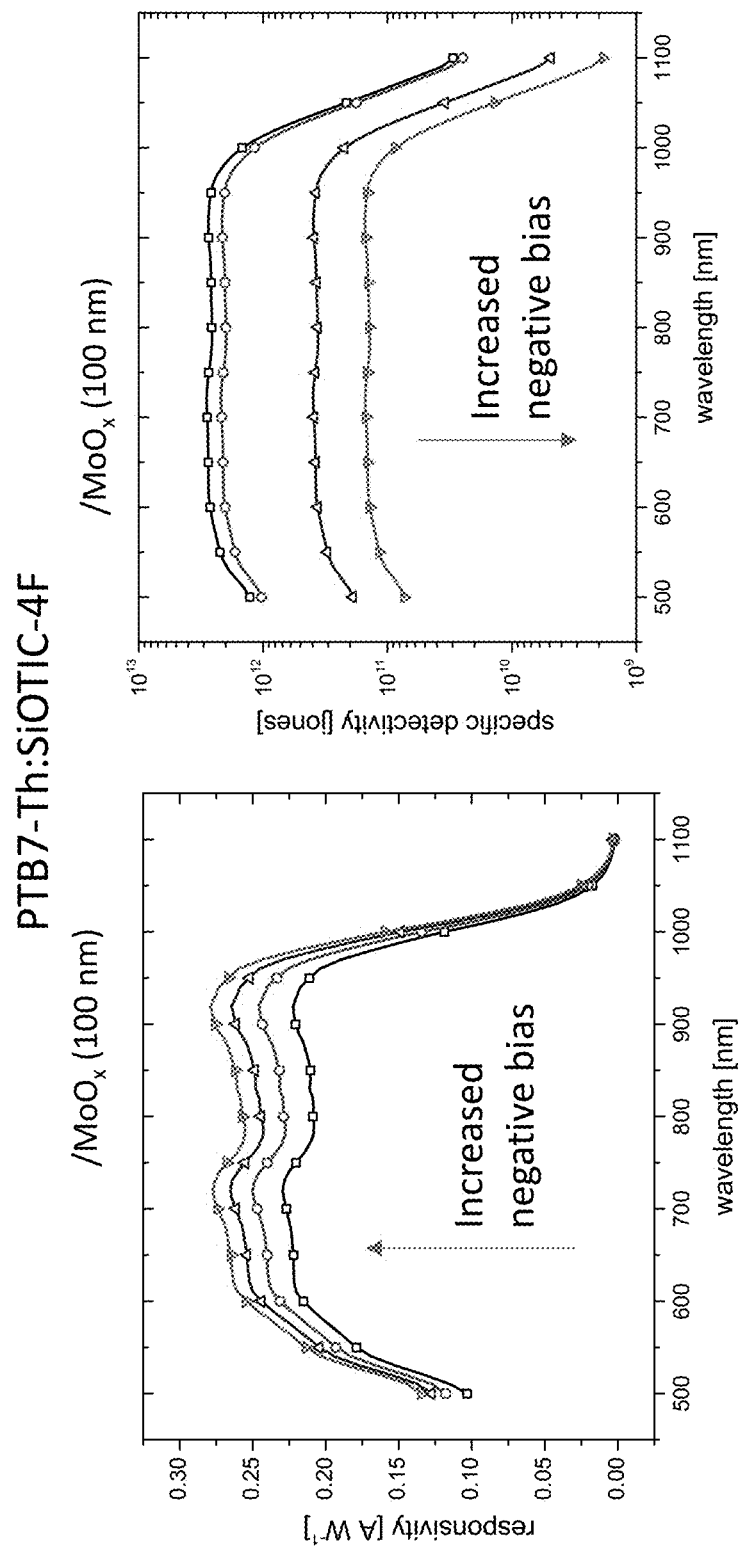

FIGS. 17A and 17B show the use of a thicker hole transporting layer (MoOx layer) in PTB7-Th:SiOTIC-4F photodiodes reduces the dark current (FIG. 17B shows data for the device having a 100 nm thick MoOx layer). FIG. 17C shows the thicker MoOx layer slightly reduces the responsivity and FIG. 17D illustrates the thicker MoOx layer increases detectivity (due to lowered dark current when the devices are not subjected to UV radiation). The thicker electron blocking/hole transporting layer resulted in a higher detectivity of $2.6\times10^{12}$ Jones at 950 nm wavelength, 0V applied bias, and 155 Hz measurement frequency.

The MoOx and Ag was deposited as follows: chamber pumped to 6E-7 torr, MoO$_3$ was evaporated at a rate of 0.15 Å/s for the first 10 nm, followed by a slow ramp to 1 Å/s for the remaining 90 nm. 100 nm of Ag was then evaporated starting at a rate of 0.4 Å/s for the first 10 nm, followed by a ramp to 1.5 Å/s for the remaining 90 nm. After deposition, the devices were stored in a "transfer box" with an O$_2$ concentration <2 ppm.

d. ZnO Layer Processing

Leakage current can also be controlled through processing of the ZnO layer. Another theory on the origin of the high leakage current in the devices was that pin holes in the ZnO film lead to defects, or "shunts" in the active layer. To this end, conductive atomic force microscopy (cAFM) was performed on thin films of ZnO (both the standard preparation and an alternative sol-gel method using zinc acetate and ethanolamine).

In an attempt to avoid "pinholing" in the standard preparation of ZnO, an experiment was performed in which the ZnO precursor solution was spin-cast twice on the same substrate, with the reasoning that any pinholes present in the first layer would be completely covered by the second layer, and that the probability of two pinholes occurring in the same place was negligible. All other conditions remained the same as described in the standard preparation of section 4a, including the volume, spin speed, and annealing temperature and time. The resulting double ZnO layer (Et$_2$Zn) films were prepared as follows: THF (anhydrous) and Et$_2$Zn (15% wt. in toluene) were combined 3:2 by vol in N$_2$ atmosphere, filtered through 0.45 μm PTFE, then removed from the glove box. The combination was stirred vigorously before each application; 35 μL was deposited onto a spinning substrate (4000 rpm), then annealed at 110° C. for 15 min in air, achieving approximately 40 nm thick films. Another 35 μL was deposited onto the first layer of ZnO at a spin rate of 4000 rpm, then annealed at 110° C. for 15 min in air, achieving approximately 80 nm thick films. The cAFM images in FIGS. 18A-18D show low surface roughness and good conductivity for the resulting single and double ZnO layers.

Figures 18E, 18F:
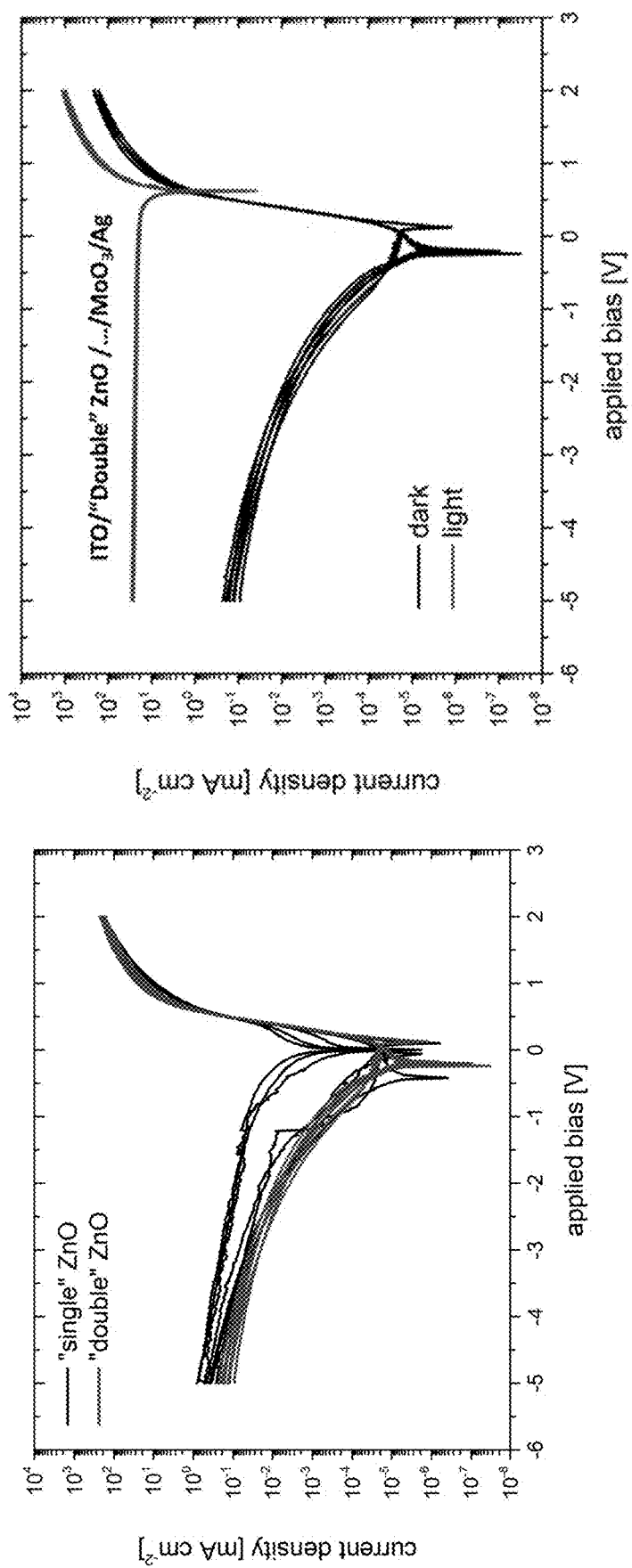
FIG. 18E. Current-voltage behavior for devices with a single layer of ZnO (from the THF and diethyl zinc precursor) and for the devices having two layers of the same precursor in the dark.
FIG. 18F. Reduced variability of the photodetector including double ZnO layer.

The current-voltage results for these devices is shown in FIGS. 18E and 18F. For reference, current-voltage data for the single-layer ZnO devices is also shown in FIG. 18E. The data of FIGS. 18E and 18F clearly illustrate the resulting "double" ZnO reduces device reduces device to device variability of the dark current.

e. Diode Rise/Fall Time (Measurement of Transient Photocurrent)

In addition to the steady-state behavior of the photodiodes (current-voltage behavior, EQE, D*, described above), it is important characterize their AC properties. The most common frequency-dependent metrics are the diode rise and fall times and the cutoff frequency, or the frequency at which the magnitude of the response (maximum power) falls below half of the maximum at steady state. To measure this value, which is given as $f_{-3\ dB}$ (the "3 decibel cutoff frequency), the response of the photodiode is measured under illumination with a square-wave modulated light source. For each driving frequency of the light source, the maximum value of the photoresponse is measured using an oscilloscope. These values are then normalized to the maximum under steady-state illumination by converting them into decibel units as follows:

Signal Magnitude (dB)=$20\cdot\log_{10}(V2/V1)$ where V2 is the voltage measured at some frequency f, and V1 is the voltage measured at steady-state.

Figure 19C:
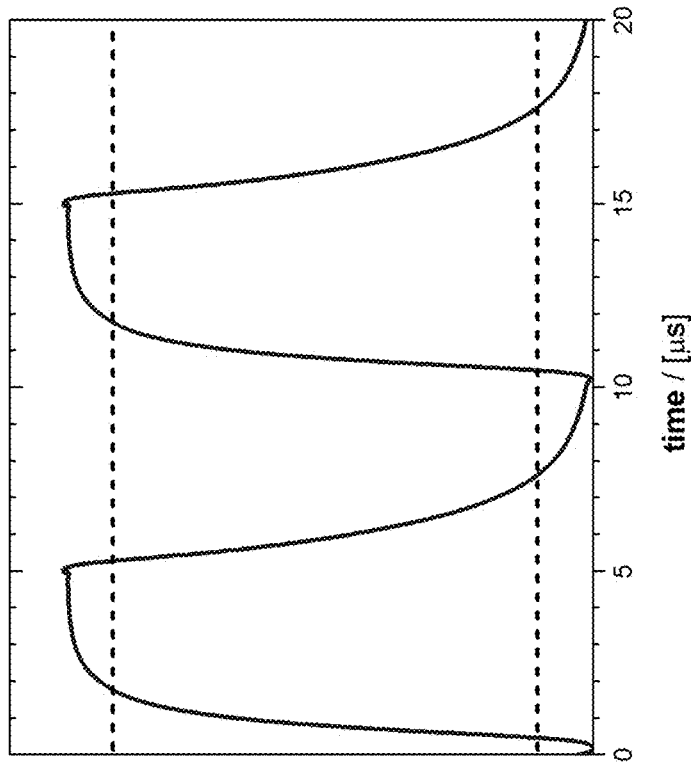
FIG. 19C A typical response pattern for one of the photodiodes measured in FIG. 19B. The dashed lines represent 10% (lower) and 90% (upper) of the maximum value.

FIG. 19A illustrates the measured transient properties, including rise time ($\tau_{rise}$ and fall times ($\tau_{fall}$), for photodetector structures fabricated in section 4a with different active layer thicknesses. An LED (having a peak absorption at a wavelength of 960 nm) was driven using an arbitrary function generator with a square-wave voltage pulse of varying frequency. The total illumination intensity from the LED was unknown, but was kept constant for each device. Many of the diodes appear to have rise/fall times below 5 microseconds. The pixel area is approximately 5 mm$^2$. The thickest devices (approximately 400-600 nm active layer) had a rise time of 8 μs and a fall time of 11 μs. Thinner active layers led to shorter rise and fall times, suggesting that the device transient behavior is influenced by charge carrier mobility in the films.

For lower active layer thicknesses in certain devices, there is an observable "ringing" behavior in both the rising and falling currents (see green trace in FIG. 19A). At this point, it is unknown if this is a property of the devices or of the measurement setup. The results could be limited by speed of pre-amplifier or uneven thicknesses of the layers in the devices.

Figure 19B:
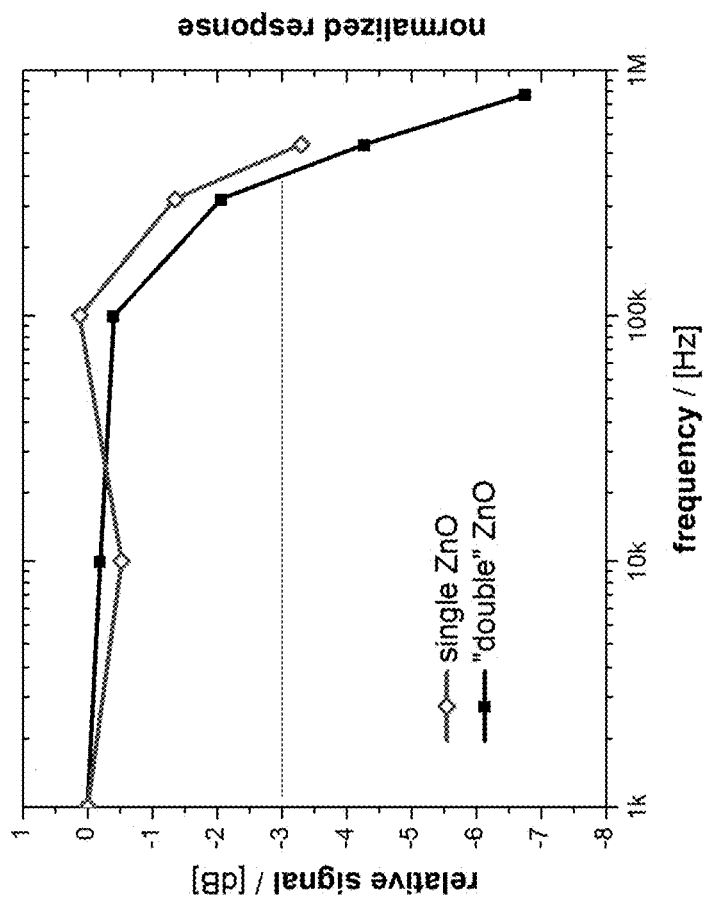
FIG. 19B −3 dB cutoff frequencies for photodiodes with different ETLs. The devices were illuminated with a white LED at an intensity of approximately 100 mW cm$^{-2}$.

FIG. 19B compares the frequency response behavior of two photodiodes, one with a single layer of ZnO and one with two layers. A characteristic signal for both device types is shown if FIG. 19C. $f_{-3\ dB}$ is 360 kHz for the device with two layers of ZnO and 460 kHz for the single layer, indicating that the thickness and perhaps the morphology of the ETL can affect $f_{-3\ dB}$ (both values are significantly higher than those reported for other organic photodiodes, but still well within reason). Additionally, the rise ($\tau_{rise}$) and fall ($\tau_{fall}$) times are 1.26 and 2.37 μs, respectively, as extracted from FIG. 19C.

5. Morphology

Figure 20B:
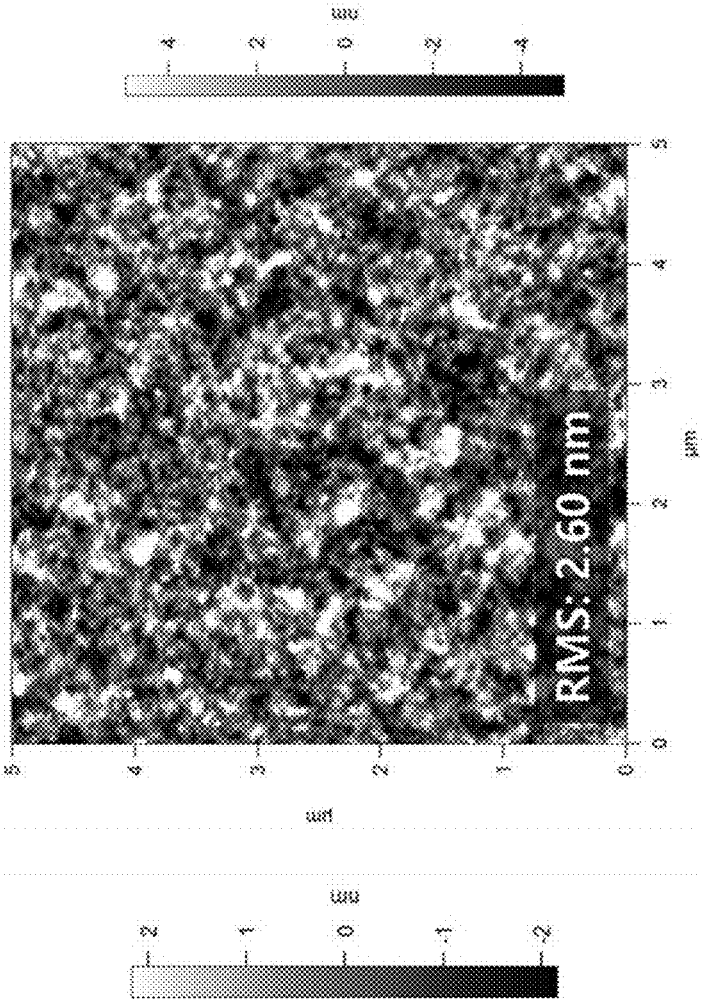
FIGS. 20A-20I. AFM height images of the blend films for (FIG. 20A) the PTB7-Th:SiOTIC-4F and (FIG. 20B) the PTB7-Th:COTIC-4F. TEM images (FIGS. 20C, 20D) and corresponding EELS (FIGS. 20E, 20F) of blend films.
Figure 20A:
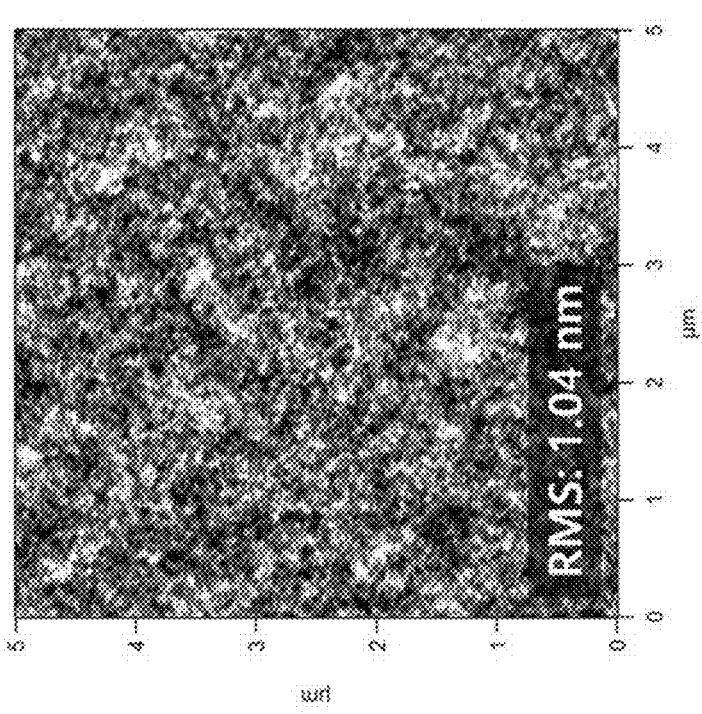

Atomic force microscopy (AFM) was used to investigate the morphology of the blend films. As shown in FIG. 20, the PTB7-Th:SiOTIC-4F blend film presents a relatively smooth surface feature (FIG. 20A) with a mean-square surface roughnesses (R$_q$) of 1.04 nm, as compared to the PTB7-Th:COTIC-4F blend film (R$_q$=2.60 nm) (FIG. 20B). The favorable BHJ morphologies with nanoscale phase separation and smaller domain sizes should benefit the charge generation and transport processes in the devices, which partially contributed to a higher FF value of the SiOTIC-4F-based device compared to that of the COTIC-4F-based device.

Figure 20D:
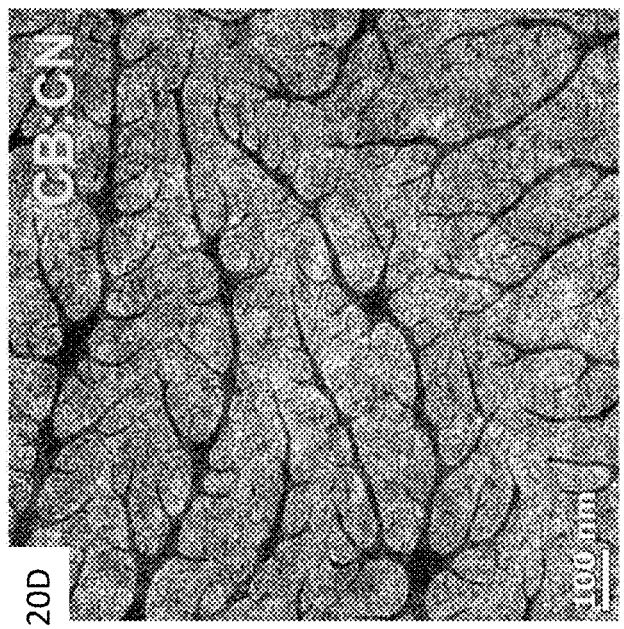
Figure 20F:
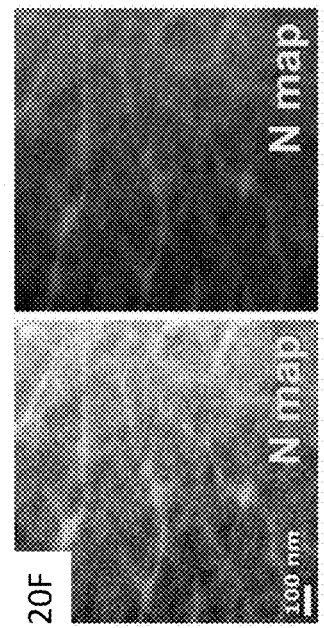
Figure 20C:
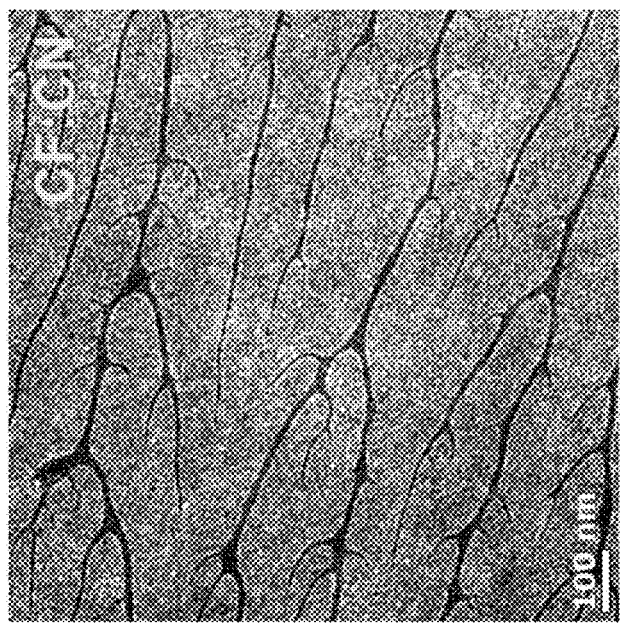
Figure 20E:
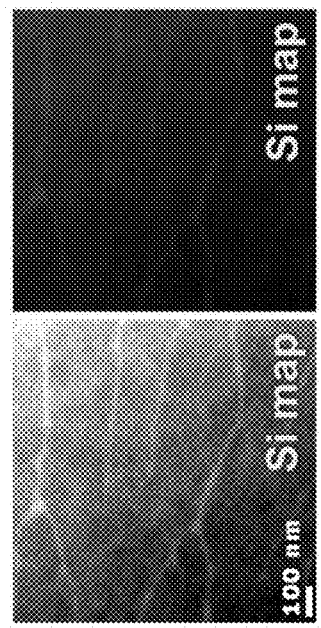
Figures 20G, 20H, 20I:
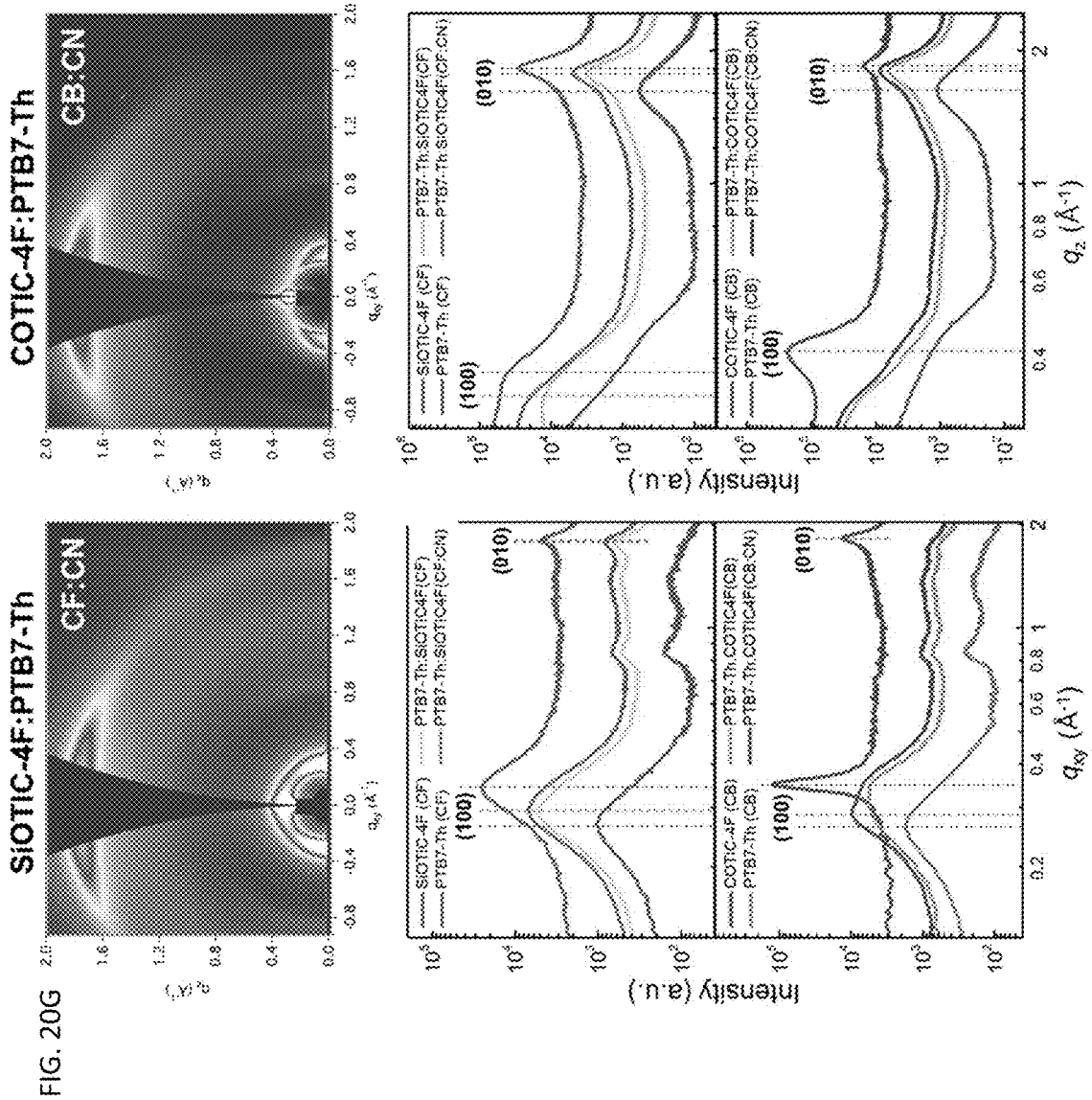

The topographic features of the films were also examined using transmission electron microscopy (TEM). As shown in FIGS. 20C and 20D, both the NFA blends exhibit multiscale phase separation with dendrite-like interconnected domains (dark regions). FIGS. 20E and 20F show elemental maps based on electron energy loss spectroscopy (EELS). Since only the acceptor molecules contain the elements nitrogen or silicon, it is possible to distinguish between donor- and acceptor-rich phases. The EELS confirms that the dendrite-like dark regions are acceptor-dominant domains, while the acceptor molecules are evenly distributed in other areas that are likely to be intermixed phases such as donor, acceptor, and some mixed/amorphous phases. It is extraordinary (surprising and unexpected) that efficient charge separation and charge transport can occur in such an unusual BHJ morphology. The present disclosure speculates that the intermixed phases provide appropriate D/A interfacial areas for generating free charge carriers, while the dendrite-like domains with long-range interconnectivity provide efficient pathways for electron transport.

Grazing incidence wide-angle X-ray scattering (GIWAXS) was employed to investigate the crystalline features of the thin films. The optimized blend films for both NFAs show a preferential face-on orientation (FIG. 20G), which is beneficial for efficient charge transport in the vertical direction across the electrodes. In both NFA blend films, the inter-lamellae (100) region in the in-plane direction and π-π stacking (010) region in the out-of-plane direction are combined features from the donor and acceptor components that cannot be easily separated. The present disclosure speculates that the donor and acceptor components maintain their crystalline features,[18] as well as part of the components reorganize into mixed phases in the BHJ blends. Overall, a combination of morphology characterization results based on the TEM, GIWAXS, and SCLC mobility data indicates that both NFA blends have quite similar film properties.

Process Steps

Figure 21:
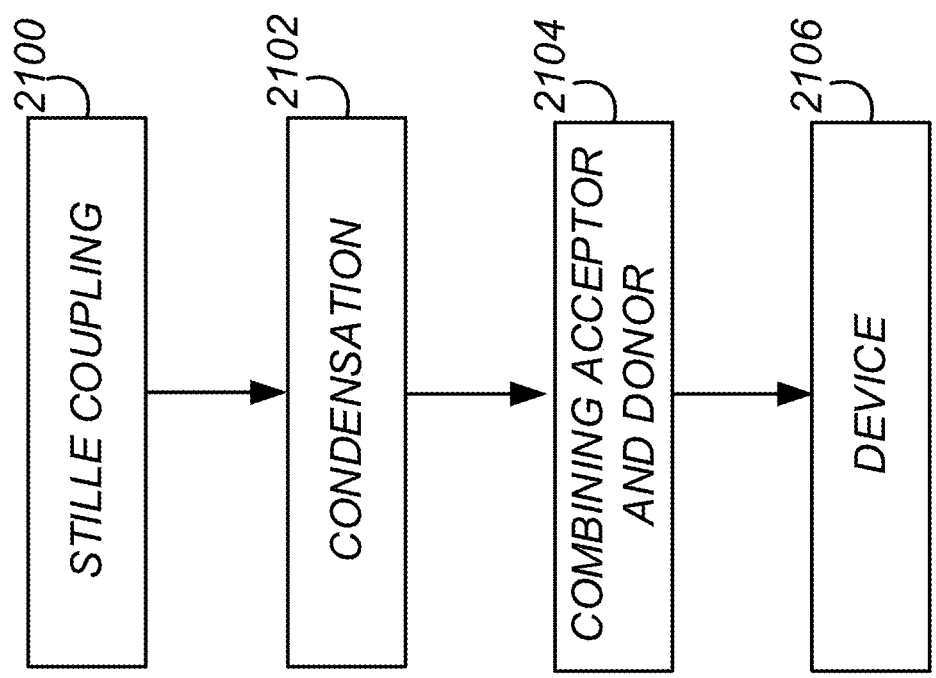
FIG. 21. Flowchart illustrating a method of fabricating a composition of matter according to embodiments of the present invention.
Figures 22A, 22B:
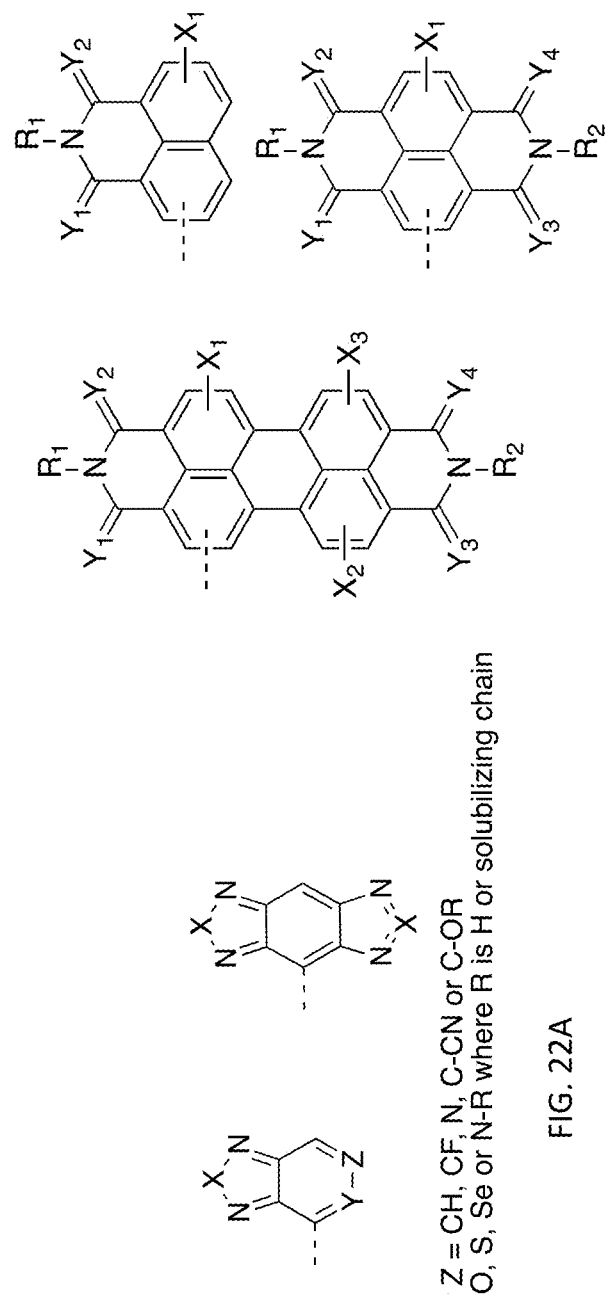
FIGS. 22A-22G illustrate electron-accepting units that can be used in embodiments of the present invention.
Figure 22C:
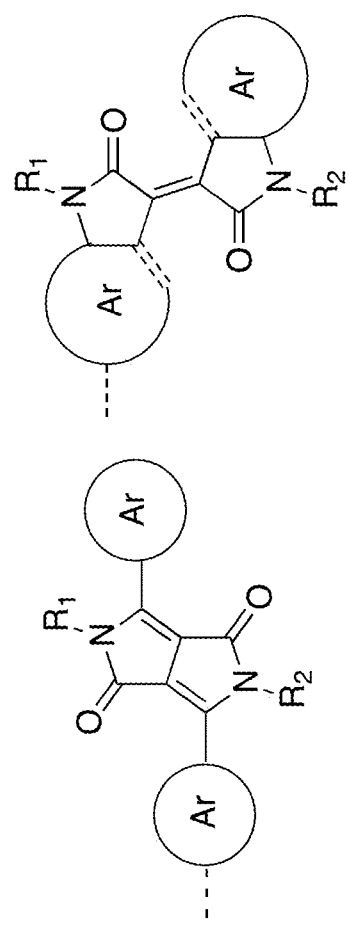
Figure 22D:
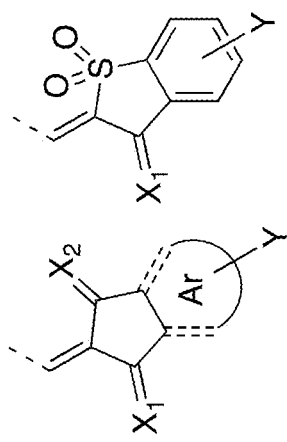
Figure 22D:
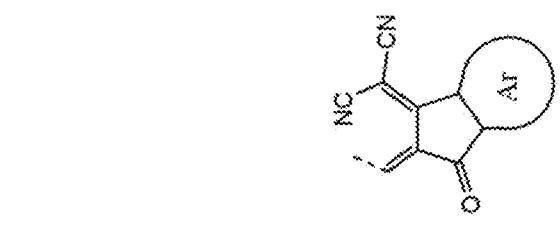
Figure 22E:
Figure 22E:
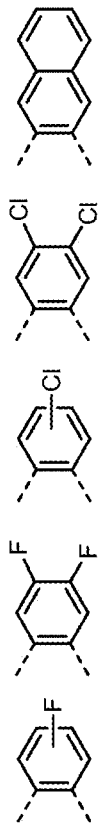
Figure 22F:
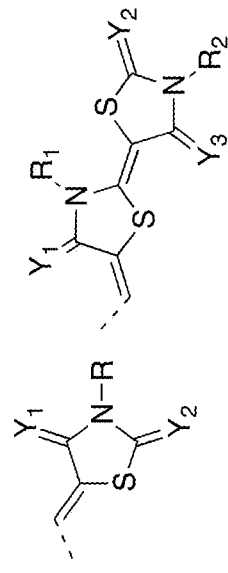
Figure 22F:
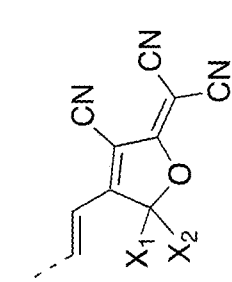
Figure 22F:
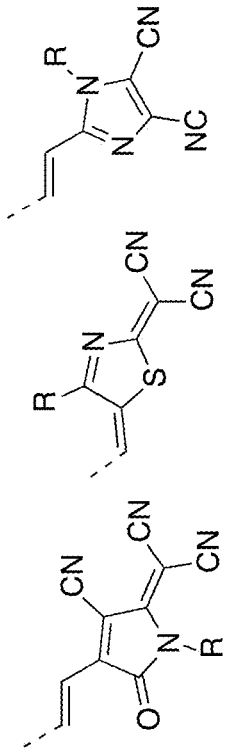
Figure 22F:
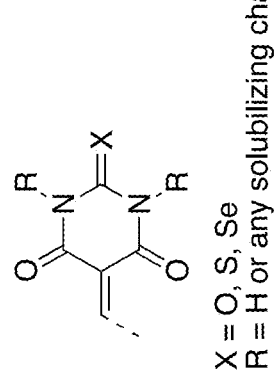
Figure 22G:
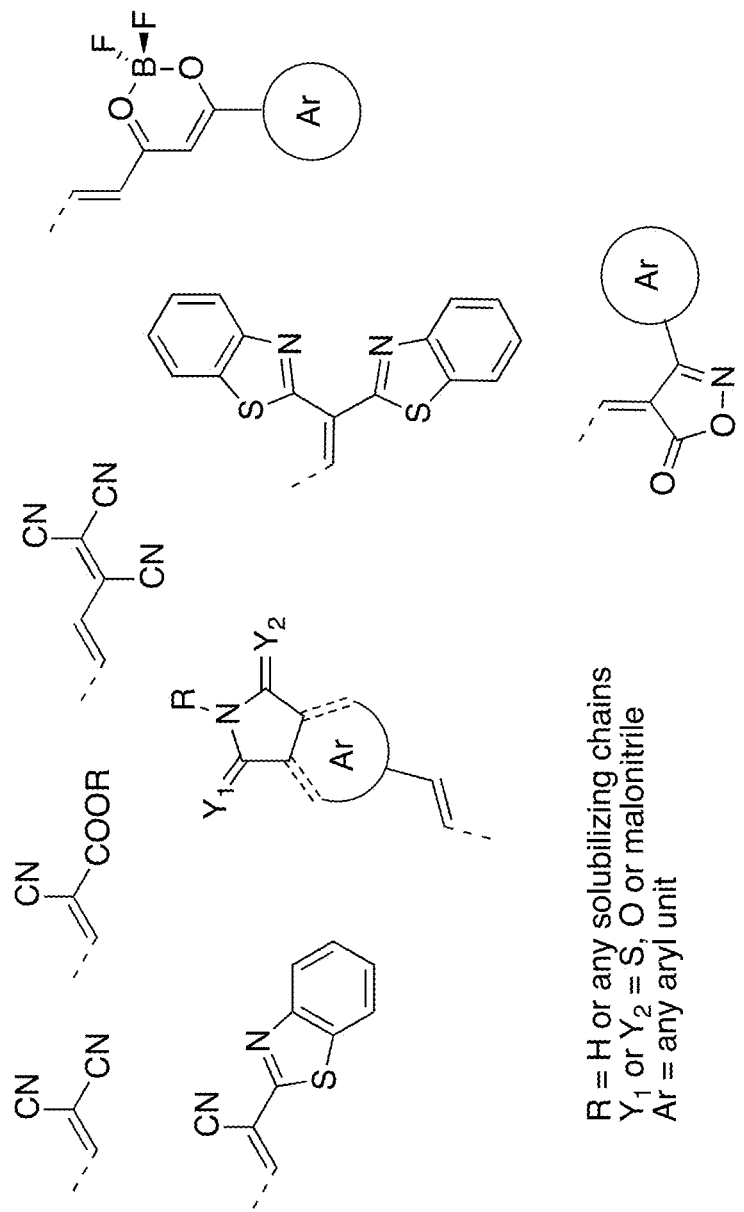
Figure 23A:
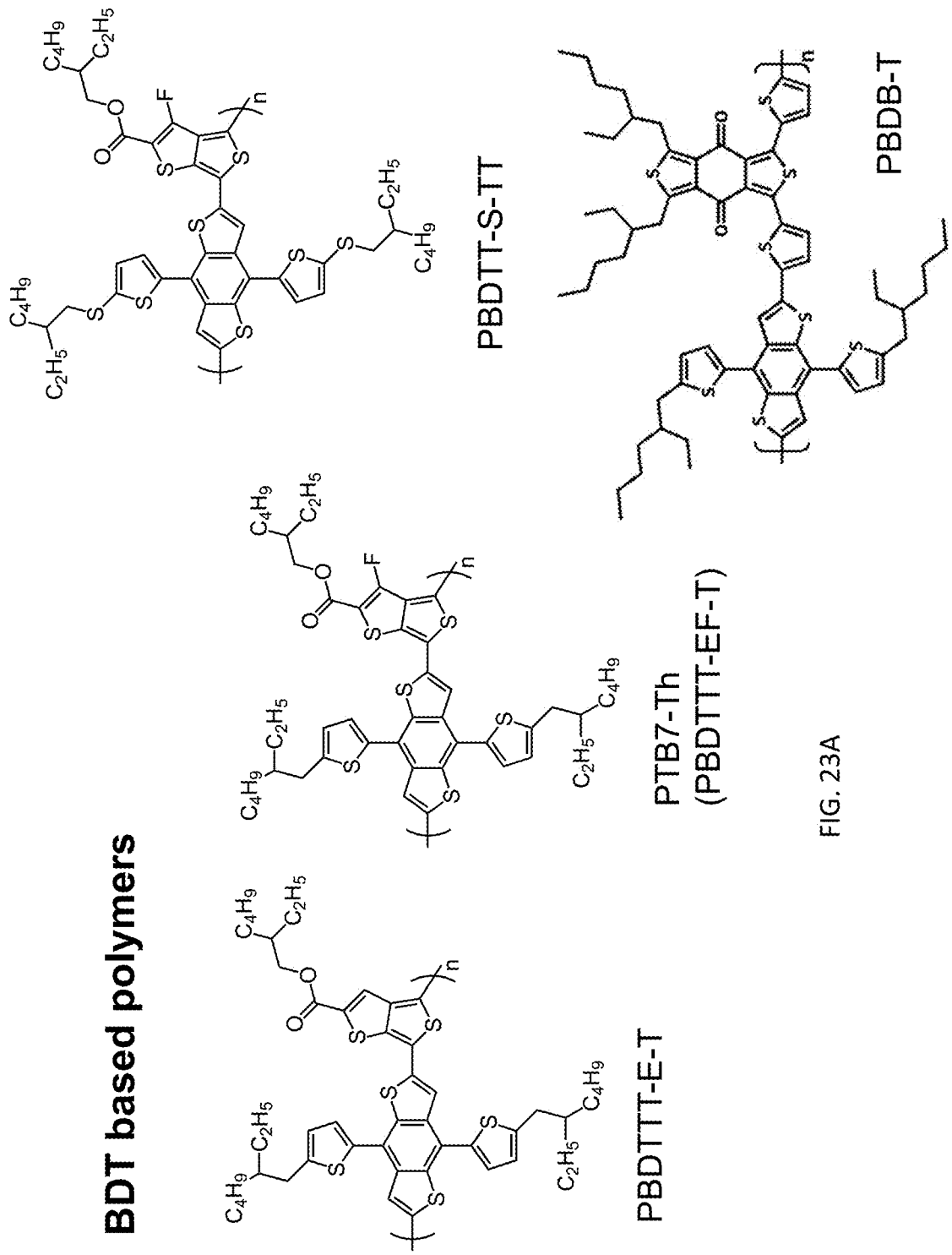
FIGS. 23A-23D illustrate polymer donor examples which have similar or narrower optical bandgap, have shown promising OPV performance, and which can be used in one or more embodiments of the present invention.
Figure 23B:
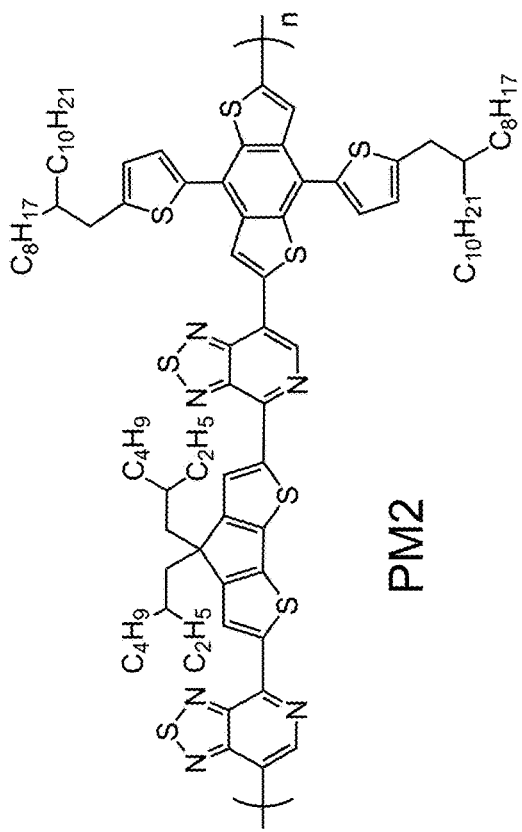
Figure 23B:
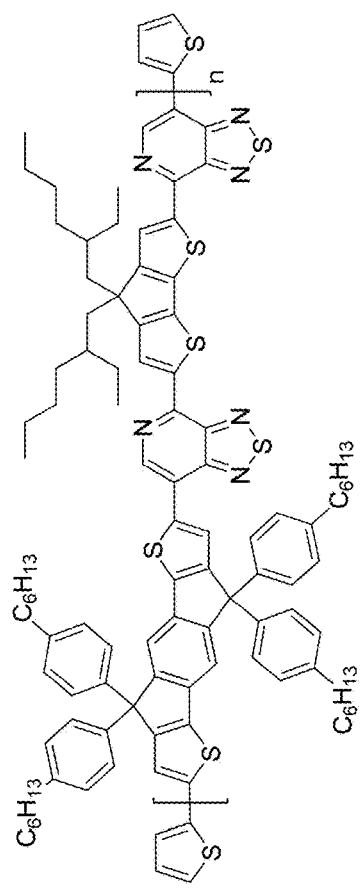
Figure 23B:
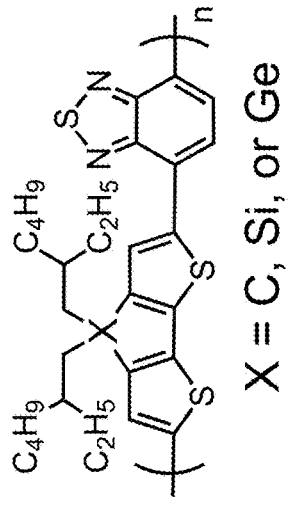
Figure 23C:
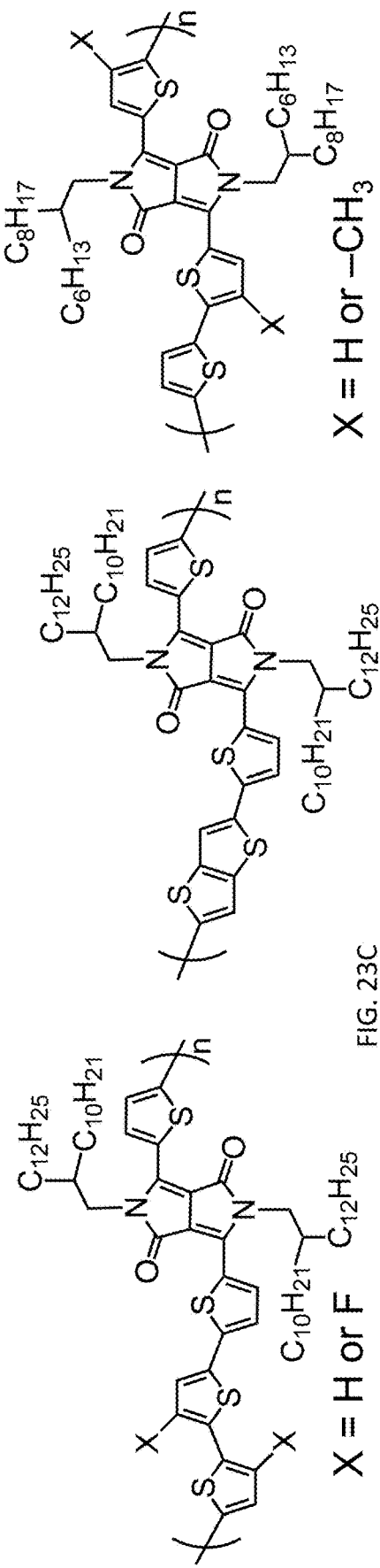
Figure 23D:
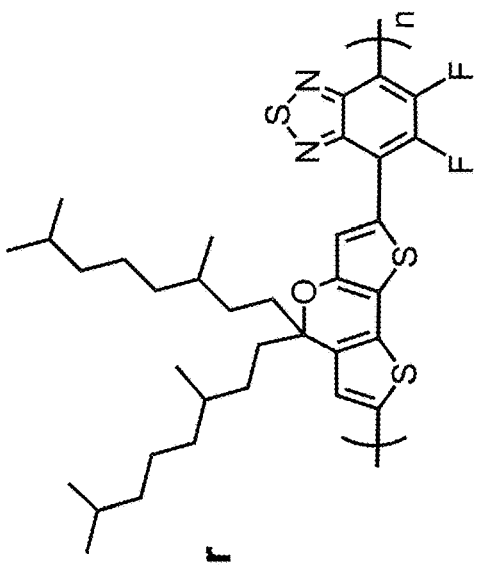

FIG. 21 illustrates a method of fabricating a composition of matter.

The method comprises the following steps.

Block 2100 represents performing a Stille coupling reaction between a first compound/moiety comprising a dithiophene and a second compound/moiety comprising an alkoxythienyl, forming a molecule of the structure D'-D-D'.

Block 2102 represents performing a condensation reaction between the molecule of structure D'-D-D' and a fluorinated IC/acceptor moiety, so as to form an organic molecule of the structure A-D'-D-D'-A, wherein D' is a donor compound/moiety comprising an alkoxythienyl, D is a donor compound/moiety comprising a dithiophene, and A is an acceptor compound comprising (3-oxo-2,3-dihydro-1H-inden-1-ylidene)malononitrile (IC), fluorinated (3-oxo-2,3-dihydro-1H-inden-1-ylidene)malononitrile, or an acceptor moiety as described herein. In one or more examples, the dithiophene has side chains soluble in a solvent used to solution process the device comprising the organic molecule.

In one or more embodiments, the A-D'-D-D'-A semiconductors comprise the general structure:

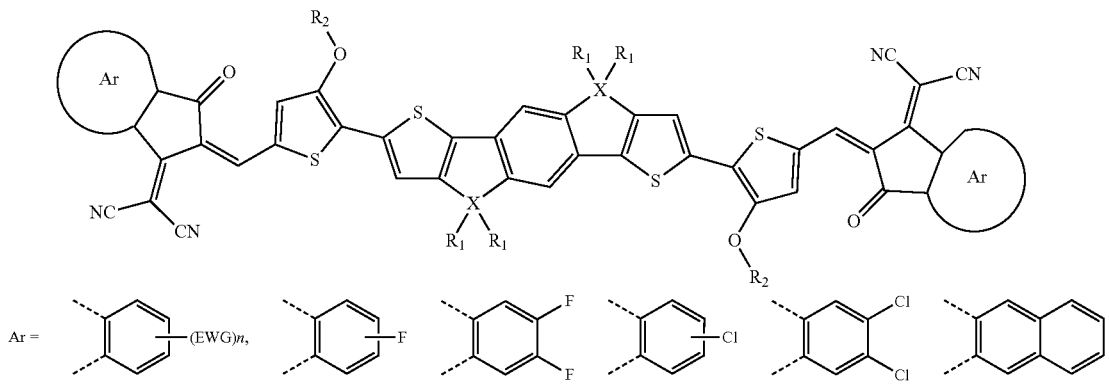

wherein X is C, Si, Ge; EWG=any electron withdrawing group, can be but not limited to F, Cl, Br, I, CN, $NO_2$, sulfonate, ketone, ester; n=1,2,3 or 4; Each $R_1$ and $R_2$ is independently hydrogen or a substituted or non-substituted alkyl, aryl or alkoxy chain.

In one embodiment, the organic semiconducting molecule has the structure

IOTIC-2F

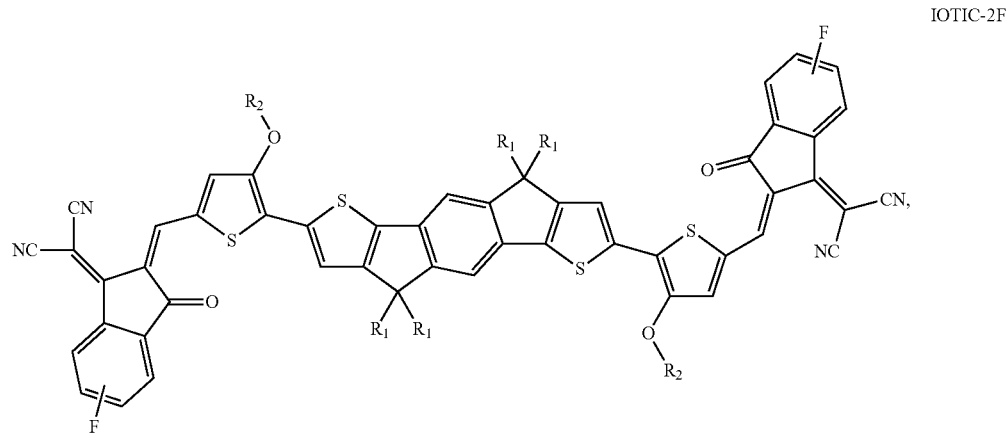

wherein

R₁ is 4-hexylphenyl, and

R₂ is 2-ethylhexyl or R₁ and R₂ are each independently a solubilizing chain, hydrogen or a substituted or non-substituted alkyl, aryl or alkoxy chain as described herein.

In one or more embodiments, the A-D'-D-D'-A semiconductors comprise the general structure:

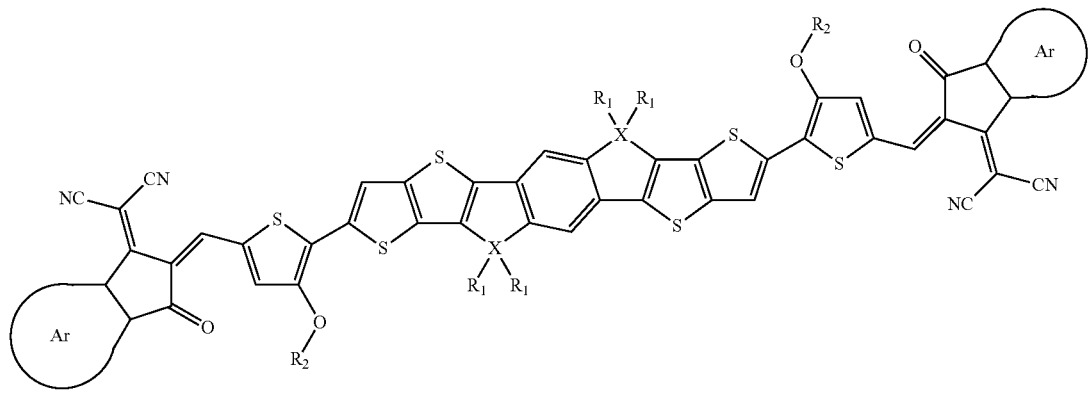

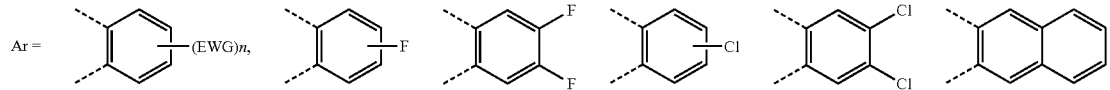

wherein X is C, Si, Ge; EWG=any electron withdrawing group, can be but not limited to F, Cl, Br, I, CN, NO₂, sulfonate, ketone, ester; n=1,2,3 or 4; Each $R_1$ and $R_2$ is independently hydrogen or a substituted or non-substituted alkyl, aryl or alkoxy chain.

In another embodiment, the organic semiconducting molecule has the structure:

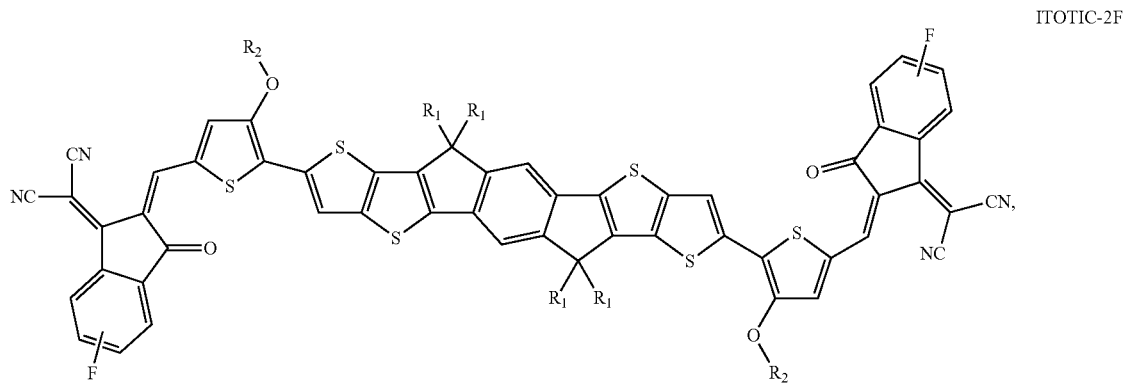

ITOTIC-2F wherein

R₁ is 4-hexylphenyl, and

R₂ is 2-ethylhexyl, or R₁ and R₂ are each independently hydrogen, a solubilizing chain, or a substituted or non-substituted alkyl, aryl or alkoxy chain as described herein.

Other examples include, but are not limited to,
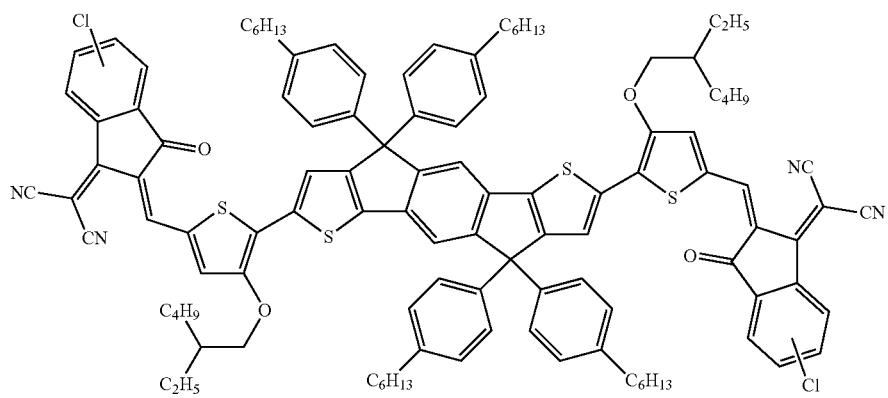
IOTIC-2Cl
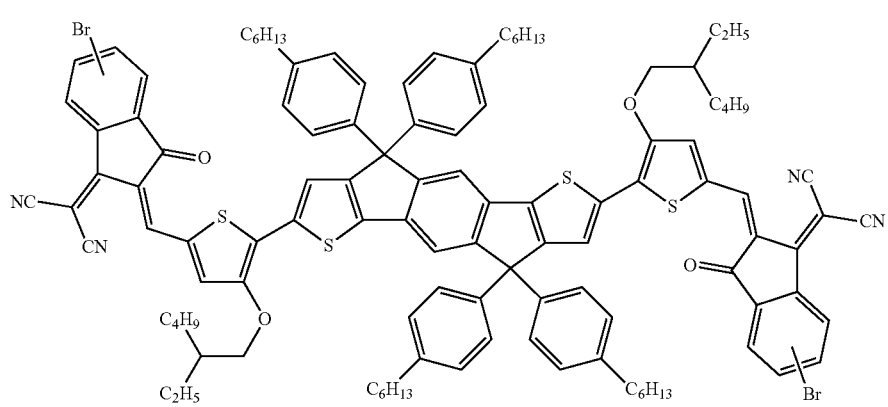
IOTIC-2Br
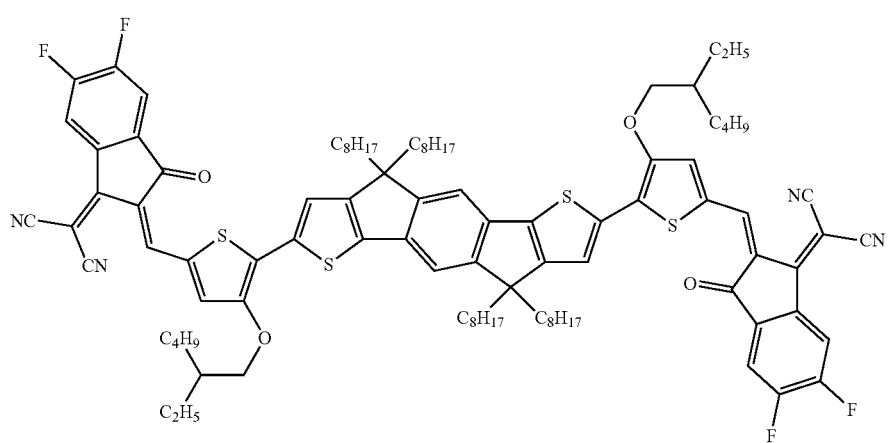
O-IO2-4F -continued
IOTN
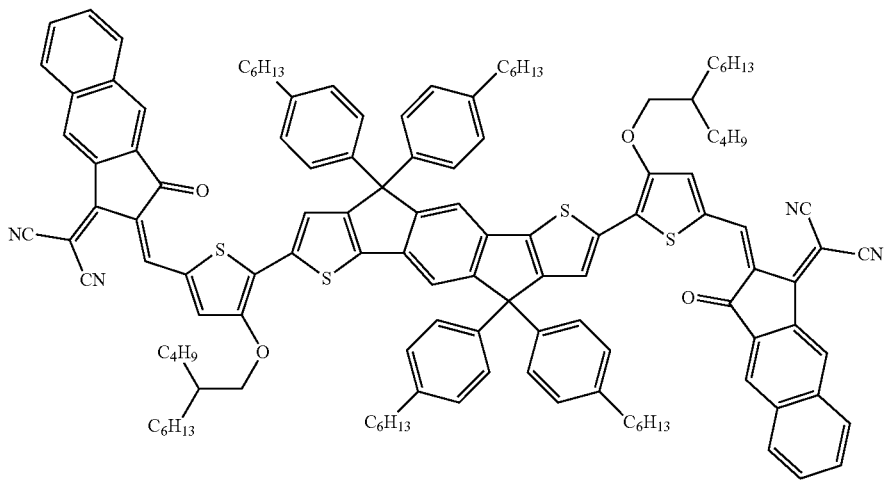
ITOTIC-4F
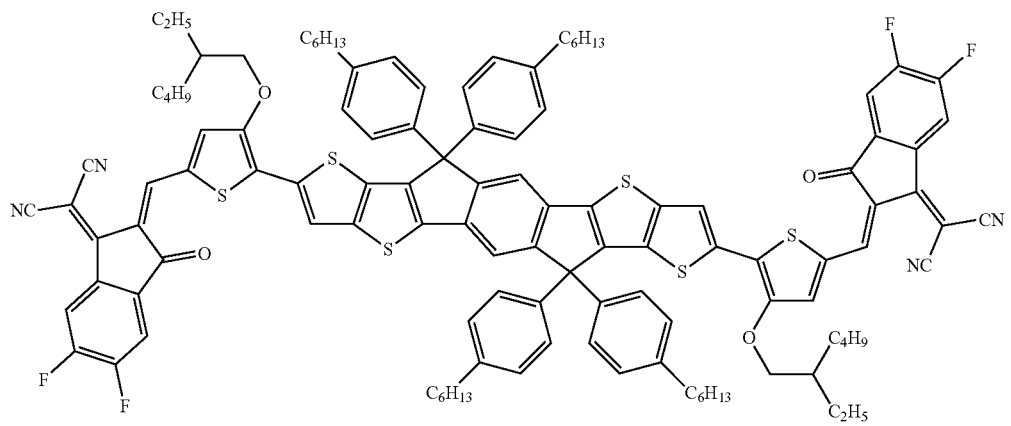
p-IO2-4F
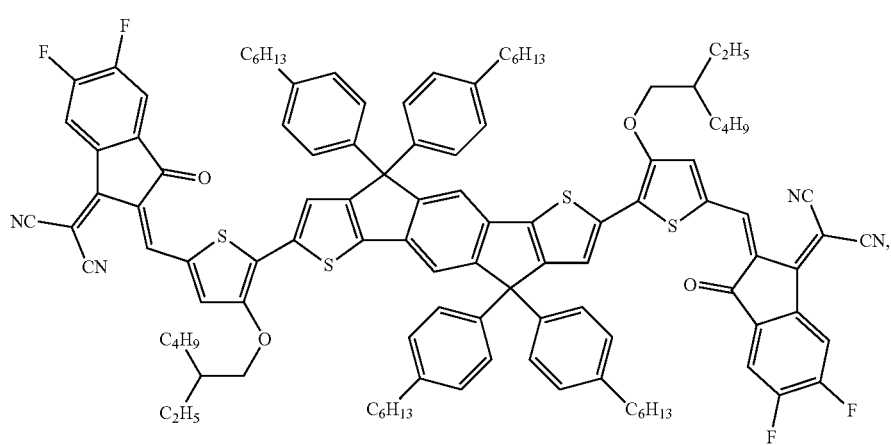
Eg = 1.26 eV wherein $C_8H_{17}$, $C_6H_{13}$ and 2-ethylhexyl can be replaced with hydrogen, a solubilizing chain, or a substituted or non-substituted alkyl, aryl or alkoxy chain as described herein. In yet a further embodiment, the organic semiconducting molecule has the structure:

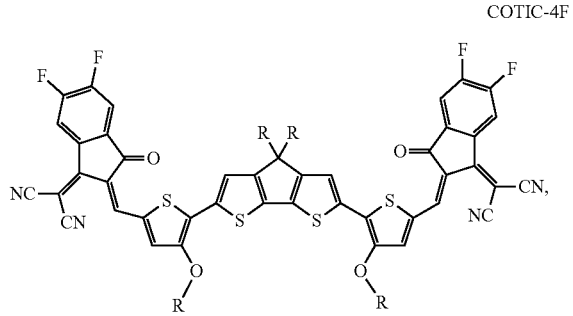

COTIC-4F wherein

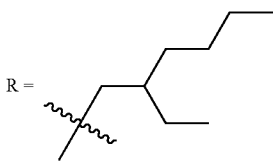 [SMILES: *CC(CC)CCCC]

or R is a solubilizing chain or hydrogen or a substituted or non-substituted alkyl, aryl or alkoxy chain as described herein.

In yet another embodiment, the acceptor molecule has the structure:

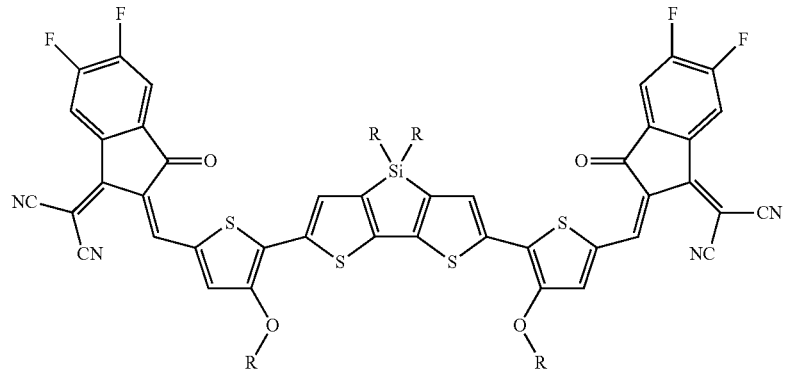

SiOTIC-4F

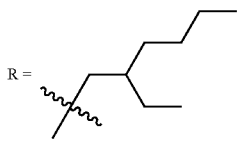

or wherein R is a solubilizing chain or hydrogen or a substituted or non-substituted alkyl, aryl or alkoxy chain as described herein.

In yet further examples, the molecule or acceptor comprises

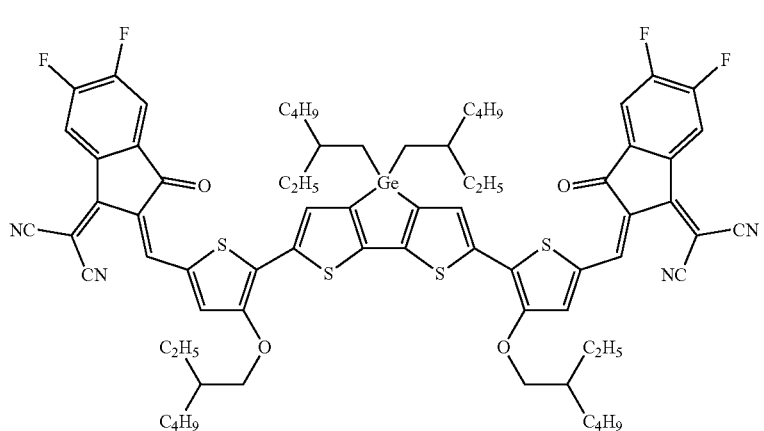

GeOTIC-4F or

-continued

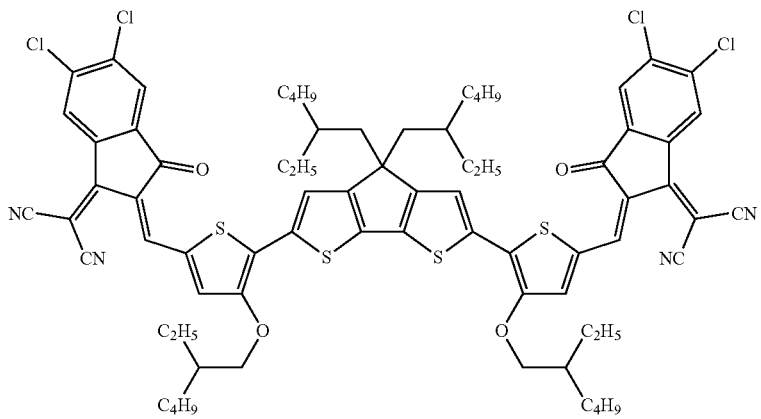

COTIC-4Cl

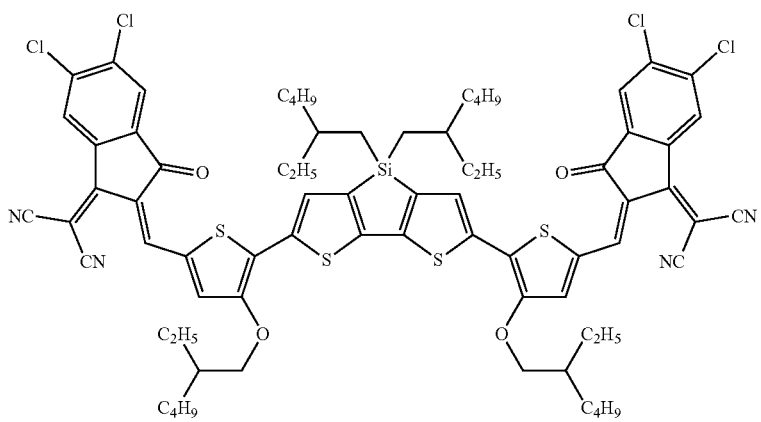

or

SiOTIC-4Cl wherein C$_2$H$_5$, C$_4$H$_9$ can be replaced with R that is a solubilizing chain or hydrogen or a substituted or non-substituted alkyl, aryl or alkoxy chain as described herein.

In one or more embodiments, the A-D'-D-D'-A semiconductors comprise the general structure:

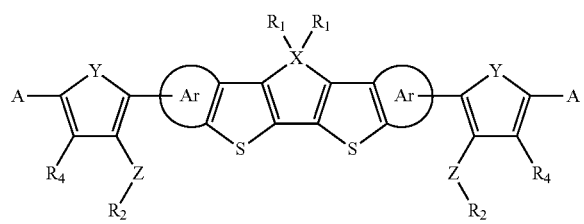

wherein each Ar is independently a substituted or non-substituted aromatic functional group, or each Ar is independently nothing and the valence of its respective thiophene ring is completed with hydrogen, each Ar may comprise one, two, three or more 5-membered or 6-membered aromatic rings; X is C, Si, Ge, N or P; Y is O, S, Se or N—R$_3$; Z is O, S, Se, or N–R$_3$; Each R$_1$, R$_2$ and R$_3$ is independently hydrogen or a substituted or non-substituted alkyl, aryl or alkoxy chain; R$_4$ is either a hydrogen or the same as Z–R$_2$. In some embodiments, the R$_1$, R$_2$ and R$_3$ groups can be the same. The R$_1$, R$_2$ and R$_3$ comprising the substituted or non-substituted alkyl, aryl or alkoxy chain can be a C$_6$-C$_{50}$ substituted or non-substituted alkyl or alkoxy chain, -(CH$_2$CH$_2$O)n (n=2 ~ 30), C$_6$H$_5$, —C$_n$F$_{(2n+1)}$ (n=2 ~ 50), —(CH$_2$)$_n$N(CH$_3$)$_3$Br (n=2 ~ 50), 2-ethylhexyl, PhC$_m$H$_{2m+1}$(m=1-50), -(CH$_2$)$_n$N(C$_2$H$_5$)$_2$(n=2 ~ 50), -(CH$_2$)$_n$Si(C$_m$H$_{2m+1}$)$_3$ (m, n=1 to 50), or -(CH$_2$)$_n$Si(OSi(C$_m$H$_{2m+1}$)$_3$)$_x$(C$_p$H$_{2p+1}$)$_y$ (m, n, p=1 to 50, x+y=3).

The R$_1$, R$_2$, R$_3$ and R$_4$ groups can be a branched side-chain comprising a C$_3$-C$_{50}$, C$_5$-C$_{50}$, C$_8$-C$_{50}$, or C$_9$-C$_{50}$ substituted or non-substituted alkyl chain. Examples of branched alkyl chains include isopropyl, sec-butyl, t-butyl, 1,2-dimethylpropyl, 1,1-dimethyl-propyl, 4-methylpentyl, 1-methylpentyl, 2-methylpentyl, 3-methylpentyl, 1,1-dimethylbutyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, 5-methylhexyl, 1-methylhexyl, 2,2-dimethylpentyl, 3,3-dimethylpentyl, 4,4-dimethylpentyl, 1,2-dimethylpentyl, 1,3-dimethylpentyl, 1,4-dimethylpentyl, 1,2,3-trimethylbutyl, 1,1,2-trimethylbutyl, 1,1,3-trimethylbutyl, 6-methylheptyl, 1-methylheptyl, 1,1,3,3-tetramethylbutyl, 1-, 2-, 3-, 4-, 5-, 6- or 7-methyloctyl, 1-, 2-, 3-, 4- or 5-ethylheptyl, 1-, 2- or 3-propylhexyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, dimethyloctyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3-, 4- or 5-propyloctyl, 1-, 2- or 3-butylheptyl, 1-pentylhexyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-, 2-pentylheptyl, branched butyl, pentyl, hexyl, heptyl, octyl, nonyl, decyl, undecyl, dodecyl, tridecyl, tetradecyl, pentadecyl, hexadecyl, heptadecyl, octadecyl, nonoadecyl, eicosyl with one or more branch points at any carbon of the alkyl chain, such as 2 (or 1, or 3, or 4)-ethylhexyl, 2 (or 1, or 3, or 4)-hexyldecyl, 2 (or 1, or 3, or 4)-octyldodecyl, 2 (or 1 or 3, or 4)-butyloctyl, 4 (or 1, or 2, or 3, or 5, or 6)-butyldecyl, 5 (or 1, or 2, or 3, or 4, or 6, or 7)-butylundecyl, 6 (or 1, or 2, or 3, or 4, or 5, or 7, or 8)-butyldodecyl, 12 (or 1, or 2, or 3, or 4, or 5, or 6, or 7, or 8, or 9, 10, or 11, or 13, or 14)-butyloctadecyl, and the like.

Examples of dithiophene units include those illustrated in Table B (FIG. 30B) in U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS,". Further examples of dithiophene units are illustrated in Table 3 of U.S. Utility patent application Ser. No. 15/406,382, filed on Jan. 1, 2017, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS,"

A is an acceptor moiety, examples of A are listed in FIGS. 22A-22G.

In some embodiments, the A-D'-D-D'-A semiconductors comprise the structure of:

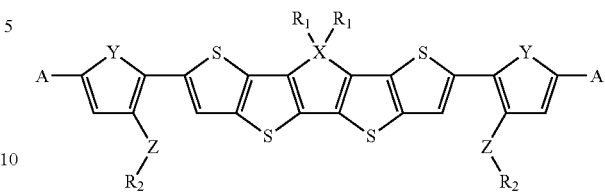

wherein X is C, Si, Ge, N or P; Y is O, S or Se; Z is O or S; Each $R_1$ and $R_2$ is independently hydrogen or a substituted or non-substituted alkyl, aryl or alkoxy chain. A is an acceptor moiety, examples of A are listed in FIGS. 22A-22G.

In some embodiments, the A-D'-D-D'-A semiconductors comprise the structure of:

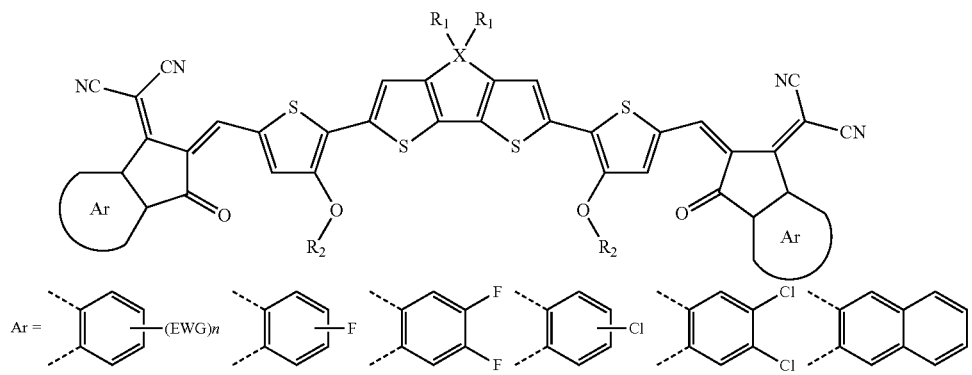

wherein X is C, Si, Ge, N or P; Y is O, S or Se; Z is O or S; Each $R_1$ and $R_2$ is independently hydrogen or a substituted or non-substituted alkyl, aryl or alkoxy chain. A is an acceptor moiety, examples of A are listed in FIGS. 22A-22G.

In some embodiments, the A-D'-D-D'-A semiconductors comprise the structure of:

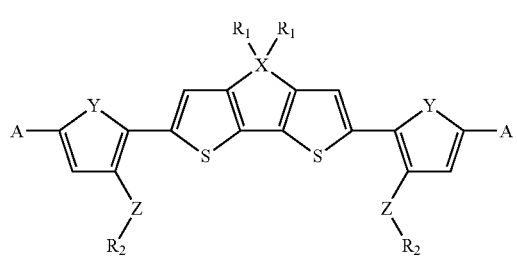

wherein X is C, Si, Ge; EWG=any electron withdrawing group, can be but not limited to F, Cl, Br, I, CN, $NO_2$, sulfonate, ketone, ester; n=1,2,3 or 4; Each $R_1$ and $R_2$ is independently hydrogen or a substituted or non-substituted alkyl, aryl or alkoxy chain.

Block 2104 represents combining the organic semiconducting molecule, comprising an acceptor molecule, with a donor molecule in a solution. Examples of donor molecules include PTB7-Th, DPP polymers, PIP CP, PBPCP, or donor molecules illustrated in FIGS. 23A-23D. The donor molecule can be a small molecule, an oligomer or a polymer.

Figure 24:
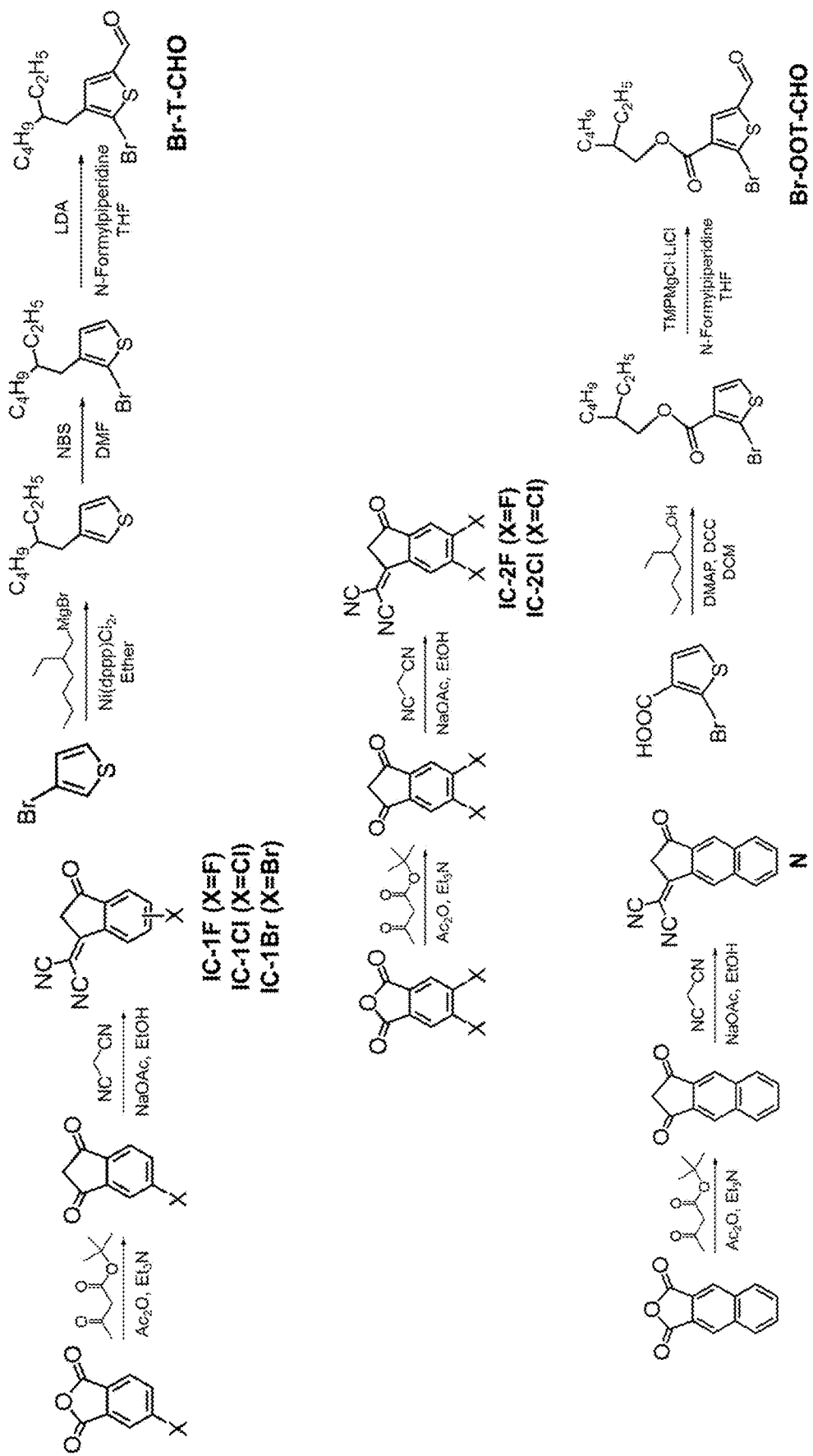
FIG. 24. Structures of intermediates used in exemplary synthesis procedures described herein.

FIG. 24 illustrates a synthesis pathway for one or more intermediates used in the processes described herein.

Figure 25:
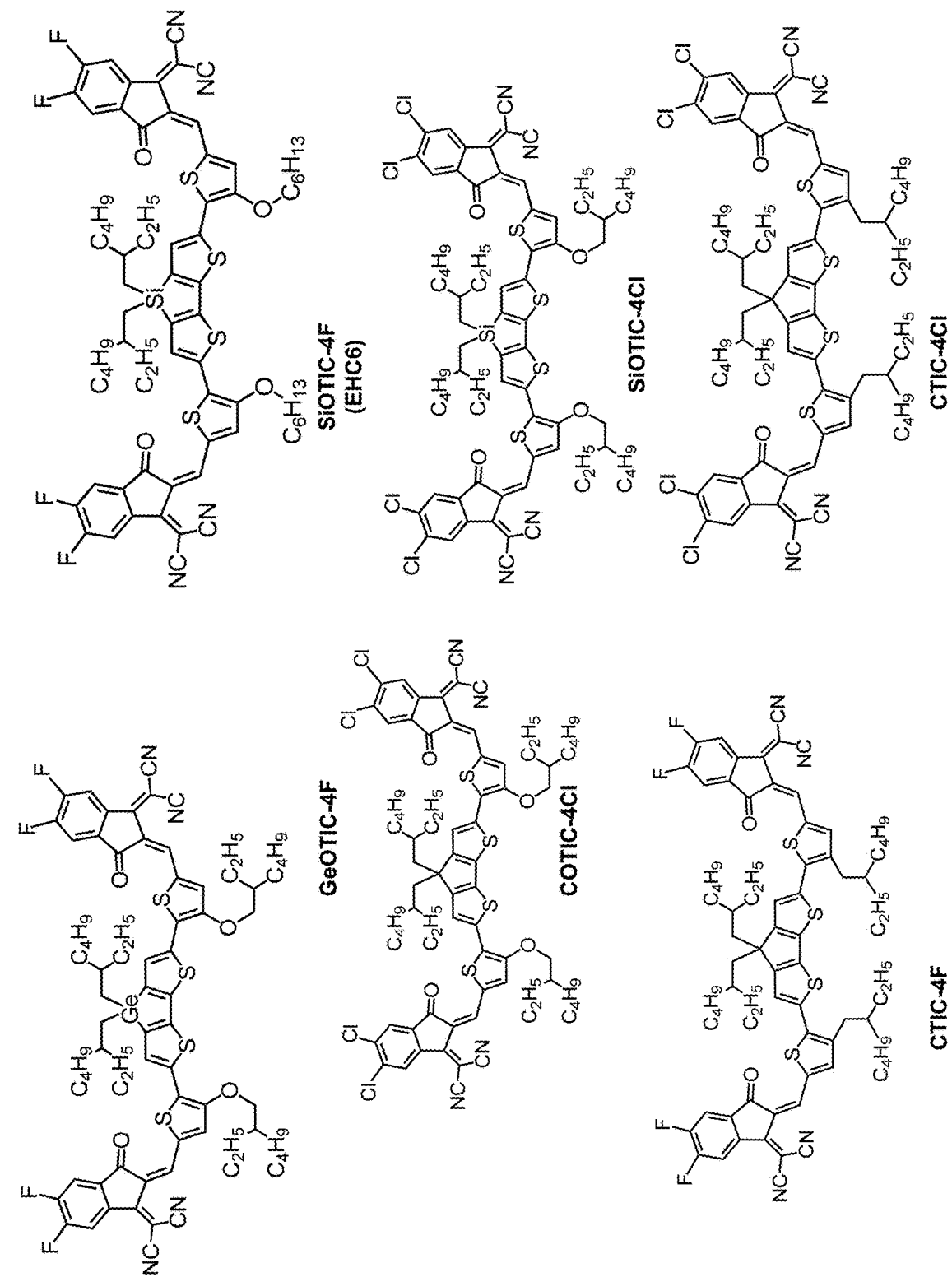
FIG. 25 Structures of exemplary DTX based NFAs described herein.
Figure 25:
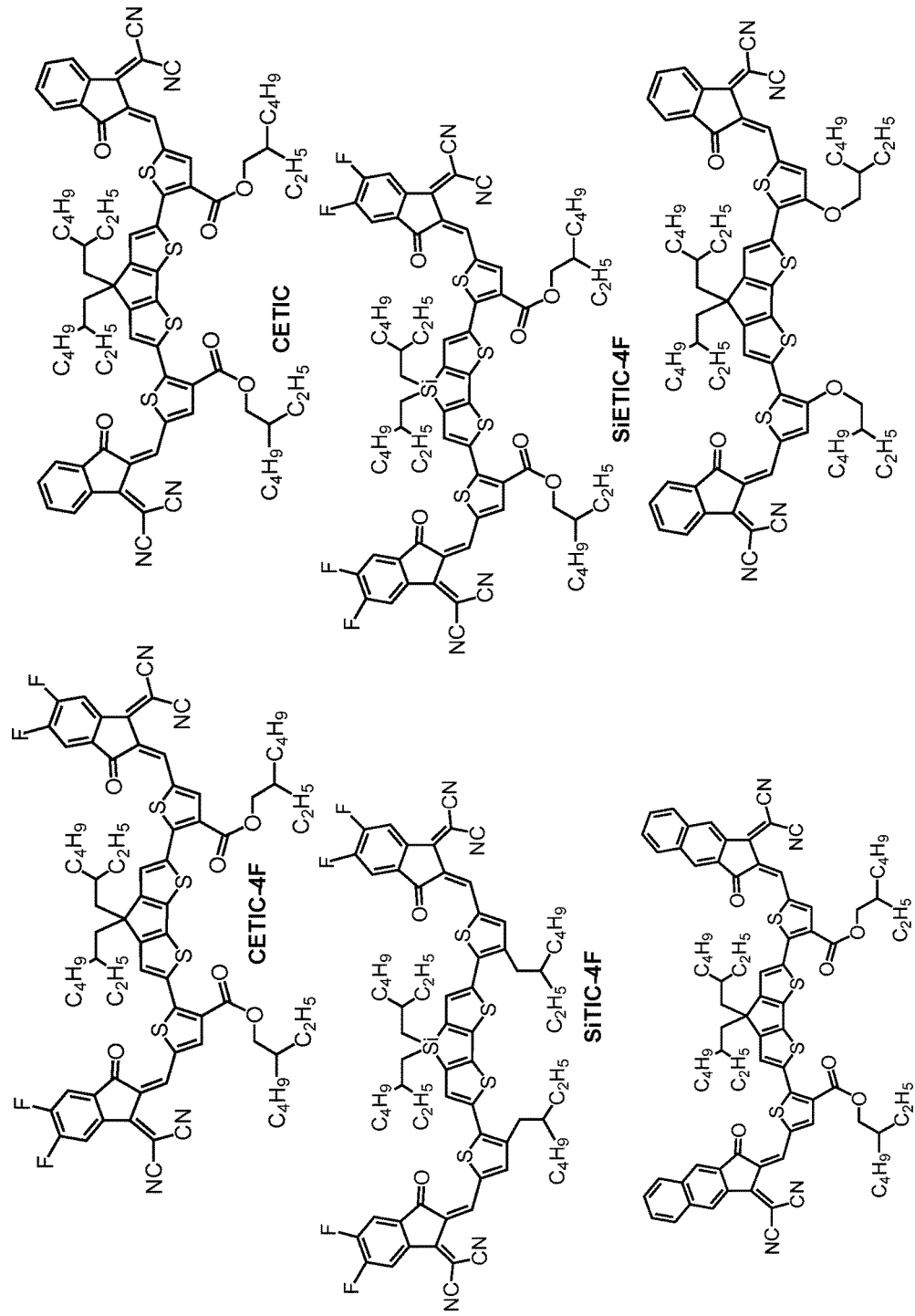

In one or more examples, the combination of the donor and the acceptor forms the molecule having a structure illustrated in FIG. 25 (DTX based NFAs).

Block 2106 represents solution processing the solution so as to form an active region in an organic device such as, but not limited to, a solar cell or a photodetector, e.g., so that the active region comprises the organic semiconducting molecule.

In one or more embodiments, the active region is the sensing element in an infrared photodetector.

In one or more examples, the active region comprises an organic semiconducting acceptor moiety coupled to a donor moiety so as to form an organic semiconducting molecule having an A-D'-D-D'-A structure as described herein, wherein the active region outputs electrical current in response to absorbing electromagnetic radiation.

In one or more embodiments, the active region (e.g., in the solar cell or the photodetector) is sensitive to infrared wavelengths (i.e., the bandgap of the acceptor molecule and/or donor molecule are sufficiently low to absorb infrared radiation).

The active layer, electron transporting/hole blocking layers, hole transporting/electron blocking layers of the electronic device may be deposited by solution casting or vapor deposition. Illustrative thin film deposition methods include a spin coating method, a casting method, a microgravure coating method, a gravure coating method, a bar coating method, a roll coating method, a blade coating method, a wire bar coating method, a dip coating method, a spray coating method, a free span coating method, a dye coating method, a screen printing method, a flexo printing method, an offset printing method, an inkjet printing method, a dispenser printing method, a nozzle coating method and a capillary coating method, for forming a film from a solution. During operation, either or both the electron donor and the electron acceptor absorb photons to create electron-hole pairs, the acceptor molecule (interfacing with the donor molecule) receives the electron in the electron hole pair and transports the electron to the cathode interface layer and the cathode. The hole is transported by the donor to the anode interface layer and then the anode.

In one or more embodiments, the organic semiconducting molecule comprises IOTIC-2F, ITOTIC-2F, IOTIC-2Cl, IOTIC-2Br, o-IO2-4F, p-IO2-4F, IOTN-BO, ITOTIC-4F, GeOTIC-4F, COTIC-4Cl, SiOTIC-4Cl, CTIC-4F, CTIC-4Cl, CETIC-4F, CETIC, SiTIC-4F, or SiETIC-4F.

In one or more embodiments, the organic semiconducting molecule has a HOMO in a range of −5.0 eV to −5.5 eV, a LUMO in a range of −3.8 eV to −4.3 eV, and a bandgap in a range of 1.0 eV to 1.4 eV.

In one or more embodiments, the organic semiconducting molecule has a bandgap narrower than 1.3 eV.

In one or more embodiments, the organic semiconducting molecule has a bandgap narrower than 1.2 eV or narrower than 1.1 eV.

In one or more embodiments, the organic semiconducting molecule has a main absorption band between 850 and 1000 nm.

In one or more embodiments, the organic semiconducting molecule has a maximum extinction coefficient in solution of at least $1.2 \times 10^5$ $M^{-1}$ $cm^{-1}$.

In one or more embodiments, the organic semiconducting molecule is an electron acceptor.

In one or more embodiments, the device further comprises an organic semiconducting donor molecule (e.g., PTB7-Th or a molecule illustrated in FIGS. 23A-23D).

In one or more embodiments, the device:
has an energetic offset between the donor and acceptor HOMO levels ($HOMO_D$-$HOMO_A$, $\Delta E_{HOMO}$) of no more than 0.2 eV;
has an energetic offset between the donor and acceptor HOMO levels ($HOMO_D$-$HOMO_A$, $\Delta E_{HOMO}$) of no more than 0.1 eV;
has an external quantum efficiency (EQE) over 60%, over 70%, over 45%, or over 55% in the wavelength range of 600-850 nm;
has an external quantum efficiency (EQE) over 45%, over 55%, or over 60% in the wavelength range of 600-1000 nm;
has an external quantum efficiency (EQE) over 45%, over 55%, or over 60%, in the wavelength range of 850-1000 nm; a short circuit current $J_{SC}$ over 21 mA $cm^{-2}$;
a transparency over 30% or over 40% in the 380-550 nm wavelength range.
has an average visible transmittance (AVT) of at least 40.7%, at least 47.9%, or at least 52.3% in the range of 370-740 nm;
has an average visible transmittance of at least 49% or at least 53% in the range of 370-740 nm; and/or
has an open circuit voltage energy loss ($E_{loss}=E_g^{opt}-aV_{OC}$) as low as 0.49 eV.
has a responsivity of 0.42 $AW^{-1}$ at 950 nm wavelength, 0V applied bias.
has a specific detectivity as high as $2.6 \times 10^{12}$ Jones at 950 nm wavelength, 0V applied bias, and 155 Hz measurement frequency.
has a specific detectivity over $2 \times 10^{12}$ Jones in the range of 600 nm-950 nm wavelength, 0V applied bias, and 155 Hz measurement frequency.
has a rise and fall time as low as 1.26 and 2.37 μs respectively.
has a dark current as low as $1 \times 10^{-4}$ mA/$cm^2$ at −1V applied bias.

In one or more examples, the device includes a substrate; a transparent cathode on the substrate; a cathode interface layer (or electron transport layer); the active region on the cathode interface layer; an anode interface layer (or hole transport layer) on the absorbing region; and an anode on the anode interface layer.

Examples of a substrate include, but are not limited to, a flexible substrate, a plastic substrate, a polymer substrate, a metal substrate, a silicon substrate, or a glass substrate. In one or more embodiments, the flexible substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film. Examples of cathode interface layer include, but are not limited to ZnO and/or ITO. The ZnO can include multiple layers (e.g., two layers) and have a surface roughness of less than 5 nm over an area of 0.2 $cm^2$.

Examples of anode interface layer include, but are not limited to MoOx having a thickness in a range of 5-150 nm.

Examples of cathode material include, but are not limited to, ITO.

Examples of cathode and anode materials include, but are not limited to, a metal or at least one material selected from gold, aluminum, copper, silver, silver paste, palladium, platinum, nickel, a combination/bilayer of metal and molybdenum oxide or molybdenum (wherein the MoOx is an interlayer), a liquid metal (e.g., mercury alloy, eutectic gallium indium), a transparent conductive layer, carbon nanotubes, graphene, carbon paste, PEDOT:PSS, and a conjugated polyelectrolyte.

In one or more examples, the active layer has a thickness in a range of 50-600 nm.

Possible Modifications and Variations

Related non-fullerene acceptor materials can be designed and synthesized with different chemical structures to tune chemical properties for narrower bandgaps and higher device efficiencies.

Advantages and Improvements

Panchromatic absorbing organic photovoltaic (OPV) devices face stiff competition from silicon and perovskite solar cells in terms of commercial applications due to their relatively lower device efficiencies. Band absorbers such as inorganic and hybrid organic-inorganic systems have much better light harvesting abilities, achieving PCEs in the range of ~ 20% (and higher for more niche applications), while OPVs have only recently attained device efficiencies near 15%. However, organic semiconductors possess an inherent advantage in applications that require transparency. The excitonic nature of their absorption makes it possible to tune the material's light transmission so that OPV devices can be paired with complementary systems, such as plants. In such applications, the absorption window of the OPV device could be tuned to the 700 nm and longer range in order to let through wavelengths of light that are necessary for plant photosynthesis. This would allow for the production of electricity while also maximizing plant growth. In order to design materials that fit these criteria, it is necessary to narrow the optical absorption gap below ~1.35 eV.

In one or more embodiments achieving such a small optical gap, the design moves away from the acceptor-donor-acceptor (A-D-A) structural motifs that have commonly been employed in non-fullerene acceptors (NFAs). As illustrated herein, the introduction of an additional electron-rich (D) or electron-poor (A) aromatic group between the central donor unit (such as indacenoditiophene, IDT, or indacenodithienothiophene, IDTT) and the outer acceptor dye enhances intramolecular charge transfer. As described herein, with these structural modifications, materials with an optical gap in the range of 1.3 eV are created. When paired with the correct polymer donor, embodiments of the present invention have been able to achieve power conversion efficiencies (PCEs) more than to 12%.

Moreover, the present disclosure shows that previous empirical limits for simultaneously achieving high photocurrent and photovoltage can be overcome by finely tuning the molecular electronic structure of NFA to match its polymeric donor counter-component in bulk-heterojunction (BHJ) devices. As illustrated herein, gradually raising the HOMO levels of NFAs through π-extension of central donor core (FIG. 1) minimizes the energetic offset between the donor and acceptor HOMO levels ($HOMO_D$-$HOMO_A$, $\Delta E_{HOMO}$) while keeping the LUMO levels. The introduction of fluorine atoms onto accepting moieties has also been shown to enhance the intramolecular charge transfer (ICT) effect and improve the degree of intermolecular organization, further reducing the $E_g^{opt}$ and enhancing charge transport properties.[section A references 20,21]. However, this strategy imposes a trade-off in efficiency: the inductively withdrawing nature of fluorine ensures that the LUMO level of electron acceptor is deep-lying and thus would produce a lower $V_{OC}$ in OSCs. However, the present disclosure describes how, based on these considerations, mono-fluorine atoms were introduced onto the 2-(3-oxo-2,3-dihydroinden-1-ylidene)malononitrile (IC) end groups. In comparison to the A-D-A structured ITIC-2F, the absorption spectrum of IOTIC-2F (or ITOTIC-2F) with the A-D'-D-D'-A configuration was broadened and redshifted remarkably into the NIR region. Blends of a polymer donor PTB7-Th and IOTIC-2F in OSC devices yielded PCEs of 12.6% with remarkably high $J_{SC}$ values over 23 mA cm$^{-2}$. These devices experience energy losses as low as 0.49 eV, which is the smallest value so far for organic BHJ solar cells over 10% PCEs. Furthermore, the transmission spectra of the PTB7-Th:IOTIC-2F blend on ITO glass/ZnO substrates show an impressive visible transparency of 52.3% in the range of 370-740 nm. Thus, these results open a new avenue for using NBG-NFAs toward future highly transparent and efficient solar cell applications.

In one or more further embodiments decreasing the optical gap, the strength of the central donor unit is increased. Most NFAs reported to date use indacenoditiophene-(IDT) or indacenodithienothiophene-(IDTT) based central donating units. However, as illustrated herein, the IDT-based core was replaced with a significantly more electron-rich (and stronger donating) moiety: cyclopentadithiophene (CPDT) or dithienosilole (DTS) in order to achieve an optical gap of ~ 1.1 eV and below. The increased donating character of the DTS/CPDT unit results in a narrower optical gap (1.0-1.2 eV). As demonstrated herein, when paired with the correct polymer donor, power conversion efficiencies (PCEs) of more than 8% were achieved. When the system was used in a photodetector application, high responsivity, high specific detectivity in the near IR region (850 nm-1000 nm) and fast response time was achieved.

Thus, the present disclosure describes surprising and unexpected methods for designing electron acceptor materials and has demonstrated both their desirable absorbance characteristics and device performance.

REFERENCES

The following references are incorporated by reference herein.

References for Part A 1. (a) Y. J. Cheng, S. H. Yang, C. S. Hsu, *Chem. Rev.*, 2009, 109, 5868.; (b) A. C. Arias, J. D. MacKenzie, I. McCulloch, J. Rivnay, A. Salleo, *Chem. Rev.*, 2010, 110, 3.; (c) G. Dennler, M. C. Scharber and C. J. Brabec, *Adv. Mater.*, 2009, 21, 1323.

2. (a) M. A. Green, K. Emery, Y. Hishikawa, W. Warta, E. D. Dunlop, *Progress Photovolt: Res Appl*, 2015, 23, 1.; (b) N. G. Park, M. Grätzel, T. Miyasaka, K. Zhu, K. Emery, *Nat Energy*, 2016, 1, 16152.

3. C. J. M. Emmott, J. A. Röhr, M. Campoy-Quiles, T. Kirchartz, A. Urbina, N. J. Ekins-Daukesa, J. Nelson, *Energy Environ. Sci.*, 2015, 8, 1317.

4. W. Chen, Q. Zhang, *J. Mater. Chem. C*, 2017, 5, 1275.

5. Y. Lin, J. Wang, Z.-G. Zhang, H. Bai, Y. Li, D. Zhu, X. Zhan, *Adv. Mater.*, 2015, 27, 1170.

6. (a) W. Zhao, S. Li, H. Yao, S. Zhang, Y. Zhang, B. Yang, J. Hou, *J. Am. Chem. Soc.*, 2017, 139, 7148.; (b) D. Baran, T. Kirchartz, S. Wheeler, S. Dimitrov, M. Abdelsamie, J. Gorman, R. S. Ashraf, S. Holliday, A. Wadsworth, N. Gasparini, P. Kaienburg, H. Yan, A. Amassian, C. J. Brabec, J. R. Durrant, I. McCulloch, *Energy Environ. Sci.*, 2016, 9, 3783.; (c) Y. Yang, Z.-G. Zhang, H. Bin, S. Chen, L. Gao, L. Xue, C. Yang, Y. Li, *J. Am. Chem. Soc.*, 2016, 138, 15011.; (d) B. Kan, H. Feng, X. Wan, F. Liu, X. Ke, Y. Wang, Y. Wang, H. Zhang, C. Li, J. Hou, Y. Chen, *J. Am. Chem. Soc.*, 2017, 139, 4929.; (e) Y. Li, L. Zhong, B. Gautam, H.-J. Bin, J.-D. Lin, F.-P. Wu, Z. Zhang, Z.-Q. Jiang, Z.-G. Zhang, K. Gundogdu, Y. Li, L.-S. Liao, *Energy Environ. Sci.*, 2017, 10, 1610.; (f) S. Chen, Y. Liu, L. Zhang, P. C. Y. Chow, Z. Wang, G. Zhang, W. Ma, H. Yan, *J. Am. Chem. Soc.*, 2017, 139, 6298.; (g) F. Liu, Z. Zhou, C. Zhang, T. Vergote, H. Fan, F. Liu, X. Zhu, *J. Am. Chem. Soc.*, 2016, 138, 15523.

7. (a) T. Liu, J. Zhao, Z. Li, C. Mu, W. Ma, H. Hu, K. Jiang, H. Lin, H. Ade, H. Yan, *Nat. Commun.*, 2014, 5, 5293.; (b) D. Deng, Y. Zhang, J. Zhang, Z. Wang, L. Zhu, J. Fang, B. Xia, Z. Wang, K. Lu, W. Ma, Z. Wei, *Nat. Commun.*, 2016, 7, 13740.; (c) J. W. Jo, J. W. Jung, E. H. Jung, H. Ahn, T. J. Shin and W. H. Jo, *Energy Environ. Sci.*, 2015, 8, 2427.

8. H. Yao, Y. Chen, Y. Qin, R. Yu, Y. Cui, B. Yang, S. Li, K. Zhang, J. Hou, *Adv. Mater.*, 2016, 28, 8283.

9. F. Zhao, S. Dai, Y. Wu, Q. Zhang, J. Wang, L. Jiang, Q. Ling, Z. Wei, W. Ma, W. You, C. Wang, X. Zhan, *Adv. Mater.*, 2017, 1700144.

10. Y.-X. Xu, C.-C. Chueh, H.-L. Yip, F.-Z. Ding, Y.-X. Li, C.-Z. Li, X. Li, W.-C. Chen, A. K.-Y. Jen, *Adv. Mater.*, 2012, 24, 6356.

11. M. Wang, H. Wang, T. Yokoyama, X. Liu, Y. Huang, Y. Zhang, T.-Q. Nguyen, S. Aramaki, G. C. Bazan, *J. Am. Chem. Soc.*, 2014, 136, 12576.

12. H. Zhou, L. Yang, A. C. Stuart, S. C. Price, S. Liu and W. You, *Angew. Chem. Int. Ed.*, 2011, 50, 2995.

13. S.-J. Ko, B. Walker, T. L. Nguyen, H. Choi, J. Seifter, M. A. Uddin, T. Kim, S. Kim, J. Heo, G.-H. Kim, S. Cho, A. J. Heeger, H. Y. Woo, J. Y. Kim, *Adv. Funct. Mater.*, 2016, 26, 3324.

14. N. A. Ran, J. A. Love, C. J. Takacs, A. Sadhanala, J. K. Beavers, S. D. Collins, Y. Huang, M. Wang, R. H. Friend, G. C. Bazan, T. Q. Nguyen, *Adv. Mater.*, 2016, 28, 1482.

15. Y. Li, L. Zhong, B. Gautam, H.-J. Bin, J.-D. Lin, F.-P. Wu, Z. Zhang, Z.-Q. Jiang, Z.-G. Zhang, K. Gundogdu, Y. Li, L.-S. Liao, F. Gao, H. Yan, J. R. Durrant, I. McCulloch, Y. F. Ng, X. Y. Zhu, C. Nuckolls, *Energy Environ. Sci.* 2017.

16. A. Mishra, M. L. Keshtov, A. Looser, R. Singhal, M. Stolte, F. Wörthner, P. Baeuerle, G. D. Sharma, *J. Mater. Chem. A* 2017.

17. W. Wang, C. Yan, T.-K. Lau, J. Wang, K. Liu, Y. Fan, X. Lu, X. Zhan, *Adv. Mater.* 2017.

18. H. Yao, Y. Chen, Y. Qin, R. Yu, Y. Cui, B. Yang, S. Li, K. Zhang, J. Hou, *Adv. Mater.* 2016, 28, 8283.

19. F. Liu, Z. Zhou, C. Zhang, J. Zhang, Q. Hu, T. Vergote, F. Liu, T. P. Russell, X. Zhu, *Adv. Mater.* 2017, 29, 1606574.

20. W. Zhao, S. Li, H. Yao, S. Zhang, Y. Zhang, B. Yang, J. Hou, *J. Am. Chem. Soc.* 2017, 139, 7148.

21. S. Dai, F. Zhao, Q. Zhang, T.-K. Lau, T. Li, K. Liu, Q. Ling, C. Wang, X. Lu, W. You, X. Zhan, *J. Am. Chem. Soc.* 2017, 139, 1336.

22. C. P. Chen, S. H. Chan, T. C. Chao, C. Ting, B. T. Ko, *J. Am. Chem. Soc.* 2008, 130, 12828.

23. Y.-X. Xu, C.-C. Chueh, H.-L. Yip, F.-Z. Ding, Y.-X. Li, C.-Z. Li, X Li, W.-C. Chen, A. K.-Y. Jen, *Adv. Mater.* 2012, 24, 6356.

24. Y.-X. Xu, C.-C. Chueh, H.-L. Yip, F.-Z. Ding, Y.-X. Li, C.-Z. Li, X Li, W.-C. Chen, A. K.-Y. Jen, *Adv. Mater.* 2012, 24, 6356.

25. H. Huang. L. Yang, A. Facchetti, T. J. Marks, *Chem. Rev.* 2017, 117, 10291.

26. N. E. Jackson, B. M. Savoie, K. L. Kohlstedt, M. O. D. L. Cruz, G. C. Schatz, L. X. Chen, M. A. Ratner, *J. Am. Chem. Soc.* 2013, 135, 10475.

27. D. Baran, T. Kirchartz, S. Wheeler, S. Dimitrov, M. Abdelsamie, J. Gorman, R. S. Ashraf, S. Holliday, A. Wadsworth, N. Gasparini, P. Kaienburg, P. Yan, A. Amassian, C. J. Brabec, J. R. Durrant, I. McCulloch, *Energy Environ. Sci.*, 2016, 9, 3783.

28. Y. Li, X. Liu, F.-P. Wu, Y. Zhou, Z.-Q. Jiang, B. Song, Y. Xia, Z.-Q. Zhang, F. Gao, 0. Inganäs, Y. Li, L.-S. Liao, *J. Mater. Chem. A* 2016, 4, 5890.

29. A. Mishra, M. L. Keshtov, A. Looser, R. Singhal, M. Stolte, F. Würthner, P. Bäuerle, G. D. Sharma, *J. Mater. Chem. A* 2017, 5, 14887.

30. J. Liu, S. Chen, D. Qian, B. Gautam, G. Yang, J. Zhao, J. Bergqvist, F. Zhang, W. Ma, H. Ade, O. Inganäs, K. Gundogdu, F. Gao, H. Yan, *Nat. Energy* 2016,1, 16089.

31. D. Meng, H. Fu, C. Xiao, X. Meng, T. Winands, W. Ma, W. Wei, B. Fan, L. Huo, N. L. Doltsinis, Y. Li, Y. Sun, Z. Wang, *J. Am. Chem. Soc.* 2016, 138, 10184.

32. Y. Lin, F. Zhao, Q. He, L. Huo, Y. Wu, T. C. Parker, W. Ma, Y. Sun, C. Wang, D. Zhu, A. J. Heeger, S. R. Marder, X. Zhan, *J. Am. Chem. Soc.* 2016, 138, 4955.

33. S. Chen, Y. Liu, L. Zhang, P. C. Y. Chow, Z. Wang, G. Zhang, W. Ma, H. Yan, *J. Am. Chem. Soc.* 2017, 139, 6298.

References for Part B 1. (a) Y. J. Cheng, S. H. Yang, C. S. Hsu, *Chem. Rev.*, 2009, 109, 5868.; (b) A. C. Arias, J. D. MacKenzie, I. McCulloch, J. Rivnay, A. Salleo, *Chem. Rev.*, 2010, 110, 3.; (c) G. Dennler, M. C. Scharber and C. J. Brabec, *Adv. Mater.*, 2009, 21, 1323.

2. (a) J. Zhao, Y. Li, G. Yang, K. Jiang, H. Lin, H. Ade, W. Ma, H. Yan, *Nat. Energy*, 2016, 1, 15027.; (b) M. Li, K. Gao, X. Wan, Q. Zhang, B. Kan, R. Xia, F. Liu, X. Yang, H. Feng, W. Ni, Y. Wang, J. Peng, H. Zhang, Z. Liang, H.-L. Yip, X. Peng, Y. Cao, Y. Chen, *Nat. Photonics*, 2017, 11, 85.; (c) H. Q. Zhou, Y. Zhang, C. K. Mai, S. D. Collins, G. C. Bazan, T. Q. Nguyen, A. J. Heeger, *Adv. Mater.*, 2015, 27, 1767.; (d) Z. C. He, B. Xiao, F. Liu, H. B. Wu, Y. L. Yang, S. Xiao, C. Wang, T. P. Russell, Y. Cao, *Nat. Photonics*, 2015, 9, 174.; (e) C. C. Chen, W. H. Chang, K. Yoshimura, K. Ohya, J. B. You, J. Gao, Z. R. Hong, Y. Yang, *Adv. Mater.*, 2014, 26, 5670.; (f) V. Vohra, K. Kawashima, T. Kakara, T. Koganezawa, I. Osaka, K. Takimiya, H. Murata, *Nat. Photonics*, 2015, 9, 403.; (g) J. Lee, D. H. Sin, B. Moon, J. Shin, H. G. Kim, M. Kim, K. Cho, *Energy Environ. Sci*, 2017,10, 247.

3. (a) M. A. Green, K. Emery, Y. Hishikawa, W. Warta, E. D. Dunlop, *Progress Photovolt: Res Appl,* 2015, 23, 1.; (b) N.-G. Park, M. Grätzel, T. Miyasaka, K. Zhu, K. Emery, *Nat Energy,* 2016, 1, 16152.

4. C. J. M. Emmott, J. A. Röhr, M. Campoy-Quiles, T. Kirchartz, A. Urbina, N. J. Ekins-Daukesa, J. Nelson, *Energy Environ. Sci.*, 2015, 8, 1317.

5. W. Chen, Q. Zhang, *J. Mater. Chem. C,* 2017, 5, 1275.

6. Y. Lin, J. Wang, Z.-G. Zhang, H. Bai, Y. Li, D. Zhu, X. Zhan, *Adv. Mater.*, 2015, 27, 1170.

7. (a) W. Zhao, S. Li, H. Yao, S. Zhang, Y. Zhang, B. Yang, J. Hou, *J. Am. Chem. Soc.*, 2017, 139, 7148.; (b) D. Baran, T. Kirchartz, S. Wheeler, S. Dimitrov, M. Abdelsamie, J. Gorman, R. S. Ashraf, S. Holliday, A. Wadsworth, N. Gasparini, P. Kaienburg, H. Yan, A. Amassian, C. J. Brabec, J. R. Durrant, I. McCulloch, *Energy Environ. Sci.*, 2016, 9, 3783.; (c) Y. Yang, Z.-G. Zhang, H. Bin, S. Chen, L. Gao, L. Xue, C. Yang, Y. Li, *J. Am. Chem. Soc.*, 2016, 138, 15011.; (d) B. Kan, H. Feng, X. Wan, F. Liu, X. Ke, Y. Wang, Y. Wang, H. Zhang, C. Li, J. Hou, Y. Chen, *J. Am. Chem. Soc.*, 2017, 139, 4929.; (e) Y. Li, L. Zhong, B. Gautam, H.-J. Bin, J.-D. Lin, F.-P. Wu, Z. Zhang, Z.-Q. Jiang, Z.-G. Zhang, K. Gundogdu, Y. Li, L.-S. Liao, *Energy Environ. Sci.*, 2017,10, 1610.; (f) S. Chen, Y. Liu, L. Zhang, P. C. Y. Chow, Z. Wang, G. Zhang, W. Ma, H. Yan, *J. Am. Chem. Soc.*, 2017, 139, 6298.; (g) F. Liu, Z. Zhou, C. Zhang, T. Vergote, H. Fan, F. Liu, X. Zhu, *J. Am. Chem. Soc.*, 2016, 138, 15523.

8. H. Yao, Y. Chen, Y. Qin, R. Yu, Y. Cui, B. Yang, S. Li, K. Zhang, J. Hou, *Adv. Mater.*, 2016, 28, 8283.

9. R. C. Coffin, J. Peet, J. Rogers, G. C. Bazan, *Nature Chemistry,* 2009, 1, 657.

10. T. L. Nguyen, H. Choi, S.-J. Ko, M. A. Uddin, B. Walker, S. Yum, J.-E. Jeong, M. H. Yun, T. J. Shin, S. Hwang, J. Y. Kim and H. Y. Woo, *Energy Environ. Sci.,* 2014, 7, 3040.

11. M. Wang, H. Wang, T. Yokoyama, X. Liu, Y. Huang, Y. Zhang, T.-Q. Nguyen, S. Aramaki, G. C. Bazan, *J. Am. Chem. Soc.*, 2014, 136, 12576.

12. H. Zhou, L. Yang, A. C. Stuart, S. C. Price, S. Liu and W. You, *Angew. Chem. Int. Ed.,* 2011, 50, 2995.

13. S.-J. Ko, B. Walker, T. L. Nguyen, H. Choi, J. Seifter, M. A. Uddin, T. Kim, S. Kim, J. Heo, G.-H. Kim, S. Cho, A. J. Heeger, H. Y. Woo, J. Y. Kim, *Adv. Funct. Mater.,* 2016, 26, 3324.

14. N. A. Ran, J. A. Love, C. J. Takacs, A. Sadhanala, J. K. Beavers, S. D. Collins, Y. Huang, M. Wang, R. H. Friend, G. C. Bazan, T. Q. Nguyen, *Adv. Mater.,* 2016, 28, 1482.

15. G. C. Welch, R. C. Bakus, S. J. Teat, G. C. Bazan, *J. Am. Chem. Soc.,* 2013, 135, 2298.

16. A. Mishra, M. L. Keshtov, A. Looser, R. Singhal, M. Stolte, F. Würthner, P. Baeuerle, G. D. Sharma, *J. Mater. Chem. A* 2017

17. H. Yao, Y. Cui, R. Yu, B. Gao, H. Zhang, J. Hou, *Angew. Chemie Int. Ed.* 2017, 56, 3045.

(18) (a) Chen, S.; Liu, Y.; Zhang, L.; Chow, P. C. Y.; Wang, Z.; Zhang, G.; Ma, W.; Yan, H. *J. Am. Chem. Soc.* 2017, 139, 6298. (b) Liu, F.; Zhou, Z.; Zhang, C.; Vergote, T.; Fan, H.; Liu, F.; Zhu, X. *J. Am. Chem. Soc.* 2016, 138, 15523.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An organic device, comprising:
an active region comprising an organic semiconducting acceptor molecule having a structure:

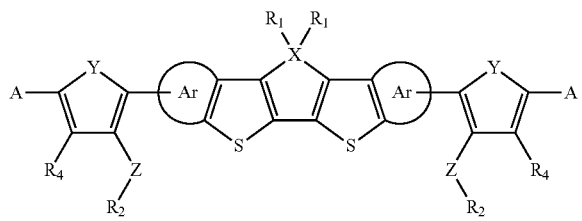

wherein:
each Ar is independently a substituted or non-substituted aromatic functional group, or each Ar is independently nothing and the valence of its respective thiophene ring is completed with hydrogen;
X is C, Si, Ge, N or P; Y is O, S, Se or N—$R_3$;
Z is O, S, Se, or N—$R_3$;
each $R_1$, $R_2$, and $R_3$ is independently hydrogen or a substituted or non-substituted alkyl, aryl or alkoxy chain;
$R_4$ is either a hydrogen or the same as Z—$R_2$; and
A is an acceptor moiety.

2. The device of claim 1, wherein the dithiophene has side chains soluble in a solvent used to solution process the device.

3. The device of claim 1, wherein the organic semiconducting acceptor molecule has the structure:

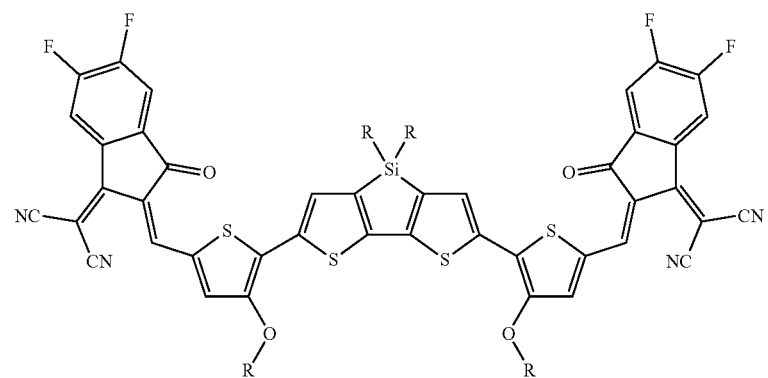

SiOTIC-4F or

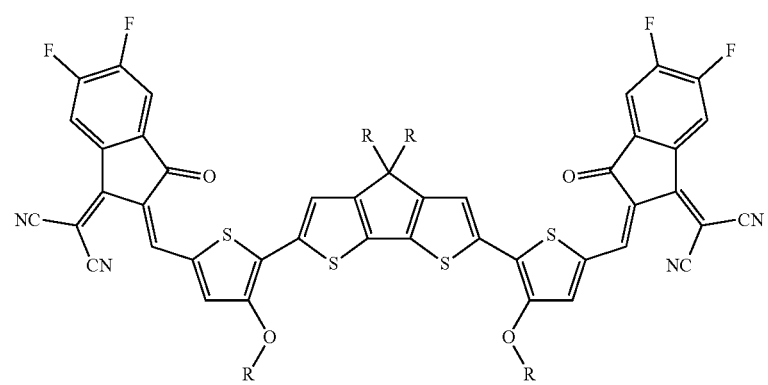

COTIC-4F or

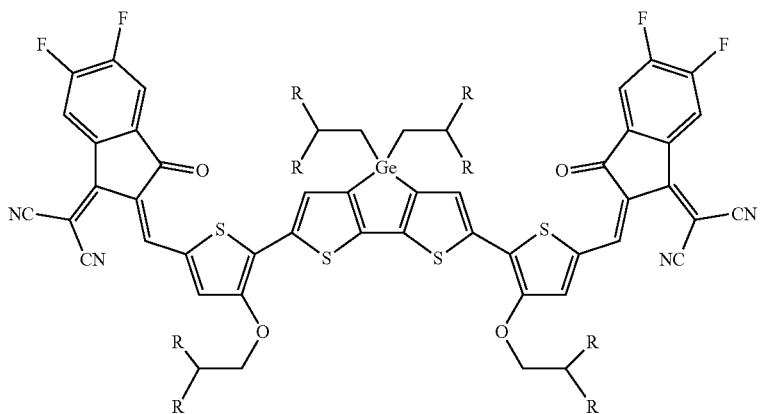
GeOTIC-4F
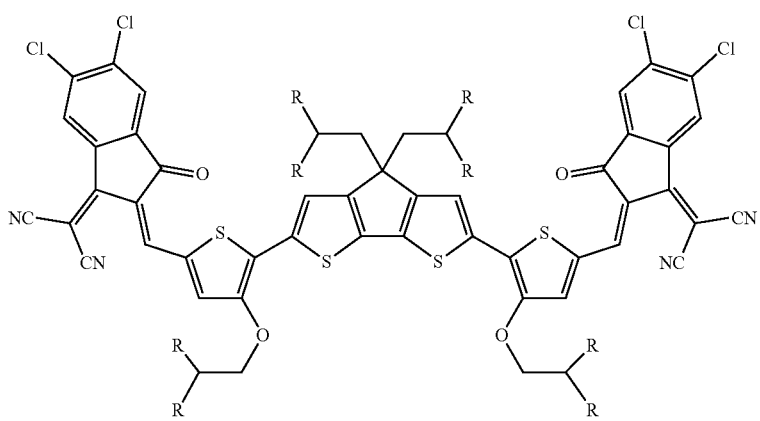
COTIC-4Cl
or
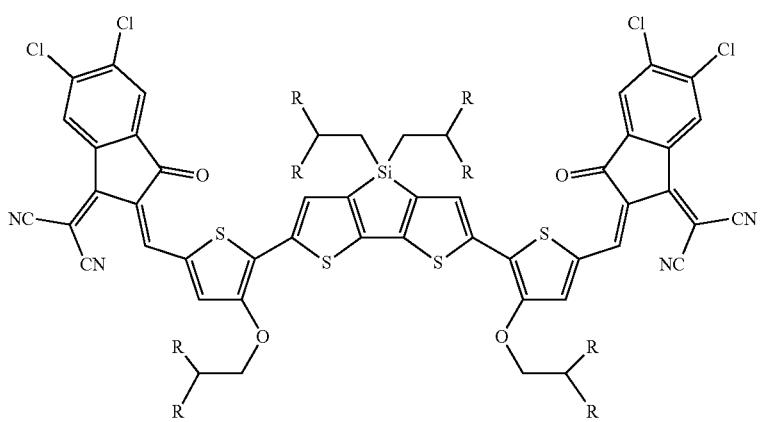

wherein R is a solubilizing chain comprising a substituted or non-Substituted alkyl, aryl or alkoxy chain.

4. The device of claim 1, wherein— the organic semiconducting molecule has the structure:

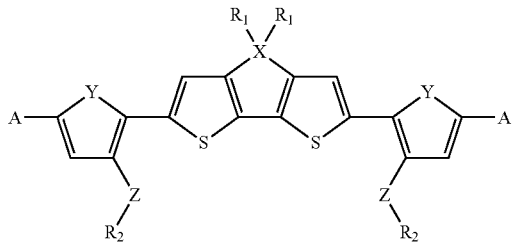

wherein X is C, Si, Ge, N or P; Y is O, S or Se; Z is O or S.

5. The device of claim 1,—wherein:
the R, $R_1$, $R_2$, $R_3$ and/or $R_4$; each comprise a substituted or non-substituted alkyl, aryl or alkoxy chain including, but not limited to, a $C_6$-$C_{50}$ substituted or non-substituted alkyl or alkoxy chain, —$(CH_2CH_2O)_n$(n=2~30), $C_6H_5$, —$C_nF_{(2n+1)}$(n=2~50),—$(CH_2)_nN(CH_3)_3Br$ (n=2~50), 2-ethylhexyl, $PhC_mH_{2m+1}$(m=1-50), —$(CH_2)_nN(C_2H_5)_2$(n=2~50), —$(CH_2)_nSi(C_mH_{2m+1})_3$ (m, n=1 to 50), or —$(CH_2)_nSi(OSi(C_mH_{2m+1})_3)_x$ $(C_pH_{2p+1})_y$(m, n, p=1 to 50, x+y=3).

6. The device of claim 1, wherein A is a compound of the structure:

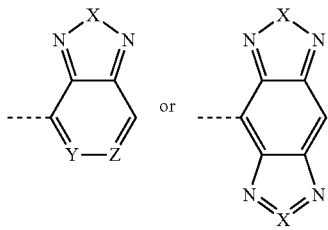

Y and Z are each independently CH, CF, N, C—CN or C—OR, and
X=O, S, Se, or N—R where R is H or a solubilizing chain.

7. The device of claim 1, wherein A is a compound of the structure:

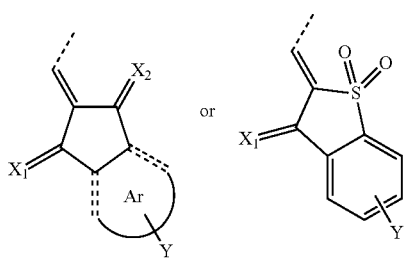

$X_1$ and $X_2$ are each independently O, S, or a malonitrile,
Y is one or more halogens, —CN, or any solubilizing chain, and
Ar is any aryl unit.

8. The device of claim 1, further comprising an organic semiconducting donor molecule.

9. The device of claim 8, wherein the donor molecule comprises PTB7-Th or PBDB-T.

10. The device of claim 1, wherein the active region is a sensing element in the photodetector comprising an infrared photodetector.

11. The device of claim 1, further comprising:
an organic semiconducting donor molecule forming heterojunction with the organic semiconducting acceptor molecule;
a first electrode coupled to the organic semiconducting acceptor molecule to receive electrons in electron-hole pairs generated in response to electromagnetic radiation;
a second electrode coupled to the organic semiconducting donor molecule to receive holes in the electron-hole pairs, wherein:
the device comprises a photodetector having an external quantum efficiency (EQE) above 50% in the wavelength range of 900-950 nm when the second electrode is biased negatively with respect to the first electrode.

12. The device of claim 1, wherein the device has an external quantum efficiency (EQE) above 55% in the wavelength range of 600-1000 nm.

13. The device of claim 1,—wherein A is a compound of the structure:

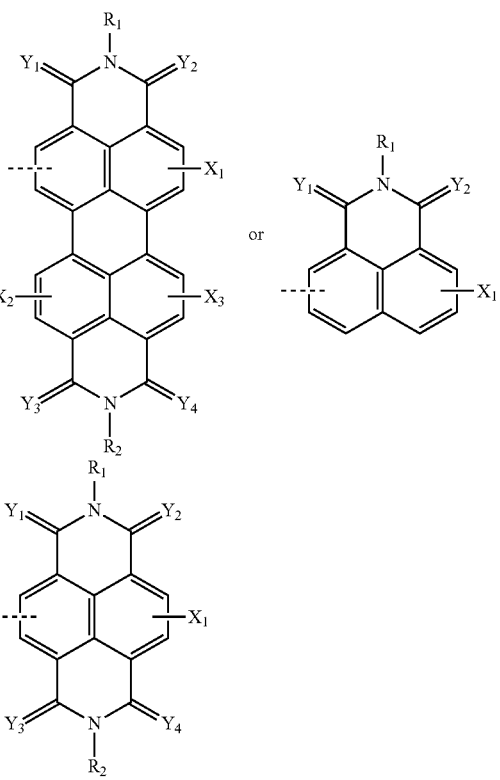

$X_1$, $X_2$, and $X_3$ are each independently a halogen, CN, alkoxy, alkylthio, N-annulated (a ring comprising N), or S—annulated (a ring comprising S),
$Y_1$, $Y_2$, $Y_3$, and $Y_4$ are each independent S or O, and
$R_1$ and $R_2$ are each independently H or a solubilizing chain.

14. The device of claim 1, wherein A is a compound of the structure:

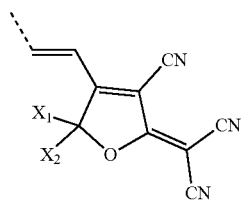

X₁ or X₂ = methyl or trifluoromethyl

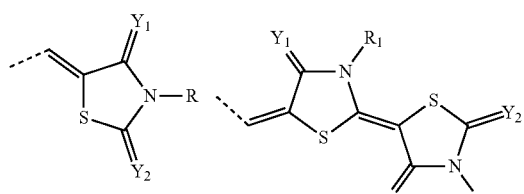

Y₁, Y₂ or Y₃ = O, S or malonitrile
R = any solubilizing chain or H

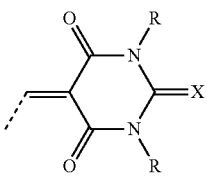

X = O, S, Se
R = H or any solubilizing chain

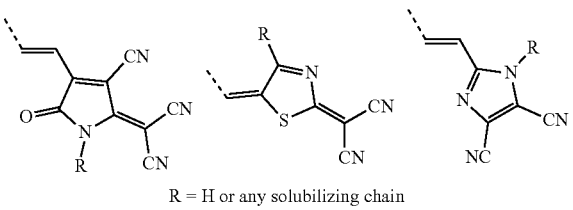

R = H or any solubilizing chain

15. A composition of matter, comprising:
a molecule of the structure:

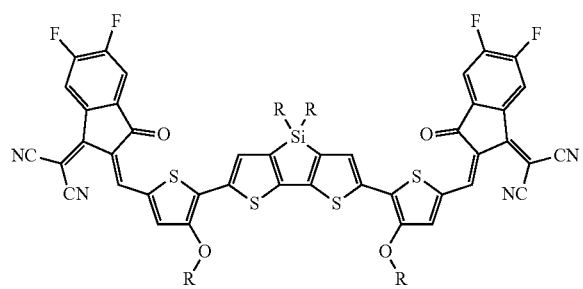

SiOTIC-4F
or

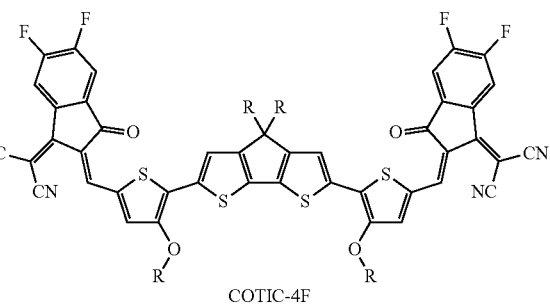

COTIC-4F or

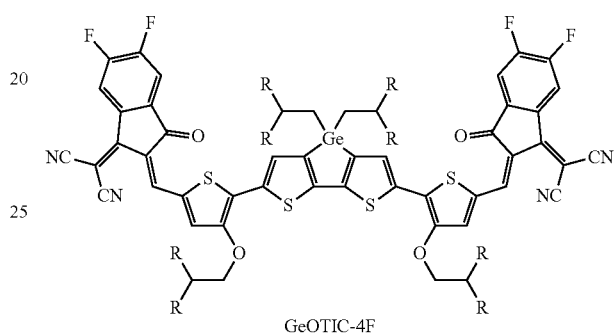

GeOTIC-4F or

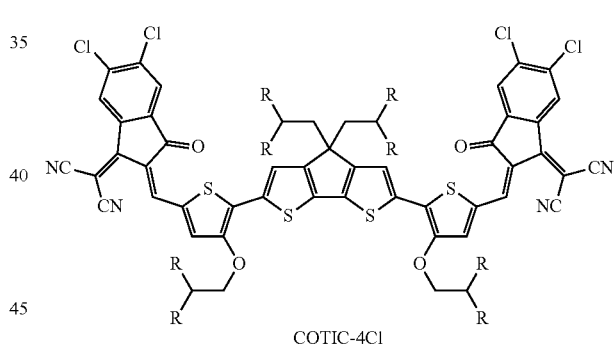

COTIC-4Cl or

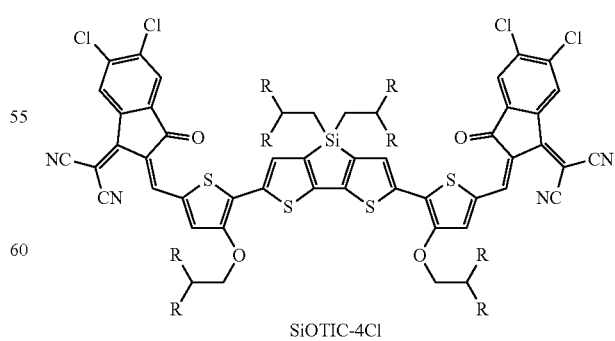

SiOTIC-4Cl wherein R is a solubilizing chain comprising a substituted or non-substituted alkyl, aryl or alkoxy chain.

16. A composition of matter, comprising an organic semiconducting molecule having a structure:

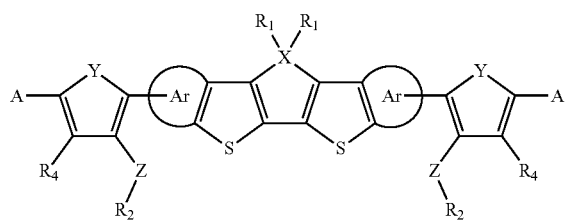

wherein:
each Ar is independently a substituted or non-substituted aromatic functional group, or each Ar is independently nothing and the valence of its respective thiophene ring is completed with hydrogen;
X is C, Si, Ge, N or P; Y is O, S, Se or N—$R_3$;
Z is O, S, Se, or N—$R_3$;
each $R_1$, $R_2$, and $R_3$ is independently hydrogen or a substituted or non-substituted alkyl, aryl or alkoxy chain;
$R_4$ is either a hydrogen or the same as Z—$R_2$; and
A is an acceptor moiety.

17. The composition of matter of claim 16, wherein the organic semiconducting molecule has the structure:

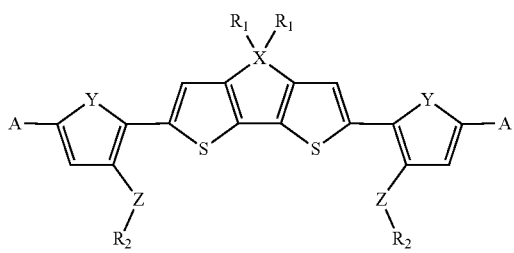

wherein X is C, Si, Ge, N or P; Y is O, S or Se; Z is O or S.

18. The composition of matter of claim 16, wherein:
the R, $R_1$, $R_2$, $R_3$ and/or $R_4$ each comprise a substituted or non-substituted alkyl, aryl or alkoxy chain including, but not limited to, a $C_6$-$C_{50}$ substituted or non-substituted alkyl or alkoxy chain, —($CH_2CH_2O$)n (n=2~30), $C_6H_5$, —$C_nF_{(2n+1)}$(n=2 ~50), —($CH_2$)$_n$N($CH_3$)$_3$Br (n=2~50), 2-ethylhexyl, Ph$C_mH_{2m+1}$(m=1-50), —($CH_2$)$_n$N($C_2H_5$)$_2$(n=2~50), —($CH_2$)$_n$Si($C_mH_{2m+1}$)$_3$ (m, n=1 to 50), or —($CH_2$)$_n$Si(OSi($C_mH_{2m+1}$)$_3$)$_x$($C_pH_{2p+1}$)$_y$(m, n, p=1 to 50, x+y=3).

19. The composition of matter of claim 16, wherein A is a compound of the structure:

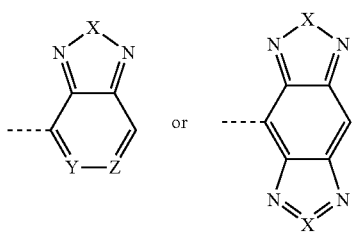

Y and Z are each independently CH, CF, N, C—CN or C—OR, and
X=O, S, Se, or N—R where R is H or a solubilizing chain.

20. The composition of matter of claim 16, wherein A is a compound of the structure:

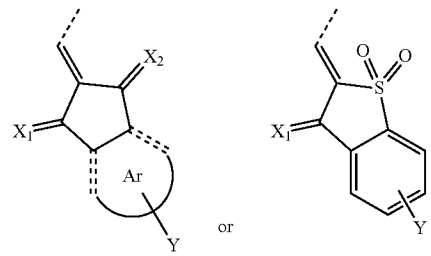

$X_1$ and $X_2$ are each independently O, S, or a malonitrile,
Y is one or more halogens, —CN, or any solubilizing chain, and
Ar is any aryl unit.

21. The composition of matter of claim 16, wherein A is a compound of the structure:

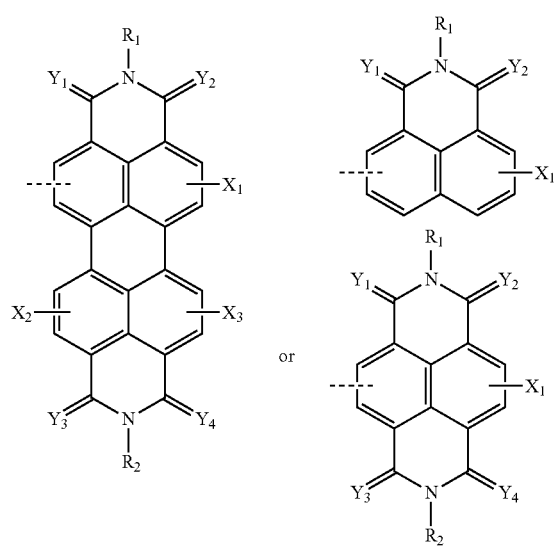

$X_1$, $X_2$, and $X_3$ are each independently a halogen, CN, alkoxy, alkylthio, N—annulated (a ring comprising N), or S—annulated (a ring comprising S),
$Y_1$, $Y_2$, $Y_3$, and $Y_4$ are each independent S or O, and
$R_1$ and $R_2$ are each independently H or a solubilizing chain.

22. The composition of matter of claim 16, wherein A is a compound of the structure:

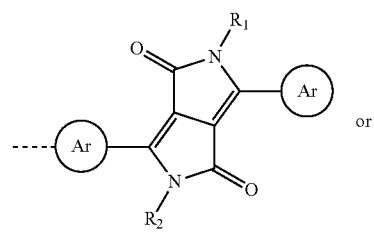

-continued

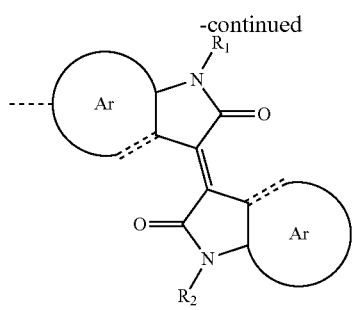

$R_1$ and $R_2$ are each independently H or a solubilizing chain, and
Ar is any aryl unit.

23. The composition of matter of claim 16, wherein A is a compound of the structure:

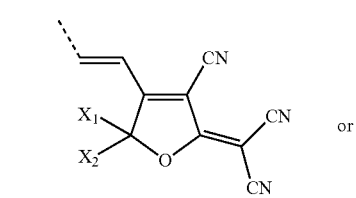

$X_1$ or $X_2$ = methyl or trifluoromethyl

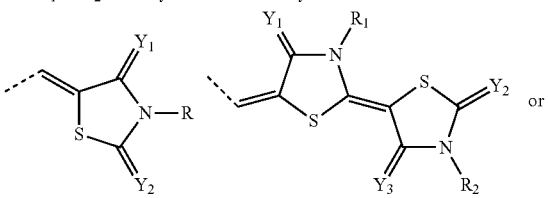

$Y_1$, $Y_2$ or $Y_3$ = O, S or malonitrile
R = any solubilizing chain or H

-continued

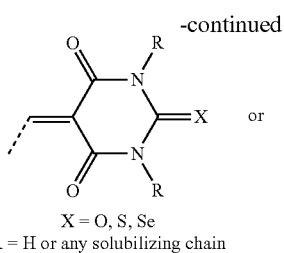

X = O, S, Se
R = H or any solubilizing chain

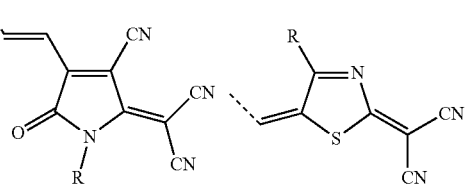

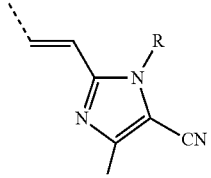

R = H or any solubilizing chain

24. The composition of matter of claim 16, wherein A is a compound of the structure:

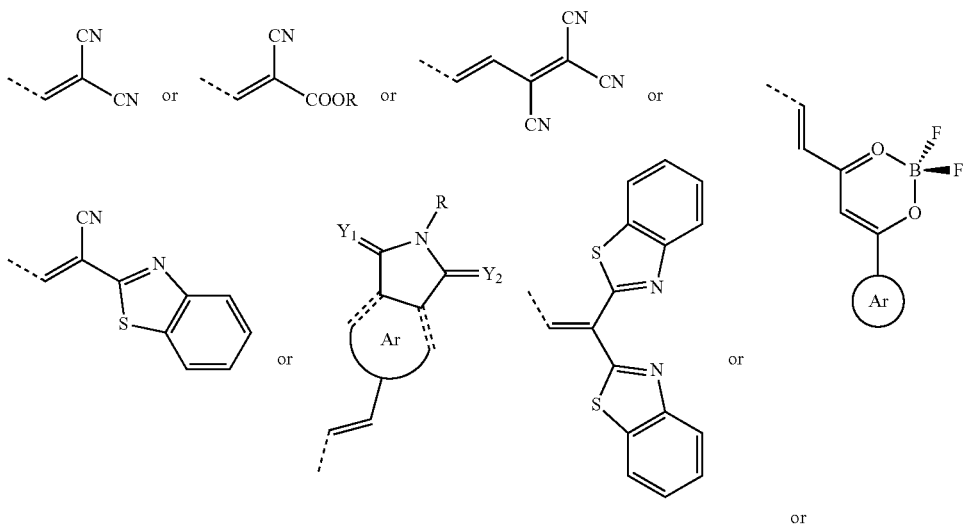

R is H or any solubilizing chain,
$Y_1$ and $Y_2$ are each independently S, O, or a malonitrile, and
Ar is any aryl unit.

25. The composition of matter of claim 16, wherein the organic semiconducting molecule has the structure:

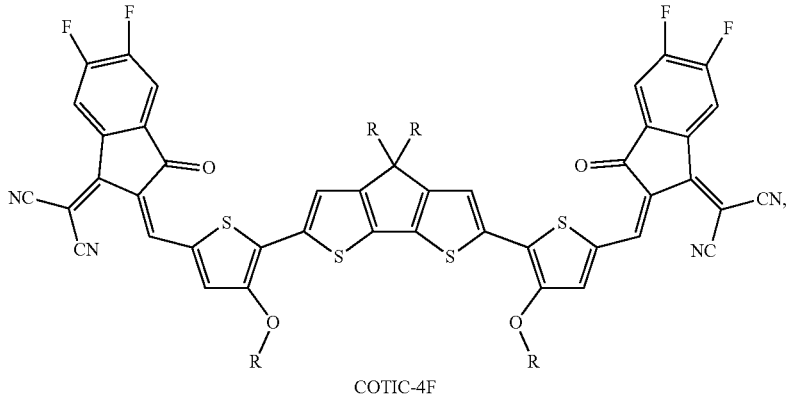

COTIC-4F and R is a solubilizing chain comprising a substituted or non-substituted alkyl, aryl or alkoxy chain.

26. The composition of matter of claim 16, wherein the organic semiconducting molecule has the structure:

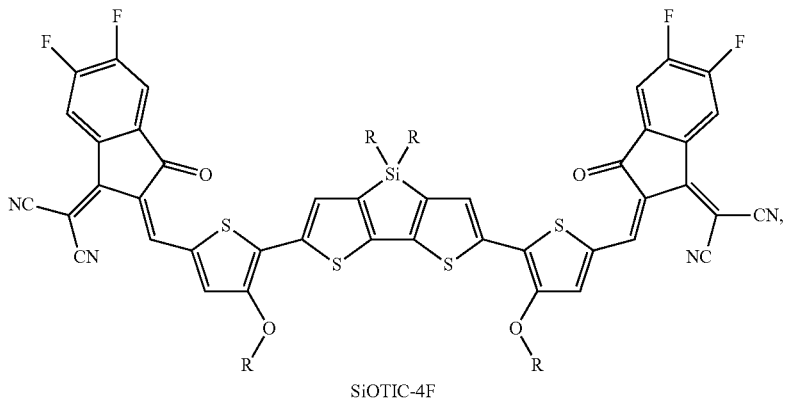

SiOTIC-4F and wherein R is a solubilizing chain comprising a substituted or non-substituted alkyl, aryl or alkoxy chain.

27. The composition of matter of claim 16, wherein A is an acceptor moiety comprising (3-oxo-2,3-dihydro-1H-inden-1-ylidene)malononitrile (IC).

28. The device of claim 1, wherein the device is an organic solar cell.

29. The device of claim 1, wherein A is an acceptor moiety comprising (3-oxo-2,3-dihydro-1H-inden-1-ylidene)malononitrile (IC).

30. The device of claim 1, wherein A is a compound of the structure:

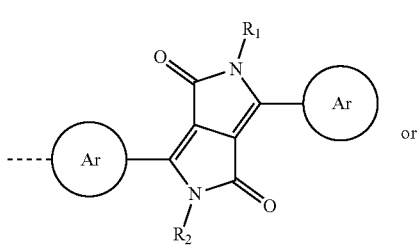

or

-continued

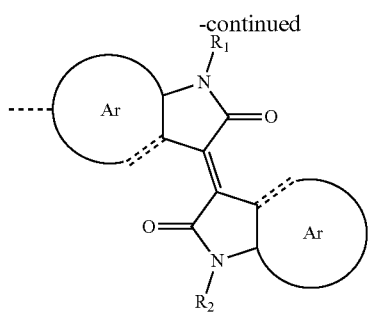

$R_1$ and $R_2$ are each independently H or a solubilizing chain, and
Ar is any aryl unit.

31. The device of claim 1, wherein A is a compound of the structure:

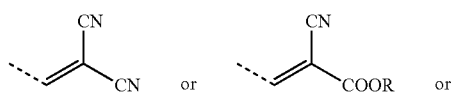

or

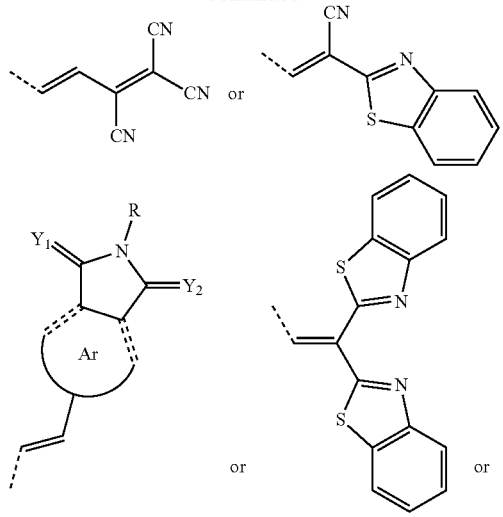
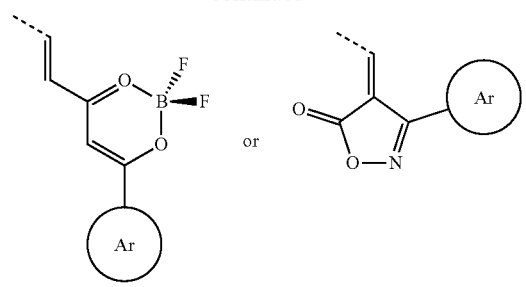
R is H or any solubilizing chain,
$Y_1$ and $Y_2$ are each independently S, O, or a malonitrile, and
Ar is any aryl unit.
* * * * *